US010243565B2

(12) United States Patent
 Aurola

(10) Patent No.: US 10,243,565 B2
(45) Date of Patent: Mar. 26, 2019

(54) NONLINEAR RESISTOR WITH TWO TRANSISTOR CHAINS

(71) Applicant: HYPERION SEMICONDUCTORS OY, Espoo (FI)

(72) Inventor: Artto Aurola, Espoo (FI)

(73) Assignee: HYPERION SEMICONDUCTORS OY, Espoo (FI)

( * ) Notice: Subject to any disclaimer, the term of this patent is extended or adjusted under 35 U.S.C. 154(b) by 7 days.

(21) Appl. No.: 15/954,202

(22) Filed: Apr. 16, 2018

(65) Prior Publication Data

US 2018/0241397 A1 Aug. 23, 2018

Related U.S. Application Data

(62) Division of application No. 15/543,801, filed as application No. PCT/FI2016/050014 on Jan. 13, 2016, now Pat. No. 9,948,304.

(30) Foreign Application Priority Data

Jan. 14, 2015 (FI) ..................................... 20150011
Feb. 5, 2015 (FI) ..................................... 20150088
(Continued)

(51) Int. Cl.
*H03K 19/0185* (2006.01)
*H01L 27/02* (2006.01)
(Continued)

(52) U.S. Cl.
CPC . *H03K 19/018521* (2013.01); *H01L 27/0207* (2013.01); *H01L 27/092* (2013.01);
(Continued)

(58) Field of Classification Search
CPC ............ H03K 19/018521; H01L 29/36; H01L 27/092
See application file for complete search history.

(56) References Cited

U.S. PATENT DOCUMENTS 4,024,418 A 5/1977 Hankel
4,072,868 A 2/1978 De La Moneda et al.
(Continued)

FOREIGN PATENT DOCUMENTS

EP 0797303 9/1997
EP 1096682 A1 5/2001
(Continued)

OTHER PUBLICATIONS

International Search Report, dated Apr. 20, 2016, from corresponding PCT/FI2016/050014 application.
(Continued)

*Primary Examiner* — Jason Crawford
(74) *Attorney, Agent, or Firm* — Young & Thompson

(57) ABSTRACT

Disclosed is a semiconductor logic element including a field effect transistor of the first conductivity type and a field effect transistor of the second conductivity type. A gate of the first FET is an input of the semiconductor logic element, a drain of the second FET is referred to as the output of the semiconductor logic element and a source of the second FET is the source of the semiconductor logic element. By applying applicable potentials to the terminals of the field effect transistors it is possible to influence the state of the output of the logic element. Also disclosed are different kinds of logic circuitries including the described logic element.

4 Claims, 96 Drawing Sheets

(30) Foreign Application Priority Data

| | | | |
|---|---|---|---|
| Feb. 17, 2015 | (FI) | ..................................... | 20150089 |
| May 20, 2015 | (FI) | ..................................... | 20150145 |
| Nov. 30, 2015 | (FI) | ..................................... | 20150334 |

(51) Int. Cl.

| | |
|---|---|
| *H01L 27/092* | (2006.01) |
| *H01L 27/098* | (2006.01) |
| *H01L 29/808* | (2006.01) |
| *H01L 27/12* | (2006.01) |
| *H01L 29/06* | (2006.01) |
| *H03K 19/00* | (2006.01) |
| *H03K 19/003* | (2006.01) |
| *H03K 19/094* | (2006.01) |
| *H03K 19/0952* | (2006.01) |
| *H03K 19/20* | (2006.01) |
| *H01L 29/36* | (2006.01) |
| *H01L 29/78* | (2006.01) |
| *H01L 29/10* | (2006.01) |
| *H01L 27/06* | (2006.01) |

(52) U.S. Cl.
CPC ........ *H01L 27/098* (2013.01); *H01L 27/1203* (2013.01); *H01L 29/0692* (2013.01); *H01L 29/1033* (2013.01); *H01L 29/36* (2013.01); *H01L 29/78* (2013.01); *H01L 29/808* (2013.01); *H01L 29/8083* (2013.01); *H03K 19/0013* (2013.01); *H03K 19/00315* (2013.01); *H03K 19/094* (2013.01); *H03K 19/0952* (2013.01); *H03K 19/20* (2013.01); *H01L 27/0629* (2013.01); *H01L 29/0649* (2013.01)

(56) References Cited

U.S. PATENT DOCUMENTS

| | | |
|---|---|---|
| 4,701,646 A | 10/1987 | Richardson |
| 4,767,950 A | 8/1988 | Schrenk |
| 4,954,730 A | 9/1990 | Yoh |
| 5,225,718 A | 7/1993 | Seshita et al. |
| 5,736,871 A | 4/1998 | Goto |
| 6,094,068 A | 7/2000 | Nomura et al. |
| 9,948,304 B2 * | 4/2018 | Aurola ................ H01L 27/0207 |
| 2007/0262793 A1 | 11/2007 | Kappor |
| 2008/0175045 A1 | 7/2008 | Lin |
| 2010/0109708 A1 | 5/2010 | Koyama et al. |
| 2010/0117684 A1 | 5/2010 | Kim et al. |
| 2013/0264583 A1 * | 10/2013 | Hayashi .................. H01L 29/36 257/77 |
| 2014/0339608 A1 * | 11/2014 | Rountree ............ H01L 27/0266 257/268 |
| 2016/0079983 A1 * | 3/2016 | Tatsumura ............... G11C 8/10 326/41 |

FOREIGN PATENT DOCUMENTS

| | | |
|---|---|---|
| JP | S5947844 | 3/1984 |
| JP | S60254921 A | 12/1985 |
| JP | S61267358 A | 11/1986 |
| JP | 2011049410 | 3/2011 |
| JP | 2012147278 A | 8/2012 |
| WO | 88/10030 | 12/1988 |
| WO | 9963669 A1 | 12/1999 |

OTHER PUBLICATIONS

FI Search Report, dated Mar. 5, 2015, from corresponding FI20150011 application.
FI Search Report, dated Jun. 23, 2015, from corresponding FI20150088 application.
FI Search Report, dated Jun. 23, 2015, from corresponding FI20150089 application.
FI Search Report, dated Jun. 23, 2015, from corresponding FI20150145 application.
FI Search Report, dated Apr. 12, 2016, from corresponding FI20150334 application.
Supplementary Partial European Search Report for Application No. 16 73 7119, dated Oct. 1, 2018.
Supplementary European Search Report dated Jan. 21, 2019 in corresponding European Patent Application No. 16737119.4.

* cited by examiner

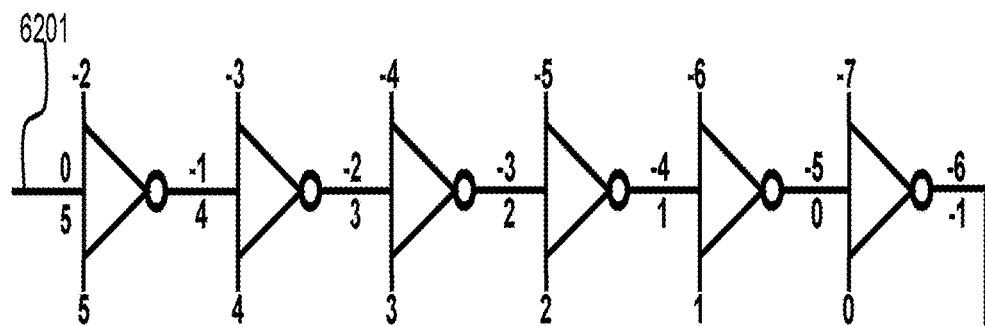
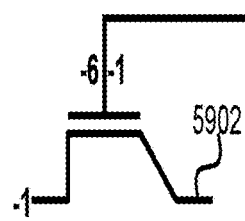
FIG 62
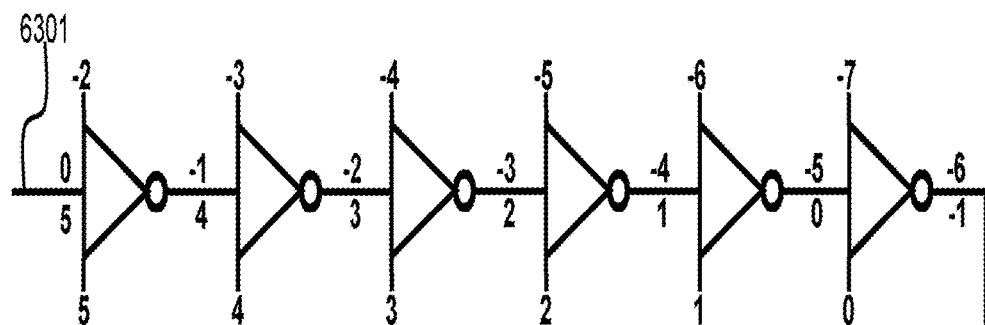
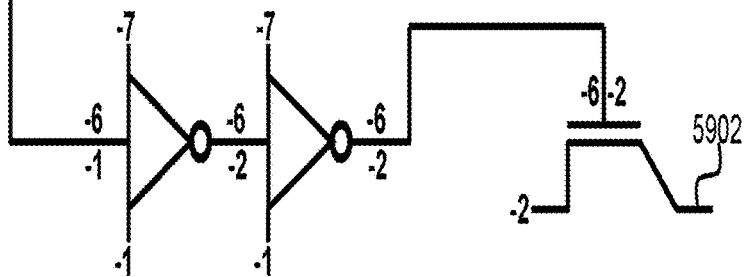
FIG 63

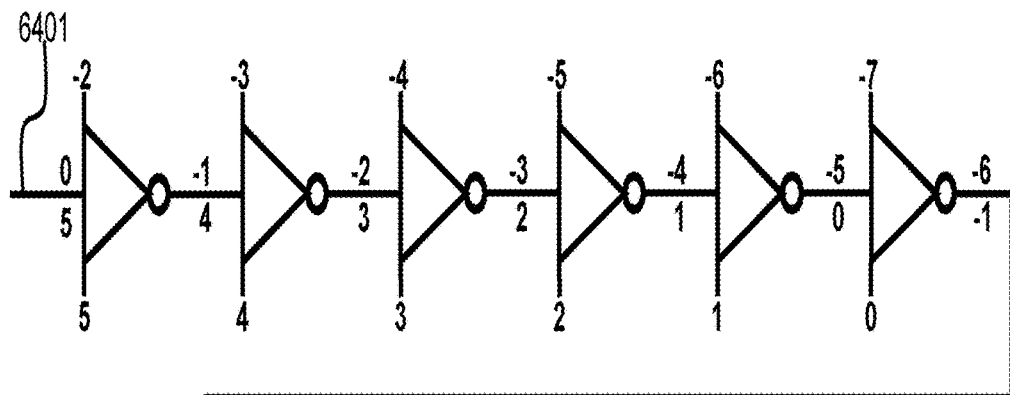
FIG 64
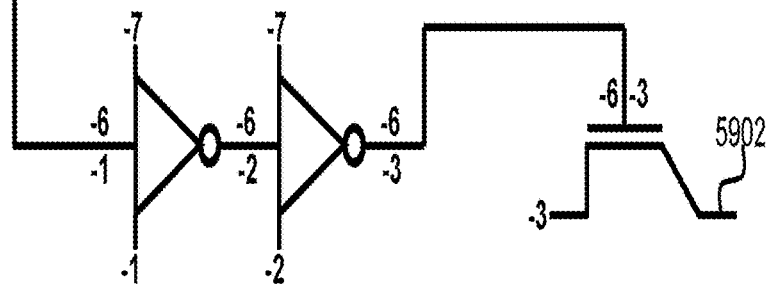
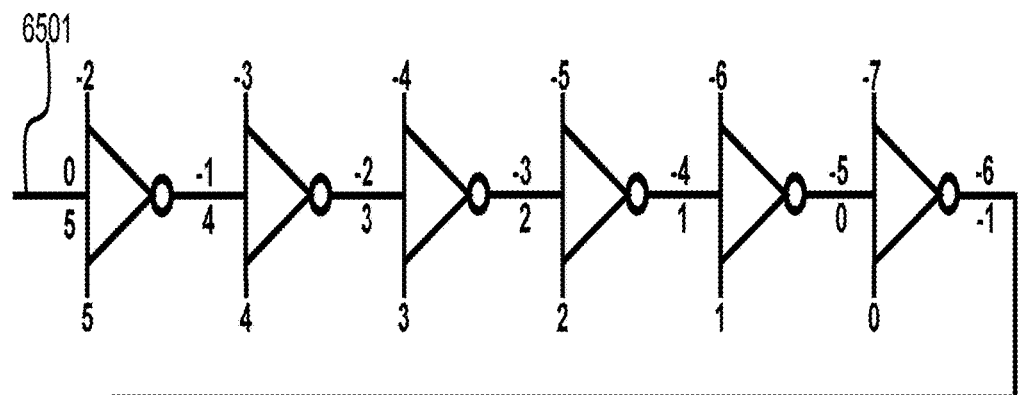
FIG 65
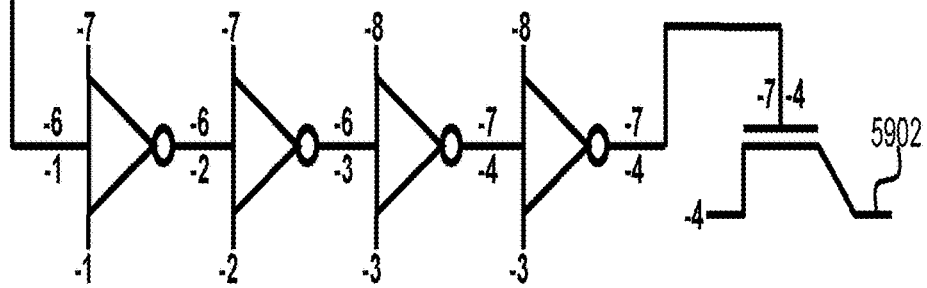

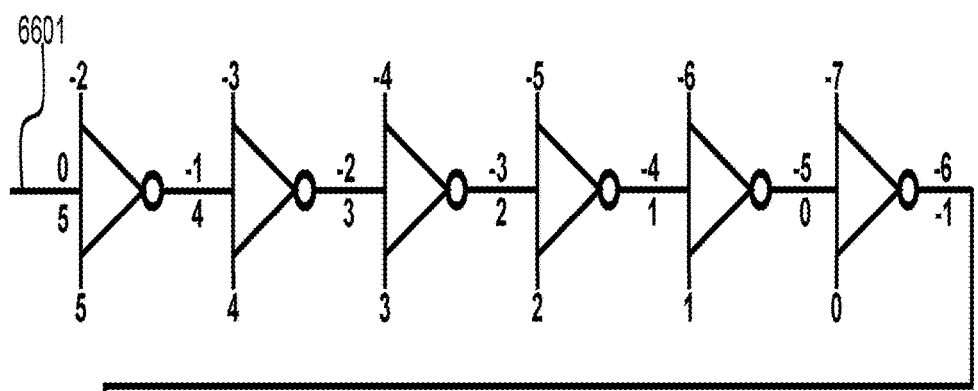
FIG 66
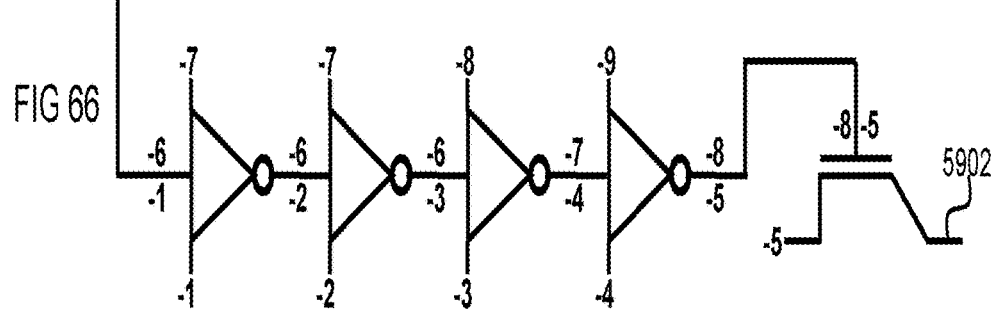

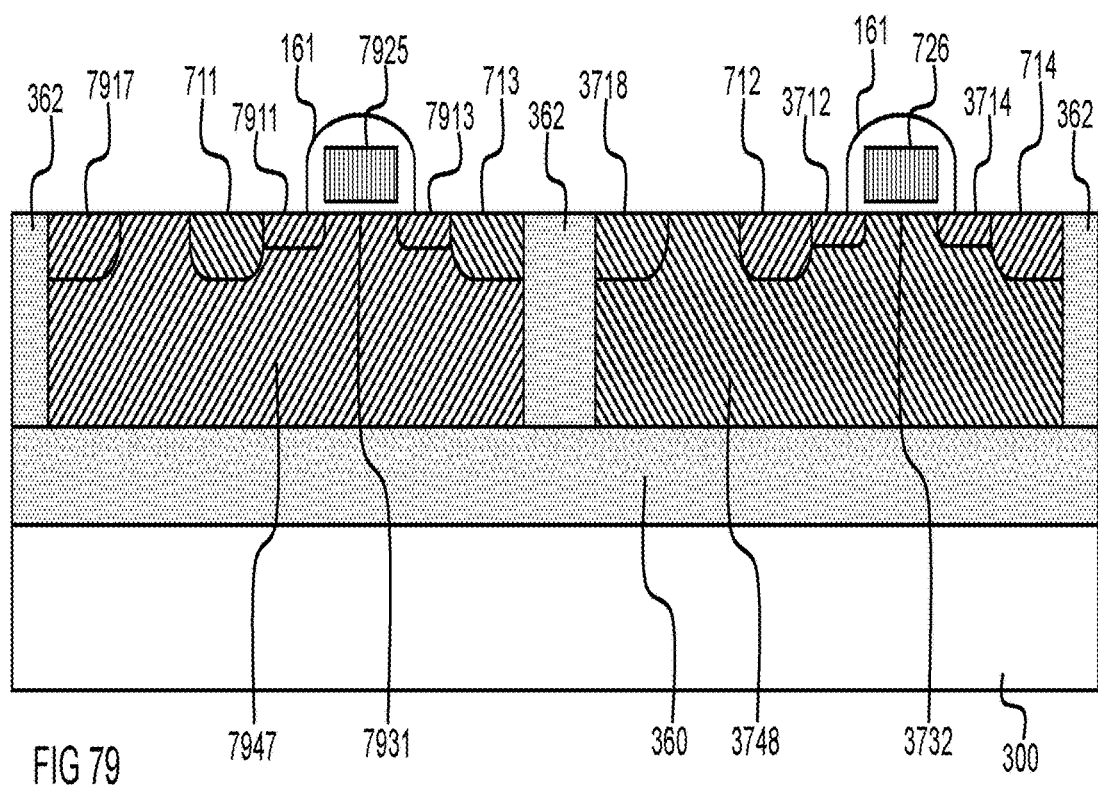

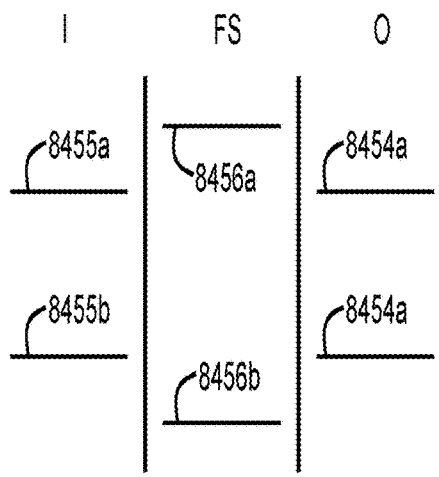
FIG 84A
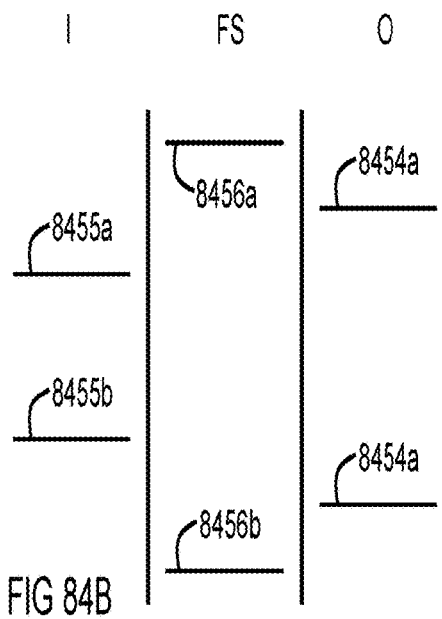
FIG 84B
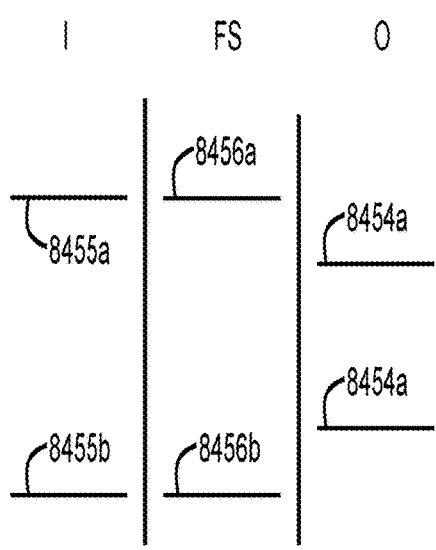
FIG 84C
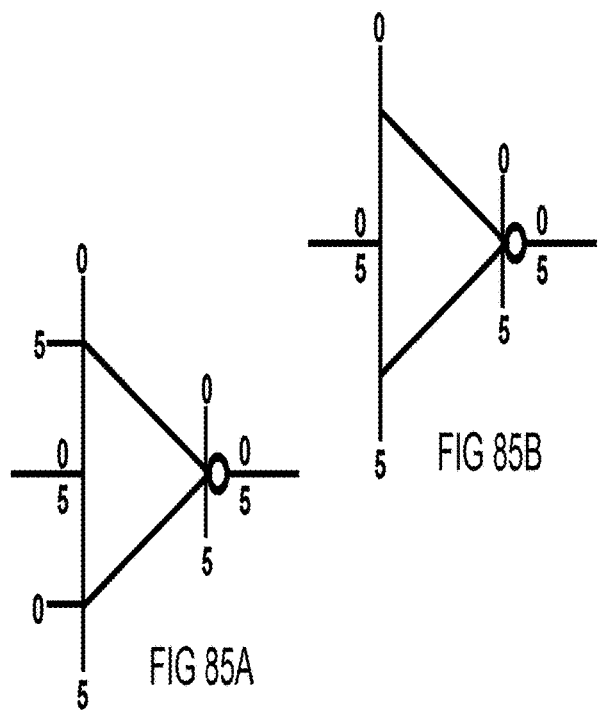
FIG 85A
FIG 85B

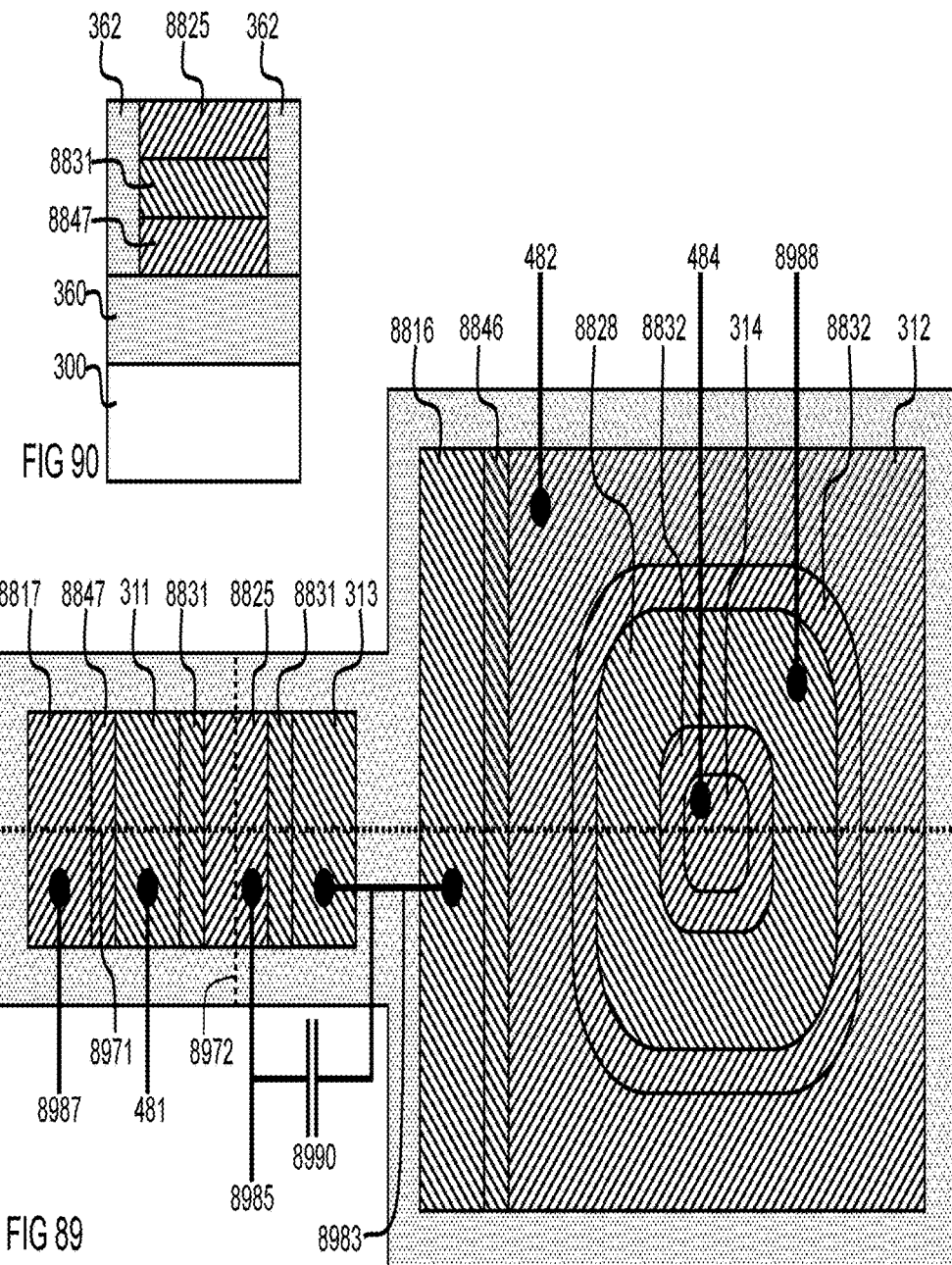

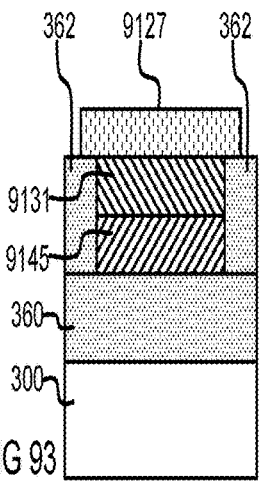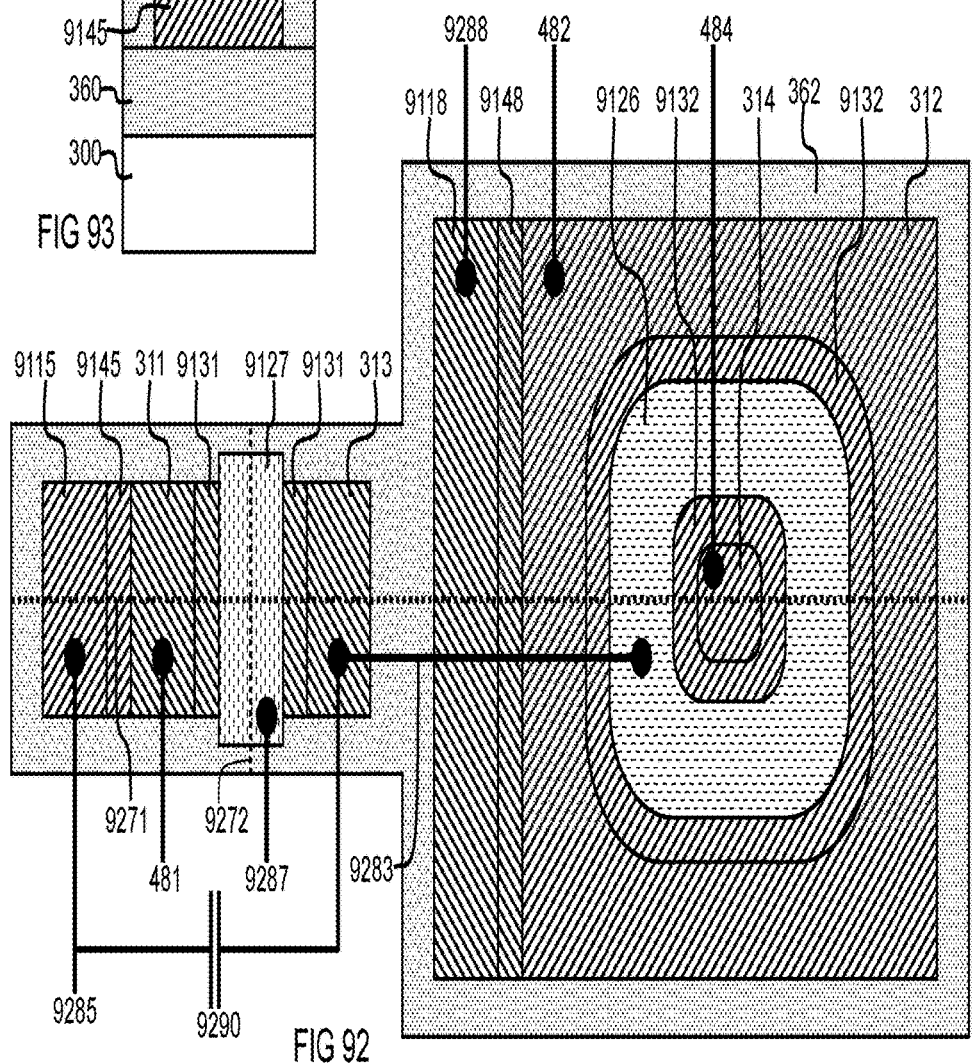

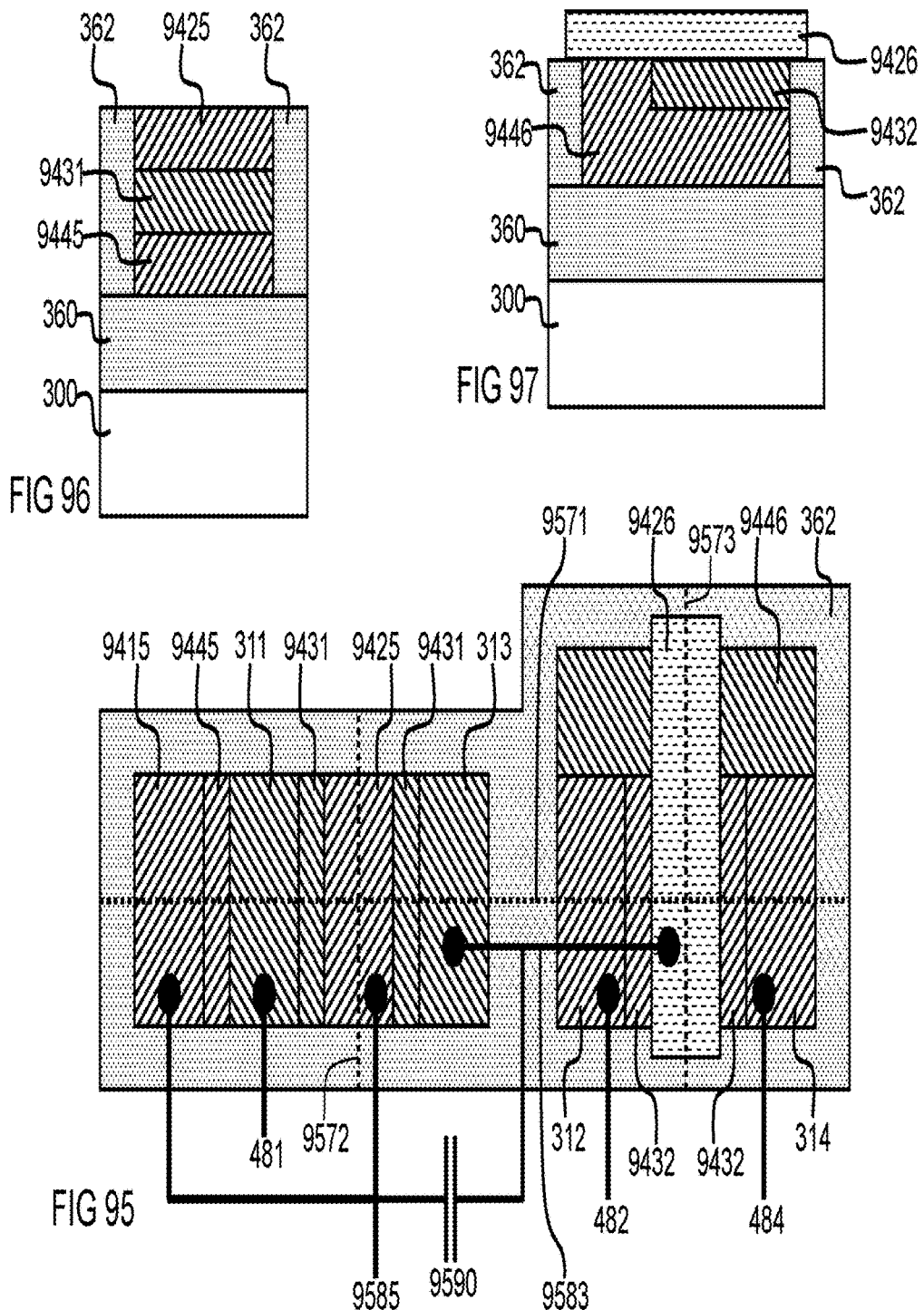

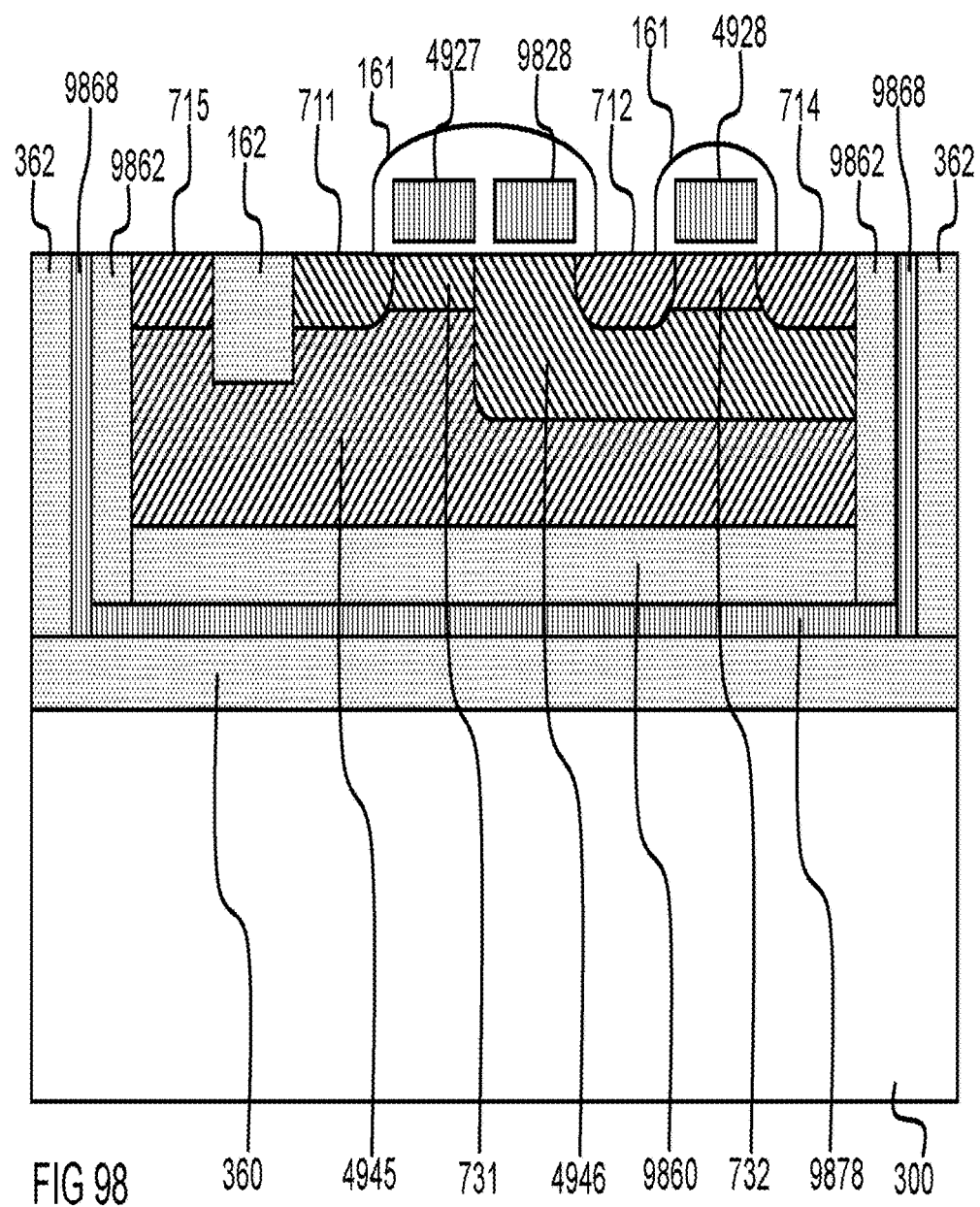

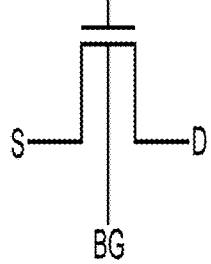
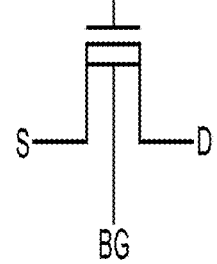
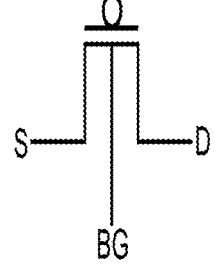
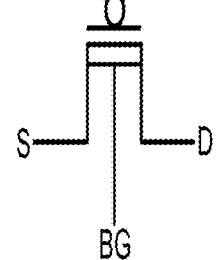
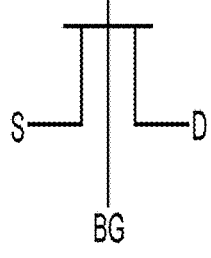
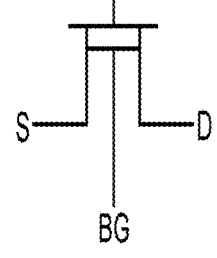
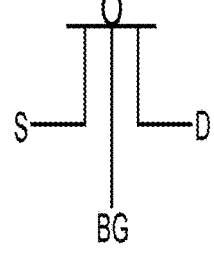
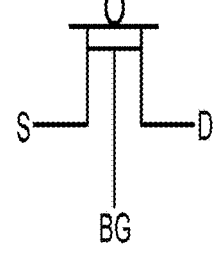
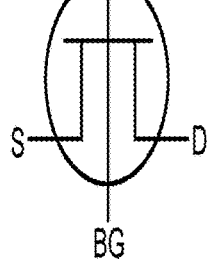
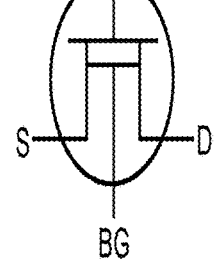
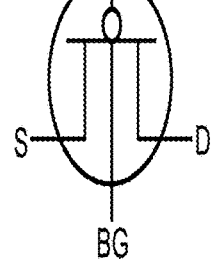
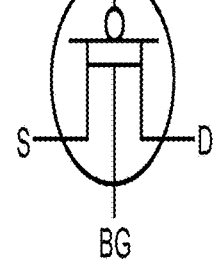

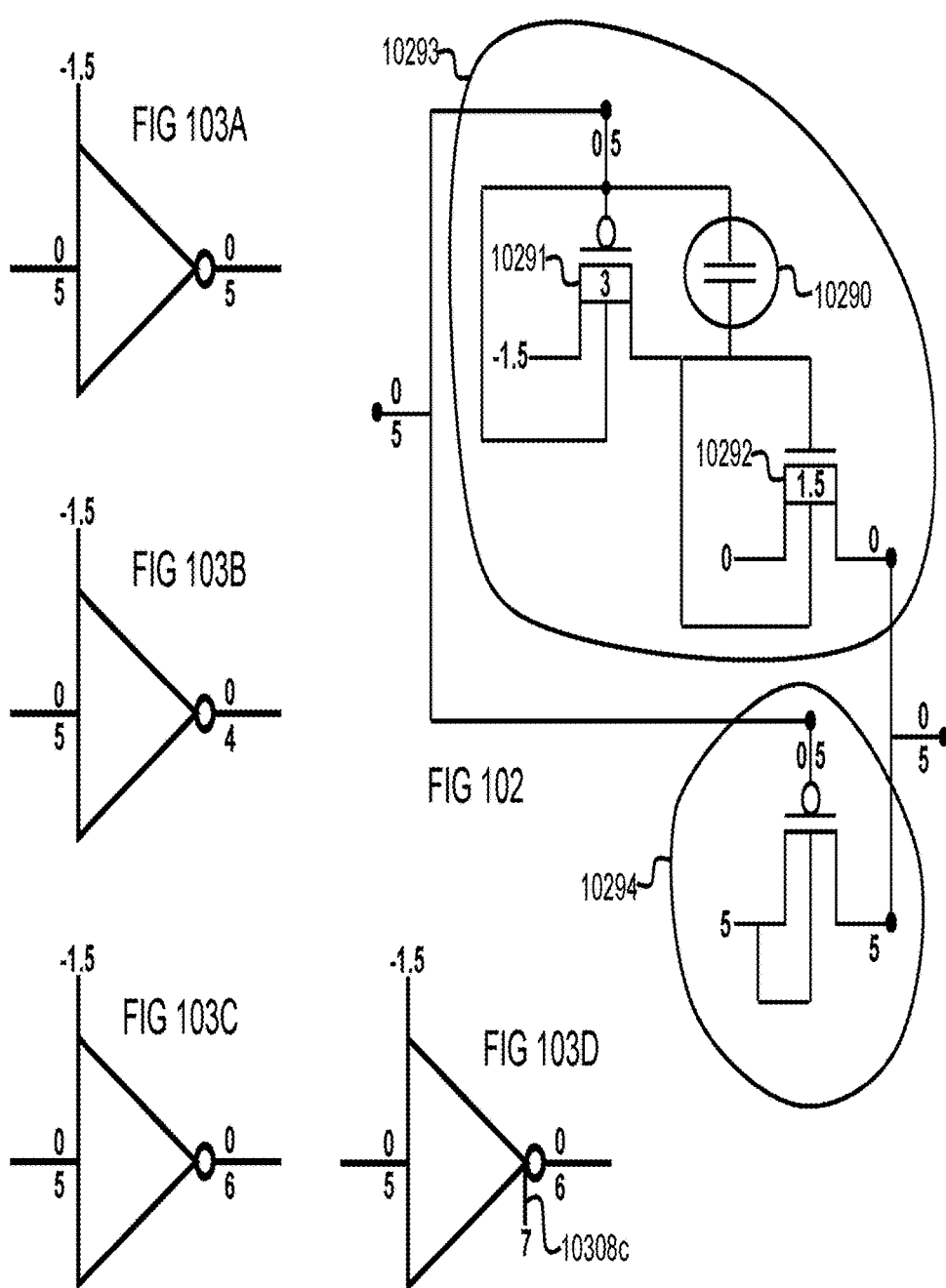

NONLINEAR RESISTOR WITH TWO TRANSISTOR CHAINS

FIELD OF THE INVENTION

The invention relates to semiconductor solutions. More specifically, the invention relates to semiconductor logic elements replacing, at least partly, traditional semiconductor logic elements in complementary binary logic.

BACKGROUND OF THE INVENTION

For sake of clarity of the disclosure the following remarks are done. In this text the term complementary binary logic refers to a logic circuitry comprising a set of logic elements that correspond either to semiconductor logic elements or to complementary semiconductor logic elements each of them having an input and an output. During a steady state in the complementary binary logic circuitry
- the potential at an input or at an output can have only two different values which are referred to as logic potentials, and
- there are no conductive paths between the nodes in the set of semiconductor logic elements that are at different potentials enabling thus low steady state power consumption.

In addition, it is only possible in complementary binary logic to establish a network of logic elements having the outputs of logic elements connected to the inputs of other logic elements and wherein the inputs/outputs of logic elements are biased only at a two different potentials that are the same throughout the network.

It is important to note that the term logic separates a semiconductor logic element and logic circuitries comprising semiconductor logic elements from analog regulation elements/circuitries. It should be also noted that in this text the terms binary logic, complementary logic, and logic are utilized generally in a context referring to the complementary binary logic since no other logic types are examined in this text. Furthermore, in this text the CMOS logic is referred to as traditional Complementary Conductor Insulator Semiconductor (CCIS) logic due to broader and more accurate scope. In a similar fashion a MOSFET is referred to as Conductor Insulator Semiconductor Field Effect Transistor (CISFET). The traditional CCIS logic is based on two opposite type enhancement mode CISFETs.

FIG. 2 illustrate a schematic layout of the two opposite type enhancement mode CISFET and FIG. 1 illustrates a schematic cross-section of the two opposite type enhancement mode CISFET along the dashed line 271 of FIG. 2. The backslash lines in FIGS. 1 and 2 refer to first conductivity type and the slash lines refer to second conductivity type. The two different conductivity types refer to p and n type but which way they are arranged is not relevant.

The CISFET on the left hand side comprises a first conductivity type source doping 111 corresponding to source, a first conductivity type drain doping 113 corresponding to drain and output, an external gate 125 corresponding to gate and output, a layer of gate insulator material 161 surrounding the external gate (except at the location of the gate contact), a second conductivity type back-gate doping 147, and a second conductivity type contact doping 117 to the back-gate doping 147. The CISFET on the right hand side comprises a second conductivity type source doping 112 corresponding to source, a second conductivity type drain doping 114 corresponding to drain and output, an external gate 126 corresponding to gate and input, a layer of gate insulator material 161 surrounding the external gate (except at the location of the gate contact), a first conductivity type back-gate doping 148, and a first conductivity type contact doping 118 to the back-gate doping 148. The both CISFETs and the contact dopings are surrounded by an insulator trench 162. Beneath the CISFETs there is a semiconductor substrate 100 of either conductivity type.

The back-gate doping can be connected to a separate node referred to as auxiliary gate node and the potential on the auxiliary gate node can be used to adjust the threshold voltage of the corresponding CISFET. In case the back-gate doping of the CISFET is of the same conductivity type as the semiconductor substrate then the auxiliary gate node is common to all CISFETs of this type. When the back-gate doping of the CISFET is of the opposite conductivity type than the substrate then this type CISFETs have individual auxiliary gate nodes. It is possible to have individual auxiliary gate nodes for both type CISFETs by incorporating underneath CISFETs an insulator layer and by incorporating deep enough trenches that reach to this insulator layer but this would increase the cost. Another option is to provide a suitable well doping of the opposite doping type than the substrate that can be used for isolating the substrate from the same conductivity type back-gate doping. The back-gate doping can be connected also to the source of the corresponding CISFET but in this case the ability to adjust the threshold voltage is lost. The second type CISFET on the right comprising the source, input, and output corresponds to a traditional semiconductor logic element comprising a source, input, and output. Similarly, the first type CISFET on the left comprising the source, input, and output corresponds to a traditional complementary semiconductor logic element having afore described source, input, and output. The traditional semiconductor logic element and the traditional complementary semiconductor logic element enable the realization of traditional complementary binary logic being capable of performing logic operations. Consequently, the said the two opposite type CISFETs enable the realization of traditional CCIS logic being capable of performing logic operations.

In the traditional CCIS logic it is a common arrangement that in a set of traditional semiconductor logic elements and of traditional complementary semiconductor logic elements the second conductivity type source of the traditional semiconductor logic element is connected to a first logic potential, that the first conductivity type source in the traditional complementary semiconductor logic element is connected to a second logic potential, that the gate 126 acts as the input and the drain 114 as the output of the traditional semiconductor logic element, that the gate 125 acts as the input and the drain 113 as the output of the traditional complementary semiconductor logic element, and that the inputs and outputs of the traditional semiconductor and complementary semiconductor logic elements can be during steady state only at the first logic potential or at the second logic potential. Furthermore, in the traditional semiconductor logic element a channel connecting the source and the drain is
- nonconductive when the source and input are at first logic potential, and
- conductive when the source is at first logic potential and the input is at second logic potential. Similarly in a traditional complementary semiconductor logic element a channel connecting the source and the drain is nonconductive when the source and input are at second logic potential, and conductive when the source is at second logic potential and the input is at first logic potential. In the traditional CCIS logic afore said common arrangement is utilized in order to perform logic operations. An important operational feature of afore said arrangement in the traditional CCIS logic is that when the input is at the same logic potential than the source in the traditional semiconductor logic element or in the traditional complementary semiconductor logic element then the output can be at either logic potential (at first logic potential or at second logic potential), i.e., the input has no control over the output. On the other hand when the input and the source are at different logic potentials then the output is set to the same logic potential as the source, i.e., the input determines the logic potential on the output.

A great and unique benefit of the traditional CCIS logic is that it consumes only very little power. This is due to the fact there are no conductive current paths between two nodes that are at different potentials in the part of the traditional CCIS logic circuitry that is in steady state, i.e., during steady state the power consumption is due to leakage only which is not the case in any other present semiconductor logic arrangement. A big benefit of the traditional CCIS logic is also that the corresponding traditional semiconductor logic elements and traditional complementary semiconductor logic elements consume only very little area and thus a lot of circuitry can be packed into a small area resulting in low cost. Another big benefit of the traditional CCIS logic is that in the conductive stage the channel corresponds to an inversion layer of mobile charge carriers meaning that a lot of charge can be packed into the channel resulting in fast operation. Beside the low power consumption, low cost, and fast operation the traditional CCIS logic has, however, also numerous problems.

A problem in the traditional CCIS logic is that only a thin gate insulator layer separates at least two logic nodes from each others the logic lines being the input gate line as well as drain and/or source line. In case in the insulator layer between the two logic nodes there is a defect that is generated either during manufacturing or during operation then the defect can result in the formation of a permanent conductive path between at least two logic lines corrupting simultaneously at least two logic lines. The problem that a defect can corrupt simultaneously at least two logic lines means that the damage is more difficult to isolate, that countermeasures against defects are more difficult to design, and that complete device breakage is more likely resulted in.

Another problem related to the traditional CCIS logic is that in order to establish an inversion layer a high quality insulator semiconductor interface is required underneath the external gate forming the gate. Such a high quality insulator semiconductor interface is present only in some semiconductor materials like in silicon (Si), silicon germanium (SiGe), and silicon carbide (SiC). Thus there are many semiconductor materials wherein traditional CCIS logic cannot be incorporated. This leads for example to the problem in semiconductor sensors based on other than afore said materials that a silicon readout chip has to be bonded (e.g. by utilizing face to face flip chip bonding) to the sensor chip. The bonding results in yield issues due to bad bonds or due to wafer breakage. An inherent problem is also that the silicon readout chip and the sensor chip have typically considerably different thermal expansion coefficients which may lead to device breakage particularly if the sensor has to be cooled e.g. with thermoelectric coolers.

Yet another problem related to the traditional CCIS logic is that very accurate control of the insulator semiconductor interface quality, of the amount of insulator charge, of the k value of the insulator, and of the insulator thickness is required in order to achieve a desired level of control over the threshold voltage, i.e., in order to achieve properly functioning traditional CCIS logic a high quality Conductor Insulator Semiconductor (CIS) stack corresponding to the external gate is required. For example if the difference in the amount of insulator charge is large across the wafer bad yield may be resulted in. A problem is also that gate insulator charge (e.g. positive oxide charge in silicon) is generated by radiation damage in the gate insulator layer causing threshold voltage shifts reducing likely the lifetime of the device.

A substantial problem is also that the temperature that is required for the manufacturing of a high quality CIS stack corresponding to the external gate exceeds typically considerably the temperature that is required for the annealing of the ion implantation induced lattice damage as well as for the activation of the implanted impurity atoms. This increases considerably the thermal budget for doped regions that are implanted before the manufacturing of the CIS stack (corresponding to the external gate acting as the gate). Thus the design complexity is increased, transistor scaling to smaller dimensions is impeded, and performance is impaired. Even if in some semiconductor material the formation of a good quality CIS stack would be possible it may be that the temperature for the formation of the CIS stack is so high that the tendency for the dopant atoms to diffuse essentially prevents the formation of functional CISFETs.

An additional problem in traditional CCIS logic is also that the CIS stack sets a limit for the maximum operational temperature of the chip. Without the CIS stack the chips could be operational at much higher temperatures which would reduce the need for cooling and which would increase the operational range and field of chips. Yet another problem in state of the art small line width CCIS logic is power consumption due to leakage from source to drain passing through the channel and due to leakage through the gate insulator.

Finally, a problem in mixed mode chips comprising digital logic and low noise analog electronics is that low voltage (e.g. 1.8 V) traditional CCIS logic for low power small foot print digital logic part as well as relatively high voltage (e.g. 3.3 or 5 V) traditional CCIS logic for the low noise analog part are required. This necessitates the manufacturing of two CIS stacks with two different insulator thicknesses increasing considerably the thermal budget of the manufacturing and thus complicating the manufacturing and design of mixed mode chips leading to higher cost. It should be also noted that in mixed mode chips based on traditional CCIS logic the amount of binary logic potential level pairs (typically two like e.g. 1.8 V and 5 V) is very limited and that it would be highly desired to have more logic level pairs available.

In the publication "Complementary logic with 60 nm poly gate JFET for 0.5 V operation", Kapoor A. K. et al, Electronics Letters, Volume 46, Issue 11, Pages 783-784, May 27, 2010, traditional Complementary Junction Field Effect Transistor (CJFET) logic has been realized. In the traditional CJFET logic the enhancement mode CISFETs of traditional CCIS logic have been replaced with enhancement mode JFETs. The benefit of the traditional CJFET logic is that problems of traditional CCIS logic related to the gate insulator and to the interface beneath the gate insulator have been removed. Another advantage is that very low operation voltage range (i.e. 0.5 V) is required only. A problem with the traditional CJFET logic is, however, that when the enhancement JFETs (corresponding to traditional semiconductor logic elements) are conductive the doped region acting as the gate is forward biased with respect to the source resulting in leakage current running between the gate and the source. Another point, which increases also considerably the leakage current is that in the nonconductive stage the channel of the enhancement mode JFET is not truly nonconductive. Due to the higher leakage current the steady state power consumption of the traditional CJFET logic is much higher than in traditional CCIS logic. Yet another problem with traditional CJFET logic is that the operation voltage is fixed, i.e. one cannot realize higher operation voltages that would be required in mixed mode chips.

It would be also possible to replace enhancement mode JFETs in traditional CJFET logic with similar type enhancement mode Metal Semiconductor Field Effect Transistors (MESFETs), which are later on referred to as Conductor Semiconductor Field Effect Transistors (CSFETs, corresponding also to traditional semiconductor logic elements). In this manner traditional Complementary MESFET (CMESFET) logic or traditional Complementary CSFET (CCSFET) logic could be realized but it would be prone to the same problems as the traditional CJFET logic.

As can be seen from above the traditional solutions, as identified above in an exemplified manner, have many problems. Thus, there is need to develop solutions, which at least partly mitigate the one or more problems pointed out in the context of the traditional solutions.

BRIEF DESCRIPTION OF THE INVENTION

The following presents a simplified summary in order to provide basic under-standing of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

An objective of the invention is to introduce a novel semiconductor logic element, and circuitries, providing very low steady state power consumption comparable to traditional CCIS logic as well as reducing the vulnerability to defects. The better defect isolation means that a defect is less likely to form a permanent conductive path between two logic lines and therefore the damage caused by a defect is easier to isolate, countermeasures against defects are easier to design, and complete device breakage is less likely resulted in.

Another objective of the invention is to facilitate the use of more binary logic potential level pairs than currently available in mixed mode chips. Another objective of the invention is to provide a novel semiconductor logic element that can replace the traditional semiconductor logic element in the traditional complementary logic. Yet another object of the invention is to provide a novel complementary semiconductor logic element that can replace the complementary traditional semiconductor logic element in the traditional complementary logic.

The objectives of the invention are reached by a semiconductor logic element as defined by the respective independent claims.

According to a first aspect, a semiconductor logic element comprising a field effect transistor of the first conductivity type hereinafter referred to as the first FET and a field effect transistor of the second conductivity type hereinafter referred to as the second FET is provided wherein the semiconductor logic element comprises an internal node wherein the internal node is at least partly formed with a drain of the first FET and a gate of the second FET and wherein the gate of the first FET is hereinafter referred to as an input of the semiconductor logic element wherein the input is configured to be coupled either to a first input logic potential or to a second input logic potential, and wherein the drain of the second FET is referred to as the output of the semiconductor logic element, and wherein a source of the second FET is the source of the semiconductor logic element, wherein the semiconductor logic element is configured so that when a source of the first FET is arranged at a first source potential and when the source of the second FET is at a first output logic potential and when the input is at the first input logic potential, a conductive channel comprising mobile first conductivity type charge carriers is established between the source of the first FET and the drain of the first FET adjusting the internal node to first source potential and thereby causing a channel between the source of the second FET and the drain of the second FET to be in a nonconductive state thus enabling the output of the semiconductor logic element to be either at the first output logic potential or at a second output logic potential; and wherein the semiconductor logic element is further configured so that when the source of the first FET is arranged at a first source potential and when the source of the second FET is at first output logic potential and when the input is at the second input logic potential, the channel between the source of the first FET and the drain of the first FET is arranged to be in a nonconductive state enabling the internal node to adjust to a potential establishing a conductive channel comprising mobile second conductivity type charge carriers between the source of the second FET and the drain of the second FET thereby adjusting the output to first output logic potential. The internal node may comprise one of the following: a single doped region acting both as first drain and at least part of second gate, a first drain doping and a second gate. Further, at least one of the following: the first FET, the second FET may be a depletion mode field effect transistor. Alternatively or in addition, at least one of the following: the first FET, the second FET may be an enhancement mode field effect transistor.

The first FET may be one of the following: a junction field effect transistor, a conductor insulator semiconductor field effect transistor, a conductor semiconductor field effect transistor.

The second FET, in turn, may be one of the following: a junction field effect transistor, a conductor insulator semiconductor field effect transistor, a conductor semiconductor field effect transistor. At least one of the following: the first FET, the second FET is a depletion mode conductor insulator semiconductor field effect transistor may comprise an auxiliary gate corresponding to an external gate as well as a back-gate doping corresponding to the gate. If the first FET is a depletion mode conductor insulator semiconductor field effect transistor the auxiliary gate of the first FET may be configured to be biased so that a layer of mobile second conductivity type charge carriers is established at the insulator semiconductor interface beneath the external gate of the first FET irrespective of whether the input is biased at first input logic potential or at second input logic potential, and the said layer of mobile second conductivity type charge carriers acting as a part of the first gate and controlling the first channel from the opposite side than the second conductivity type back-gate doping. On the other hand, if the second FET is a depletion mode conductor insulator semiconductor field effect transistor the auxiliary gate of the second FET may be configured to be biased so that a layer of mobile first conductivity type charge carriers is established at the insulator semiconductor interface beneath the external gate of the second FET irrespective of whether the input is biased at first input logic potential or at second input logic potential, and the said layer of mobile first conductivity type charge carriers acting as a part of the second gate and controlling the second channel from the opposite side than the first conductivity type back-gate doping.

Furthermore, if the semiconductor logic element comprises a depletion mode conductor insulator semiconductor field effect transistor then the gate may comprise both an external gate as well as a back-gate doping. Alternatively, if the semiconductor logic element comprises a depletion mode conductor semiconductor field effect transistor then the gate may comprise both an external Schottky gate as well as a back-gate doping. Finally, if the semiconductor logic element comprises a depletion mode junction field effect transistor having a front-gate doping and a back-gate doping then the gate may comprise both the front-gate doping and the back-gate doping.

Moreover, if the semiconductor logic element comprises a depletion mode conductor insulator semiconductor field effect transistor then the gate may correspond either to an external gate or to a back-gate doping and wherein the gate controls the channel only from the side where the gate is located. Further, if the semiconductor logic element comprises a depletion mode conductor semiconductor field effect transistor then the gate may correspond either to an external Schottky gate or to a back-gate doping and wherein the gate controls the channel only from the side where the gate is located. Finally, if the semiconductor logic element comprises a depletion mode junction field effect transistor having a front-gate doping and a back-gate doping then the gate may correspond either to the front-gate doping or to the back-gate doping and wherein the gate controls the channel only from the side where the gate is located.

The second FET may correspond to an enhancement mode conductor insulator semiconductor field effect transistor wherein the gate of the second FET corresponds to an external gate and the first FET may correspond to one of the following: a depletion mode junction field effect transistor that comprises a gate confining the channel at least from two sides, a depletion mode conductor semiconductor field effect transistor wherein a gate corresponds to a Schottky gate and a back-gate doping, a depletion mode conductor insulator semiconductor field effect transistor that, in turn, may correspond to one of the following: an external gate corresponding to an auxiliary gate configured to be biased so that a layer of mobile second conductivity type charge carriers is established at the insulator semiconductor interface beneath the external gate of the first FET irrespective of the fact whether the input is biased at first input logic potential or at second input logic potential, and the said layer of mobile second conductivity type charge carriers acting as a part of the first gate and controlling the first channel from the opposite side than the second conductivity type back-gate doping; or a gate corresponding to an external gate and a back-gate doping.

The first conductivity type may be p type and the second conductivity type may be n type. Alternatively, the first conductivity type may be n type and the second conductivity type may be p type.

According to a further aspect, a logic circuitry comprising at least one semiconductor logic element as claimed disclosed above and at least one semiconductor logic element as disclosed above may be provided.

According to a still further aspect, a logic circuitry comprising: a first semiconductor logic element as disclosed above, and a second semiconductor logic element as disclosed above may be provided wherein the first input logic potential of the second semiconductor logic element corresponds to the second input logic potential of the first semiconductor logic element; the second input logic potential of the second semiconductor logic element corresponds to the first input logic potential of the first semiconductor logic element; the first output logic potential of the second semiconductor logic element corresponds to the second output logic potential of the first semiconductor logic element; and the second output logic potential of the second semiconductor logic element corresponds to the first output logic potential of the first semiconductor logic element.

The logic circuit may be configured to operate as an inverter configuration as follows: in the first semiconductor logic element the second source is connected to the first output logic potential of the first semiconductor logic element; in the second semiconductor logic element the second source is connected to the second output logic potential of the first semiconductor logic element; wherein the inputs of the first semiconductor logic element and the second semiconductor logic element are connected together as an input of the inverter configuration, the outputs of the first semiconductor logic element and the second semiconductor logic element are connected together as the output of the inverter configuration, and the input of the inverter configuration is configured to be coupled either to the first or the second input logic potential of the first semiconductor logic element wherein when the input of the inverter configuration is coupled to the first input logic potential of the first semiconductor logic element the output of the inverter configuration sets to the second output logic potential of the first semiconductor logic element, and when the input of the inverter configuration is coupled to the second input logic potential of the first semiconductor logic element the output of the inverter configuration sets to the first output logic potential of the first semiconductor logic element. The first input logic potential of the first semiconductor logic element may be the same as the first output logic potential of the first semiconductor logic element and the second input logic potential of the first semiconductor logic element may be the same as the second output logic potential of the first semiconductor logic element.

Furthermore, a logic circuitry may be provided which logic circuitry comprises at least one semiconductor logic element as disclosed above and at least one complementary semiconductor logic element corresponding to a first conductivity type field effect transistor.

According to still further aspect, a logic circuitry comprising: a semiconductor logic element as disclosed above, and a first conductivity type field effect transistor may be provided, wherein the field effect transistor comprising: a first conductivity type source, a first conductivity type drain, and a gate; wherein in the semiconductor logic element the second source is connected to the first output logic potential of the semiconductor logic element, in the first conductivity type field effect transistor the source is connected to the second output logic potential of the semiconductor logic element, and wherein the first conductivity type drain of the field effect transistor and the output of the semiconductor logic element are connected together as an output of the inverter configuration, and the gate of the field effect transistor and the input of the semiconductor logic element are connected together as an input of the inverter configuration; the input of the inverter configuration is configured to be coupled either to the first or the second input logic potential of the semiconductor logic element; wherein when the input of the inverter configuration is coupled to the first input logic potential of the semiconductor logic element, a conductive channel comprising mobile first conductivity type charge carriers is established between the source and the drain of the field effect transistor so that the output of the inverter configuration sets to the second output logic potential of the semiconductor logic element, and when the input of the inverter configuration is coupled to the second input logic potential of the semiconductor logic element, the channel of the first conductivity type field effect transistor is nonconductive causing the output of the inverter configuration to the first output logic potential of the semiconductor logic element.

The field effect transistor in the logic circuitry may be one of the following: conductor insulator semiconductor field effect transistor, junction field effect transistor, conductor semiconductor field effect transistor. The first input logic potential of the semiconductor logic element may be the same as the first output logic potential of the semiconductor logic element and the second input logic potential of the semiconductor logic element may be the same as the second output logic potential of the semiconductor logic element. According to still further aspect, a multi-level logic circuitry comprising a first and a second logic circuitry as disclosed above may be provided, wherein in the first logic circuitry at least one of the following: the first output logic potential of the first logic circuitry, the second output logic potential of the first logic circuitry may be shifted towards a first direction with respect to the first and second input logic potential of the first logic circuitry; in the second logic circuitry the first and second input logic potentials may be shifted towards the first direction with respect to the first and second input logic potentials of the first logic circuitry; and at least one of the following: the first output logic potential of the second logic circuitry, the second output logic potential of the second logic circuitry may be shifted with respect to the first and second output logic potentials of the second logic circuitry towards the first direction.

A multi-level logic circuitry may also be provided that comprises a first, a second and a third logic circuitry as disclosed above, wherein in the first logic circuitry at least one of the following: the first output logic potential of the first logic circuitry, the second output logic potential may be shifted towards a first direction with respect to the first and second input logic potential of the first logic circuitry; in the second logic circuitry the first and second input logic potentials may be shifted towards the first direction with respect to the first and second input logic potentials of the first logic circuitry; at least one of the following: the first output logic potential of the second logic circuitry, the second output logic potential of the second logic circuitry may be shifted with respect to the first and second input logic potentials of the second logic circuitry towards the first direction; in the third logic circuitry the first and second input logic potentials may be shifted towards the first direction with respect to the first and second input logic potentials of the second logic circuitry; and at least one of the following: the first output logic potential of the third logic circuitry, the second output logic potential of the third logic circuitry may be shifted with respect to the first and second output logic potentials of the third logic circuitry towards the first direction.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE DRAWINGS

FIG. 62 illustrates an arrangement on the chip realizing −1 V on the output.

FIG. 63 illustrates an arrangement on the chip realizing −2 V on the output.

FIG. 64 illustrates an arrangement on the chip realizing −3 V on the output.

FIG. 65 illustrates an arrangement on the chip realizing −4 V on the output.

FIG. 66 illustrates an arrangement on the chip realizing −5 V on the output.

FIG. 79 illustrates an embodiment of the invention corresponding to a schematic cross-section of a semiconductor logic element.

FIG. 84A illustrates possible bias levels in an inverter arrangement wherein both first and second FET are depletion mode FETs.

FIG. 84B illustrates possible bias levels in an inverter arrangement wherein both first and second FET are depletion mode FETs.

FIG. 84C illustrates possible bias levels in an inverter arrangement wherein both first and second FET are depletion mode FETs.

FIG. 85A illustrates a possible biasing scheme for an inverter arrangement wherein the first FET is a depletion mode FET having only a CIS gate and the second FET is an enhancement mode FET having only a CIS gate.

FIG. 85B illustrates a possible biasing scheme for an inverter arrangement wherein the first FET is a depletion mode FET and the second FET is an enhancement mode FET having only a CIS gate.

FIG. 86B illustrates possible bias levels in an inverter arrangement wherein the first FET is a depletion mode FET and the second FET is an enhancement mode FET having only a CIS gate and a relatively large threshold voltage.

FIG. 87A illustrates possible bias levels in an inverter arrangement wherein the first FET has a CIS gate only.

FIG. 87B illustrates possible bias levels in an inverter arrangement wherein the first FET has a CIS gate only and the second FET is an enhancement mode FET having only a CIS gate and a relatively large threshold voltage.

FIG. 88 illustrates an embodiment of the invention corresponding to a schematic cross-section of a semiconductor logic element.

FIG. 89 illustrates an embodiment of the invention corresponding to the schematic layout of the semiconductor logic element according to FIG. 88.

FIG. 90 illustrates an embodiment of the invention corresponding to a schematic cross-section of the semiconductor logic element according to FIG. 89.

FIG. 91 illustrates an embodiment of the invention corresponding to a schematic cross-section of a semiconductor logic element.

FIG. 92 illustrates an embodiment of the invention corresponding to the schematic layout of the semiconductor logic element according to FIG. 91.

FIG. 93 illustrates an embodiment of the invention corresponding to a schematic cross-section of the semiconductor logic element according to FIG. 92.

FIG. 94 illustrates an embodiment of the invention corresponding to a schematic cross-section of a semiconductor logic element.

FIG. 95 illustrates an embodiment of the invention corresponding to the schematic layout of the semiconductor logic element according to FIG. 94.

FIG. 96 illustrates an embodiment of the invention corresponding to a schematic cross-section of the semiconductor logic element according to FIG. 95.

FIG. 97 illustrates an embodiment of the invention corresponding to a schematic cross-section of the semiconductor logic element according to FIG. 95.

FIG. 98 illustrates an embodiment of the invention corresponding to a schematic cross-section of a semiconductor logic element.

Figure 99:
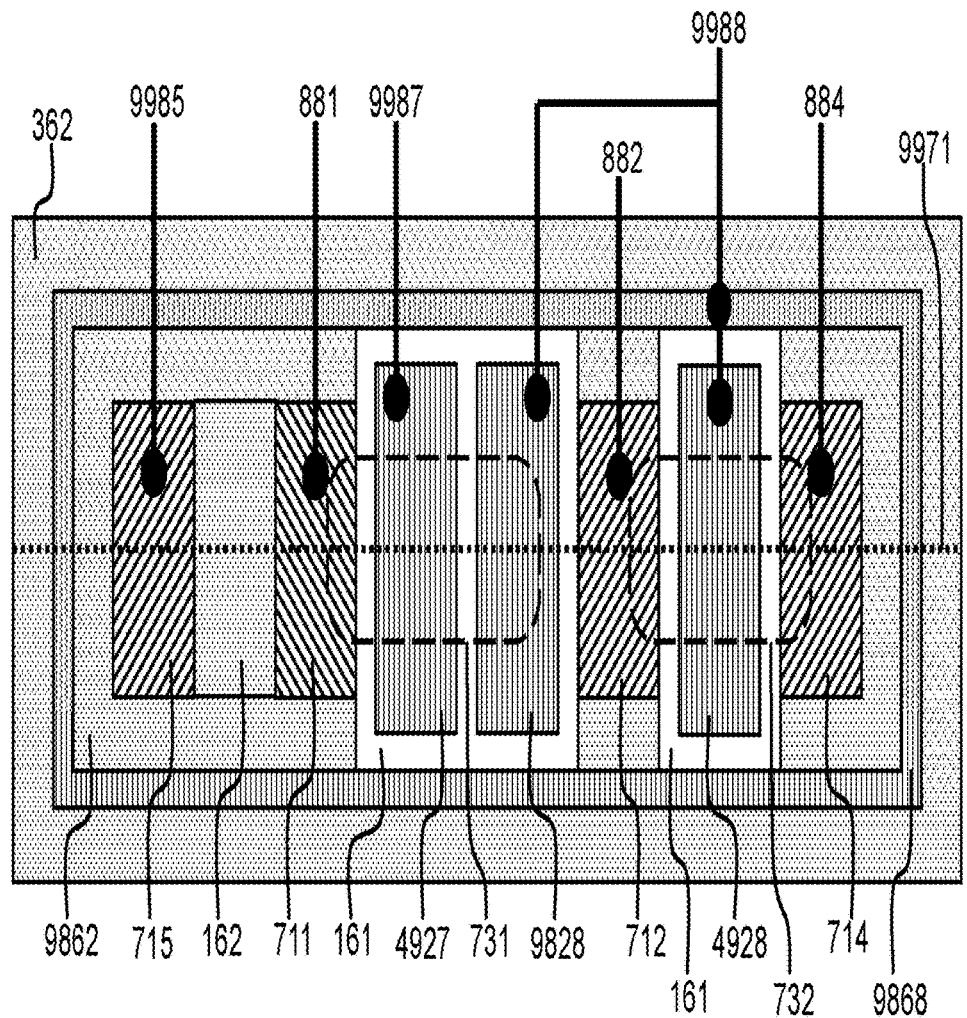

FIG. 99 illustrates an embodiment of the invention corresponding to the schematic layout of the semiconductor logic element according to FIG. 98.

Figure 100A:
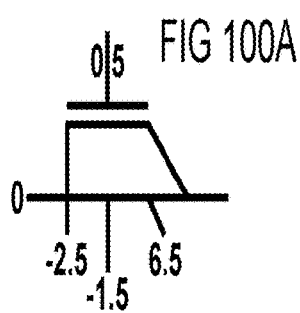

FIG. 100A illustrates a possible biasing scheme of the embodiment of FIGS. 98 and 99 wherein first conductivity type corresponds to p type and second conductivity type corresponds to n type.

Figure 100B:
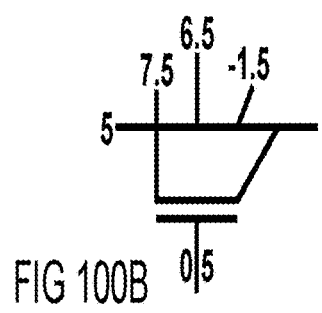

FIG. 100B illustrates a possible biasing scheme of the embodiment of FIGS. 98 and 99 wherein first conductivity type corresponds to n type and second conductivity type corresponds to p type.

FIG. 101A illustrates a possible schematic symbol for an EM nCISFET.

FIG. 101B illustrates a possible schematic symbol for a DM nCISFET.

FIG. 101C illustrates a possible schematic symbol for an EM pCISFET.

FIG. 101D illustrates a possible schematic symbol for a DM pCISFET.

FIG. 101E illustrates a possible schematic symbol for an EM nCSFET.

FIG. 101F illustrates a possible schematic symbol for a DM nCSFET.

FIG. 101G illustrates a possible schematic symbol for an EM pCSFET.

FIG. 101H illustrates a possible schematic symbol for a DM pCSFET.

FIG. 101I illustrates a possible schematic symbol for an EM nJFET.

FIG. 101J illustrates a possible schematic symbol for a DM nJFET.

FIG. 101K illustrates a possible schematic symbol for an EM pJFET.

FIG. 101L illustrates a possible schematic symbol for a DM pJFET.

FIG. 102 illustrates an inverter arrangement comprising an invented semiconductor logic element and a traditional complementary semiconductor logic element.

FIG. 103A illustrates the biasing scheme of the inverter arrangement of FIG. 102.

FIG. 103B illustrates another possible biasing scheme of the inverter arrangement of FIG. 102.

FIG. 103C illustrates another possible biasing scheme of the inverter arrangement of FIG. 102.

FIG. 103D illustrates another possible biasing scheme of a similar inverter arrangement than presented in FIG. 102.

Figure 103E:
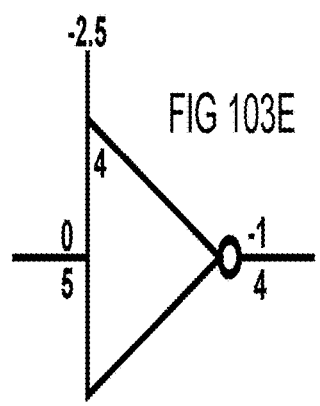

FIG. 103E illustrates another possible biasing scheme of a similar inverter arrangement than presented in FIG. 102.

Figure 104:
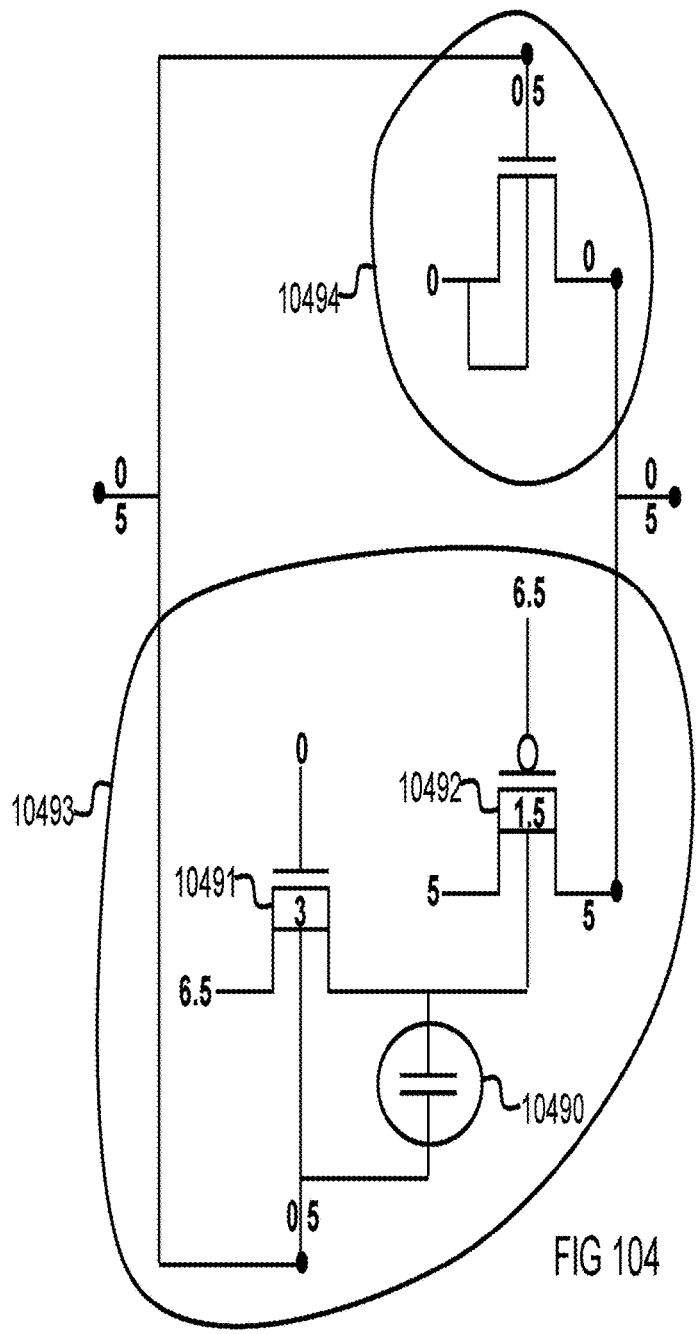

FIG. 104 illustrates an inverter arrangement comprising an invented semiconductor logic element and a traditional complementary semiconductor logic element.

Figure 105A:
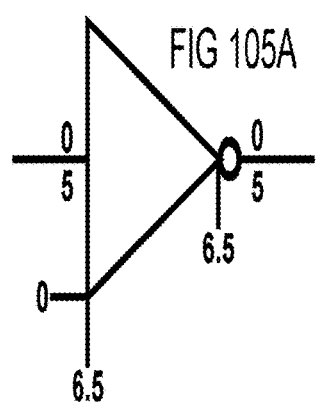

FIG. 105A illustrates the biasing scheme of the inverter arrangement of FIG. 104.

Figure 105B:
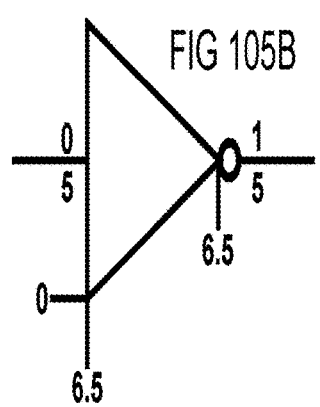

FIG. 105B illustrates another possible biasing scheme of the inverter arrangement of FIG. 104.

Figure 105C:
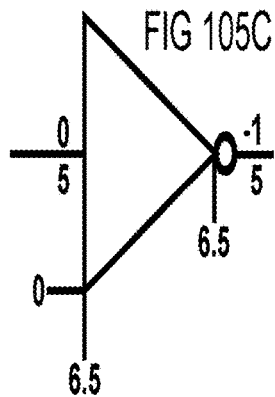

FIG. 105C illustrates another possible biasing scheme of the inverter arrangement of FIG. 104.

Figure 105D:
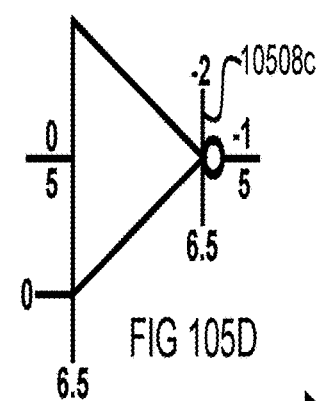

FIG. 105D illustrates another possible biasing scheme of a similar inverter arrangement than presented in FIG. 104.

Figure 105E:
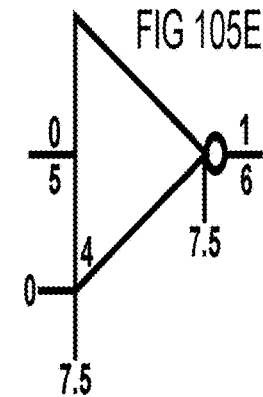

FIG. 105E illustrates another possible biasing scheme of a similar inverter arrangement than presented in FIG. 104.

Figure 106A:
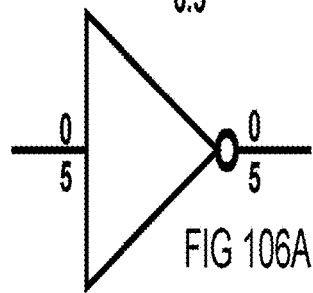

FIG. 106A illustrates a schematic symbol for a possible traditional inverter configuration.

Figure 106B:
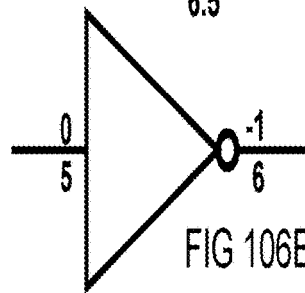

FIG. 106B illustrates a schematic symbol for a possible traditional inverter configuration.

Figure 106C:
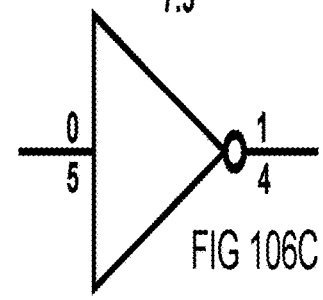

FIG. 106C illustrates a schematic symbol for a possible traditional inverter configuration.

Figure 106D:
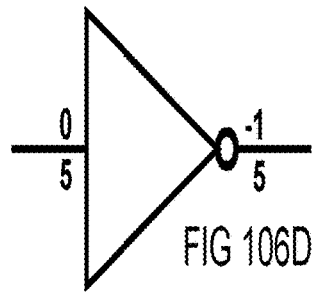

FIG. 106D illustrates a schematic symbol for a possible traditional inverter configuration.

Figure 106E:
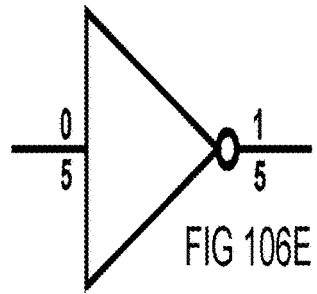

FIG. 106E illustrates a schematic symbol for a possible traditional inverter configuration.

Figure 106F:
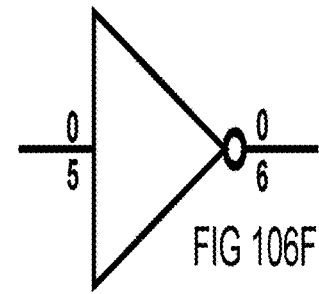

FIG. 106F illustrates a schematic symbol for a possible traditional inverter configuration.

Figure 106G:
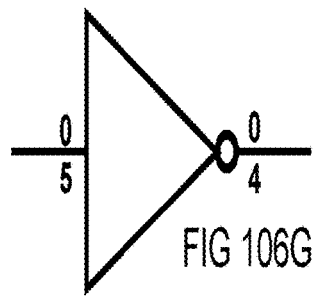

FIG. 106G illustrates a schematic symbol for a possible traditional inverter configuration.

Figure 106H:
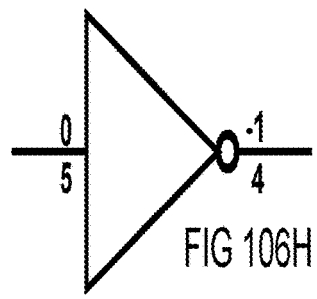

FIG. 106H illustrates a schematic symbol for a possible traditional inverter configuration.

Figure 106I:
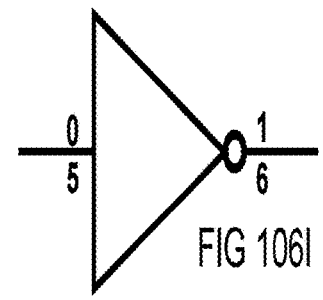

FIG. 106I illustrates a schematic symbol for a possible traditional inverter configuration.

Figure 107A:
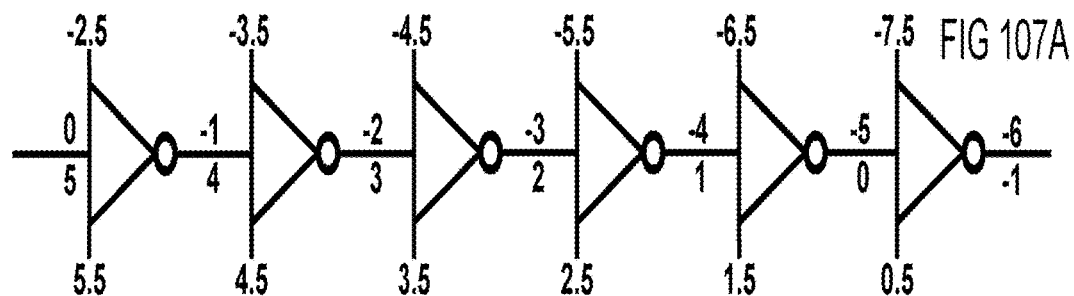

FIG. 107A illustrates a binary logic level shifter wherein the inverters comprise an invented semiconductor logic element and an invented complementary semiconductor logic element.

Figure 107B:
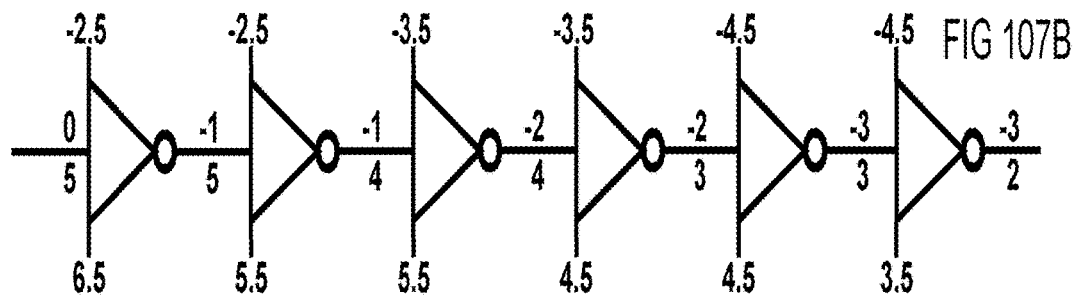

FIG. 107B illustrates a binary logic level shifter wherein the inverters comprise an invented semiconductor logic element and an invented complementary semiconductor logic element.

Figure 107C:
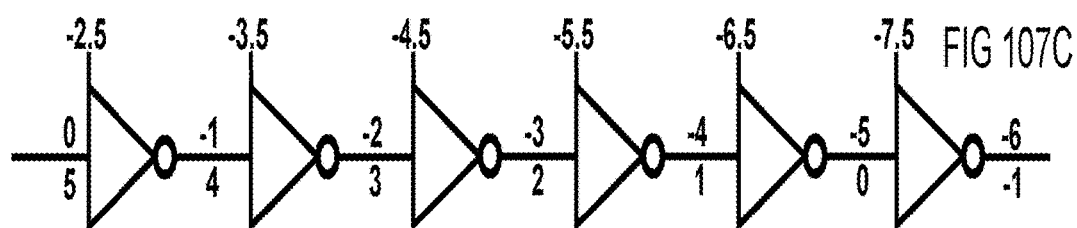

FIG. 107C illustrates a binary logic level shifter wherein the inverters comprise an invented semiconductor logic element and a traditional complementary semiconductor logic element.

Figure 107D:
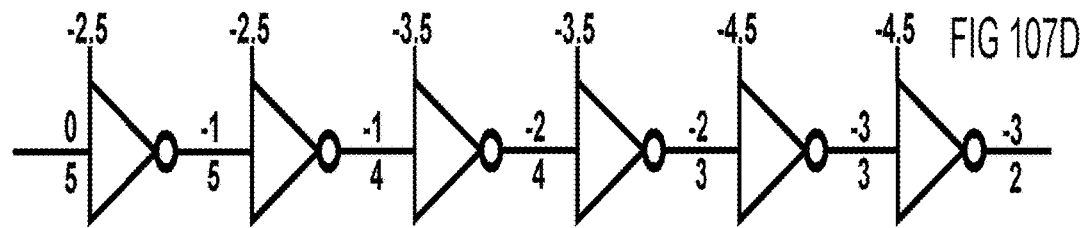

FIG. 107D illustrates a binary logic level shifter wherein the inverters comprise an invented semiconductor logic element and a traditional complementary semiconductor logic element.

Figure 107E:
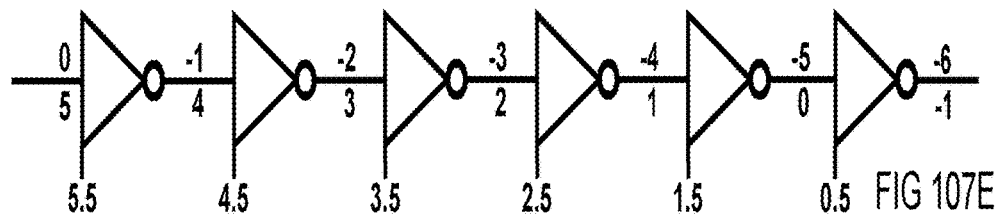

FIG. 107E illustrates a binary logic level shifter wherein the inverters comprise an invented semiconductor logic element and a traditional complementary semiconductor logic element.

Figure 107F:
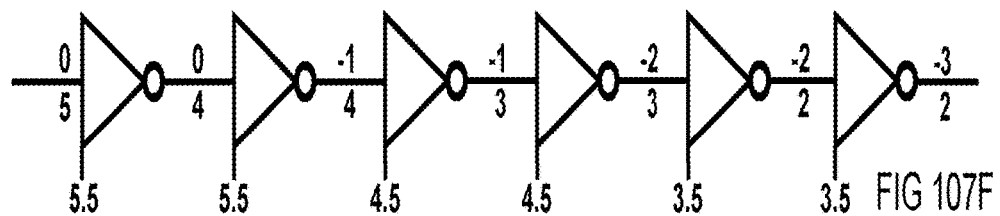

FIG. 107F illustrates a binary logic level shifter wherein the inverters comprise an invented semiconductor logic element and a traditional complementary semiconductor logic element.

Figure 107G:
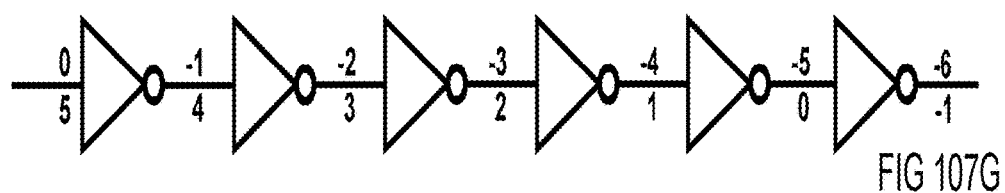

FIG. 107G illustrates a binary logic level shifter wherein the inverters comprise a traditional semiconductor logic element and a traditional complementary semiconductor logic element.

Figure 107H:
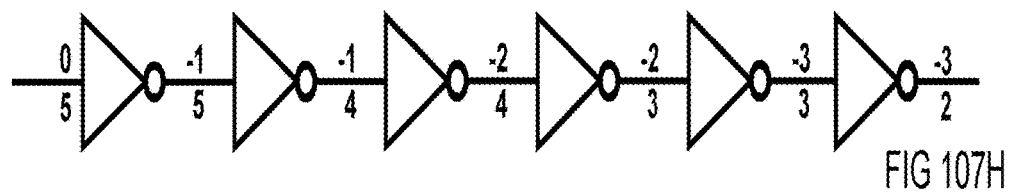

FIG. 107H illustrates a binary logic level shifter wherein the inverters comprise a traditional semiconductor logic element and a traditional complementary semiconductor logic element.

DETAILED DESCRIPTION OF THE INVENTION

The specific examples provided in the description given below should not be construed as limiting the scope and/or the applicability of the appended claims. Lists and groups of examples provided in the description given below are not exhaustive unless otherwise explicitly stated.

As already previously said, in this text the term complementary binary logic refers to a logic circuitry comprising a set of logic elements that correspond either to semiconductor logic elements or to complementary semiconductor logic elements each of them having an input and an output. During a steady state in the complementary binary logic circuitry
- the potential at an input or at an output can have only two different values which are referred to as logic potentials, and
- there are no conductive paths between the nodes in the set of semiconductor logic elements that are at different potentials enabling thus low steady state power consumption.

In addition, it is only possible in complementary binary logic to establish a network of logic elements having the outputs of logic elements connected to the inputs of other logic elements and wherein the inputs/outputs of logic elements are biased only at a two different potentials that are the same throughout the network.

It is important to note that the term logic separates a semiconductor logic element and logic circuitries comprising semiconductor logic elements from analog regulation elements/circuitries. It should be also noted that in this text the terms binary logic, complementary logic, and logic are utilized generally in a context referring to the complementary binary logic since no other logic types are examined in this text.

The semiconductor logic element according to the invention comprises a first conductivity type field effect transistor wherein the first conductivity type refers to the mobile majority charge carriers of the source and drain, i.e. the source and drain are of the first conductivity type. The first conductivity type Field Effect Transistor (FET) is hereinafter referred to as the first type first FET or simply as the first FET. In addition, the semiconductor logic element comprises a second conductivity type second field effect transistor which is hereinafter referred to as the second type second FET or simply as the second FET.

The first conductivity type source of the first FET is hereinafter referred to as the first source. The first source node comprises the first source and optional associated wiring and it is configured to be coupled via the optional wiring or via other means to a first source potential. The gate of the first FET is hereinafter referred to as the first gate. The first gate node comprises the first gate and optional associated wiring. The first gate node is also referred to as the input node or simply as input and it is configured to be coupled via the optional wiring or via other means at least to a first input logic potential or to a second input logic potential. The first conductivity type drain of the first FET is hereinafter referred to as the first drain. The channel of the first FET is hereinafter referred to as the first channel and it is capable of transporting mobile first conductivity type charge carriers.

The second conductivity type source of the second FET is hereinafter referred to as the second source. The second source node comprises the second source and optional associated wiring and it can be configured to be coupled via the wiring or via other means to the first output logic potential. The gate of the second FET is hereinafter referred to as the second gate. The second conductivity type drain of the second FET is hereinafter referred to as the second drain. The second drain node comprises the second drain and optional associated wiring. The second drain node is also referred to as the output node or simply as output. The output potential refers to potential on the output node. The channel of the second FET is hereinafter referred to as the second channel and it is capable of transporting mobile second conductivity type charge carriers.

The first drain and the second gate are connected electrically together as an entity, which is hereinafter referred to as the internal node. The name internal node stems from the fact that there is no external connection to this node unlike in the case of the other nodes of the invented semiconductor logic element. In case the first drain and the second gate are not electrically connected inside semiconductor material then a wiring is used to connect them together as a single entity. In case the first drain and the second gate are electrically connected together inside semiconductor material as a single entity then a wiring is not required to connect them together. The term internal node potential refers to the potential on the internal node.

When the input is at first input logic potential the first channel is conductive and the internal node is set to first source potential, which renders the second channel nonconductive irrespective of the fact whether the second source/drain is biased at first or second output logic potential. Since the second drain and/or source are biased at either the first or second output logic potential (if transition between states is not taken into account) there is no conductive path between the second source and the second drain (if transition is not taken into account). This means that when the second source node is at the first output logic potential the output can be either at first output logic potential or at second output logic potential, i.e., the input has no control over the output potential. On the other hand, when the input is at second input logic potential the first channel is nonconductive. Consequently, when the input is at second input logic potential and when the second source node is connected to first output logic potential a situation is established enabling the internal node to adjust to a potential rendering the second channel conductive which sets the output to first output logic potential.

The term conductive channel refers to the situation when the channel comprises mobile charge carriers that are of the same type as the majority carriers of the source/drain corresponding to the FET comprising the channel. The term nonconductive refers to the situation when the channel comprises essentially no mobile charge carriers that are of the same type as the majority carriers of the source/drain corresponding to the FET comprising the channel. Even though the channel is nonconductive one can still compare different nonconductive channel states with the terms less conductive or more conductive—the reason for this is that there is still some residual amount of mobile charge carriers present in the channel. Albeit at a first nonconductive state there would be one billionth part of a mobile charge carrier present in the channel and at a second nonconductive state there would be one trillionth part of a mobile charge carrier present in the channel one can still say that the first nonconductive state is more conductive than the second nonconductive state. Similarly one can say that the second nonconductive state is less conductive than the first nonconductive state.

The invention is based on the idea that in traditional complementary logic the traditional second conductivity type semiconductor logic element (CISFET, CSFET, or JFET having second conductivity type source and drain and in between them a channel capable of transporting mobile second conductivity type charge carriers) can be replaced with the invented semiconductor logic element in order to achieve novel type of complementary logic. When this is done the gate (i.e. the input) of the traditional semiconductor logic element corresponds to above described gate of the first FET, but in a broader sense it corresponds to the joint entity comprising the first FET and the internal node. The source of the traditional semiconductor logic element corresponds to above described source of the second FET, the drain (i.e. the output) of the traditional semiconductor logic element corresponds to above described drain of the second FET, and the channel of the traditional semiconductor logic element corresponds to the channel of the second FET. It should be noted that the gate (i.e. the input) of the traditional semiconductor logic element can be coupled either to a first or second input logic potential, that the source of the traditional semiconductor logic element can be coupled to a first output logic potential, and that the drain could be either at a first output logic potential or at a second logic potential.

By changing the dopings of the invented semiconductor logic element to opposite type, by providing a complementary first input logic potential corresponding to the second input logic potential of the invented semiconductor logic element, by providing a complementary second input logic potential corresponding to the first input logic potential of the invented semiconductor logic element, by providing a complementary first output logic potential corresponding to the second output logic potential of the invented semiconductor logic element, by providing a complementary second output logic potential corresponding to the first output logic potential, and by providing a complementary first source potential an invented complementary semiconductor logic element is established.

The invention is based also on the idea concerning the traditional complementary logic that the traditional second conductivity type semiconductor logic element (CISFET, CSFET, or JFET having second conductivity type source and drain) can be replaced with the invented semiconductor logic element and that the traditional complementary first conductivity type semiconductor logic element (CISFET, CSFET, or JFET having first conductivity type source and drain) can be replaced with the invented complementary semiconductor logic element in order to achieve novel type of complementary logic. When this is done the gate (i.e. the input) of the traditional complementary semiconductor logic element corresponds to the gate of the first FET in the invented complementary semiconductor logic element. The source of the traditional complementary semiconductor logic element corresponds to the source of the second FET in the invented complementary semiconductor logic element, and the drain of the traditional complementary semiconductor logic element corresponds to the drain of the second FET in the invented complementary semiconductor logic element. It should be noted that the gate of the traditional complementary semiconductor logic element can be coupled either to a first or second input logic potential, that the source of the traditional complementary semiconductor logic element can be coupled to a second output logic potential, and that the drain could be either at a first output logic potential or at a second logic potential.

Based on afore said invented complementary semiconductor logic is established either by combining together invented semiconductor logic elements and first conductivity type traditional semiconductor logic elements or by combining together invented semiconductor logic elements and invented complementary semiconductor logic elements. If the invented semiconductor logic element is used to replace a second conductivity type enhancement mode CISFET in traditional CCIS logic, then the input of the invented semiconductor logic element corresponds to the external gate of the CISFET. If the invented complementary semiconductor logic element is used to replace a first conductivity type enhancement mode CISFET in traditional CCIS logic, then the input of the invented complementary semiconductor logic element corresponds to the external gate of the CISFET. It is possible in traditional CCIS logic to replace the second conductivity type CISFET with the invented semiconductor logic element and/or to replace the first conductivity type CISFET with the invented complementary semiconductor logic element.

The benefit of a complementary logic circuitry based on the invented semiconductor logic element and/or on the invented complementary semiconductor logic element is that during steady state there are no conductive current paths between nodes that are at different potentials resulting in small power consumption. A further benefit is that since the internal node is located in between the first gate and the second source/drain the first gate node is well isolated from the second source node and from the second drain node. This means that a single defect cannot result in the formation of a permanent conductive path between the first gate node as well as the second source node and/or the second drain node, i.e., the formation of a conductive path between two logic lines is mitigated. Thus the damage caused by a defect is easier to isolate, countermeasures against defects are easier to design, and complete device breakage is less likely resulted in. Yet another benefit of the invented semiconductor logic element and of the invented complementary semiconductor logic element is that multiple complementary logic level pairs can be easily established in an invented complementary logic circuitry, which is explained according to corresponding embodiments later on in the text. Besides, depending on the specific arrangement of the invented semiconductor logic element or of the invented complementary semiconductor logic one can also avoid further problems related to the traditional CCIS logic that have been described in the background of the invention section.

It is important to note that the semiconductor element according to the invention can be bidirectional like the corresponding CISFET in traditional CCIS logic in case the back-gate doping of the CISFET is not connected to the source doping, i.e., when ever desired one could interchange the function of the second source and the second drain. For example, one could revert the biasing of the invented semiconductor logic element via suitable associated circuitry so that the second drain doping would be connected to the first output logic potential and so that the second source doping would become the output. This means that the roles of the second source and the second drain can be interchangeable in the invented semiconductor element.

It is also important to note that the input, the second source and/or the second drain of the invented semiconductor logic element can be connected to any number of
- outputs, inputs, second sources, and second drains of other semiconductor logic elements,
- complementary outputs (or shortly: outputs), complementary inputs (or shortly: inputs), complementary second sources (or shortly: second sources), and complementary second drains (or shortly: second drains) of complementary semiconductor logic elements,
- outputs, inputs, sources, and drains of traditional semiconductor logic elements including enhancement mode CISFETs, and
- complementary outputs (or shortly: outputs), complementary inputs (or shortly: inputs), complementary sources (or shortly: sources), and complementary drains (or shortly: drains) of complementary traditional semiconductor logic elements including enhancement mode CISFETs provided that during steady state a conductive path is not generated between nodes that are biased at different potentials.

For example the output of the semiconductor logic element could be connected to the second source of another semiconductor logic element in order to realize part of a NAND logic gate or part of a NOR logic gate. Based on the NAND or the NOR logic gates one can realize all other logic gates (like e.g. AND, OR, XOR, XNOR, NOT). In this example the output and the second source of different semiconductor logic elements could be fused together so that a wiring would not be required between them (in this case the biasing of the second source would take place inside the semiconductor substrate).

As already explained before one can replace a CISFET in traditional CCIS logic with a similar type invented semiconductor logic element in a manner wherein the source of the CISFET corresponds to the second source of the second FET, wherein the drain of the CISFET corresponds to the second drain of the second FET, and wherein the gate of the CISFET corresponds to the first gate of the first FET. For example in order to realize an inverter according to the invention one would connect the second source of the second FET in the invented semiconductor logic element to the first output logic potential and the complementary second source of the complementary second FET in the invented complementary semiconductor logic element to the second output logic potential of the invented semiconductor logic element. Next one would connect the first gate of the first FET in the invented semiconductor logic element to the complementary first gate of the complementary first FET in the invented complementary semiconductor logic element as the input of the inverter. Finally one would connect the second drain of the second FET in the invented semiconductor logic element to the complementary second drain of the complementary second FET in the invented complementary semiconductor logic element as the output of the inverter. The input of the inverter would be biased either at the first input logic potential or at the second input logic potential. If the input of the inverter would be biased at the first input logic potential the output of the inverter would be at the second output logic potential and if the input of the inverter would be biased at the second input logic potential the output of the inverter would be at the first output logic potential. In this invented inverter configuration the first input logic potential and the first output logic potential can be different or the same; similarly the second input logic potential and the second output logic potential can be different or the same.

In order to realize a simple switch one would connect the second source of an invented semiconductor logic element and the complementary second source of an invented complementary semiconductor logic element together as one node of the switch, and in addition one would connect the second drain of the invented semiconductor logic element and the complementary second drain of the invented complementary semiconductor logic element together as another node of the switch. Next one would connect the input of the invented semiconductor logic element to the input of an inverter and finally the output of the inverter to the input of the invented complementary semiconductor logic element. Now the input of the invented semiconductor logic element would act as the input of the switch. Depending on the state of the input of the switch (either at first or second input logic potential) the switch either blocks or passes through from one node to another voltages that are between the first and second output logic potentials (or at least either blocks or passes through from one node to another voltages that are either the first or second output logic potential).

Beside the fact that the second source of a certain invented semiconductor logic element may not be biased to the first output logic potential it is crucial to understand that there must be at least one invented semiconductor logic element in the complementary logic circuitry wherein the second source is connected to the first output logic potential since otherwise the invented complementary logic circuitry would not work. This does, however, neither restrict the use of different biasing schemes in the invented semiconductor logic element nor limit the scope of protection of this invention. For example in some conjunction and/or at some point of time the second source could be connected to the second output logic potential or it could be floating or one could interchange the roles of the second source and the second drain.

In addition it is important to note that it is possible to realize an invented semiconductor logic element wherein there is more than one first FET which could be connected e.g. in parallel or in series meaning that in this manner one invented semiconductor logic element could have several inputs. In the parallel configuration one would connect the first drains of the multiple first FETs to the second gate of the second FET, i.e., the size and therefore the overall capacitance of the internal node would increase. The problem is, however, that capacitive coupling between an individual first gate node and the internal node would decrease due to the larger overall capacitance of the internal node which may likely reduce the switching speed.

In the series connection of first FETs the first drain of a first FET would be connected to a first source of another first FET. The problem is, however, that the internal node comprises only the first drain of the first FET that is next to the second FET. In other words, only one input is capacitively coupled to the internal node which could seriously affect the switching speed. One could handle this situation e.g. by utilizing plate capacitors between the internal node and all the inputs of the seriously connected first FETs which would, however, increase the capacitance of the internal node thus likely decreasing the switching speed. Another option would be to remove (or mitigate as much as possible) the capacitive coupling between the internal node and the input that is located next to the internal node and to implant impurity atoms having mid band gap states (like e.g. Gold in Silicon) beneath the first drain of the first FET which first drain is connected to the second gate of the second FET. In this manner one could improve the switching speed of the series connection of first FETs to an acceptable level but it would increase considerably the steady state power consumption.

One could also have several second FETs per one single first FET wherein the internal node would comprise the first drain of the first FET and the second gates of the several second FETs. The problem with this arrangement is, however, that it may reduce the switching speed and that it consumes also more area. The former is due to larger internal node capacitance and the latter one is due to the fact that one could achieve the same effect with a single second FET by coupling multiple wiring paths to the second drain of the second FET. One could also realize an invented semiconductor logic element comprising multiple first FETs and multiple second FETs.

In addition it is possible to utilize multiple independent gates in the first FET and/or in the second FET so that the first FET would have multiple inputs and/or the second FET would have multiple internal nodes that are connected to multiple independent first FETs if the multiple independent gates are isolated from each other. In other words the independent gates should correspond to external gates of CIS or Schottky type (comprising a Conductor Semiconductor stack). In case the first FET comprises multiple independent first gates it suffers from the same problems than when multiple first FETs are connected in series (i.e. when the first drain of a first FET is connected to the first source of another first FET). In case the second FET comprises multiple independent second gates wherein each of the independent second gate is connected to the first drain of a separate first FET then the switching speed is not affected when compared to the case that there is only one first FET per one second FET but a reduction in area is achieved. This fact could be exploited e.g. in the NAND configuration.

For the reason of simplicity only the case wherein the invented semiconductor logic element comprises one first FET and one second FET is considered later on in the text. In addition wherever it is not specifically mentioned otherwise the first input logic potential is assumed to be the same as the first output logic potential and referred to as first logic potential, the second input logic potential is assumed to be the same as the second output logic potential and referred to as the second logic potential, and the second source is assumed to be connected to first logic potential. However, this neither restricts the use of different kind of semiconductor logic elements and different kind of biasing schemes nor limits the scope of protection of this invention. Besides the invented/novel semiconductor logic element is hereinafter also simply referred to as the semiconductor logic element and the novel/invented complementary semiconductor logic element is hereinafter also simply referred to as the complementary semiconductor logic element.

In the above description and later on in the text the term node potential refers to the Fermi level of the node that could be deduced e.g. on a wiring that is or would be electrically connected to the node corresponding to the situation wherein all the wirings electrically connected to the nodes of the semiconductor logic element or to the complementary semiconductor logic element are formed of the same material (Ohmic contact is naturally required). One could, however, use for biasing different wiring materials at different nodes or one could omit the wires by biasing the different nodes e.g. through a conductive path located inside semiconductor material.

Figure 3:
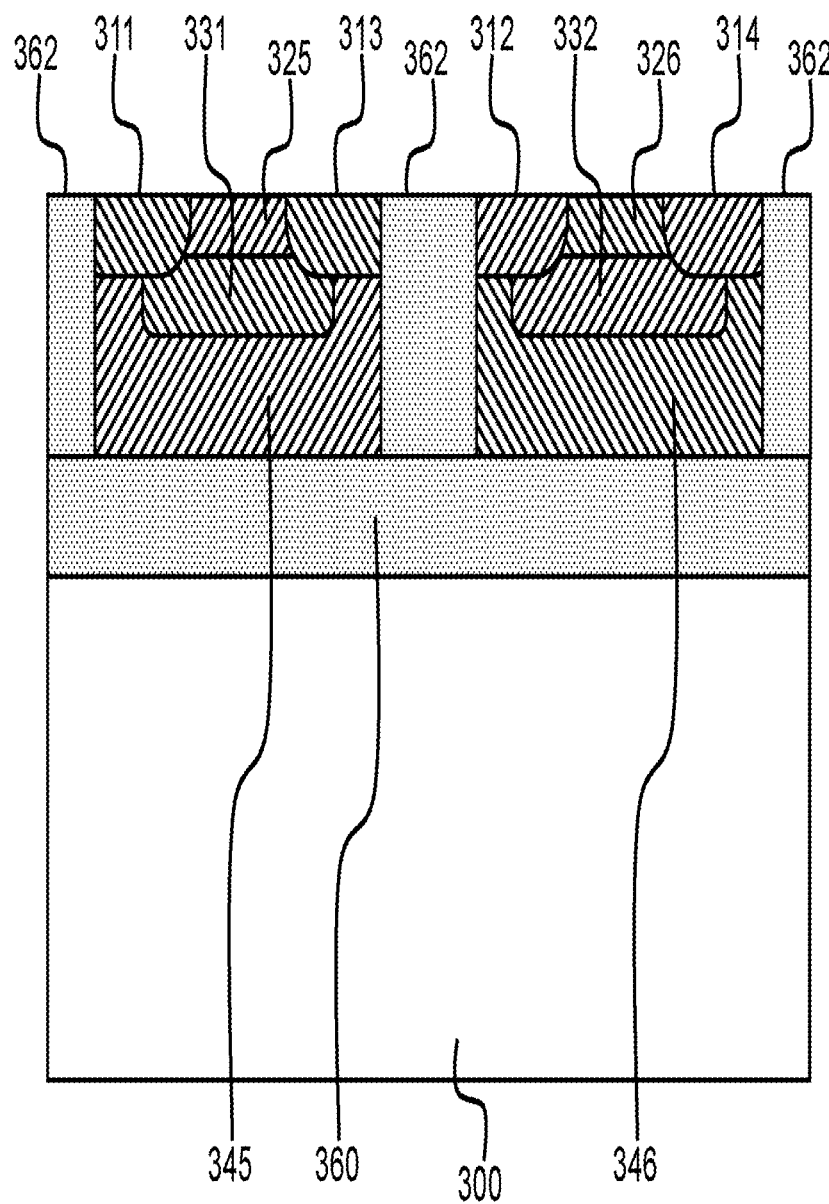
FIG. 3 illustrates an embodiment of the invention corresponding to a schematic cross-section of a semiconductor logic element.
Figure 4:
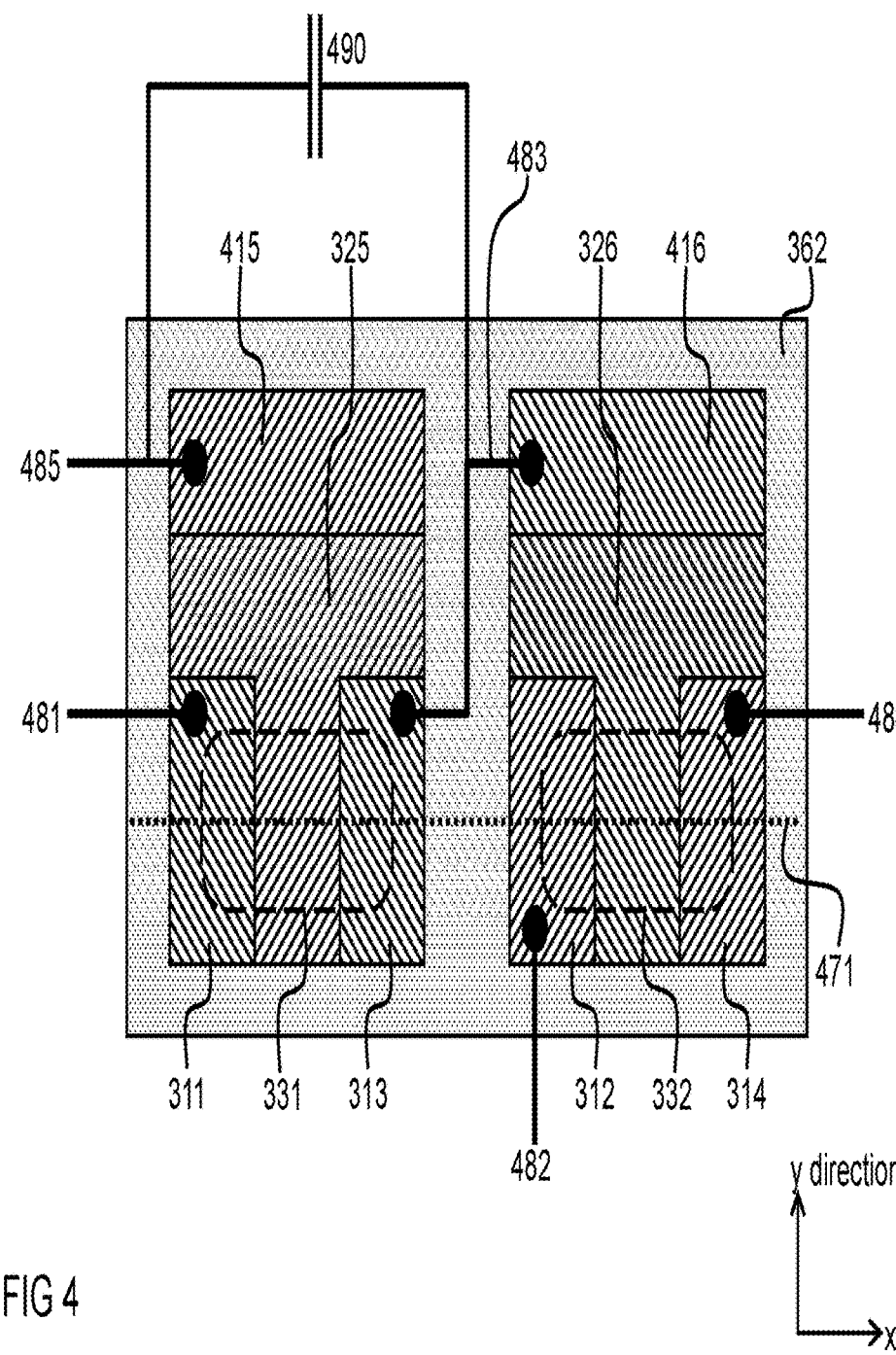
FIG. 4 illustrates an embodiment of the invention corresponding to the schematic layout of the semiconductor logic element according to FIG. 3.

FIGS. 3 and 4 illustrate an embodiment of the invention corresponding to a semiconductor logic element. FIG. 4 corresponds to a schematic layout and FIG. 3 to a schematic cross-section along the dashed line 471 in FIG. 4 of the semiconductor logic element. The semiconductor logic element of FIGS. 3 and 4 comprises on the left hand side the first FET and on the right hand side the second FET. In FIG. 3 the horizontal x-direction corresponds to a direction located on the surface of the semiconductor logic element and the vertical z-direction refers to a direction being perpendicular to the surface of the semiconductor logic element. In FIG. 4 the horizontal x-direction is located on the surface of the semiconductor logic element and it is parallel to the dashed line 471. In FIG. 4 the vertical y-direction is located also on the surface of the semiconductor logic element and it is perpendicular to the x-direction.

The first FET comprises a first conductivity type source 311 corresponding to the first source, a first conductivity type drain 313 corresponding to the first drain, a first conductivity type channel doping 331 located between the first source and the first drain and corresponding to the first channel capable of carrying mobile first conductivity charge carriers, and a first gate controlling/confining the first channel. The first gate comprises a second conductivity type upper gate doping 325, a second conductivity type lower gate doping 345, and a second conductivity type contact doping 415. The upper gate doping 325 controls/confines the first channel from above and the lower gate doping 345 controls/confines the first channel from below.

The second FET comprises a second conductivity type source 312 corresponding to the second source, a second conductivity type drain 314 corresponding to the second drain, a second conductivity type channel doping 332 located between the second source and the second drain and corresponding to the second channel capable of carrying mobile second conductivity type charge carriers, and a second gate controlling/confining the second channel. The second gate comprises a first conductivity type upper gate doping 326, a first conductivity type lower gate doping 346, and a first conductivity type contact doping 416. The upper gate doping 326 controls/confines the second channel from above and the lower gate doping 346 controls/confines the second channel from below.

In FIG. 4 the first channel 331 and the second channel 332 are presented for illustrative reason by dashed lines since they are not located at the surface of the semiconductor material but deeper inside the semiconductor material. The insulator layer 360 is part of a Semiconductor On Insulator (SOI) structure. The trench 362 reaches to the insulator layer 360 and surrounds the first FET and the second FET providing thereby isolation for both of the FETs. The layer 300 supports the above situated SOI arrangement.

The first source node comprises the first source and associated wiring 481 and it is configured to be coupled via the wiring 481 to a first source potential. The first gate node corresponds to the input and it comprises the first gate and associated wiring 485 and it is configured to be coupled via the wiring 485 either to a first input logic potential or to a second input logic potential. The second source node comprises the second source and associated wiring 482 and it is configured to be coupled via the wiring 482 to the first output logic potential. The second drain node corresponds to the output and comprises the second drain and associated wiring 484. The internal node comprises the first drain, the second gate, and wiring 483 connecting the first drain and the second gate together. In between the input and the internal node there is also an optional 'drag-along' capacitor 490.

For the reason of importance the special case of the semiconductor logic element is analyzed wherein the first input logic potential corresponds to the first output logic potential (both referred to as first logic potential), wherein the second input logic potential corresponds to the second output logic potential (both referred to as second logic potential), and wherein the band-gap width corresponds roughly to silicon. This special case is analyzed with respect to the semiconductor logic element of FIGS. 3 and 4 with the help of FIGS. 25-30. In FIGS. 25-30 the physical x, y, and z directions are depicted by a horizontal direction and the electrostatic potential is depicted by a vertical direction. In FIGS. 25-30 the curved lines separated by a constant distance from each others refer to valence and conduction band edges (the upper line corresponds to the conduction band edge, the lower one to the valence band edge, and in between them is situated the forbidden gap) of the semiconductor material. The lines constituted of straight vertical and horizontal sections refer, on the other hand, to wirings external to the semiconductor material and belonging to different nodes. In FIGS. 25-30 the potential of the valence and conduction band edges inside the semiconductor material is represented by the vertical direction as a function of a physical direction (x, y, and/or z), which corresponds to the horizontal direction. It is important to note that in FIGS. 25-30 the electrostatic potential and the physical directions apply inside the semiconductor material only and that they do not apply to the wirings situated outside the semiconductor material. In FIGS. 25-30 mobile negative charge carriers, i.e., electrons are illustrated with black dots 2551 and mobile positive charge carriers, i.e., holes are illustrated with circles 2552. Furthermore, in FIGS. 25-30 the horizontal dashed lines 2553 illustrate Fermi and quasi-Fermi levels.

Figure 25:
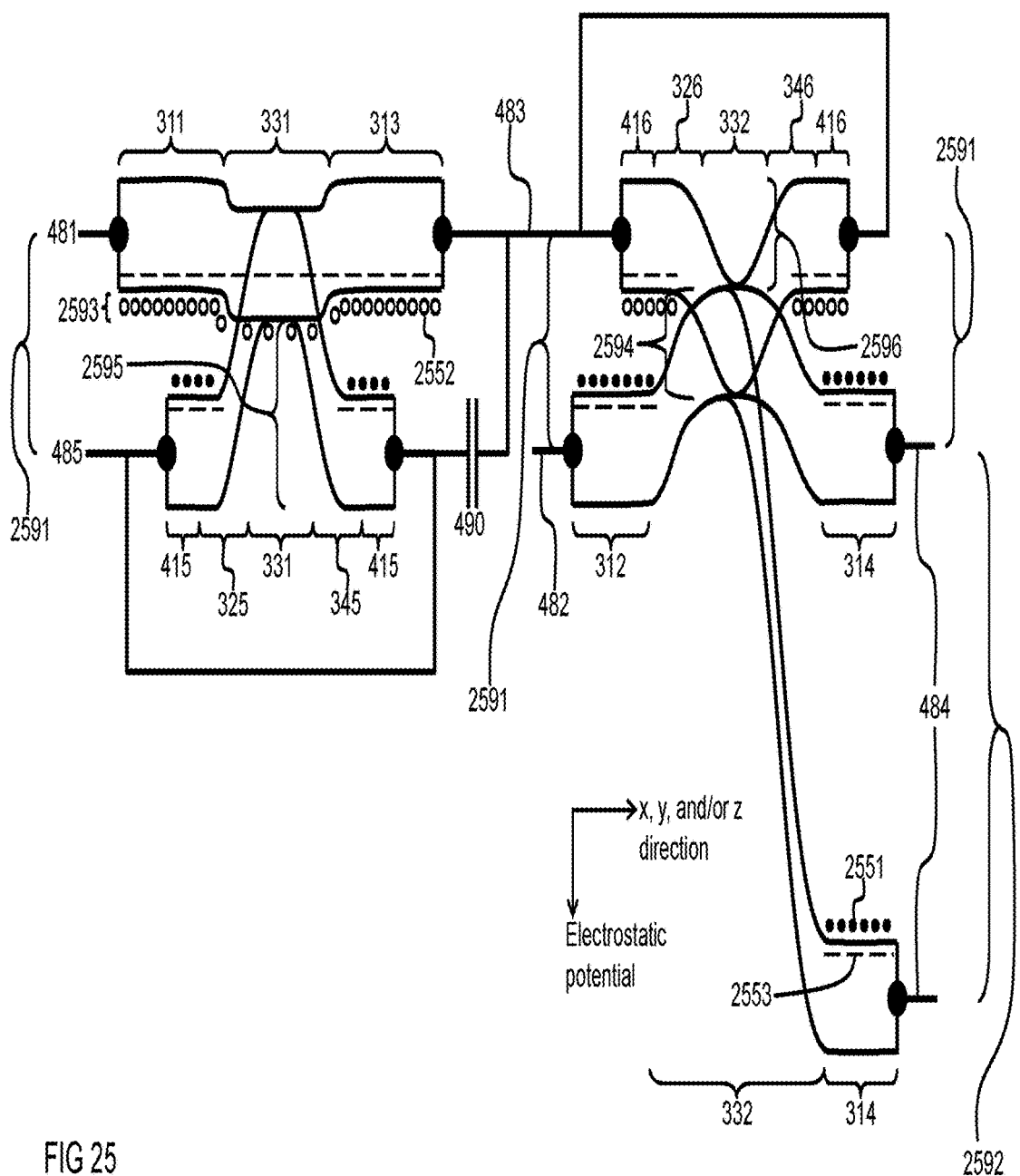
FIG. 25 illustrates an operational potential diagram of an embodiment of the invention corresponding to a semiconductor logic element.
Figure 27:
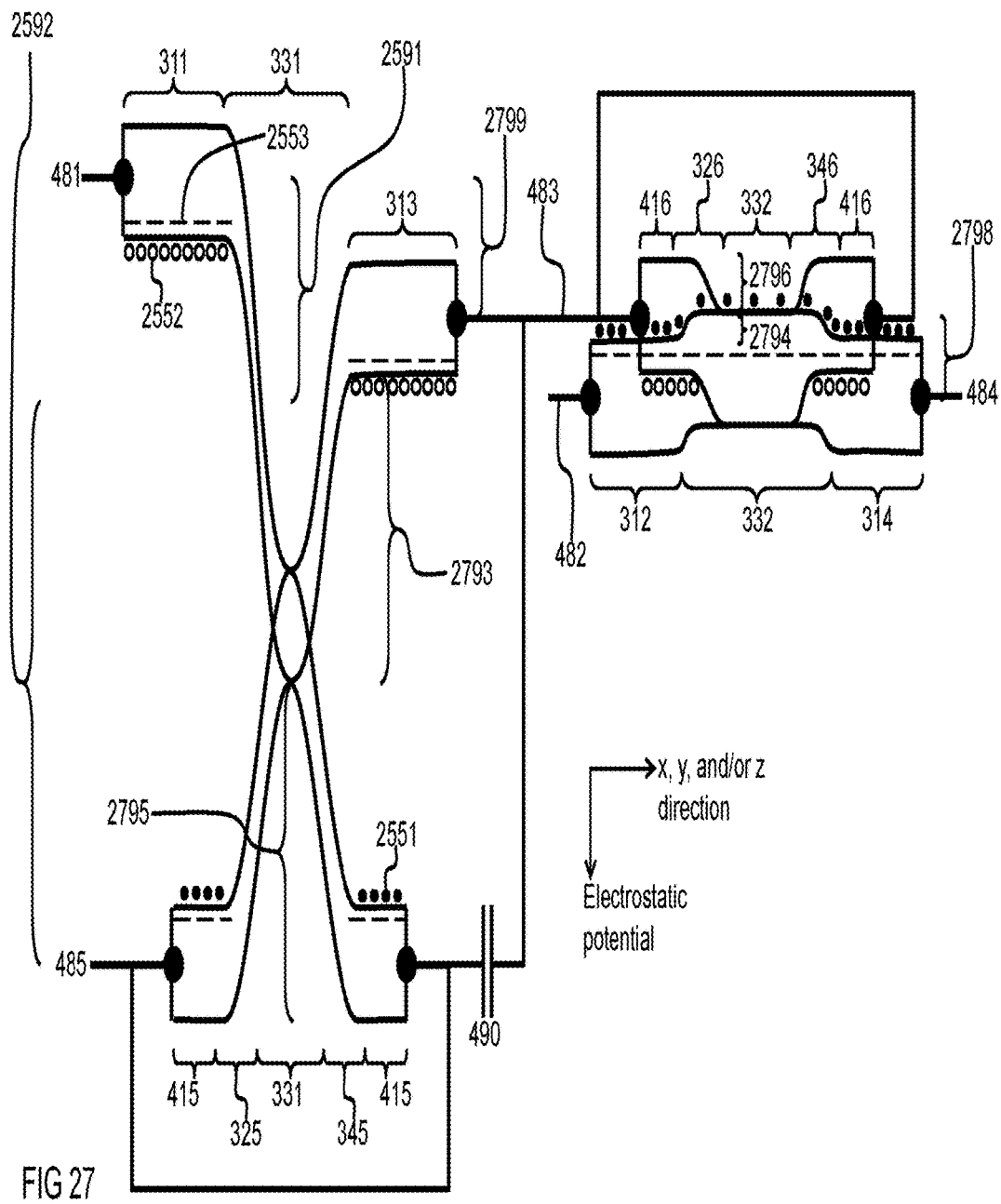
FIG. 27 illustrates another operational potential diagram of the embodiment of the invention corresponding to the same semiconductor logic element as in FIG. 25.

FIG. 25 corresponds to first FET being of p type (p type source and drain, hole channel), the second FET being of n type (n type source and drain, electron channel), and the first gate node (i.e. the input) being connected to the first logic potential being e.g. 0 V. The first source node is coupled to the first source potential being e.g. −1 V and the second source node is connected to the first logic potential. FIG. 27 refers, on the other hand, to the case when the input is connected to the second logic potential being e.g. +5 V.

A situation when the gate node of a transistor is biased at such a potential that the channel of the transistor is less conductive than in case the gate node would be biased at the potential of the source node is referred to as gate node being reverse biased with respect to the source node. A larger reverse bias on the gate node is hereinafter referred to as a situation wherein the channel is less conductive. Similarly a situation when the gate node of a transistor is biased at such a potential that the channel of the transistor is more conductive than in case the gate node would be biased at the source node potential is hereinafter referred to as gate node being forward biased with respect to the source node. A larger forward bias on the gate node is hereinafter referred to as a situation wherein the channel is more conductive.

In the semiconductor logic elements according to FIGS. 25-27 and FIGS. 28-30 the first logic potential and the second logic potential on the first gate node are both reverse biases with respect to the first source potential at which the first source node is biased. Furthermore, the second logic potential is a larger reverse bias than the first logic potential with respect to the first source potential meaning that the first channel is less conductive when the first gate node is biased at the second logic potential than at the first logic potential.

A fundamentally important operational feature of the semiconductor logic elements according to FIGS. 25-30 is shown in FIG. 25, namely, that even though the input being at the first logic potential is reverse biased with respect to the first source node being at the first source potential the first channel is still conductive. This can be deduced from the fact that in FIG. 25 the first channel doping 331 comprises a section wherein the valence and conduction band edges are represented by flat horizontal lines (meaning that the channel is not essentially fully depleted; a flat horizontal section in the valence and conduction edges means generally that there is no potential gradient and that the corresponding section is not depleted). Another indication is that in FIG. 25 the vertical distance 2593 corresponding to potential barrier for first source's (p type in FIG. 25) majority carriers (holes in FIG. 25) to enter into the first channel doping 331 (p type in FIG. 25) is very small, i.e., this barrier is only due to the change of doping concentration in neutral region of similar doping type corresponding to high source/drain doping versus lower channel doping and thus the barrier does not limit the flow of first source's majority carriers into the first channel and further to the first drain (p type in FIG. 25). This means that the internal node comprising the first drain and the second gate will be biased at the same potential than the first source node, i.e. at the first source potential (e.g. −1 V), and thus the internal node will be reverse biased with respect to the second source node being at the first logic potential (e.g. 0 V). The words vertical distance and potential barrier (or just barrier) according to FIGS. 25-30 are hereinafter referred to as the absolute magnitude of a potential difference, i.e., the corresponding value is always positive and has the quantity Volt.

FIG. 25 shows also another fundamentally important operational feature of the semiconductor logic elements according to FIGS. 25-30, namely, that when the reverse biasing between the internal node and the second source node is such that the internal node is at first source potential and the second source node is at first logic potential then the second channel is nonconductive. This can be deduced from the fact that the second channel 332 does not comprise a flat horizontal section wherein the valence and conduction band edges would be presented by a flat horizontal line (meaning that the channel is essentially fully depleted). Another more significant indication is that in FIG. 25 the vertical distance 2594 corresponding to potential barrier for second source's (n type in FIG. 25) majority carriers (electrons in FIG. 25) to enter into the second channel 332 (n type in FIG. 25) is large enough to prevent the flow of second source's majority carriers to the second drain (n type in FIG. 25). Thus the output of the semiconductor logic element may be either at first logic potential or at second logic potential, i.e., the application of the first logic potential to the input means that the semiconductor logic element has no control of the potential on the output.

The vertical distance 2595 corresponds to the potential barrier that first source's majority carriers located in the bottom of the conductive first channel (p type in FIG. 25) need to overcome in order to enter into the neutral part of the first gate (n type in FIG. 25) when input is at first logic potential. The vertical distance 2596 corresponds to the potential barrier that second source's majority carriers located in the bottom of the nonconductive second channel (n type in FIG. 25) need to overcome in order to enter into the neutral part of the second gate (p type in FIG. 25) when input is at first logic potential. In order for semiconductor logic elements according to FIGS. 25-30 to work it is fundamentally important that the vertical distance 2595 is considerably larger than the vertical distance 2596 when similar gate to source reverse bias is applied in both FETs. In other words the first FET has a deeper channel or larger channel depth than the second FET so that when the first source node is at first source potential, when the first gate node is at first logic potential, when the second source node is at first logic potential, and when the internal node comprising the second gate is at first source potential then the first channel of the first FET is conductive and the second channel of the second FET is nonconductive.

In FIG. 25 the vertical distance 2591 corresponds to the absolute magnitude of the potential difference between the first source and the first gate, which equals to the absolute magnitude of the potential difference between the first source potential (e.g. −1 V) and the first logic potential (e.g. 0 V) plus built-in Voltage Vbi (vertical distance 2591 being e.g. 1 V+Vbi; Vbi>0 V). The vertical distance 2591 equals to the sum of the potential barriers 2595 and 2593. Similarly the vertical distance 2591 equals to the sum of the potential barriers 2596 and 2594. In FIG. 25 it is further highlighted that since at this stage the input has no control over the output the output node comprising the wiring 484 may be either at first logic potential (e.g. 0 V) or at second logic potential (e.g. 5 V). In FIG. 25 the vertical distance 2592 corresponds to the absolute magnitude of the potential difference between the first logic potential and the second logic potential.

Figure 26:
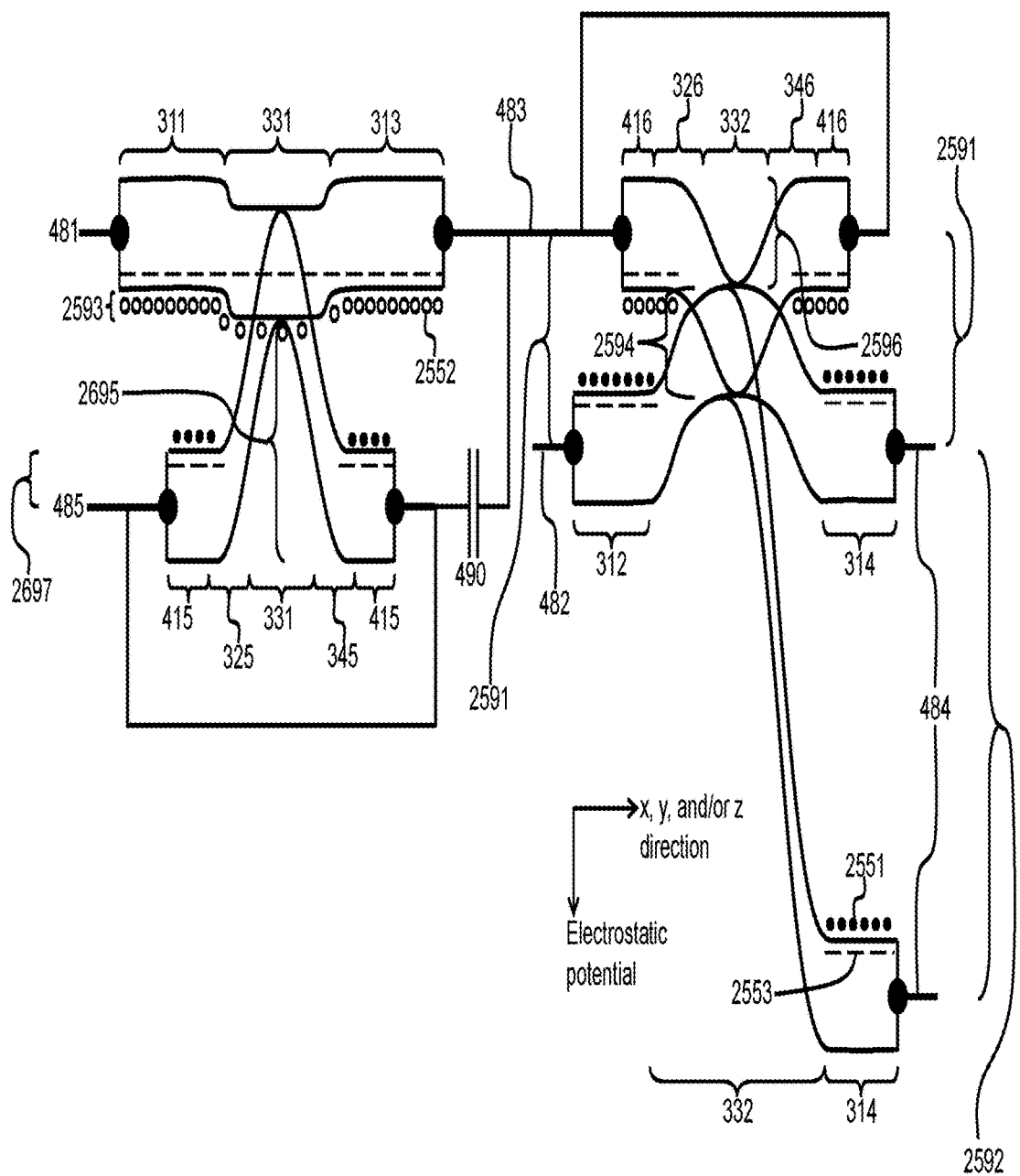
FIG. 26 illustrates another operational potential diagram of the embodiment of the invention corresponding to the same semiconductor logic element as in FIG. 25.

FIG. 26 corresponds to the situation when the input node comprising the wiring 485 is in the process of being pulled from the first logic potential (e.g. 0 V) to the second logic potential (e.g. 5 V). The specific timing of FIG. 26 corresponds exactly to when the first channel (p type in this case) is pinched off (i.e. intermediate stage of the channel in between conductive and nonconductive stages) and when the influence of the changing input potential on the second FET cannot be compensated anymore by current flow through the first channel, i.e. the potential of the internal node starts to follow strongly the potential of the input (i.e. first gate node) via the first gate to first drain capacitance and possibly via an optional 'drag-along' plate capacitor 490. This has the effect on the second FET that the second gate starts to be less reverse biased with respect to the second source. The vertical distance 2697 refers to the absolute magnitude of the potential difference in the first gate between the situation when the first gate node (i.e. input) is at first logic potential and when the first gate node is at the potential when the first channel is pinched off. In FIG. 26 the vertical distance 2695 refers to the potential barrier that the first source's majority carriers located in the bottom of the first channel need to overcome in order to enter into the neutral part of the first gate when the first channel is at pinch off, i.e. the vertical distance 2695 refers to the channel depth of the first FET at channel pinch-off. It can be clearly seen also from FIG. 26 that the first channel is considerably deeper than the second channel, i.e., the vertical distance 2695 is clearly bigger than the vertical distance 2596.

FIG. 27 corresponds to the situation when the input node has already reached the second logic potential (e.g. 5 V) and the internal node comprising the wiring 483 has been clamped at the first logic potential. The clamping happens due to the fact that if the internal node comprising the second gate (p type in this case) were forward biased with respect to the second source node comprising the second source (n type in this case) then the internal node would be charged to lower forward bias with respect to the second source node until the forward bias would disappear. To be precise the internal node is actually slightly forward biased with respect to the second source during the steady state when the input is at second logic potential since the slight forward bias cancels out the dark current collected by reverse biased junctions in the first drain and in the second gate. In FIG. 27 the vertical distance 2794 refers to the potential barrier of second source's majority carriers to enter into the second channel when the second channel is conductive. In FIG. 27 the vertical distance 2796 refers to the potential barrier that the second source's majority carriers located in the bottom of the second channel need to overcome in order to enter into the neutral part of the second gate when the internal node has been clamped at the first logic potential, i.e. the vertical distance 2796 refers to the channel depth of the second channel when internal node is clamped. In FIG. 27 the vertical distance 2798 corresponds to the built-in Voltage Vbi equaling to the sum of the potential barrier 2794 and the potential barrier 2796. In FIG. 27 the vertical distance 2793 refers to the potential barrier for first drain's majority carriers to enter into the first channel and further into the first source. In FIG. 27 the vertical distance 2795 refers to the potential barrier that first source's majority carriers located in the bottom of the non-conductive first channel need to overcome in order to enter into the neutral part of the first gate when the input is at second logic potential, i.e. the vertical distance 2795 refers to the channel depth of the first channel when input is at second logic potential.

One can deduce from FIG. 27 that the second channel is at this stage conductive due to the fact that the second channel doping 332 comprises a flat horizontal section (i.e. the channel is not fully depleted) and due to the fact that the potential barrier 2794 is so small (i.e. the barrier is only due to the change of doping concentration in a neutral region of similar doping type corresponding to high source/drain doping versus lower channel doping) that it does not prevent second source's majority carriers from entering in to the second channel and further into the second drain (i.e. output). The fact that the second channel is conductive means that the output node will be biased at the same potential as the second source node, namely, at first logic potential.

Similarly one can deduce from FIG. 27 that the first channel is at this stage nonconductive due to the facts that there is no flat horizontal section in the first channel 331 and that the potential barrier 2793 is big enough to prevent first drain's majority carriers (holes in this case) from entering into the first channel and further into the first source. The fact that the first channel is nonconductive means that the internal node is no more biased at the first source potential, but on the contrary the potential of the internal node may adapt to a potential adjusting the second channel conductive.

To summarize, in order for the semiconductor logic element to work it is a fundamentally important point that when the input is set to the second logic potential the first channel is nonconductive since this feature enables the potential of the internal node to be disconnected from the first source potential and thus enabling the potential of the internal node to adapt to a potential adjusting the second channel conductive, which means that the output is set to first logic potential.

The adaptation of the internal node to a potential transforming the second channel conductive can be achieved via the inherently present capacitance between the first gate node and the internal node (comprising the capacitance between the first gate and first drain) and/or via the optional 'drag-along' plate capacitor which does actually not have to have the form of two opposite plates separated by a small gap. Besides, according to FIG. 27 even without any capacitance between the first gate node and the internal node the potential at the internal node would settle down to the first logic potential when the input is set to second logic potential since the initial reverse bias between second gate and the second source would disappear and the potential difference between the internal node and second source node would settle down to 0 V, i.e., the potential barrier for electrons from the second source to the second gate would settle down to built in potential Vbi. However, if there were no capacitance between the first gate node (i.e. input) and the internal node the settling time of the internal node could be much longer than when the internal node would be pulled to first logic potential via the capacitance between the input and the input node. Since the speed of operation is important for semiconductor logic elements it may be beneficial to utilize an optional 'drag-along' plate capacitor. It may also be beneficial to cover the internal node with a biased conductor acting as a shield to the internal node since in this manner unwanted external capacitive coupling to the internal node can be prevented.

Figure 28:
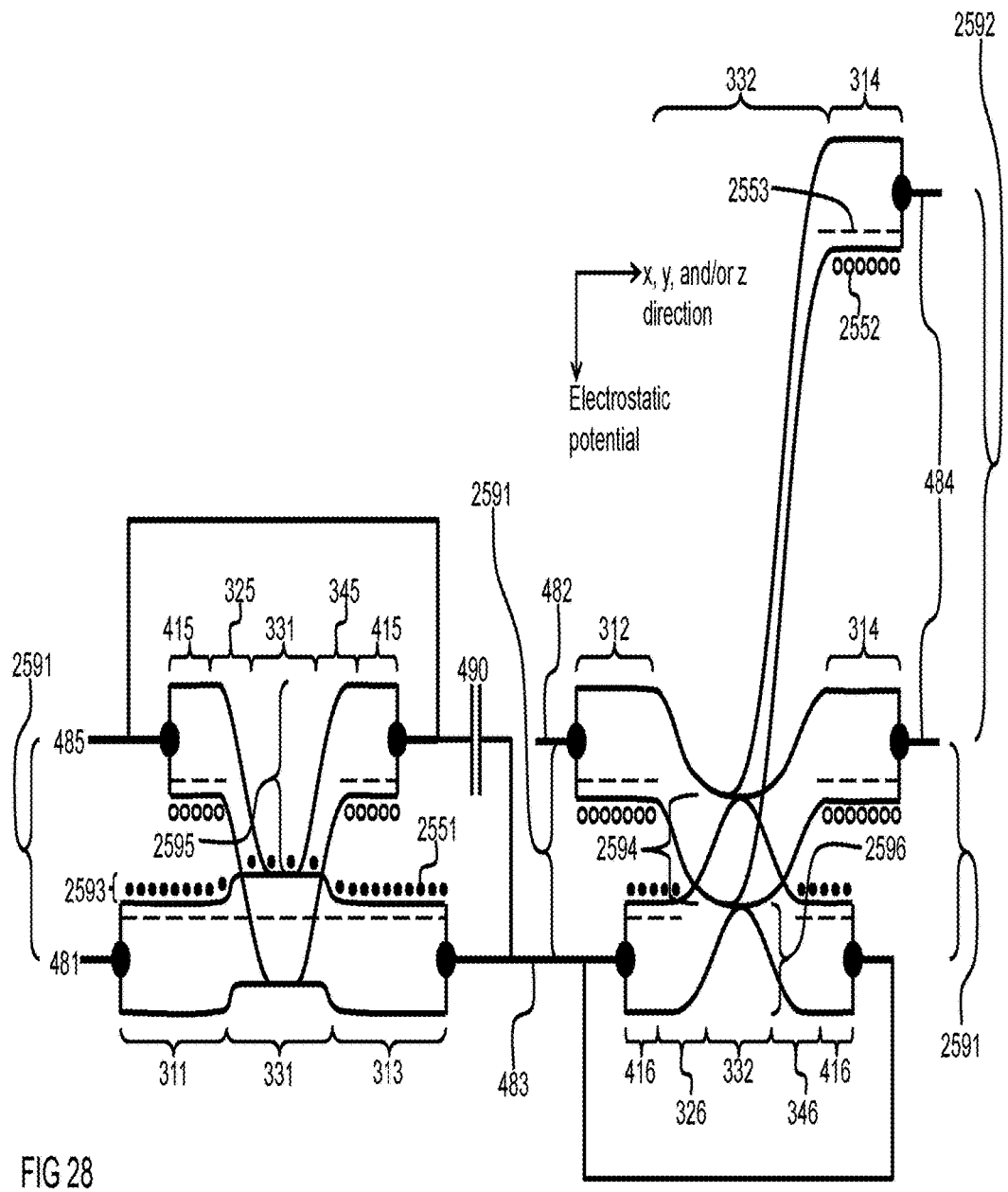
FIG. 28 illustrates an operational potential diagram of an embodiment of the invention corresponding to the complementary semiconductor logic element of the semiconductor logic element of FIG. 25.
Figure 29:
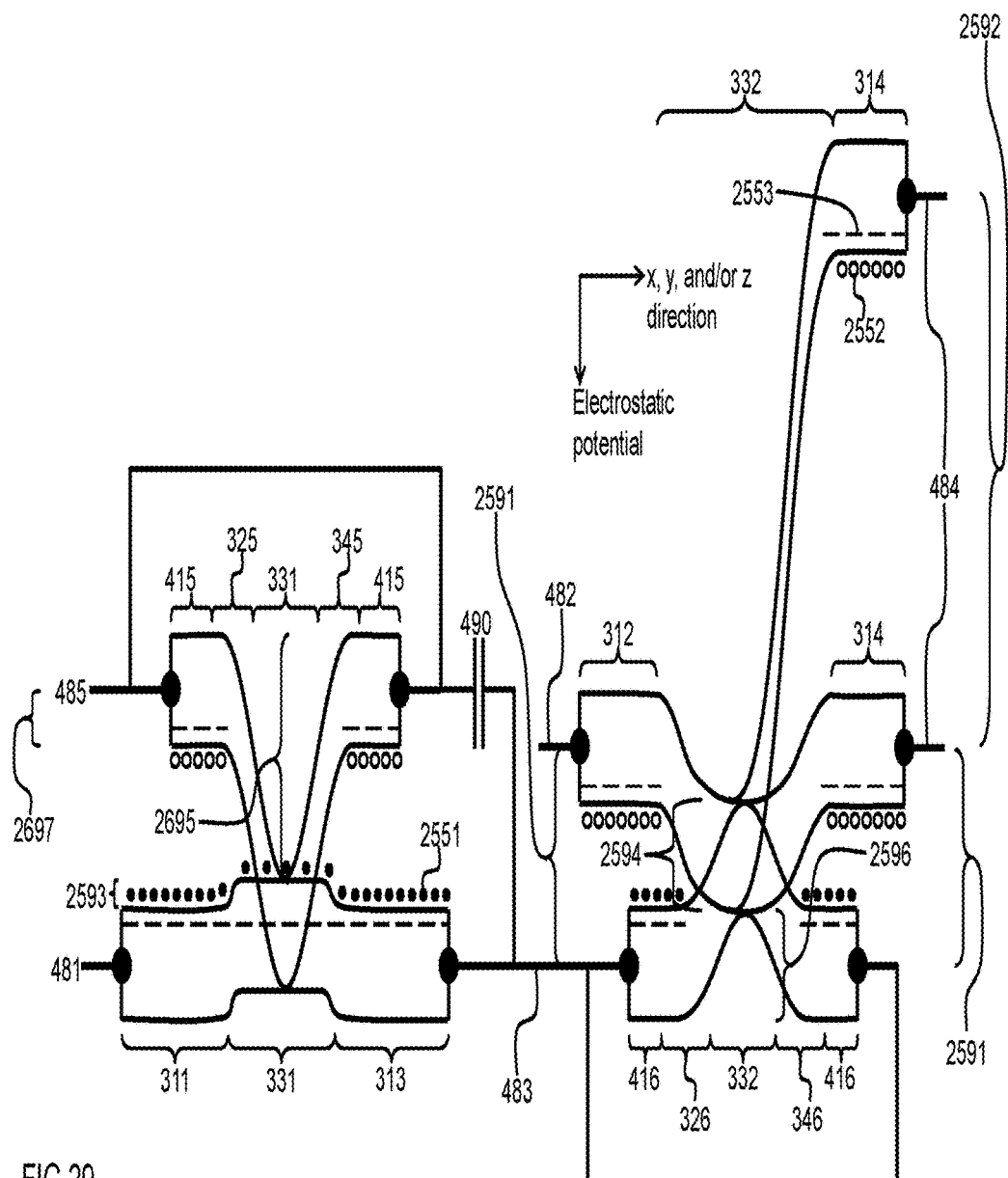
FIG. 29 illustrates an operational potential diagram of the embodiment of the invention corresponding to the complementary semiconductor logic element of FIG. 28.
Figure 30:
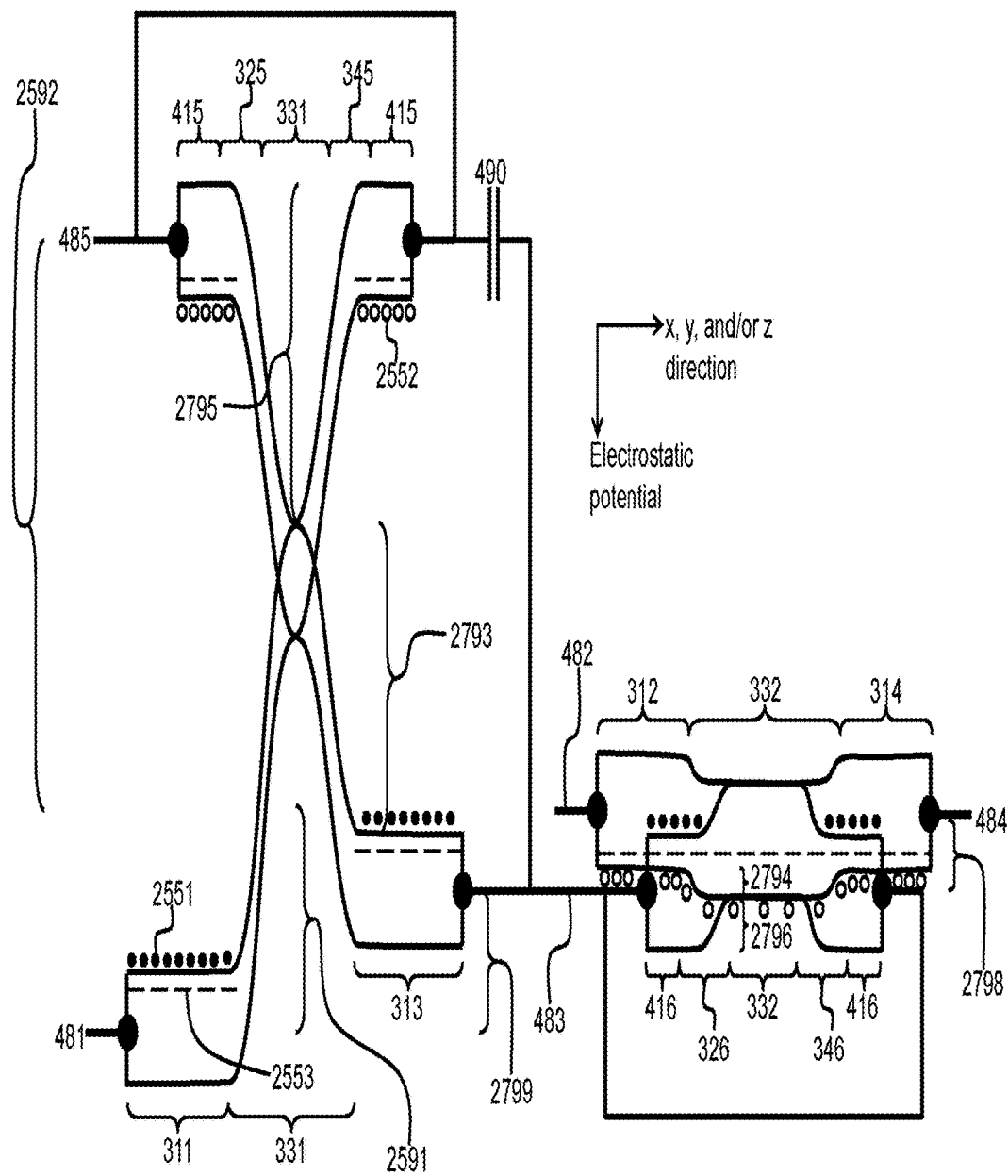
FIG. 30 illustrates an operational potential diagram of the embodiment of the invention corresponding to the complementary semiconductor logic element of FIG. 28.

As already said FIGS. 25-27 correspond to the situation when the first FET is p type and the second FET is n type. The opposite is true for FIGS. 28-30 wherein the first FET is n type (n type source and drain, electron channel) and the second FET is p type (p type source and drain, hole channel). The only differences between FIGS. 28-30 and FIGS. 25-27 are that every p type doping atom is changed to n type doping atom and vice versa and that the polarities of the potentials are changed. In addition a level shift may be asserted to all of the potentials. Otherwise everything else remains the same. Afore said means that FIG. 28 is a vertical mirror image of FIG. 25, that FIG. 29 is a vertical mirror image of FIG. 26, and that FIG. 30 is a vertical mirror image of FIG. 27.

In FIG. 28 the first source node is connected to first source potential which is e.g. 6 V, the second source node is connected to first logic potential which is e.g. 5 V. When the input is connected to the first logic potential (e.g. 5 V) the first channel is conductive thus biasing the internal node to first source potential (e.g. 6 V) causing the second channel to be nonconductive, which enables the output to be either at the first logic potential (e.g. 5 V) or at the second logic potential (e.g. 0 V). On the other hand, in FIG. 30 when the input is connected to the second logic potential (e.g. 0 V) the first channel is nonconductive enabling the internal node to adjust to a potential rendering the second channel conductive thus biasing the output at the first logic potential (e.g. 5 V). FIG. 29 illustrates a transition stage in between the initial stage (when input was biased at first logic potential) and the final stage (when input will be biased at the second logic potential) exactly at the moment when the first channel is pinched off.

As already said FIG. 26 (or FIG. 29) presents transition from the stage presented in FIG. 25 (or FIG. 28) wherein the input being at first logic potential has no control over the potential of the output to the stage presented in FIG. 27 (or FIG. 30) wherein the input is at second logic potential setting the output to first logic potential. When the transition is performed to the other direction, i.e., when the potential of the input is being transformed from the second logic potential to the first logic potential then the intermediate stage concerning the second FET would look slightly different since when the input is transformed to smaller reverse bias with respect to the first source the 'drag-along' capacitance (comprising an inherently preset first gate to first drain capacitance and an optional plate 'drag-along' capacitor) pushes the internal node to larger reverse bias with respect to the second source. In this process the internal node may be pushed to a larger reverse bias with respect to the second source than what is the reverse bias of the internal node biased at first source potential with respect to the second source node being biased at first logic potential. However, at the moment when the potential on the input reaches first channel's pinch-off reverse bias with respect to the first source node then the internal node will be biased to first source potential through the conductive first channel.

In the embodiments corresponding to FIGS. 3, 4, and 25-30 both the first FET and the second FET in FIGS. 3 and 4 are lateral Junction FETs (JFETs). The gate of a JFET is formed in the same region of semiconductor material than the source, the drain, and the channel. Besides the JFET channel is located inside the semiconductor material, i.e., the JFET comprises a buried channel. In a lateral JFET the current flows laterally in a plane that is beneath the semiconductor interface and parallel with respect to the surface (in FIGS. 3 and 4 along the x-direction). Besides in semiconductor logic elements corresponding to FIGS. 3, 4, and 25-30 both the first FET and the second FET in FIGS. 3 and 4 are depletion mode FETs. In addition, in the first FET the channel remains conductive at higher gate to source reverse bias levels than in the second FET. To summarize, in semiconductor logic elements corresponding to FIGS. 3, 4, and 25-30 the first FET and second FET are depletion mode lateral JFET of opposite type and the first FET has a deeper buried channel than the second FET.

The term depletion mode FET refers hereinafter to a FET wherein the channel is conductive when the gate is connected to the same potential than the source. The term enhancement mode FET refers hereinafter to a FET wherein the channel is nonconductive when the gate is connected to the same potential than the source. It should be noted that in first FET and second FET designs comprising an auxiliary gate the biasing of the auxiliary gate may define whether the transistor corresponds to depletion or enhancement mode.

The term buried channel FET refers hereinafter to a channel wherein at least a part of the current and beneficially all the current flows inside the semiconductor material. This is enabled by deploying a channel doping that is of the same conductivity type than the source and drain. In a JFET being in the conductive stage all the current flows inherently inside the semiconductor material. In a buried channel CISFET being in the conductive stage all the current can be forced to flow inside the semiconductor material by biasing the external gate properly so that the mobile charge carriers in the channel (being of the same type as the majority carriers in the source/drain of the corresponding buried channel CISFET) are pushed away from the interface (between the semiconductor and the gate insulator layer) located beneath the external gate.

Yet another point is that in the semiconductor logic elements corresponding to FIGS. 3, 4, and 25-30 the first FET and the second FET comprise a wrap around gate, i.e., the channel is confined by the gate from four sides. In case the width of the channel (y-direction) is considerably larger than the thickness of the channel (z-direction) it would not make a big difference if the channel would be confined only from above and below (i.e. from two sides), which would be the case if the channel would be confined in y-direction from both sides by insulator trenches. If the channel would be confined by a trench in y-direction only from one side the channel would be confined by the gate from three sides.

In FIGS. 25-30 it is assumed for the reason of simplicity that the first FET and the second FET are formed of the same semiconductor material. Thus the location of the valence and conduction band edges in both first FET and second FET match if the doping concentration, the doping type, and the potential of the node match. The first FET and the second FET could, however, be also made of different semiconductor materials and this may even be beneficial since in this manner the performance of the semiconductor logic element could be better optimized. In addition, it is assumed that the material of the wiring is the same in all the nodes but one could naturally utilize different wiring material in different wirings.

Figure 1:
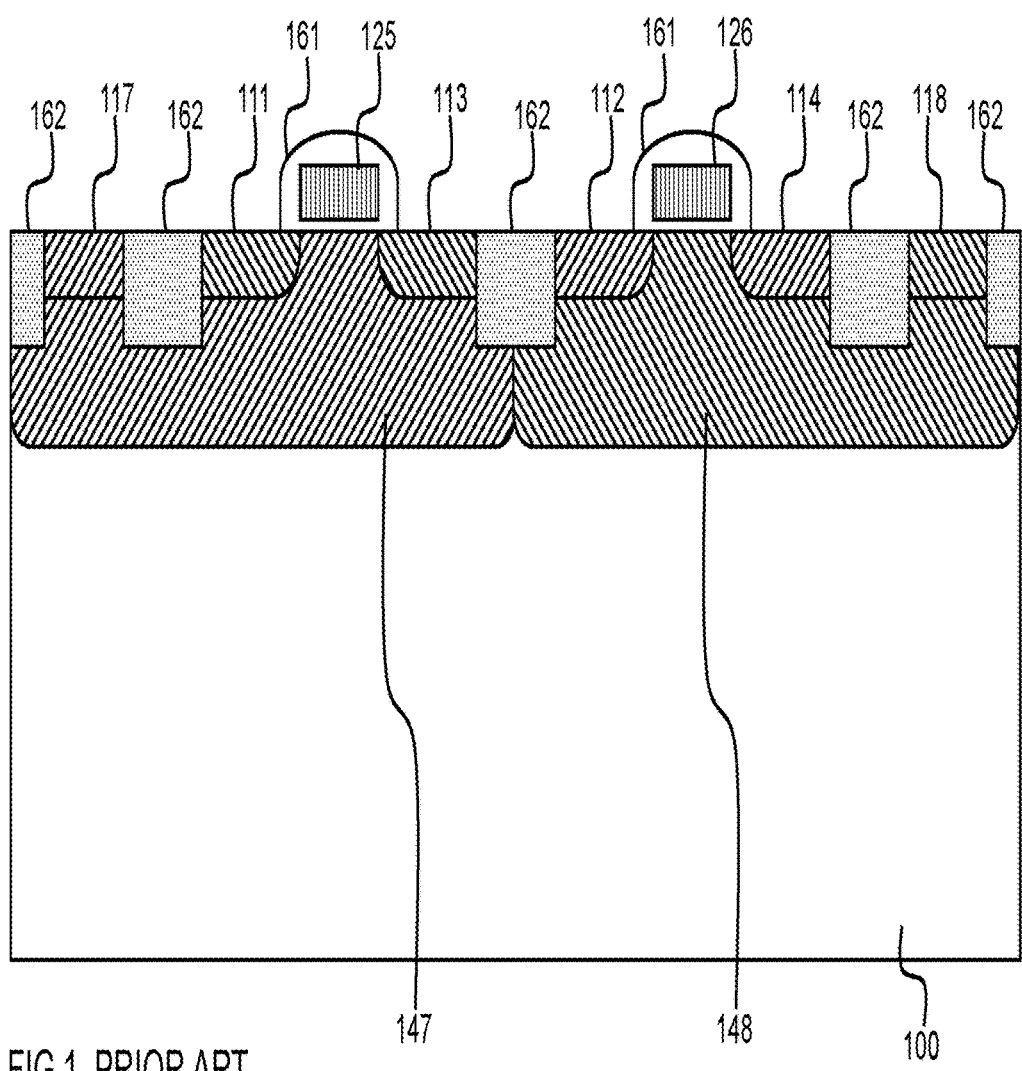
FIG. 1 illustrates a schematic cross-sections of the prior art semiconductor logic element on the right and of the prior art complementary semiconductor logic element on the left both corresponding to traditional CCIS logic.
Figure 2:
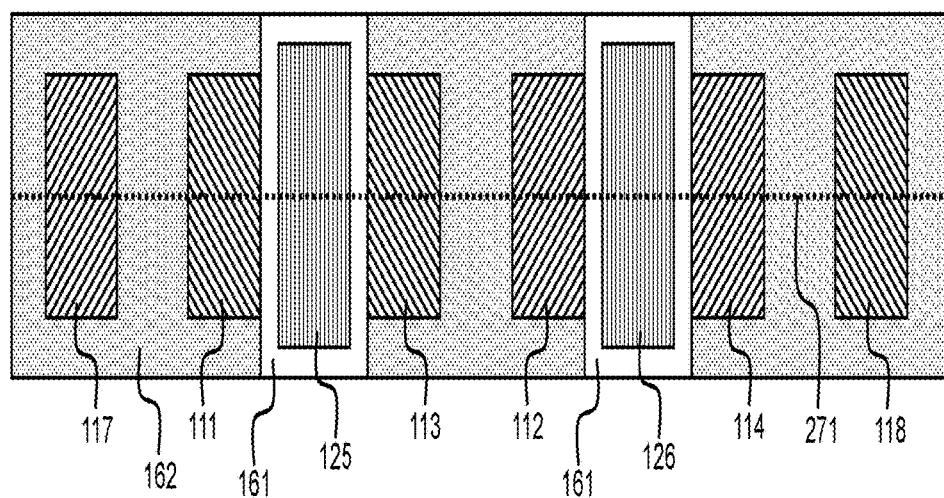
FIG. 2 illustrates a schematic layouts of the prior art semiconductor logic element on the right and of the prior art complementary semiconductor logic element on the left presented in FIG. 1.

As already previously mentioned in FIGS. 1 and 2 two semiconductor logic elements are presented, namely, two enhancement mode surface channel CISFETs of opposite type. It is important to note that the traditional CCIS logic is realized with only these two basic semiconductor logic elements. The semiconductor logic element on the right hand side of FIGS. 1 and 2 (i.e. right hand side CISFET) corresponds to the semiconductor logic element presented in FIGS. 3 and 4. A complementary semiconductor logic element wherein the n and p type doping in FIGS. 3 and 4 are interchanged, i.e., wherein the semiconductor regions marked with slash lines are changed to backslash lines and vice versa corresponds to the semiconductor logic element presented on the left hand side of FIGS. 1 and 2. The invented semiconductor logic element and/or the complementary semiconductor logic element (i.e. one corresponding to FIGS. 25-27 and the other one corresponding to FIGS. 28-30) enable the realization of specific complementary logic, which is hereinafter referred to Modified Standard Complementary Logic (MSCL).

The term Traditional Standard Complementary Logic (TSCL) refers to complementary logic circuitry comprising a set of logic elements corresponding to traditional semiconductor logic elements comprising a gate, a second conductivity type source, a second conductivity type drain, and a channel in between the source and the drain; when the source is at a first output logic potential and the gate is at a first input logic potential then the channel is nonconductive; when the source is at the first output logic potential and the gate is at a second input logic potential then the channel is conductive; and traditional complementary semiconductor logic elements comprising a gate, a first conductivity type source, a first conductivity type drain, and a channel in between the source and the drain; when the source is at a complementary first output logic potential and the gate is at a complementary first input logic potential then the channel is nonconductive; when the source is at the complementary first output logic potential and the gate is at a complementary second input logic potential then the channel is conductive;

and wherein the first input logic potential, the first output logic potential, the complementary second input logic potential, and the complementary second output logic potential are all the same throughout afore said set of logic elements and correspond to first logic potential, the second input logic potential, the second output logic potential, the complementary first input logic potential, and the complementary first output logic potential are all the same throughout afore said set of logic elements and correspond to second logic potential, and during a steady state there are no conductive paths between two nodes that are at different potentials.

It important to note that TSCL circuitry can be a part of a larger complementary logic circuitry or a part of different types of logic and mixed mode circuitries.

The term MSCL refers to complementary logic that is composed of a set of logic elements comprising invented semiconductor logic elements, as well as invented complementary semiconductor logic elements and/or traditional complementary semiconductor logic elements. In addition the set of logic elements may comprise also traditional semiconductor logic elements. Furthermore, in the set of logic elements when in the invented semiconductor logic elements the source of the first type first FET is at a first source potential, the source of the second type second FET is at a first output logic potential, and the gate of the first FET is at a first input logic potential then the channel of the first FET is conductive and the channel of the second FET is nonconductive, when in the invented semiconductor logic elements the source of the first FET is at the first source potential, the source of the second FET is at the first output logic potential, and the gate of the first FET is at a second input logic potential then the channel of the first FET is nonconductive and the channel of the second FET is conductive, when in the invented complementary semiconductor logic elements (if present in the set of logic elements) the source of the second type complementary first FET is at a complementary first source potential, the source of the first type complementary second FET is at a complementary first output logic potential, and the gate of the complementary first FET is at a complementary first input logic potential then the channel of the complementary first FET is conductive and the channel of the complementary second FET is nonconductive, when in the invented complementary semiconductor logic elements (if present in the set of logic elements) the source of the complementary first FET is at the complementary first source potential, the source of the complementary second FET is at the complementary first output logic potential, and the gate of the complementary first FET is at a complementary second input logic potential then the channel of the complementary first FET is nonconductive and the channel of the complementary second FET is conductive, when in the traditional semiconductor logic elements (comprising a gate, a second conductivity type source, a second conductivity type drain, and a channel in between the source and the drain; and if present in the set of logic elements) the source is at the first output logic potential and the gate is at the first input logic potential then the channel is nonconductive, when in the traditional semiconductor logic elements (if present in the set of logic elements) the source is at the first output logic potential and the gate is at the second input logic potential then the channel is conductive, when in the traditional complementary semiconductor logic elements (comprising a gate, a first conductivity type source, a first conductivity type drain, and a channel in between the source and the drain; and if present in the set of logic elements) the source is at the complementary first output logic potential and the gate is at the complementary first input logic potential then the channel is nonconductive, when in the traditional complementary semiconductor logic elements (if present in the set of logic elements) the source is at the complementary first output logic potential and the gate is at the complementary second input logic potential then the channel is conductive, the first input logic potential, the first output logic potential, the complementary second input logic potential, and the complementary second output logic potential are all the same throughout afore said set of logic elements and correspond to first logic potential, the second input logic potential, the second output logic potential, the complementary first input logic potential, and the complementary first output logic potential are all the same throughout afore said set of logic elements and correspond to second logic potential, and during the steady state there are no conductive paths between two nodes that are at different potentials.

It is important to note that MSCL circuitry can replace TSCL circuitry and that MSCL circuitry can be a part of a larger complementary logic circuitry or a part of different types of logic and mixed mode circuitries. Particularly MSCL can replace traditional CCIS logic corresponding to TSCL.

Concerning the MSCL corresponding FIGS. 25-30 a mandatory requirement is naturally that the first logic potential of FIGS. 25-27 corresponds to the second logic potential of FIGS. 28-30 and that the second logic potential of FIGS. 25-27 corresponds to the first logic potential of FIGS. 28-30, i.e., the first logic potential and the second logic potential of FIGS. 28-30 are interchanged when compared to the semiconductor logic element of FIGS. 25-27. In addition a complementary first source potential (e.g. 6 V) needs to be provided for the complementary semiconductor logic element. Other mandatory requirements of MSCL corresponding to FIGS. 25-30 are that in the invented semiconductor logic element the channel depth at channel pinch-off in the first FET is larger than the channel depth at channel pinch-off in the second FET and that in the invented complementary semiconductor logic element the channel depth at channel pinch-off in the (complementary) first FET is larger than the channel depth at channel pinch-off in the (complementary) second FET.

Hereinafter the term Complementary Semiconductor logic (CS logic) is utilized for invented complementary logic comprising invented semiconductor logic elements and invented complementary semiconductor logic elements wherein the first FET, the complementary first FET, the second FET, and the complementary second FETs are all composed of JFETs (like e.g. in FIGS. 25-30). A very beneficial aspect of the CS logic is that in the first FET and second FET the gate is formed in the same semiconductor region than the source and the drain, i.e., the gate is not comprised of a CIS stack and thus the semiconductor logic element is not affected by gate insulator electric breakdown, by leakage through the gate insulator, by variations thickness and/or k value of the gate insulator, or by buildup of insulator charge (e.g. positive oxide charge in Silicon) in the gate insulator. This means that CS logic is much more resistant towards process variations than the traditional CCIS logic improves considerably the manufacturing yield. This means also that CS logic has a much longer life time and it is much more tolerant to radiation induced soft and hard failures than traditional CCIS logic meaning that CS logic is particularly well suited for high radiation environments like space.

Another big benefit of the CS logic when compared to traditional CCIS logic is that the temperature required to form a high quality CIS stack may be considerably higher than the temperature required to anneal the implantation damage and to activate the implanted dopant atoms, which is the case e.g. in silicon with respect to poly-silicon silicon-dioxide silicon CIS stack. Thus in such a case the removal of the CIS stack processing from the manufacturing process enables the thermal budget of the manufacturing to be considerably reduced. This means that doped regions that would have to be implanted before the CIS stack manufacturing would diffuse considerably less in case the CIS stack manufacturing is omitted. The smaller diffusion of doped regions results in better control over the process variations in the manufacturing process improving further the yield and facilitating also transistor scaling. Yet another advantage is that the lack of the CIS stack manufacturing steps simplifies and eases manufacturing which compensates along the improved yield at least to some degree the cost of the larger chip area that is required in the CS logic when compared to traditional CCIS logic.

A mandatory requirement for traditional CCIS logic to work is that an inversion layer of mobile minority charge carriers can be established at the Semiconductor Insulator (SI) interface beneath the external gate corresponding to the CIS stack. In order to enable the formation of the inversion layer a high quality SI interface is required. Many semiconductor materials lack, however, a high quality interface and thus the interface is often pinned at a certain potential preventing the formation of the inversion layer meaning that such semiconductor materials are not suited for traditional CCIS logic. Therefore only a few semiconductor materials like e.g. Silicon, Silicon Germanium, and Silicon Carbide are well suited for traditional CCIS logic. Yet another great benefit of the CS logic is that a high quality interface is not required meaning that CS logic can be established virtually in any semiconductor material.

It should be noted that it is also possible to construct the semiconductor logic element corresponding to FIGS. 3 and 4 in such a manner that the first source potential corresponds to first input logic potential and that the first output logic potential is shifted with respect to the first input logic potential towards the second input logic potential. For example, one could construct a silicon based semiconductor logic element according to FIGS. 3 and 4 wherein first conductivity type corresponds to p type and second conductivity type corresponds to n type, the first channel depth at channel pinch-off is 1.5 V, the second channel depth at channel pinch-off is 2 V, first source potential and first input logic potential correspond to 0 V, second input logic potential corresponds to 5 V, and the second source is biased at first output logic potential corresponding to 2 V.

In this manner it is actually possible to establish an embodiment wherein the first gate biased at first logic potential is not reverse biased with respect to the first source and wherein the channel depth at channel pinch-off in the second FET is larger than the channel depth at channel pinch-off in the first FET. If the second channel depth at channel pinch-off were 1.5 V, the first output logic potential were 1.5 V, and the rest would remain the same one could establish an embodiment wherein the first gate biased at first logic would not be reverse biased with respect to the first source and wherein the first and second channel depths at channel pinch-off would be the same.

If a wide band-gap semiconductor material is used in the first FET one could actually utilize also a first type enhancement mode JFET as the first FET (in an enhancement mode JFET the channel depth at pinch-off happens. In this case the first gate biased at first input logic potential would need to be forward biased with respect to the first source biased at first source potential in order to establish a conductive first channel. It should be appreciated that in wide band-gap semiconductors (like e.g. in diamond, gallium oxide, gallium nitride, silicon carbide, zinc oxide, zinc sulfide) the required amount of forward bias (between the first gate biased at first input potential and the first source at biased first source potential) depends on the band-gap width and on the channel depth at channel pinch-off. In case the channel depth at pinch-off is around 1 V or larger the power consumption due to a forward biased pn junction should not be a problem at room temperature (irrespective of the fact whether the forward bias were several Volts). Even if this is the case the size of the required forward bias could still be couple of Volts (depending on material).

If a wide band gap semiconductor material were used in the second FET one could actually utilize an enhancement mode JFET as the second FET if a sufficiently large forward bias between the internal node and the second source can be maintained when the input is at second input logic potential and when the second source is at first output logic potential in order to establish a conductive second channel. A possible way to maintain afore said forward bias could be achieved by implanting mid-band-gap impurity atoms underneath the first drain doping in order to generate enough dark current to counter current generation in a forward biased pn junction. Another possibility would be to utilize a substantially smaller band-gap material in the first FET than in the second FET, which would result in higher dark current generation in the first FET than in second FET.

In MSCL corresponding to the semiconductor logic element of FIGS. 3 and 4 and to its complementary semiconductor logic element the first FET, the complementary first FET, the second FET and the complementary second FET are preferably depletion mode JFETs. However, depending on the operating temperature and on the band-gap widths of the semiconductor materials forming the first FET, the complementary first FET, the second FET, and the complementary second FETs it is possible to utilize in MSCL corresponding to the semiconductor logic element of FIGS. 3 and 4 and to its complementary semiconductor logic element also an enhancement mode FET as the first FET, complementary first FET, second FET, and/or complementary second FET, but in any case the channel depth in the first FET at channel pinch-off has to be larger than the channel depth in the second FET at channel pinch-off and the channel depth in the complementary first FET at channel pinch-off has to be larger than the channel depth in the complementary second FET at channel pinch-off (this condition is mainly due to the MSCL requirement that the first input logic potential corresponds to the first output logic potential and that the second input logic potential corresponds to the second output logic potential).

Figure 5:
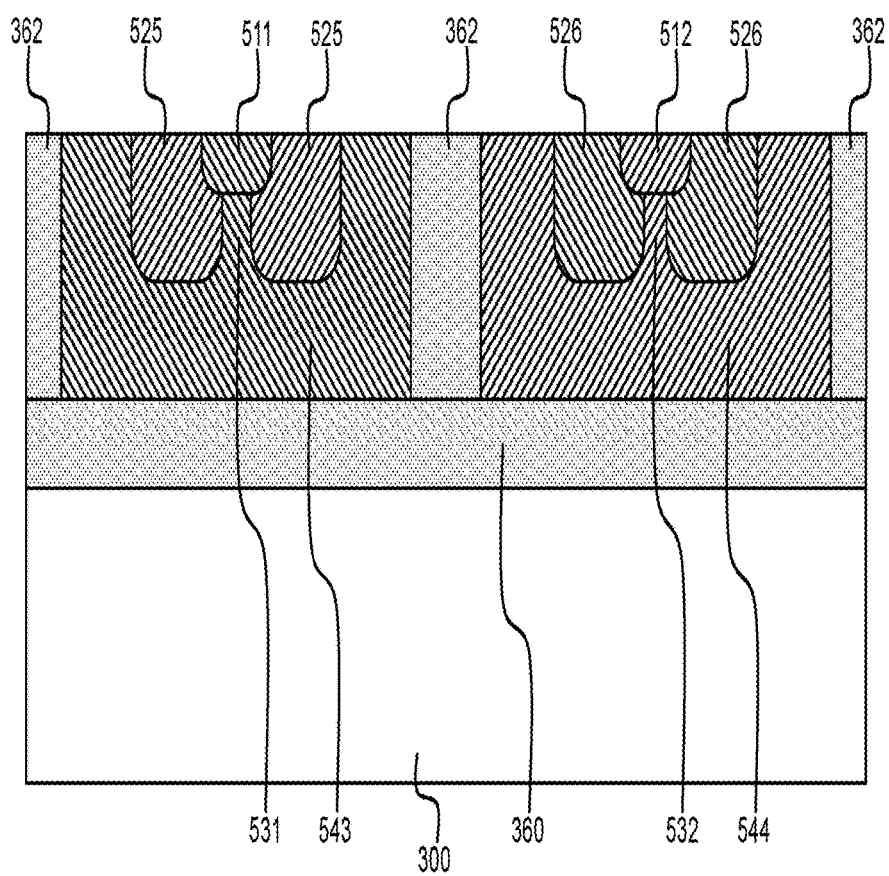
FIG. 5 illustrates an embodiment of the invention corresponding to a schematic cross-section of a semiconductor logic element.
Figure 6:
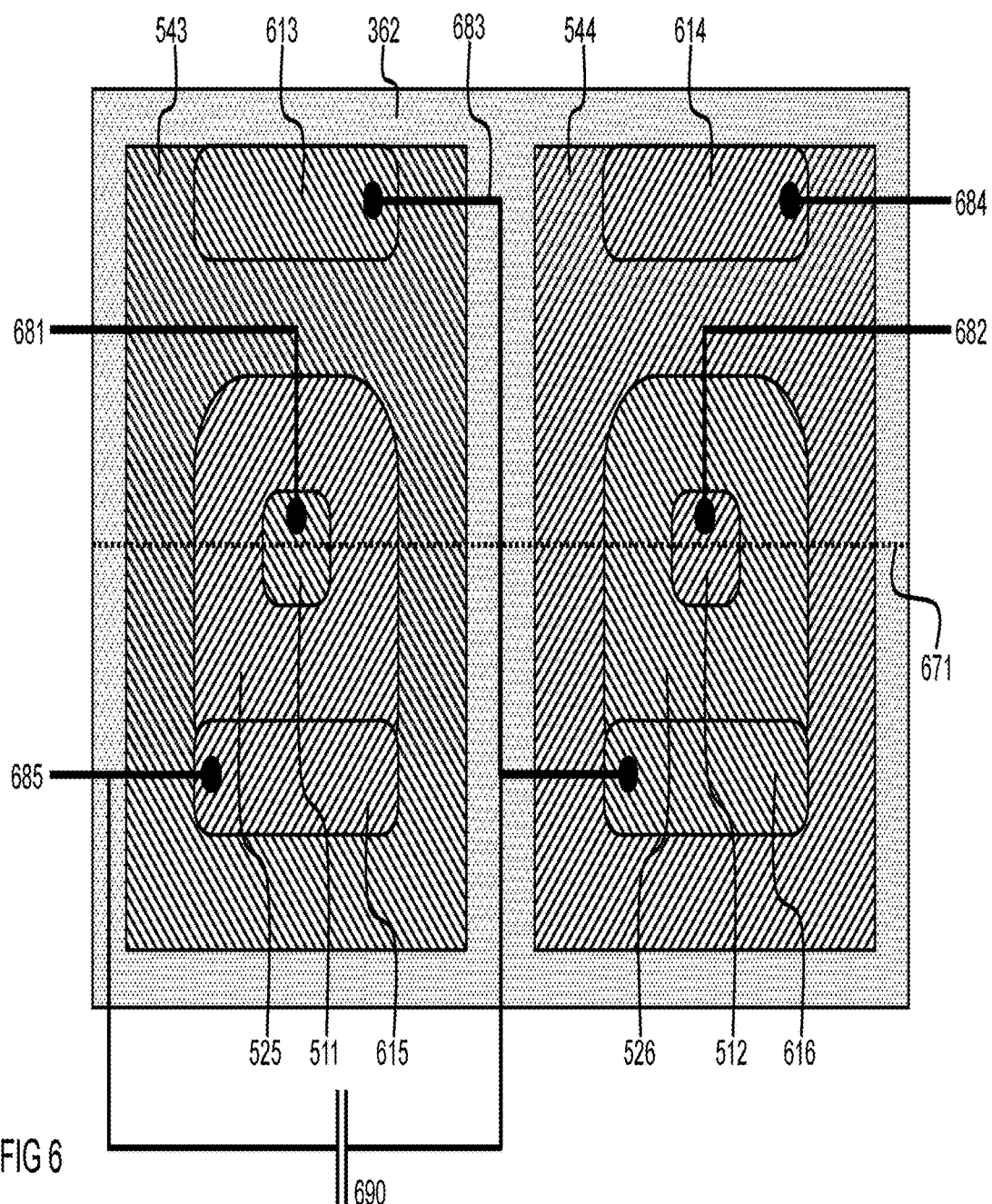
FIG. 6 illustrates an embodiment of the invention corresponding to the schematic layout of the semiconductor logic element according to FIG. 5.

In the MSCL corresponding to FIGS. 3, 4, and 25-30 one p type FET comprising a deeper hole channel and one n type FET comprising a shallower electron channel are required to replace the n type CISFET in the traditional CCIS logic corresponding to TSCL and one n type FET comprising a deeper electron channel and one p type FET comprising a shallower hole channel are required to replace the p type CISFET in the traditional CCIS logic corresponding to TSCL. In other words, in the MSCL corresponding to FIGS. 3, 4, and 25-30 two different n type FETs and two different p type FETs are required; one n type FET with a shallower channel and one n type FET with a deeper channel as well as one p type FET with a shallower channel and one p type FET with a deeper channel. A disadvantage of the MSCL corresponding to FIGS. 3, 4, and 25-30 is that four different type channel implants are required which corresponds to four mask steps increasing somewhat the cost. FIGS. 5 and 6 illustrate an embodiment of the invention corresponding to a semiconductor logic element requiring less mask steps in order to compose the four different FETs that are required in MSCL comprising invented semiconductor logic elements and invented complementary semiconductor logic elements. FIG. 6 corresponds to a schematic lay-out and FIG. 5 corresponds to a schematic cross-section along the dashed line 671 in FIG. 6 of the of the semiconductor logic element.

In FIGS. 5 and 6 the FET on the left hand side corresponds to the first FET, and the FET on the right hand side corresponds to the second FET. The first type first FET comprises a first conductivity type source doping 511 corresponding to first source, a first conductivity type first drain, a first gate, as well as a first conductivity type doped region 531 surrounded by the first gate, located between the first source and the first drain, and corresponding to the first channel. The first gate comprises a second conductivity type gate doping 525 and a second conductivity type contact doping 615. The first drain comprises a first conductivity type drain doping 543 (excluding the channel region 531) and a first conductivity type contact doping 613. The second type second FET comprises a second conductivity type source doping 512 corresponding to the second source, a second conductivity type second drain, a second gate, as well as a second conductivity type doped region 532 surrounded by the second gate, located between the second source and second drain, and corresponding to the second channel. The second gate comprises a first conductivity type gate doping 526 and a first conductivity type contact doping 616. The second drain comprises a second conductivity type drain doping 544 (excluding the channel region 532) and a second conductivity type contact doping 614.

The first gate node corresponding to input comprises the first gate and associated wiring 685. The first source node comprises the first source and associated wiring 681. The second source node comprises the second source and associated wiring 682. The second drain node corresponding to output comprises the second drain and associated wiring 684. The internal node comprises the first drain, the second gate, and associated wiring 683. In a similar fashion than in the semiconductor logic element according to FIGS. 3 and 4 the first source node is connected to the first source potential via wiring 681, the second source node can be connected to the first output logic potential via wiring 682, and the input is connected either to first input logic potential or to second input logic potential via wiring 685.

When the input is connected to first input logic potential the first channel 531 will be conductive and the internal node is set to first source potential rendering the second channel 532 nonconductive and thus the output may be either at first output logic potential or at second output logic potential, i.e. the input has no control of the potential level of the output. On the other hand, when the input is connected to second input logic potential the first channel 531 will be nonconductive enabling the internal node to be clamped at the first output logic potential thereby rendering the second channel 532 conductive and thus forcing the output to the first output logic potential when the second source node is biased at first output logic potential. In other words, the operation of the semiconductor logic element of FIGS. 5 and 6 is similar than the operation of the semiconductor logic element of FIGS. 3 and 4 and thus the special operational cases described in FIGS. 25-30 apply also to the semiconductor logic element of FIGS. 5 and 6.

The benefit of the semiconductor logic element of FIGS. 5 and 6 and its complementary semiconductor logic element when applied in MSCL is that the two different n type FETs and two different p type FETs can be achieved with layout variations only. By assuming that the doping concentration of the channel regions 531 and 532 is the same but of opposite type then the deeper channel in the first FET on the left when compared to the second FET on the right can be achieved simply by providing the second FET with a narrower channel in the layout as depicted in FIG. 5. In other words, in the semiconductor logic element corresponding to MSCL there is a larger gap in the implantation mask of the second conductivity type first gate 525 in FIG. 5 than in the implantation mask of the first conductivity type second gate 526 in FIG. 5 resulting in a wider and thus deeper first conductivity type first channel 531 and a narrower and thus shallower second conductivity type second channel 532.

In the complementary (i.e. oppositely doped) semiconductor logic element the doping type of the first type doped and second type doped regions are interchanged, the first input logic potential and the second input logic potentials are interchanged, and the first output logic potential and the second output logic potential are interchanged when compared to the semiconductor logic element of FIGS. 5 and 6 and in addition a complementary first source potential is provided. Furthermore, if the complementary semiconductor logic element corresponds to MSCL, then the second conductivity type deeper channel in the complementary first FET (the complementary first FET is of second conductivity type in the complementary semiconductor logic element) is achieved with a larger gap in the first conductivity type complementary first gate than what is in the semiconductor logic element of FIGS. 5 and 6 the gap size in the first conductivity type second gate 526 in the second conductivity type second FET. Correspondingly, in the complementary semiconductor logic element corresponding to MSCL the first conductivity type shallower channel in the complementary second FET (the complementary second FET is of first conductivity type in the complementary semiconductor logic element) is achieved with a narrower gap in the second conductivity type complementary gate than what is in the semiconductor logic element of FIGS. 5 and 6 the gap size in the second conductivity type first gate 525 in the first conductivity type first FET. This means that in MSCL corresponding to FIGS. 5 and 6 the shallow and deep channel nFETs can be constructed with layout changes, which is the case also for the shallow and deep channel pFETs. The downside of the semiconductor logic element of FIGS. 5 and 6 when compared to the semiconductor logic element of FIGS. 3 and 4 is, however, larger drain resistance, which may slow down the operation.

The semiconductor logic element of FIGS. 5 and 6 comprises perpendicular JFETs as first FET and second FET meaning that the current in the channel flows along a direction that is perpendicular to the surface. Again the abbreviation JFET refers to a FET having all transistor nodes (which are in this case the source, drain, and gate) formed in the same region of semiconductor material. In addition the gates of both perpendicular JFETs are wrap-around gates of opposite doping types. It would be, however, possible as already described according to FIGS. 3 and 4 to provide gates confining the channel from two sides in case insulator trenches would cut the gate into separate sectors.

It should be noted that the operation principle of the semiconductor logic element of FIGS. 5 and 6 corresponds to the one presented in FIGS. 3 and 4 and thus the matters explained according to the embodiment of FIGS. 3 and 4 apply also to the embodiment of FIGS. 5 and 6. For example it is beneficial to utilize depletion mode JFETs in the embodiment of FIGS. 5 and 6 but depending on the bandgap width and temperature it is also possible to utilize in the first FET and/or second FET an enhancement mode JFET. Furthermore, in order to realize MSCL the semiconductor logic element of FIGS. 5 and 6 corresponding to MSCL and possibly a complementary semiconductor logic element corresponding to MSCL are required. The complementary semiconductor logic element corresponding to MSCL could be a one being complementary to the embodiment of FIGS. 5 and 6 or being complementary to the embodiment of FIGS. 3 and 4 or being complementary to any another embodiment being compatible to MSCL. This applies naturally to all the semiconductor logic elements: it is possible to combine one semiconductor logic element corresponding to one embodiment with a complementary semiconductor logic element corresponding to another embodiment unless it is stated explicitly otherwise.

Figure 7:
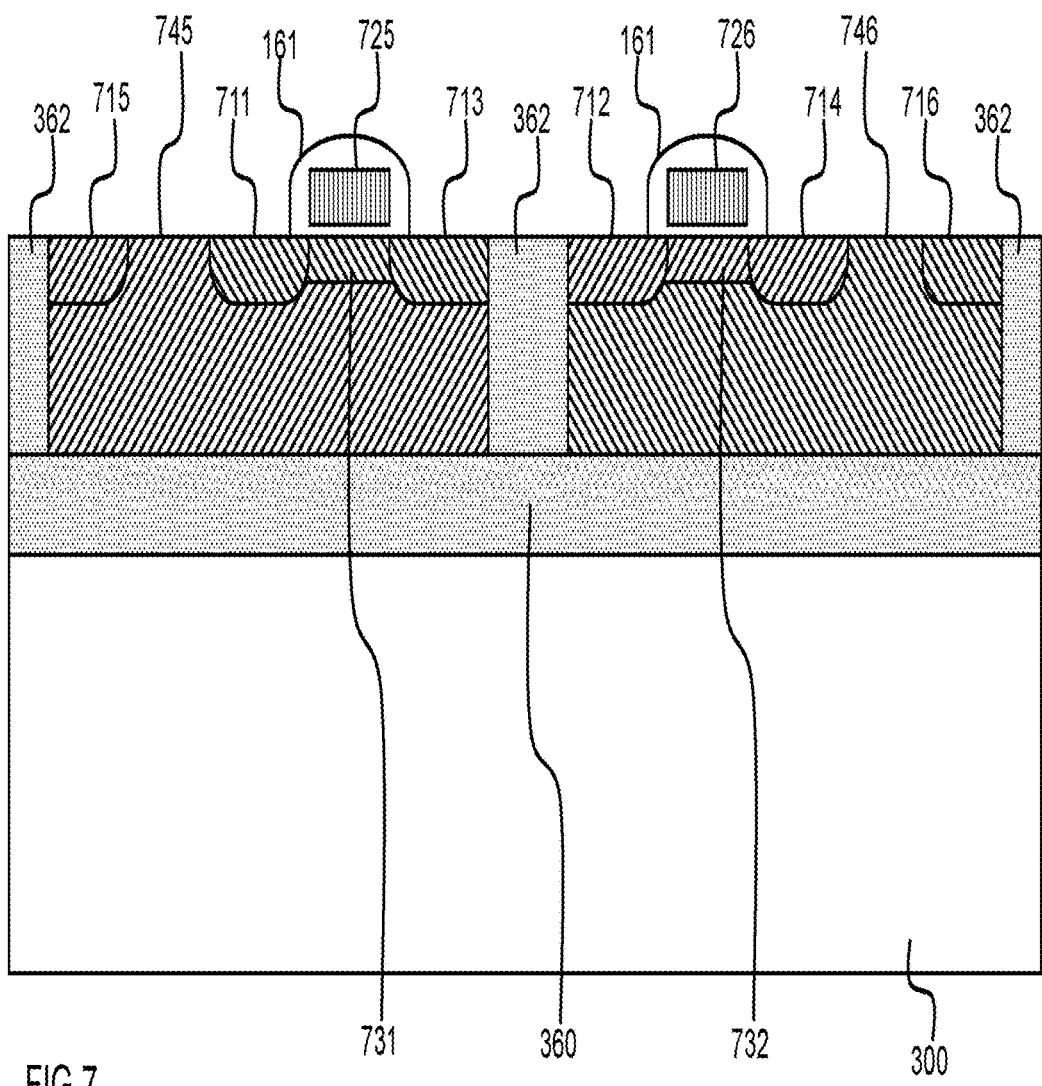
FIG. 7 illustrates an embodiment of the invention corresponding to a schematic cross-section of a semiconductor logic element.
Figure 8:
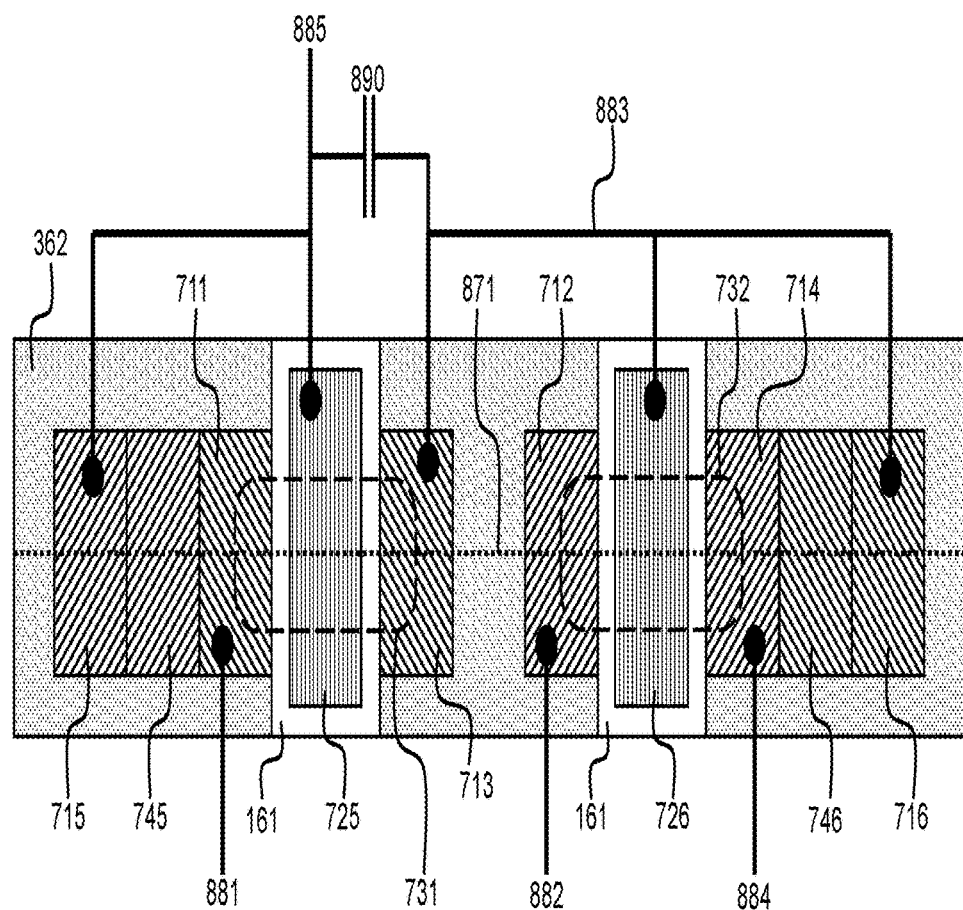
FIG. 8 illustrates an embodiment of the invention corresponding to the schematic layout of the semiconductor logic element according to FIG. 7.

In FIGS. 7 and 8 is presented an embodiment of the invention corresponding to a semiconductor logic element wherein the first FET and the second FET are formed of two opposite type buried channel lateral CISFETs. FIG. 8 corresponds to a schematic lay-out of the semiconductor logic element and FIG. 7 corresponds to a schematic cross-section along the dashed line 871 of FIG. 8 of the semiconductor logic element. In FIGS. 7 and 8 the FET on the left hand side corresponds to the first FET, and the FET on the right hand side corresponds to the second FET.

The first type first FET comprises a first conductivity type source doping 711 corresponding to the first source, a first conductivity type drain doping 713 corresponding to the first drain, a first conductivity type channel doping 731 located in between the first drain and first source and corresponding to the first channel, and a first gate. The first gate controls the first channel and it comprises an external gate 725, a second conductivity type back-gate doping 745, and a second conductivity type contact doping 715. The external gate 725 confines the first channel from above and the second conductivity type back-gate doping 745 confines the first channel from below.

The second type second FET comprises a second conductivity type source doping 712 corresponding to the second source, a second conductivity type drain doping 714 corresponding to the second drain, a second conductivity type channel doping 732 located in between the second source and second drain and corresponding to the second channel, and a second gate. The second gate comprises an external gate 726, a first conductivity type back-gate doping 746, and a first conductivity type contact doping 716. The external gate 726 confines the second channel from above and the first conductivity type back-gate doping 746 confines the second channel from below. The part of the insulator layer 161 situated in between the external gates and the semiconductor material is referred to as the gate insulator layer or simply as gate insulator. The insulator layer 161 encapsulates the external gates excluding gate contact openings.

The first gate node corresponds to input and it comprises the first gate and associated wiring 885. The first source node comprises the first source and associated wiring 881. The second source node comprises the second source node and associated wiring 882. The output comprises the second drain and associated wiring 884. The internal node comprises the first drain, the second gate, and associated wiring 883.

In a similar fashion than in the semiconductor logic element according to FIGS. 3 and 4 the first source node is connected to first source potential via wiring 881, the second source node is connected to the first output logic potential via wiring 882, and the input is connected either to first input logic potential or to second input logic potential via wiring 885. When the input is connected to first input logic potential the first channel 731 will be conductive and the internal node is set to first source potential rendering the second channel 732 nonconductive and thus the output may be either at first output logic potential or at second output logic potential, i.e. the input has no control of the potential level of the output. On the other hand, when the input is connected to second input logic potential the first channel 731 will be nonconductive enabling the internal node to be clamped at the first output logic potential when the second source is biased at the first output logic potential thereby rendering the second channel 732 conductive and thus forcing the output to first output logic potential.

In an embodiment wherein a gate comprises an external gate as well as a back-gate doping the term channel depth refers to the potential barrier that the majority charge carriers of source/drain located in the bottom of the channel need to overcome in order to enter into the neutral region of the back-gate doping. In the complementary semiconductor logic element with respect to FIGS. 7 and 8 the doping type of the first type doped regions and the second type doped regions are interchanged, the first input logic potential and the second input logic potential are interchanged, the first output logic potential and the second output logic potentials are interchanged when compared to the semiconductor logic element of FIGS. 7 and 8 and in addition a complementary first source potential is provided.

Based of afore description of FIGS. 7 and 8 the operation of the semiconductor logic element of FIGS. 7 and 8 is similar than the operation of the semiconductor logic element of FIGS. 3 and 4 or of FIGS. 5 and 6 and thus the matters explained according to the embodiment of FIGS. 3 and 4 apply also to the embodiment of FIGS. 7 and 8. For example, it is beneficial to utilize depletion mode buried channel CISFETs in the embodiment of FIGS. 7 and 8 but depending on the band-gap width and temperature it is also possible to utilize in the first FET and/or second FET an enhancement mode buried channel CISFET. Furthermore, the MSCL operation described according to FIGS. 25-30 can be utilized also in the semiconductor logic element of FIGS. 7 and 8. In order to realize MSCL corresponding to FIGS. 7 and 8 one requires a semiconductor logic element of FIGS. 7 and 8 being compatible to MSCL as well as a complementary semiconductor logic element being compatible to MSCL or a traditional semiconductor logic element being compatible to MSCL. Just as is the case with other embodiments the semiconductor logic element of FIGS. 7 and 8 can be paired up with a complementary semiconductor logic element according to other embodiments unless otherwise stated. In this manner complementary circuitry being compatible or non-compatible to MSCL can be generated. In case the semiconductor logic element of FIGS. 7 and 8 corresponds to MSCL the channel of the first FET must be naturally deeper than the channel of the second FET.

Hereinafter the term modified CCIS logic of the first kind is utilized for invented complementary logic comprising invented semiconductor logic elements and invented complementary semiconductor logic elements wherein the first FET, the complementary first FET, the second FET, and the complementary second FET are all composed of CISFETs, in the semiconductor logic element the internal node is clamped at first output logic potential when the second source is at first output logic potential and the input is at second input logic potential, in the complementary semiconductor logic element the internal node is clamped at complementary first output logic potential when the second source is at complementary first output logic potential and the input is at complementary second output potential.

This has e.g. the advantage that in case low noise buried channel CISFETs are required for low noise analog Integrated Circuitry (IC) one does not need to create separate traditional CCIS logic but instead based on the buried channel CISFETs it is possible to create modified CCIS logic of the first kind in order to take care of the required logic functions.

Another advantage of the modified CCIS logic of the first kind is that one can extend the voltage range of traditional CCIS logic for example in case when traditional CCIS logic is required for the digital part of a mixed mode chip (i.e. chip incorporating both digital and analog functions) and extra logic operating with higher potential range is required for the analog part of the mixed mode chip. In such a case typically two traditional CCIS logic arrangements are required (e.g. traditional CCIS logic operating at 1.8 V utilized for the digital part of the chip and traditional CCIS logic operating at 3.3 or 5 V utilized for the analog part of the chip) necessitating the processing of two gate insulator layers having different thicknesses. Furthermore, the formation of a high quality gate insulator requires typically processing at high temperatures. The problem is that the required two different gate insulators increases the complexity and the cost of manufacturing as well as increases the thermal budget thereby increasing the design complexity of semiconductor devices.

The invention enables to utilize the gate insulator of low voltage (e.g. 1.8 V) traditional CCIS logic in higher voltage (e.g. 3.3 or 5 V) semiconductor logic elements thus removing the need to manufacture two different gate insulators of different thickness. This lowers the manufacturing complexity and cost, and reduces the thermal budget. Thus the design complexity of semiconductor devices is also reduced. In order for this approach to work it is very likely necessary to place the source and the drain further away from the gate edge but this is trivial particularly with regarding buried channel transistors (this is not shown in the schematic drawings presented by FIGS. 7 and 8 but it is highlighted e.g. in FIGS. 39 and 40).

Beside the several advantages of the embodiments of FIGS. 3-8 a common feature of them is that they are likely slower than traditional surface channel CISFETs of FIGS. 1 and 2 because in surface channel CISFETs the channel comprises an inversion layer that has the more mobile charge carriers with given gate node to source node forward bias the thinner the gate insulator layer is. Thus a thin gate insulator enables a lot of mobile charge carriers to be packed into the inversion layer forming the surface channel resulting in a highly conductive channel. This enables fast charging of the capacitance of the output resulting in fast operation. It should be also noted that the share amount of mobile charge carriers in the surface channel outweighs the lower mobility in a surface channel versus the mobility in a buried channel (the mobility in the surface channel being around half of the mobility in a buried channel).

Figure 37:
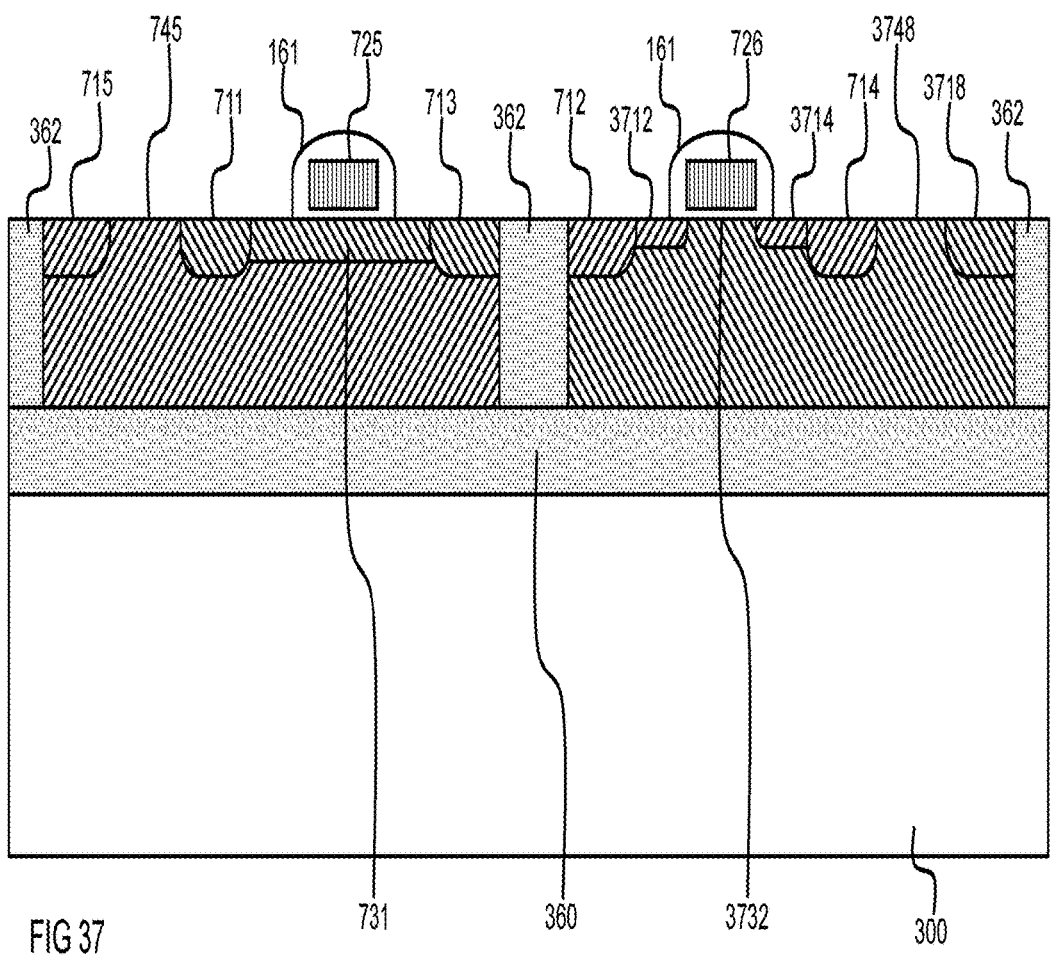
FIG. 37 illustrates an embodiment of the invention corresponding to a schematic cross-section of a semiconductor logic element.
Figure 38:
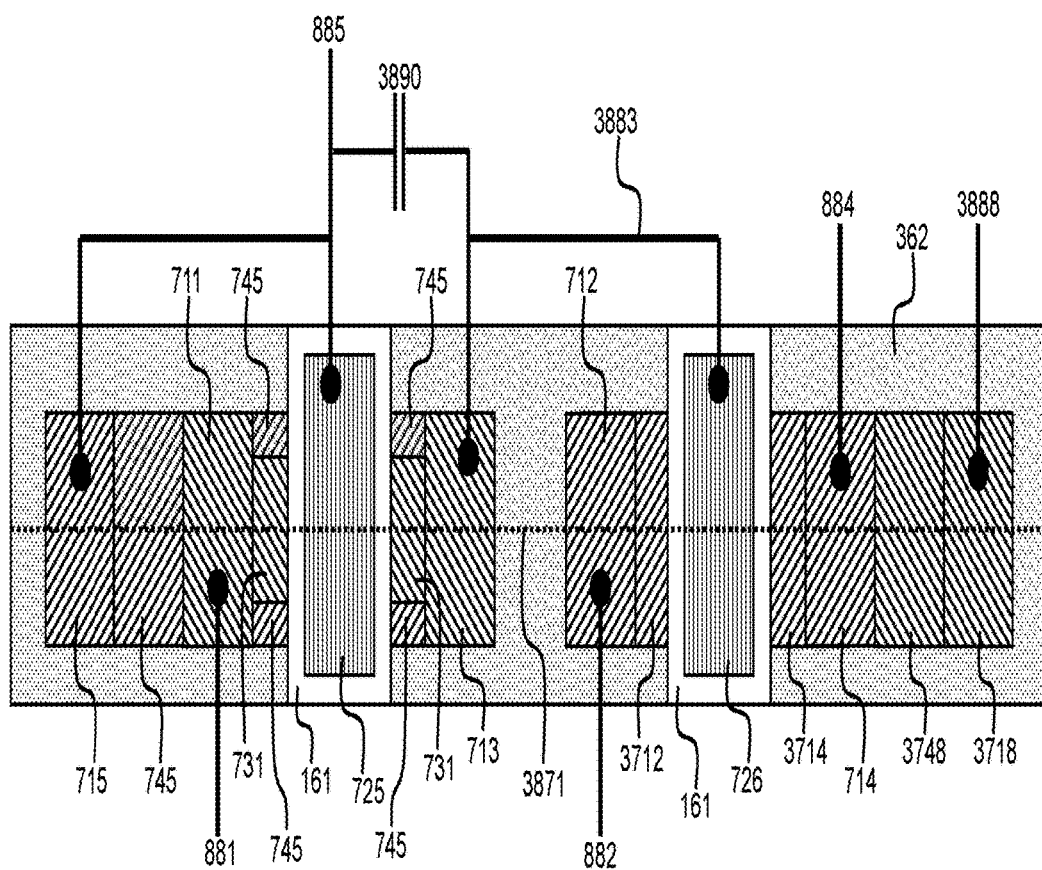
FIG. 38 illustrates an embodiment of the invention corresponding to the schematic layout of the semiconductor logic element according to FIG. 37.

FIGS. 37 and 38 illustrate an embodiment of the invention corresponding to a semiconductor logic element comprising two opposite type lateral CISFETs wherein the first FET on the left hand side corresponds to a lateral buried channel CISFET wherein the external gate and the back-gate doping are connected together as the first gate node (i.e. input). The first FET is preferably a depletion mode FET but an enhancement mode buried channel CISFET is also possible if the band-gap width and the temperature enable it. The second FET on the right hand side corresponds to a lateral enhancement mode surface channel CISFET wherein the comprising an auxiliary gate. FIG. 38 corresponds to a schematic layout of the semiconductor logic element and the cross-section along the dashed line 3871 corresponds to the schematic cross-section presented in FIG. 37. In FIGS. 37 and 38 it is illustrated regarding the first FET (wherein the first conductivity type first channel doping 731 is located in between the first conductivity type source doping 711 and the first conductivity type drain doping 713) that the first source 711 and the first drain 713 can be placed further away from the external gate 725 in order to increase the voltage handling capacity of a buried channel FET. Despite this fact the operation of the first FET of FIGS. 37 and 38 is similar than the operation of the first FET of FIGS. 7 and 8. In FIGS. 37 and 38 it is also illustrated regarding the second FET that a lower doped source extension doping 3712 and a lower doped drain extension doping 3714 can be deployed in order to increase the voltage handling capacity of a surface channel FET and/or in order to lower the second gate to second source/drain capacitance. The voltage handling capacity of a surface channel FET can be also increased by incorporating spray implants in to the back-gate doping the spray implants being of the same conductivity type as the back-gate doping but the spray implants are not illustrated in FIG. 37 although they would be beneficially utilized.

In FIG. 37 the second FET comprises a surface channel 3732 located in between the second source (comprising the source extension doping 3712) and the drain (comprising the drain extension doping 3714) and corresponding to the second channel, an external gate 726 corresponding to the second gate, and an additional auxiliary gate. The auxiliary gate comprises a first conductivity type back-gate doping 3748 and a first conductivity type contact doping 3718. The auxiliary gate node comprises the auxiliary gate and associated wiring 3888. The internal node comprises the second gate, the first conductivity type first drain doping 713, and associated wiring 3883. The first FET including the first gate is described in the description of FIGS. 7 and 8. The input comprises the first gate and associated wiring 885. Between the internal node and the input there is an optional 'drag-along' plate capacitor 3890. The first source node comprises the first conductivity type first source doping 711 and associated wiring 881. The second source node comprises the second conductivity type second source doping 712 and associated wiring 882.

During operation the first source node is coupled to first source potential, the second source node can be coupled to the first output logic potential, the auxiliary gate node is coupled to a suitable auxiliary gate node potential, and the input is coupled either to first input logic potential or to second input logic potential. When the input is connected to first input logic potential the first channel (corresponding to the first channel doping 731) will be conductive and the internal node is set to first source potential rendering the second channel (corresponding to the second channel 3732) nonconductive (irrespective of the fact whether the second source is at first or second output logic potential) and thus the output may be either at first output logic potential or at second output logic potential, i.e. the input has no control of the potential level of the output. On the other hand, when the input is connected to second input logic potential and the second source is connected to first output logic potential the first channel will be nonconductive enabling the internal node to settle to a potential rendering the second channel conductive and thus forcing the output to first output logic potential.

As a matter of fact, the potential of the internal node will be defined by the channel depth of the first channel corresponding to the vertical distance 2795 and by the barrier for mobile first conductivity type charge carriers from the first drain to the first source corresponding to the vertical distance 2793. Thus when the input is at second input logic potential the potential of the internal node settles down to a quasi thermal equilibrium, i.e. the height of the barrier corresponding to the vertical distance 2793 settles down to a value enabling all the thermally generated mobile first conductivity type charge carriers collected by the first drain to be thermally emitted from the first drain over the barrier corresponding to the vertical distance 2793 and to be collected by the first source.

By properly adjusting the potential of the auxiliary gate node, the first source potential, the first input logic potential, the second input logic potential, the first output logic potential, the second output logic potential, and by properly designing the semiconductor logic element of FIGS. 37 and 38 one can insure that when the input is at the second input logic potential the surface channel of the second FET is conductive, i.e. an inversion layer of mobile second conductivity type charge carriers (hereinafter second type inversion layer) is created. This necessitates more or less in any practical case that the internal node comprising the second gate is enough forward biased with respect to the second source node in order to turn the second channel conductive. In the second FET, when the input is biased at the second input logic potential, the forward bias between the internal node and the second source node is enabled due to the fact that the second gate corresponds only to an external gate and thus clamping of the internal node to the first output logic potential is avoided.

Furthermore, when the input is at the first input logic potential it is a mandatory requirement that the bias between the internal node and second source node is such that the second channel is nonconductive. Depending on the auxiliary gate node potential, on the first source potential, on the first input logic potential, on the second input logic potential, on the first output logic potential, and on the second output logic potential it is actually possible to establish an accumulation layer of mobile first conductivity type charge carriers (hereinafter first type accumulation layer) beneath the external gate 726 when the input is biased at the first input logic potential. The benefit of said first type accumulation layer is that it prevents any second conductivity type leakage current from running through the second channel (from second source to second drain) when the input is at the first input logic potential.

In the embodiment of FIGS. 37 and 38 wherein the surface channel CISFET corresponds to the second FET and comprises an auxiliary gate corresponding to a back-gate doping the second channel is controlled/confined both by the gate from above and by the auxiliary gate from below. It is hereby defined that in a FET the term threshold voltage is utilized instead of the term channel depth when the potential on the auxiliary gate affects the potential configuration of the channel. The threshold voltage corresponds to the gate to source bias at which channel pinch-off takes place and it depends in the embodiment of FIGS. 37 and 38 both on the gate node potential and on the auxiliary gate node potential with respect to the source potential, i.e. that a change in the auxiliary gate node potential results in a change in the threshold voltage.

As already said in the embodiment of FIGS. 37 and 38 the second gate corresponding to the external gate has to be in almost any practical case forward biased with respect to the second source when the second channel is conductive, i.e. at the channel pinch-off the second gate is forward biased with respect to the second source. It is, however, typically not feasible to have the auxiliary gate corresponding to the back-gate doping forward biased with respect to the source (unless the combination of the band-gap, the temperature, and the magnitude of the forward bias enable operation below power consumption specifications). By increasing the reverse bias of the auxiliary gate node with respect to the source node it is possible to increase the absolute magnitude of the threshold voltage. In the embodiment of FIGS. 37 and 38 the higher the absolute magnitude of the second FET's threshold voltage the weaker the inversion in the channel, i.e. it is actually beneficial to have the auxiliary gate node comprising the wiring 3888 to be connected to the second source node comprising the wiring 882 if the second source is permanently biased at first output logic potential.

In the embodiments corresponding to FIGS. 3-8 the absolute magnitude of threshold voltage (if the term threshold voltage would be utilized in these embodiments) in the first FET would actually correspond to the sum of the channel depth at pinch-off (for reference see 2695 in FIG. 26) and the source to channel barrier potential (for reference see 2593 in FIG. 26) from which the built-in potential is subtracted (whereby it is assumed that the wiring material is the same in each node meaning that the wirings comprise similar Fermi level).

To summarize, the fact that the second FET comprises an auxiliary gate that corresponds to the back-gate doping means that the second channel is controlled/confined by the second gate only from one side, i.e. from above. Besides, the fact that the second gate of the second FET corresponds only to an external gate means that the internal node is not clamped at the first output logic potential when the input is at second input logic potential and second the source node is at first output logic potential. Based on the description according to FIGS. 37 and 38 the operation of the corresponding semiconductor logic element resembles the operation of the semiconductor logic element of FIGS. 3-8 with the exceptions that the second FET is an enhancement mode transistor, that the second FET comprises a surface channel and an auxiliary gate, that the threshold voltage of the second FET can be adjusted with the potential on the auxiliary gate node, and that the internal node is not clamped at the first output logic potential when the input is at the second input logic potential and when the second source is at first output logic potential. It should be noted that with these exceptions the MSCL operation corresponding to FIGS. 25-30 applies also to the semiconductor logic element of FIGS. 37 and 38, i.e., the semiconductor logic element of FIGS. 37 and 38 is compatible to MSCL.

It is important to note that in MSCL arrangement according to FIGS. 37 and 38 the first source potential can be the same as the first logic potential because the second FET is an enhancement mode FET (the first source biased at first source potential could be actually even forward biased with respect to the first gate biased at first logic potential if the temperature, band-gap widths in first and second FET, as well as threshold voltage of the second FET enable this). It should be also appreciated that it is not possible to replace the first FET in the semiconductor logic element of FIGS. 37 and 38 with a surface channel CISFET having the gate and back-gate doping connected together as the first gate since the channel depth could not be reasonably large unless there would be a sufficiently large amount of gate insulator charge of the correct polarity and/or unless the difference of work functions in the semiconductor and in the material forming the external gate would be of correct polarity and the magnitude of the difference would be sufficiently large when compared to the band-gap. Similarly in an embodiment of the invention wherein the second FET corresponds to a surface channel CISFET the external gate and the back-gate doping cannot be connected together as the second gate since the channel depth could not be reasonably large unless there would be a sufficiently large amount of gate insulator charge of the correct polarity and/or unless the difference of work functions in the semiconductor and in the material forming the external gate would be of correct polarity and the magnitude of the difference would be sufficiently large when compared to the band-gap.

Hereinafter the term modified CCIS logic of the second kind is utilized for invented complementary logic comprising invented semiconductor logic elements and invented complementary semiconductor logic elements wherein the first FET, the second FET, the complementary first FET, and the complementary second FET are all CISFETs, in the second FET the second gate corresponds to the external gate in the complementary second FET the second gate corresponds to the external gate in the semiconductor logic element the internal node is not clamped at first output logic potential when the input is at second input logic potential and the second source is at first output logic potentila, and in the complementary semiconductor logic element the internal node is not clamped at complementary first output logic potential when the input is at complementary second input logic potential and the second source is at complementary first output logic potential.

The semiconductor logic elements of FIGS. 37 and 38 and its complementary semiconductor logic elements (in the complementary semiconductor logic element the doping type of the first type doped regions and the second type doped regions are interchanged, the first input logic potential and the second input logic potential are interchanged, and the first output logic potential and the second output logic potential are interchanged when compared to the semiconductor logic element of FIGS. 37 and 38 and in addition a complementary first source potential is provided) enable the realization of modified CCIS logic of the second kind wherein clamping of the internal node does not take place.

The advantage of the modified CCIS logic of the second kind wherein both the second FET and complementary second FET correspond to surface channel FETs is that due to the surface channel arrangement of the second FET a lot of mobile second conductivity type charge carriers can be packed in the second type inversion layer corresponding to the second channel meaning that high operation speed can be achieved in case the overall 'drag-along' capacitance including the optional 'drag-along' plate capacitor is reasonably small. Another benefit of the modified CCIS logic of the second kind wherein both the second FET and complementary second FET correspond to surface channel FETs is that the highest electric field value across the gate insulator in the second FET is always smaller than what would be the highest electric field value across the gate insulator in traditional CCIS logic featuring similar potential difference between the first output logic potential and the second input logic potential and thus a thinner gate insulator is enabled in the modified CCIS logic of the second kind wherein both the second FET and complementary second FET correspond to surface channel FETs than in corresponding traditional CCIS logic.

It is important to note that in the modified CCIS logic of the second kind wherein both the second FET and complementary second FET correspond to surface channel FETs the combination of thin gate insulator layer, high operation voltage, and high speed is simultaneously enabled. In other words, one can utilize the thin gate insulator layer of surface channel CISFETs corresponding to low voltage (e.g. 1.8 V) digital traditional CCIS logic in order to generate higher voltage (e.g. 3.3 V or 5 V) high speed logic to be used in the analog part of a mixed mode chip. Thus it is not necessary to manufacture two gate insulator layers having different gate insulator thicknesses while still enabling the formation of fast low and high voltage logic, which lowers considerably the manufacturing complexity and cost as well as reduces the design complexity of semiconductor devices.

In the modified CCIS logic of the second kind wherein both the second FET and complementary second FET correspond to surface channel FETs four different FETs are required; two opposite type surface channel FETs and two opposite type buried channel FETs. The surface channel complementary second FET could be, however, realized from the first FET by removing the first conductivity type channel doping and by providing first conductivity type source and drain extension dopings. Similarly the complementary first FET could be realized from the second FET by removing the second conductivity type source and drain extension dopings and by providing a second conductivity type channel doping. Another option would be to simply use the source and drain extensions both in the surface channel FETs and in the buried channel FETs.

It is important to note in the embodiment of FIGS. 37 and 38 the first FET could be replaced for example with one of the following:
- a depletion mode junction field effect transistor that comprises a gate confining the channel at least from two sides (particularly from above and below), or
- a depletion mode conductor semiconductor field effect transistor wherein the gate corresponds to a Schottky gate and a back-gate doping, or
- a depletion mode conductor insulator semiconductor field effect transistor comprising an external gate corresponding to an auxiliary gate configured to be biased so that a layer of mobile second conductivity type charge carriers is established at the insulator semiconductor interface beneath the external gate of the first FET irrespective of the fact whether the input is biased at first input logic potential or at second input logic potential, and the said layer of mobile second conductivity type charge carriers acting as a part of the first gate and controlling the first channel from the opposite side than the second conductivity type back-gate doping (for further reference refer to the embodiment of FIG. 31).

Figure 39:
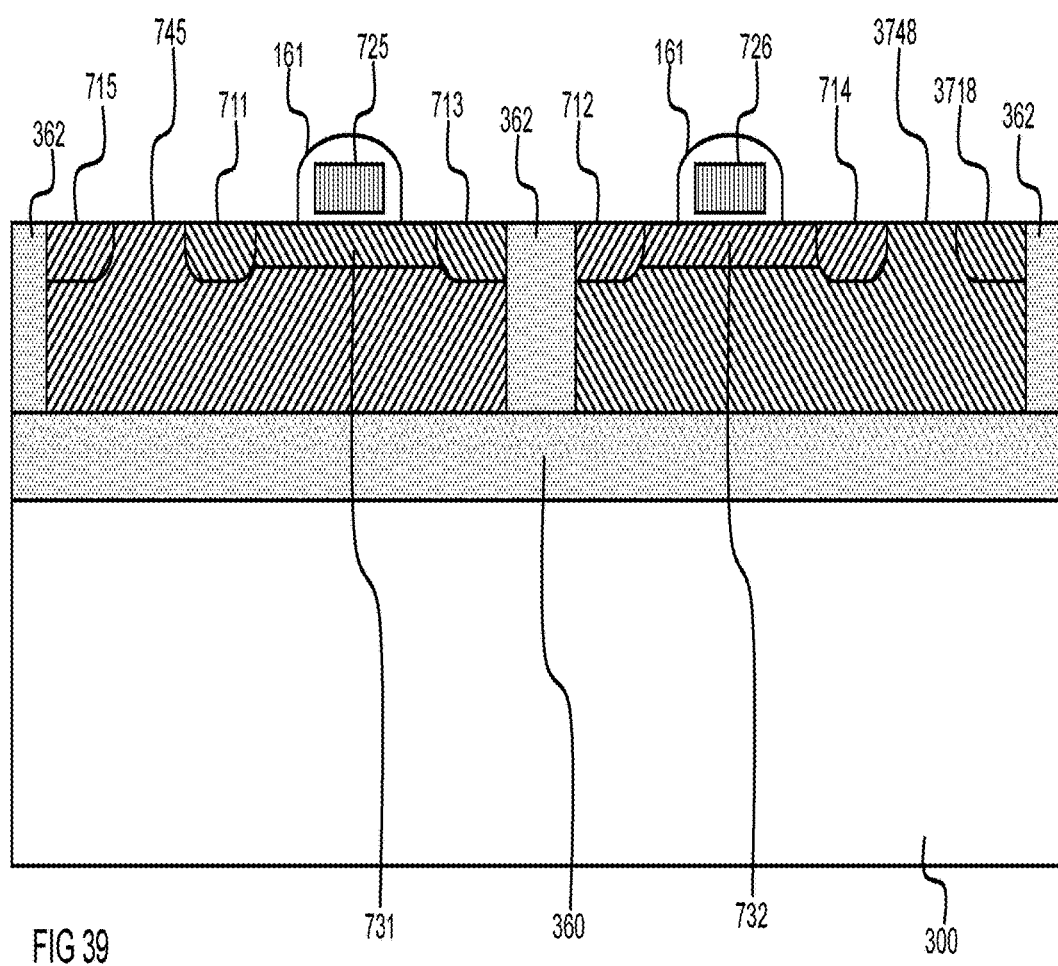
FIG. 39 illustrates an embodiment of the invention corresponding to a schematic cross-section of a semiconductor logic element.
Figure 40:
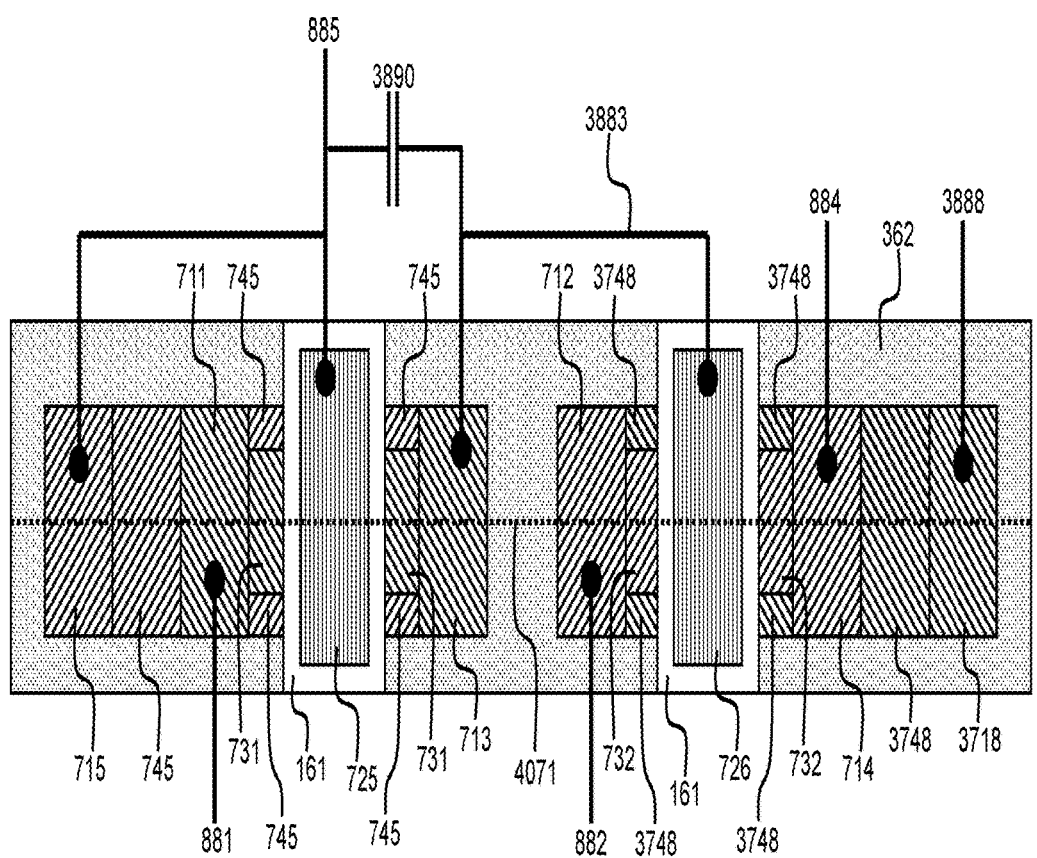
FIG. 40 illustrates an embodiment of the invention corresponding to the schematic layout of the semiconductor logic element according to FIG. 39.

FIG. 40 corresponds to a schematic layout of an invented semiconductor logic element and the cross-section along the dashed line 4071 corresponds to the schematic cross-section presented in FIG. 39. FIGS. 39 and 40 illustrate an embodiment of the invention corresponding to a semiconductor logic element wherein the second FET corresponding to a surface channel second type CISFET of FIGS. 37 and 38 has been replaced by a second type CISFET incorporating the second conductivity type channel doping 732 located in between the second source 712 and the second drain 714. In other words, in the embodiment of FIGS. 39 and 40 the first FET corresponds to the first FET of the embodiment of FIGS. 37 and 38, i.e., the first FET corresponds to a buried channel first type CISFET wherein the external gate and the back-gate doping are connected together as the first gate. The semiconductor logic element of FIGS. 39 and 40 is compatible to MSCL. In addition the semiconductor logic element of FIGS. 39 and 40 and its complementary semiconductor logic element enable the realization of modified CCIS logic of the second kind wherein clamping of the internal node does not take place since in the second FET and in the complementary second FET the second gate comprises only an external gate.

Figure 87A:
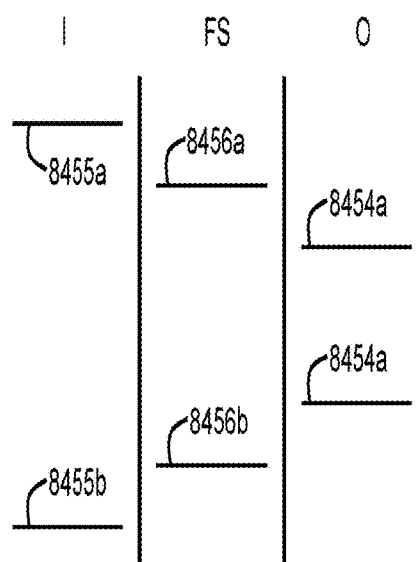
Figure 87B:
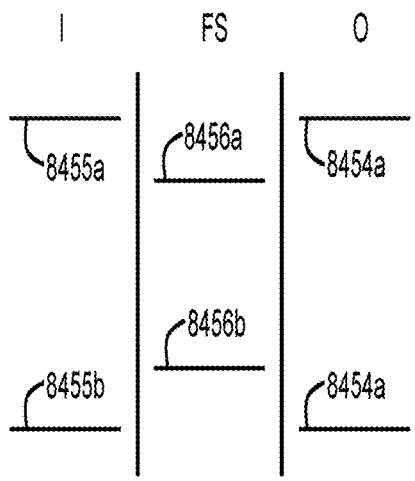

In an embodiment of the invention according to FIGS. 39 and 40 wherein the second FET corresponds to a second type CISFET having so low amount of second type channel doping that it is of enhancement type then the situation of the second FET of FIGS. 39 and 40 corresponds actually to a surface channel CISFET what was discussed amongst the description of FIGS. 37 and 38, i.e., in the corresponding MSCL arrangement the first source potential can be the same as the first input logic potential. Furthermore, in MSCL wherein the second FET is an enhancement mode field effect transistor depending on the temperature, on the threshold voltage of the second FET, as well as on the band-gap width of the semiconductor material in the first FET it is even possible that the first source potential would be in between the first logic potential and the second logic potential (i.e. the first gate at first logic potential would be forward biased with respect to the first source at first source potential and in addition the internal node at first source potential would be forward biased with respect to the second source at first logic potential)—for further discussion see also FIG. 87B and the corresponding description. It should be noted that in MSCL configuration when the second FET is a depletion mode field effect transistor then the first gate biased at first or second logic potential has to be reverse biased with respect to the first source biased at first source potential in order to establish nonconductive second channel, i.e., in this case the first source potential cannot be in between the first logic potential and the second logic potential.

Concerning the embodiment of FIGS. 39 and 40 being compatible to MSCL, in case the amount of second conductivity type channel doping in the second FET corresponds to a depletion mode buried channel CISFET when the auxiliary gate is at the same potential than the second source and in case the first source potential corresponds to first logic potential then the potential on the auxiliary gate should be adjusted to a sufficiently large reverse bias in order to transform the second FET into an enhancement mode field effect transistor. In this case the first FET in the embodiment of FIGS. 39 and 40 has to be a depletion mode first type field effect transistor.

As already explained according to the embodiment of FIGS. 37 and 38 the term threshold voltage is used instead of channel depth in case the potential on the auxiliary gate affects the channel, which is the case when the second FET is an enhancement mode field effect transistor and when the input is at second input logic potential (i.e. when the internal node is forward biased with respect to the second source).

In modified CCIS logic of the second kind corresponding to FIGS. 39 and 40 it is possible to utilize the second conductivity type complementary first FET from the complementary semiconductor logic element as the second type second FET in the semiconductor logic element of FIGS. 39 and 40 wherein the required smaller absolute value of the threshold voltage is achieved by applying a suitably large reverse bias on the auxiliary gate node with respect to the second source node. Thus in the modified CCIS logic of the second kind corresponding to FIGS. 39 and 40 only one first type and one second type CISFET are required.

When the input is at the second input logic potential and the second source is at the first output logic potential in the embodiment of FIGS. 39 and 40 the second channel in the second FET comprises mobile second conductivity type charge carriers in the second conductivity type channel doping 732 and preferably also in an accumulation layer incorporating mobile second conductivity type charge carriers (hereinafter second type accumulation layer). Actually the smaller the amount of second conductivity type channel doping in the second channel the larger the total amount of mobile second conductivity type charge carriers located both in the second type accumulation layer and in the second type channel doping. The larger this total amount of mobile second conductivity type charge carriers is the faster the operation of the semiconductor logic element (i.e. the faster the total capacitance of the output is charged). This amount is, however, smaller in the embodiment of FIGS. 39 and 40 than in the embodiment of FIGS. 37 and 38 (comprising mobile second conductivity type charge carriers only in the second type inversion layer) and thus the embodiment of FIGS. 39 and 40 is slower than the one in FIGS. 37 and 38.

The semiconductor logic element of FIGS. 39 and 40 could be also configured such that when the input is at first input logic potential (i.e. when the second channel is non-conductive) there would be an inversion layer comprising mobile first conductivity type charge carriers (hereinafter first type inversion layer) beneath the external gate 726 being part of the second gate.

It should be also noted regarding the semiconductor logic elements of FIGS. 37-40 that in the conductive state there are less mobile first conductivity type channel carriers in the first conductivity type channel doping 731 (located in between the first source and first drain) than there are mobile second conductivity type charge carriers in a second channel comprising a second type inversion layer or a second type accumulation layer. In other words, in this case in the conductive stage the second FET of FIGS. 37-40 is likely considerably more conductive and thus faster than the first FET. This bears, however, little relevance to the operation speed since the maximum conductance of the second FET is substantially more important than the maximum conductance of the first FET. This is due to the fact that a lot more current may flow through the second FET than through the first FET (only the capacitance of a single internal node is charged through the first channel whereas several tens of internal nodes may be charged through the second FET). Another observation is that although the non-clamping semiconductor logic elements of FIGS. 37-40 corresponding to modified CCIS logic of the second kind are faster than the clamping semiconductor logic element of FIGS. 7 and 8 corresponding to modified CCIS logic of the first kind the semiconductor logic elements of FIGS. 37-40 have the disadvantage that a thicker gate insulator layer is likely required than in the semiconductor logic element of FIGS. 7 and 8.

Figure 21:
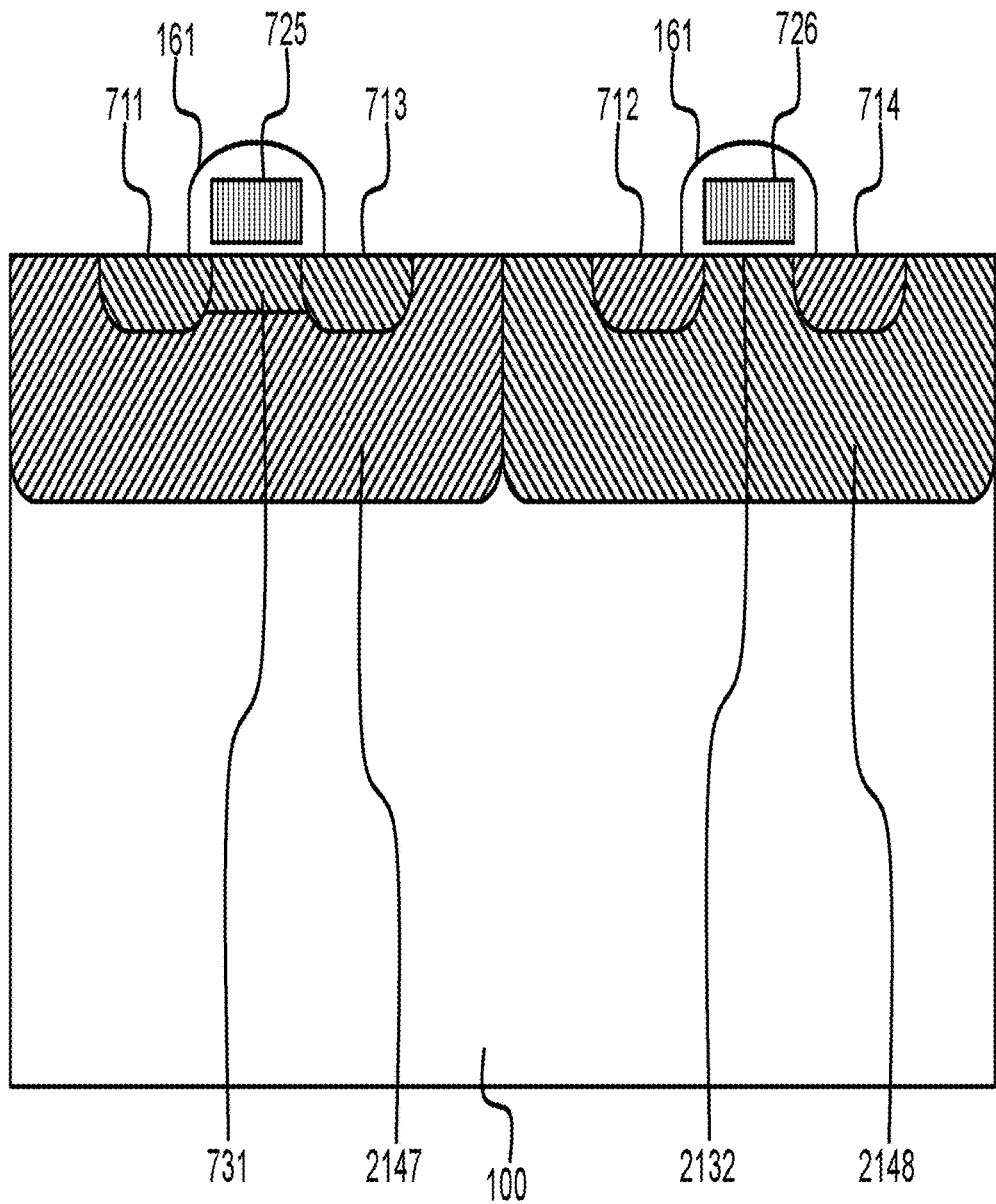
FIG. 21 illustrates an embodiment of the invention corresponding to a schematic cross-section of a semiconductor logic element.
Figure 22:
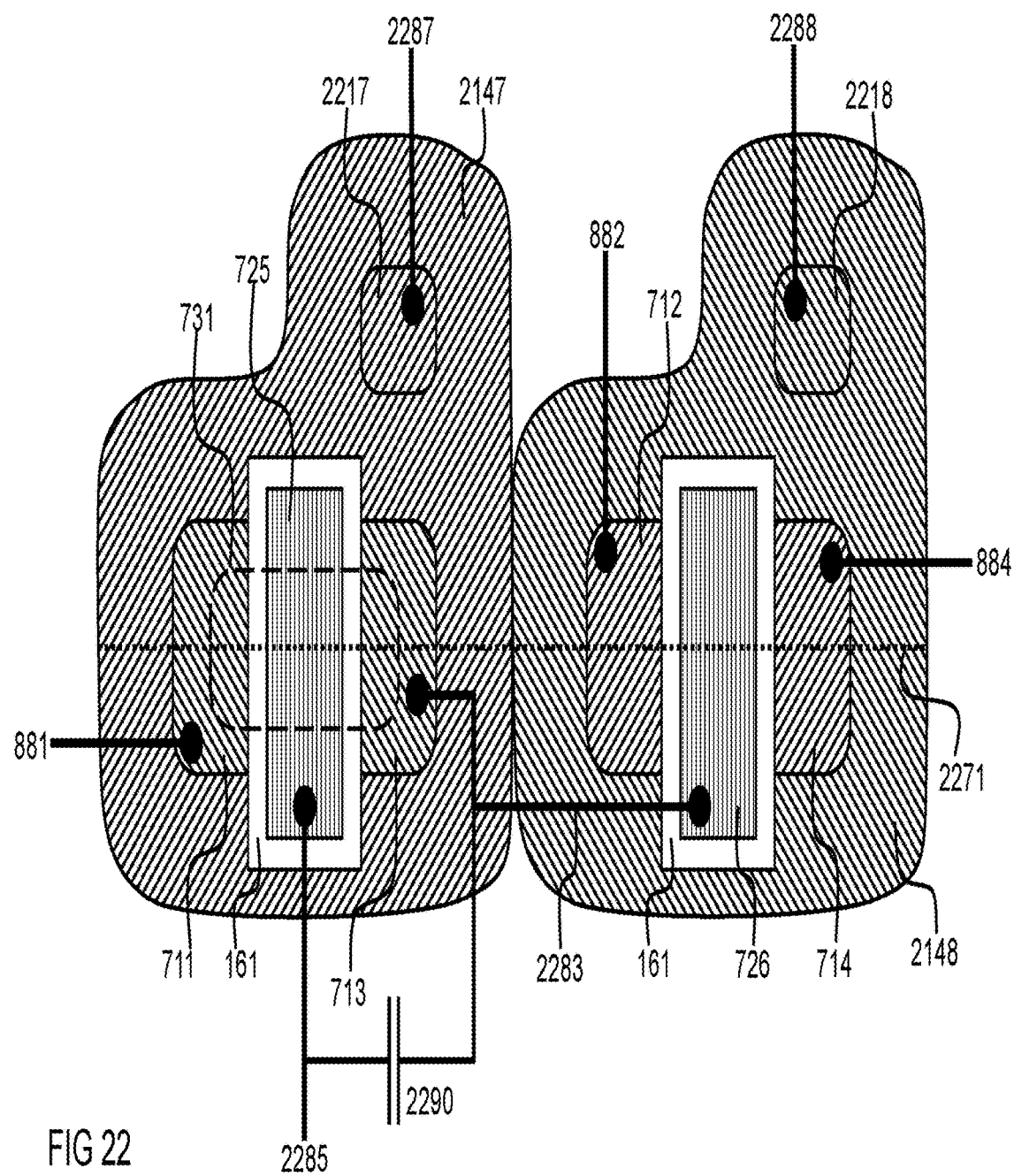
FIG. 22 illustrates an embodiment of the invention corresponding to the schematic layout of the semiconductor logic element according to FIG. 21.

The so far presented semiconductor logic elements according to FIGS. 3-8 and FIGS. 37-40 have been based on SOI architecture. Although the SOI architecture is beneficial from logic IC point of view it increases the cost of manufacturing and it may be unwanted in some analog applications wherein a thick semiconductor substrate is required. FIGS. 21 and 22 illustrate an embodiment of the invention wherein the semiconductor logic element is formed on top of a thick semiconductor substrate 100. In FIGS. 21 and 22 the first FET is on the left hand side is a first type depletion mode buried channel CISFET. The second FET on the right hand side is a second type surface channel CISFET operating similarly than the second FET in the embodiment of FIGS. 37 and 38. Both the first FET and the second FET comprise an auxiliary gate.

In FIGS. 21 and 22 the first auxiliary gate of the first FET comprises the second conductivity type back-gate doping 2147 and the second conductivity type contact doping 2217. The first auxiliary gate node comprises the first auxiliary gate and associated wiring 2287. Similarly the second auxiliary gate of the second FET comprises a first conductivity type back-gate doping 2148 and the second conductivity type contact doping 2218. The second auxiliary gate node comprises the second auxiliary gate and associated wiring 2288. The first gate comprises the external gate 725 and the first gate node comprises the first gate and associated wiring 2285. The second gate comprises the external gate 726. The internal node comprises the first drain 713, the second gate, and associated wiring 2283. Between the input and the internal node there is an optional 'drag-along' plate capacitor 2290. The first gate controls/confines the first channel doping 731 from above, the first auxiliary gate controls/confines the first channel from below, the second gate controls/confines the second channel 2132 (being a surface channel) from above, and the second auxiliary gate controls/confines the second channel from below. The first channel doping 731 is located between the first conductivity type first source doping 711 and the first conductivity type first drain doping 713. The second channel 2132 corresponding to a surface channel is located between the second conductivity type second source doping 712 and the second conductivity type second drain doping 714.

Next a case wherein the semiconductor logic element of FIGS. 21 and 22 is compatible to MSCL and wherein the first conductivity type in the semiconductor logic element is of p type is considered. In case the first input and output logic potentials are 0 V, in case the second input and output logic potentials are 5 V, and in case the first source potential is −1 V, then the first auxiliary gate node could be connected e.g. to 5 V (or 6 V) and the second auxiliary gate node could be connected e.g. to 0 V (or −1 V). Consequently, in the complementary semiconductor logic element the first input and output logic potentials would be 5 V, the second input and output logic potential would be 0 V, and the first source potential could be 6 V in the n type first source doping. In the complementary semiconductor logic element the complementary first auxiliary gate node (the complementary first auxiliary gate is of first conductivity type) could be connected to 0 V (or −1 V) and the complementary second auxiliary gate node (the complementary second auxiliary gate is of second conductivity type) could be connected to 5 V (or 6 V). If the substrate 100 were of p type it could be connected e.g. to 0 V (or −1 V) or if it were of n type it could be connected e.g. to 5 V (or 6 V).

The semiconductor logic element of FIGS. 21 and 22 and its complementary semiconductor logic element enable the realization of modified CCIS logic of the second kind since the semiconductor logic element and the complementary semiconductor logic element are of non-clamping type. The downside of the arrangement illustrated in FIGS. 21 and 22 is that since the first gate and second gate control/confine the channel only from one side the potential on the first and second gate has a lesser effect on the channel potential and thus larger separation between the first and second input logic potential as well as between the first output logic potential and the first source potential has to be used. In other words the maximum electric field value in the gate insulator layer will be higher than in case the channel is controlled/confined at least from two directions unless this effect is compensated with a thicker gate insulator layer. It should be noted that in the semiconductor logic element of FIGS. 21 and 22 it is possible to remove the back-gate doping and the contact doping in the auxiliary gate being of the same conductivity type than the semiconductor substrate 100 as well as the corresponding auxiliary gate node if the substrate possesses a suitable doping concentration. The additional auxiliary gate offers, however, the possibility of utilizing a lower substrate doping which provides more flexibility for the design of the modified CCIS logic of the second kind according to FIGS. 21 and 22 and facilitates the integration of low voltage traditional CCIS logic to the same chip.

In the embodiment of FIGS. 21 and 22 it is not possible to use a gate confining the channel from above and beneath since the back-gate dopings 2147 and 2148 corresponding to auxiliary gates are required in order to provide insulation for the first and second CISFET, i.e., the back-gate dopings 2147 and 2148 are a substitute for the SOI layer and the trenches. If one would use a wrap around CIS gate or a finFET gate (see FIGS. 82A, 82B, 83A, and 83B) one would achieve better control of the channel but these are much harder to realize than the planar CIS gate arrangement of FIGS. 21 and 22. Besides in the embodiment of FIGS. 21 and 22 it is not possible to use the auxiliary gate node potential in order to adjust the threshold voltage (the term threshold voltage is utilized instead of channel depth as long as the potential on the auxiliary gate has an influence on the channel). In a semiconductor logic element not built on a SOI structure the control over the channel can be improved by utilizing a gate confining the channel from at least two sides, which allows the use of a thinner gate insulator layer than in the embodiment of FIGS. 21 and 22. In this case two deep well dopings are, however, required in order to provide the required insulation. Two such embodiments of the invention applicable to MSCL and to modified CCIS logic of the first kind are illustrated in FIGS. 17-20.

Figure 17:
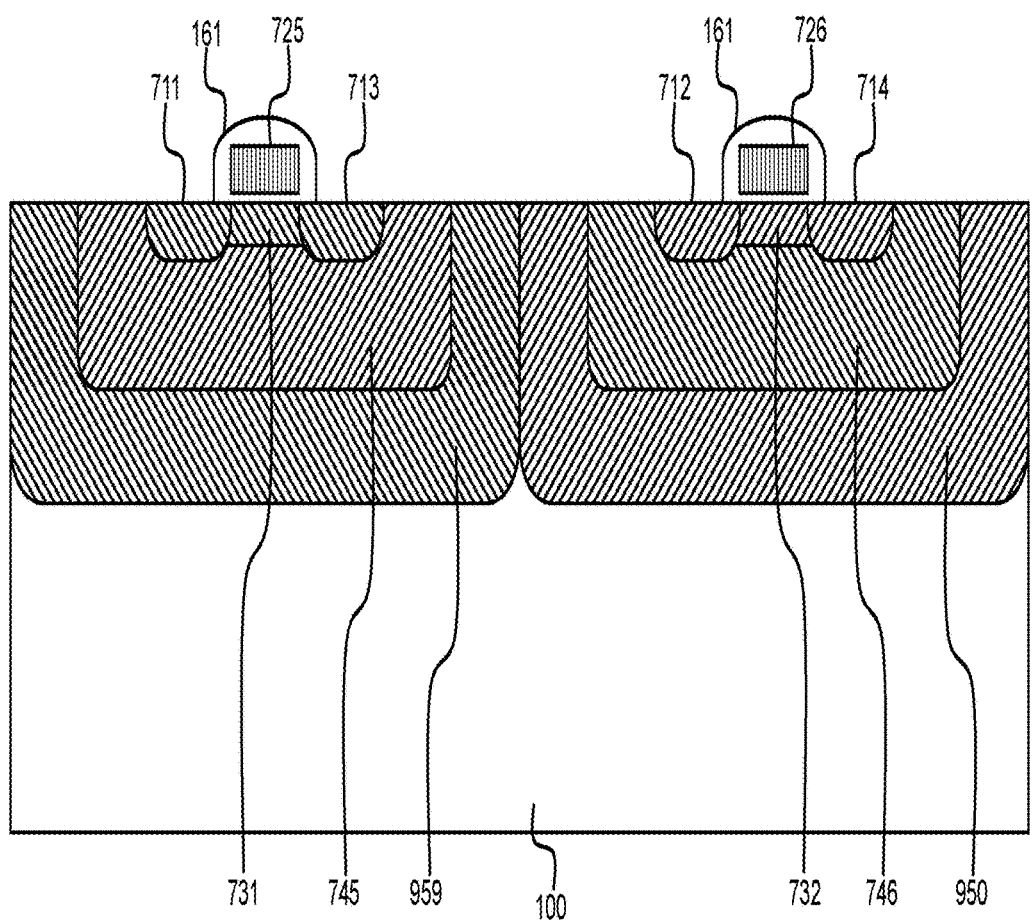
FIG. 17 illustrates an embodiment of the invention corresponding to a schematic cross-section of a semiconductor logic element.
Figure 18:
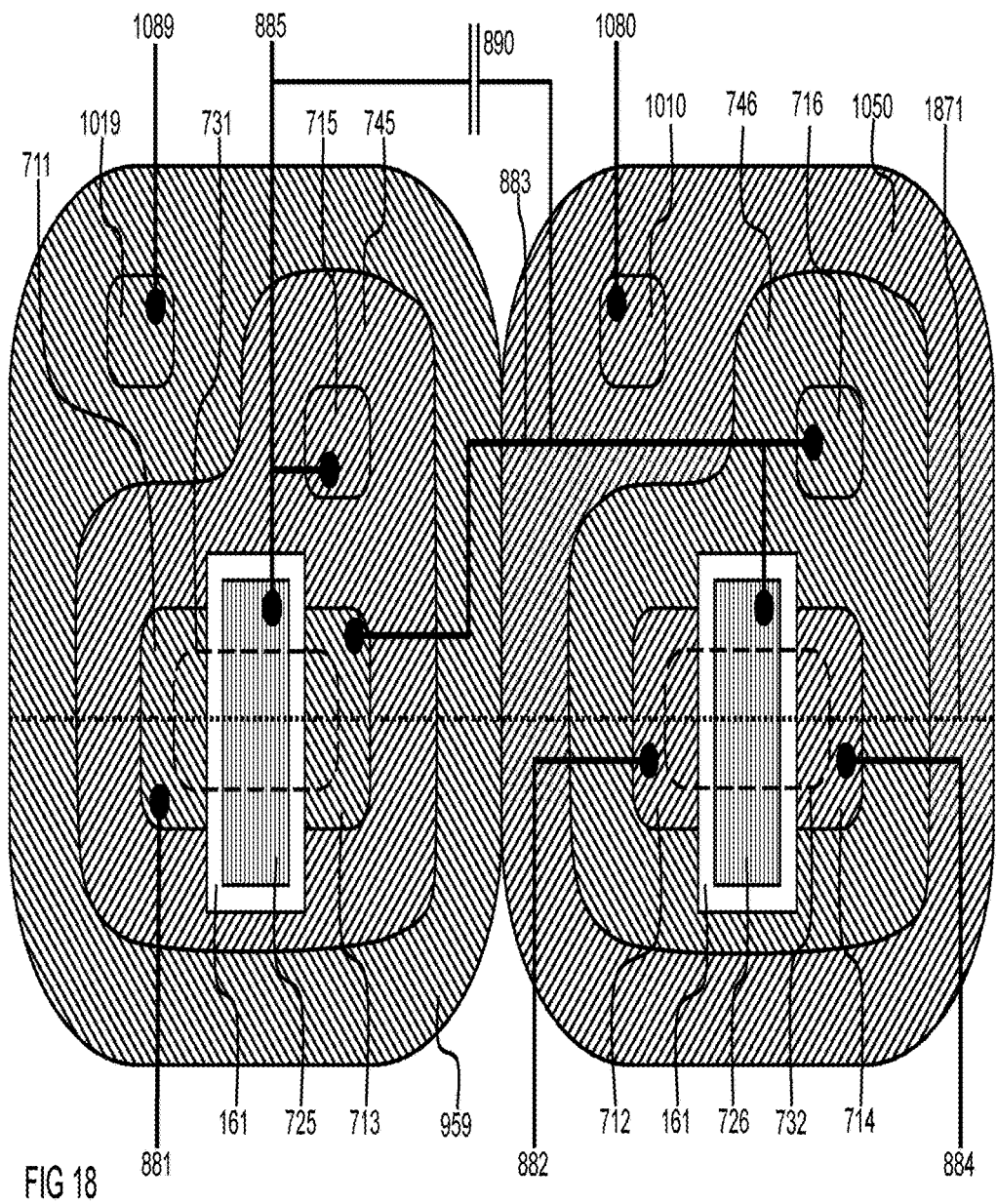
FIG. 18 illustrates an embodiment of the invention corresponding to the schematic layout of the semiconductor logic element according to FIG. 17.

FIG. 17 illustrates a schematic cross-section and FIG. 18 a schematic layout of an embodiment of the invention wherein the semiconductor logic element comprises additional insulation well dopings. In FIG. 17 the first FET is on the left hand side and the second FET is on the right hand side as in every embodiment. In FIGS. 17 and 18 there is a first conductivity type first insulation well doping 959 enclosing the second conductivity type back-gate doping 745 (which belongs to the first gate). Correspondingly a second conductivity type second insulation well doping 950 encloses the first conductivity type back-gate doping 746 (which belongs to the second gate). The first insulation node comprises the first insulation well doping, a first conductivity type first contact doping 1019, and associated wiring 1089. Similarly the second insulation node comprises the second insulation well doping, a second conductivity type second contact doping 1010, and associated wiring 1080. In FIG. 18 a cross-section along the dashed line 1871 corresponds to FIG. 17.

Beside the difference of having SOI and trench insulation when compared to well insulation the semiconductor logic element of FIGS. 7 and 8 and its operation is similar than the operation of the semiconductor logic element of FIGS. 17 and 18. In case the first conductivity type is p type then the first insulation node 1089 comprising a p type insulation well doping could be connected e.g. to 0 V (or −1 V) and the second insulation node 1080 comprising an n type insulation well doping could be connected e.g. to 5 V (or 6 V). In a similar manner in the complementary semiconductor logic element the complementary first insulation node comprising an n type insulation well doping could be connected to 5 V (or 6 V) and the complementary second insulation node comprising a p type insulation well doping could be connected to 0 V (or −1 V).

It should be noted that in the semiconductor logic element of FIGS. 17 and 18 it is possible to remove the insulation well doping being of the same conductivity type than the semiconductor substrate 100 if the substrate possesses a suitable doping concentration. The additional insulation well doping offers, however, the possibility to utilize a lower substrate doping which provides more flexibility for the design of the modified CCIS logic of the first kind and facilitates the integration of low voltage traditional CCIS logic to the same chip.

Figure 19:
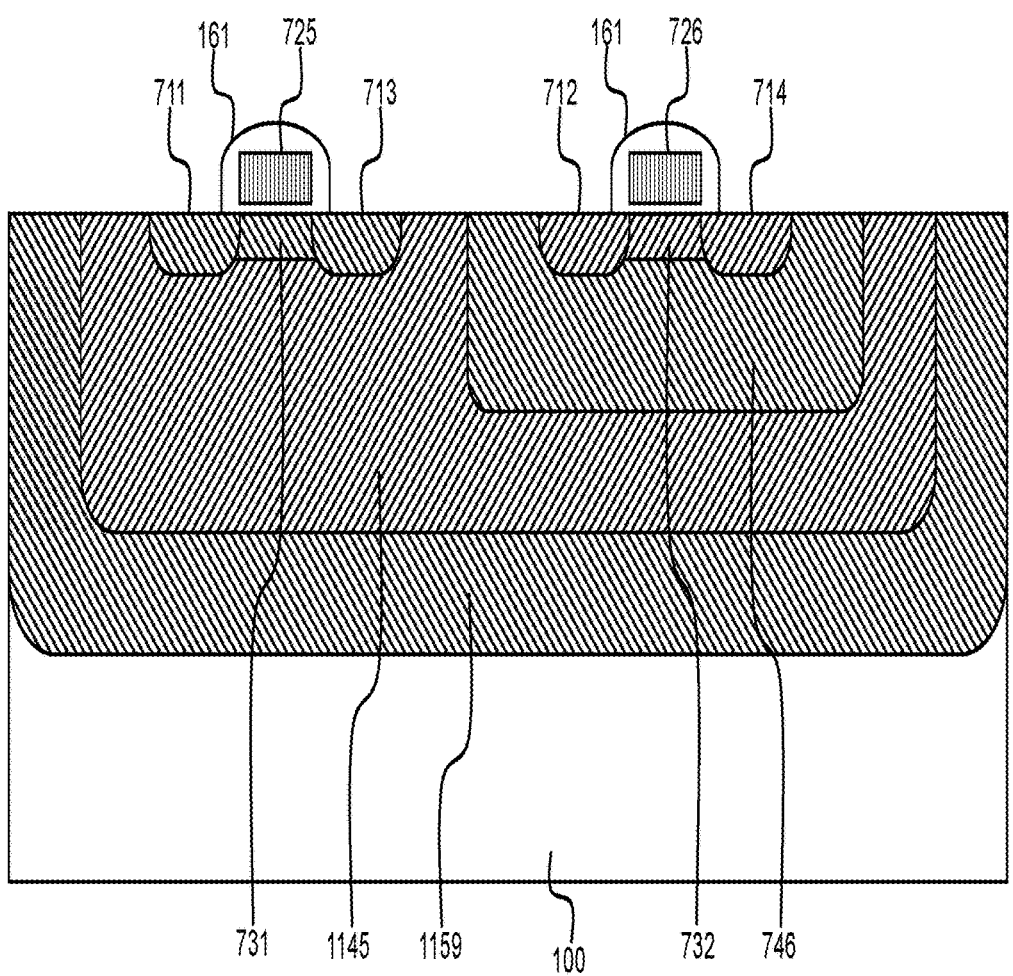
FIG. 19 illustrates an embodiment of the invention corresponding to a schematic cross-section of a semiconductor logic element.
Figure 20:
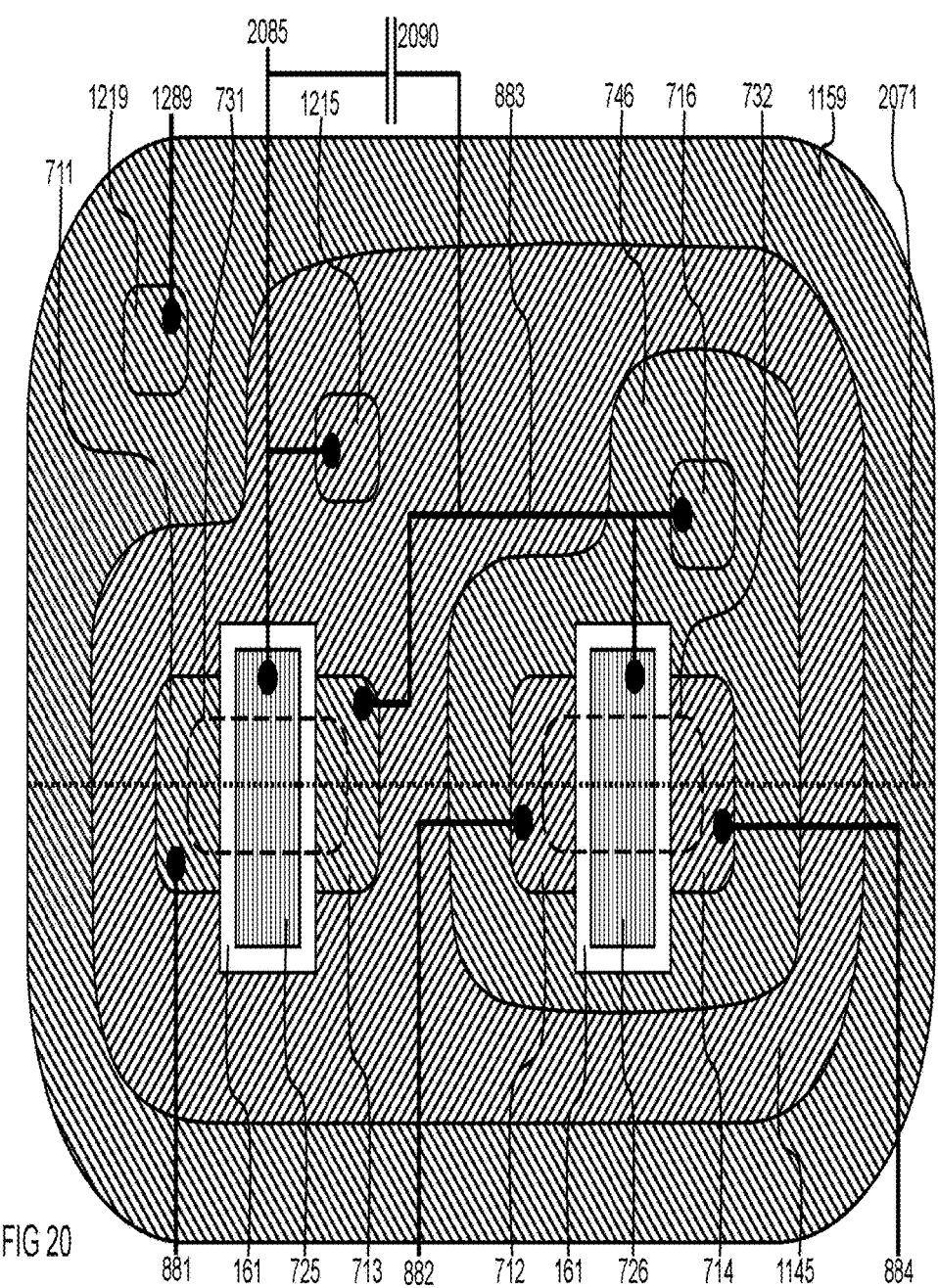
FIG. 20 illustrates an embodiment of the invention corresponding to the schematic layout of the semiconductor logic element according to FIG. 19.

FIG. 19 illustrates a schematic cross-section and FIG. 20 a schematic layout of an embodiment of the invention corresponding to a semiconductor logic element wherein the first conductivity type back-gate doping 746 is enclosed by the second conductivity type back-gate doping 1145 which is further enclosed by a first conductivity type isolation well 1159. In other words the first gate of the first FET located on the left hand reaches actually beneath the second FET located on the right hand side. The insulation node comprises first conductivity type insulation well doping 1159, a first conductivity type contact doping 1219, and associated wiring 1289. The first gate comprises the back-gate doping 1145, second conductivity type contact doping 1215, and the external gate 725. The second gate comprises the back-gate doping 746, the first conductivity type contact doping 716, and the external gate 726. The input comprises the first gate and associated wiring 2085. The internal node comprises the first drain 713, the second gate, and associated wiring 883. The first conductivity type first channel doping 731 is located between the first conductivity type first source doping 711 and the first conductivity type first drain doping 713. The second conductivity type second channel doping 732 is located between the second conductivity type second source doping 712 and the second conductivity type second drain doping 714. The optional 'drag-along' plate capacitor 2090 is connected between the input and the internal node. The cross-section along the dashed line 2071 corresponds to FIG. 19.

The semiconductor logic elements of FIGS. 19 and 20 is applicable to MSCL and modified CCIS logic of the first kind. It is important to note that the reason why the arrangement of enclosing the back-gate doping 746 by the back-gate doping 1145 is possible is due to the fact that the back-gate dopings are never forward biased with respect to each others when the first gate at first input logic potential is not forward biased with respect to the first source at first source potential. It should be also noted that in the semiconductor logic element of FIGS. 19 and 20 or in the oppositely doped complementary semiconductor logic element it is possible to remove the insulation well doping and the corresponding insulation node in case the insulation well doping is of the same conductivity type than the semiconductor substrate 100 and in case the substrate possesses a suitable doping concentration. The additional insulation well doping offers, however, the possibility to utilize a lower substrate doping providing more flexibility for the design of the modified CCIS logic of the first kind and facilitating the integration of low voltage traditional CCIS logic to the same chip.

The benefit of the semiconductor logic element of FIGS. 19 and 20 when compared to the semiconductor logic element of FIGS. 17 and 18 is that it requires less area. Another benefit is that there is a relatively large capacitance inherently present between the input and the internal node (i.e. between the first gate and the second gate) and thus there is less need for a separate optional 'drag-along' plate capacitor. The exclusion of a separate plate capacitor simplifies manufacturing and reduces the manufacturing cost.

Figure 9:
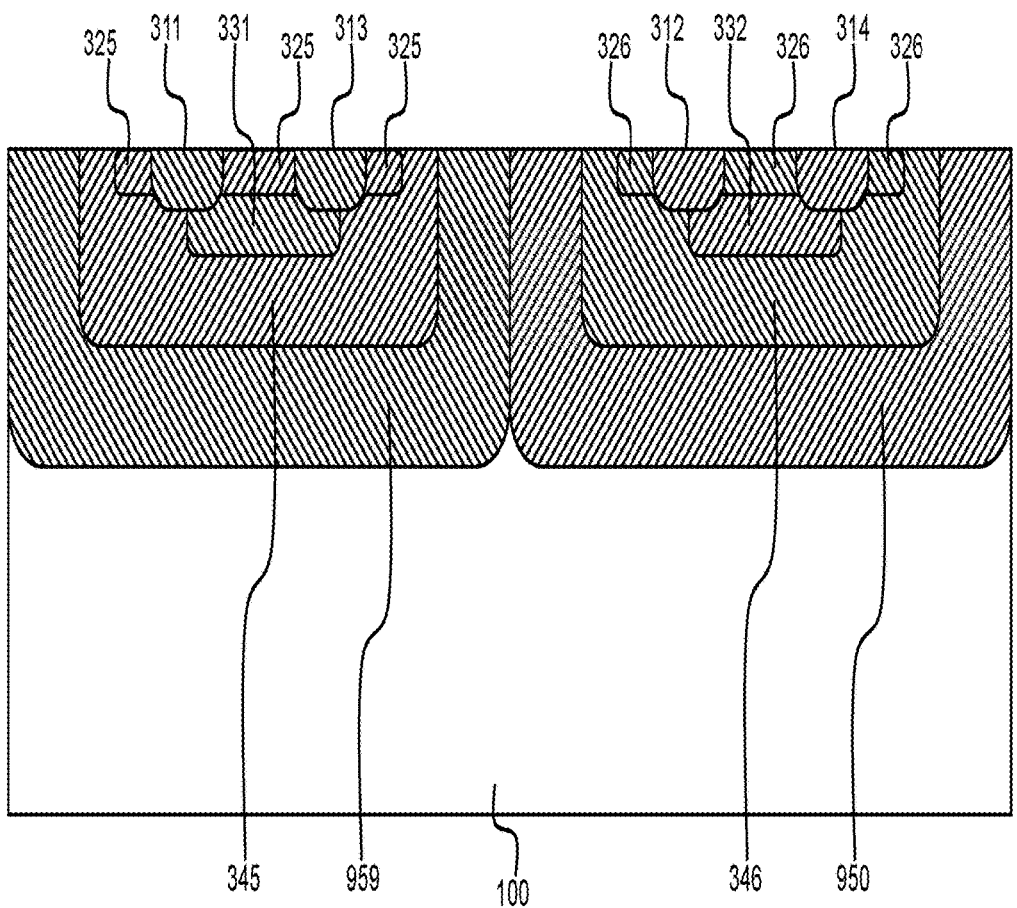
FIG. 9 illustrates an embodiment of the invention corresponding to a schematic cross-section of a semiconductor logic element.
Figure 10:
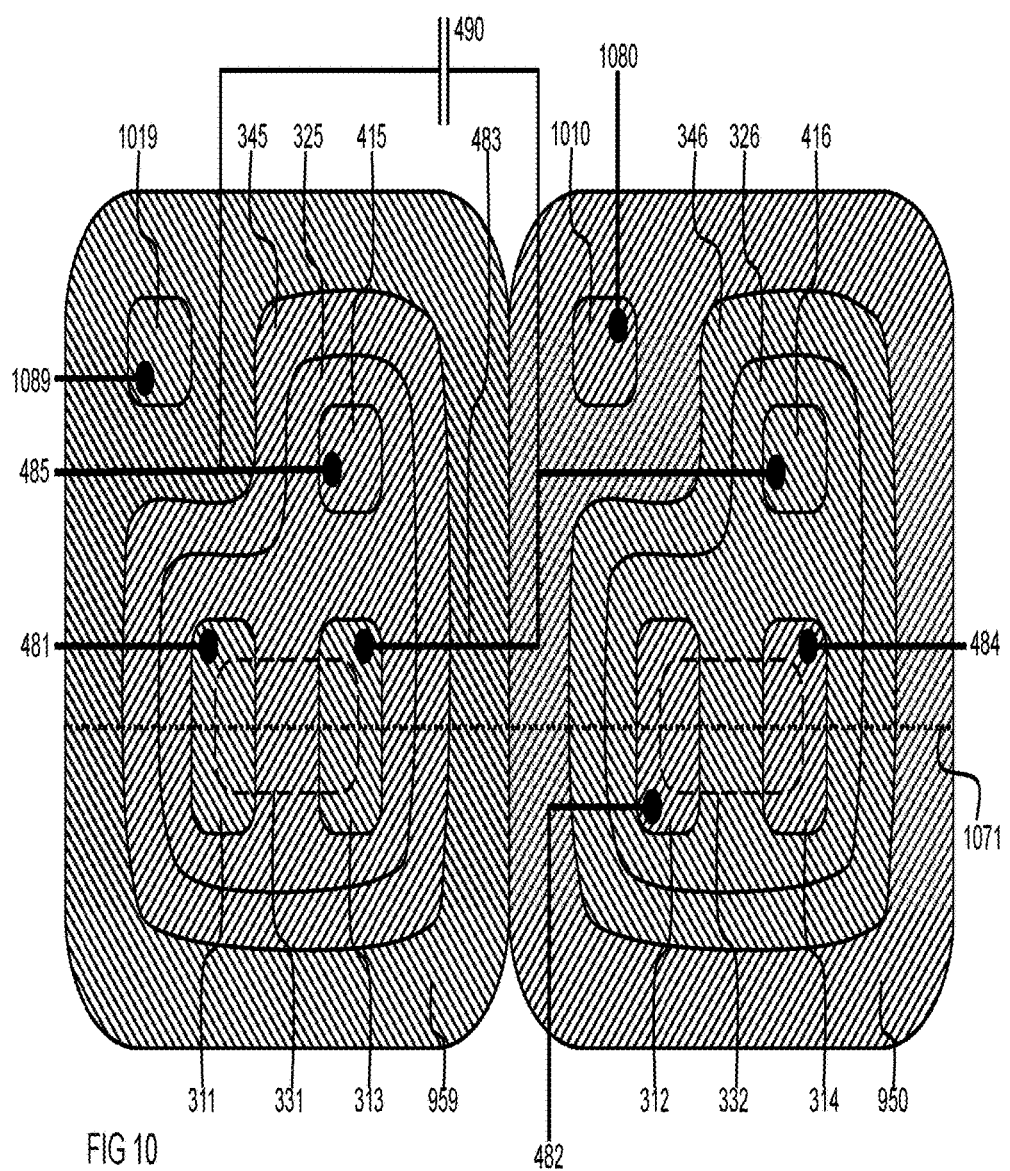
FIG. 10 illustrates an embodiment of the invention corresponding to the schematic layout of the semiconductor logic element according to FIG. 9.

FIG. 10 illustrates an embodiment of the invention corresponding to a schematic layout of a semiconductor logic element and FIG. 9 illustrates a schematic cross-section of the semiconductor logic element along the dashed line 1071 of FIG. 10. The semiconductor logic element of FIGS. 9 and 10 is based on the lateral wrap-around buried channel depletion mode JFET arrangement of FIGS. 3 and 4 as well as on the insulating well dopings 950 and 959 as explained according to FIGS. 17 and 18, i.e., the first and second gate are encapsulated by the insulating well dopings. The operation principle of the semiconductor logic element of FIGS. 9 and 10 is the same as the operation principle of the semiconductor logic element of FIGS. 3 and 4. This means that the embodiment of FIGS. 9 and 10 is compatible to MSCL as presented according to FIGS. 25-30. The semiconductor logic element of FIGS. 9 and 10 is also compatible to CS logic.

Figure 11:
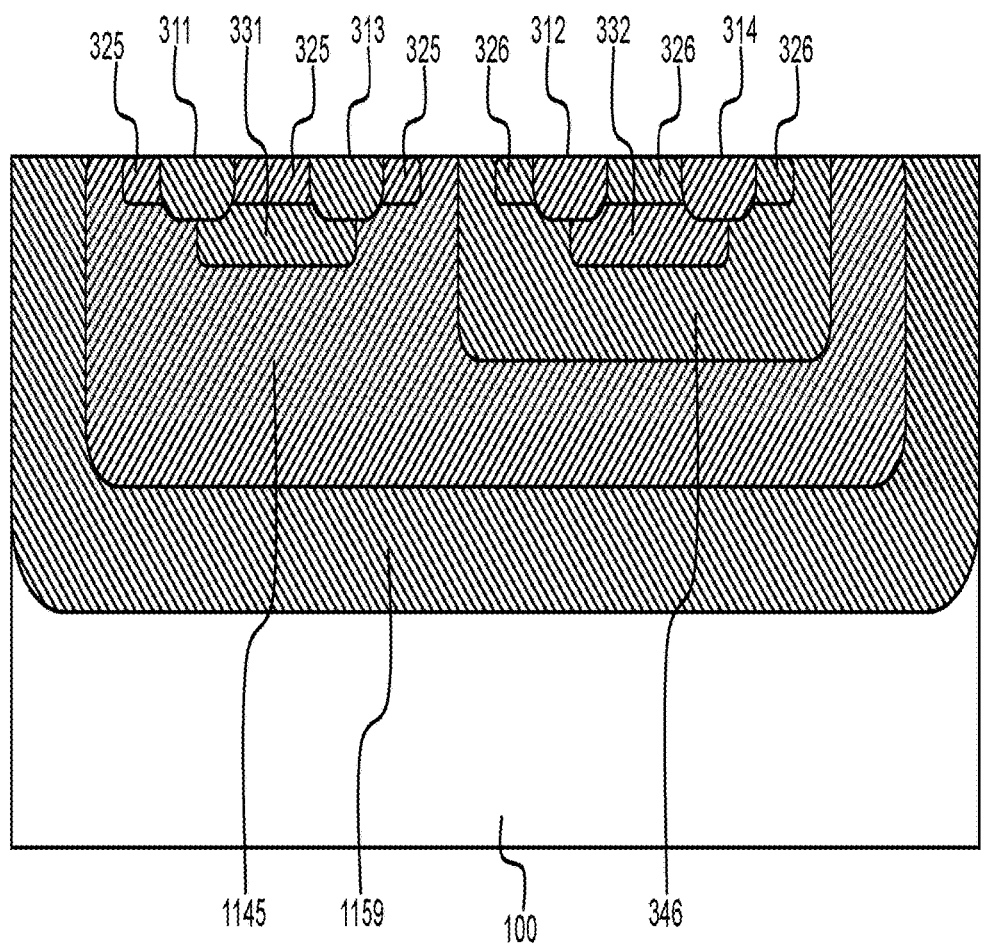
FIG. 11 illustrates an embodiment of the invention corresponding to a schematic cross-section of a semiconductor logic element.
Figure 12:
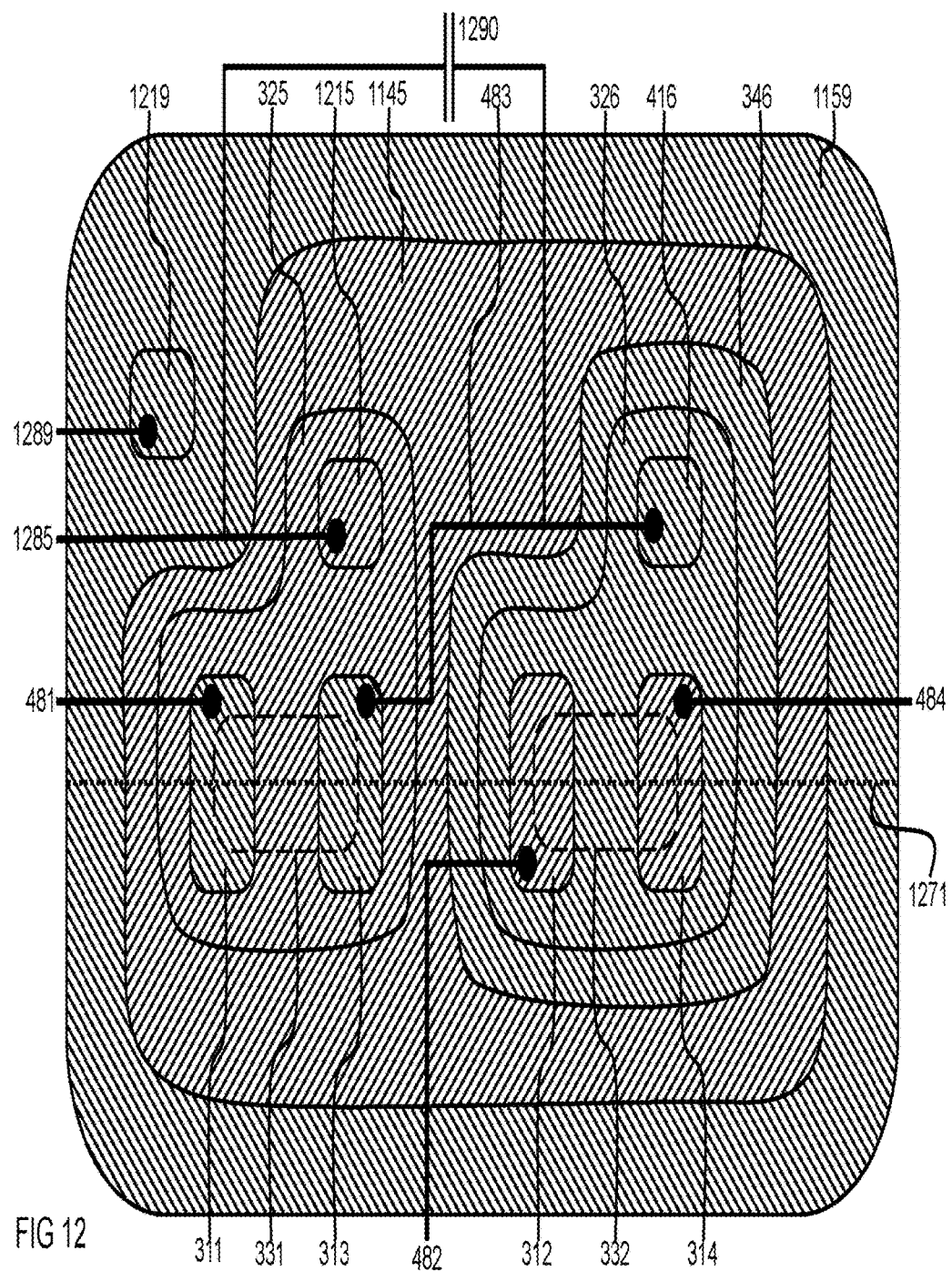
FIG. 12 illustrates an embodiment of the invention corresponding to the schematic layout of the semiconductor logic element according to FIG. 11.

FIG. 12 illustrates an embodiment of the invention corresponding to a schematic layout of a semiconductor logic element and FIG. H illustrates a schematic cross-section of the semiconductor logic element along the dashed line 1271 of FIG. 12. The semiconductor logic element of FIGS. 11 and 12 is based on the lateral wrap-around gate JFET arrangement of FIGS. 3 and 4 as well as on the encapsulation of the first conductivity type lower gate doping 346 inside the second conductivity type lower gate doping 1145 and on the application of the insulating well doping 1159 as explained according to FIGS. 19 and 20. The first gate comprises the second conductivity type lower gate doping 1145, the second conductivity type upper gate doping 325, and a second conductivity type contact doping 1215. The second gate comprises the first conductivity type lower gate doping 346, the first conductivity type upper gate doping 326, and the first conductivity type contact doping 416. The input comprises the first gate and associated wiring 1285. The internal node comprises the first conductivity type first drain doping 313, the first conductivity type second gate, and associated wiring 483. The first conductivity type first channel doping 331 is located between the first conductivity type first source doping 311 and the first conductivity type first drain doping 313. The second conductivity type second channel doping 332 is located between the second conductivity type second source doping 312 and the second conductivity type second drain doping 314. Between the input and the internal node there is an optional 'drag-along' plate capacitor 1290.

The operation principle of the semiconductor logic element of FIGS. 11 and 12 is very similar as the operation principle of the semiconductor logic element of FIGS. 3 and 4 and it is compatible to MSCL along the lines as presented in FIGS. 25-30. The semiconductor logic element of FIGS. 11 and 12 is also compatible to CS logic.

Figure 13:
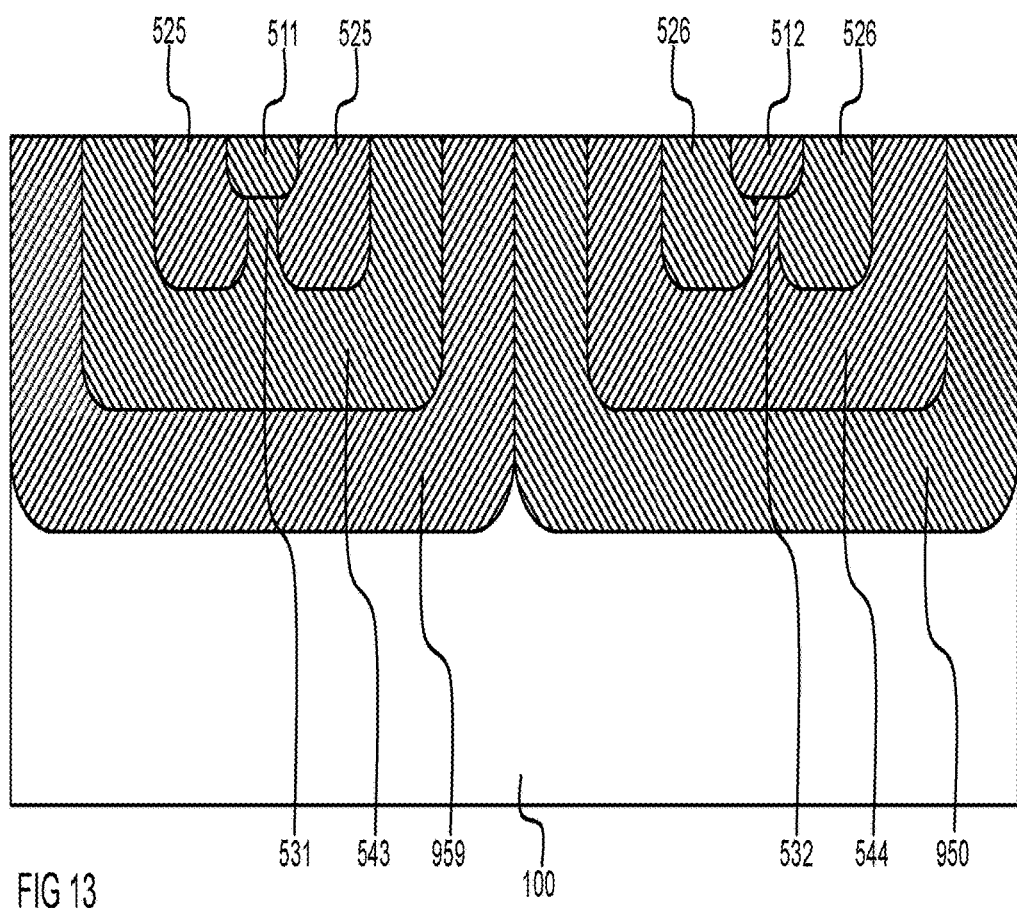
FIG. 13 illustrates an embodiment of the invention corresponding to a schematic cross-section of a semiconductor logic element.
Figure 14:
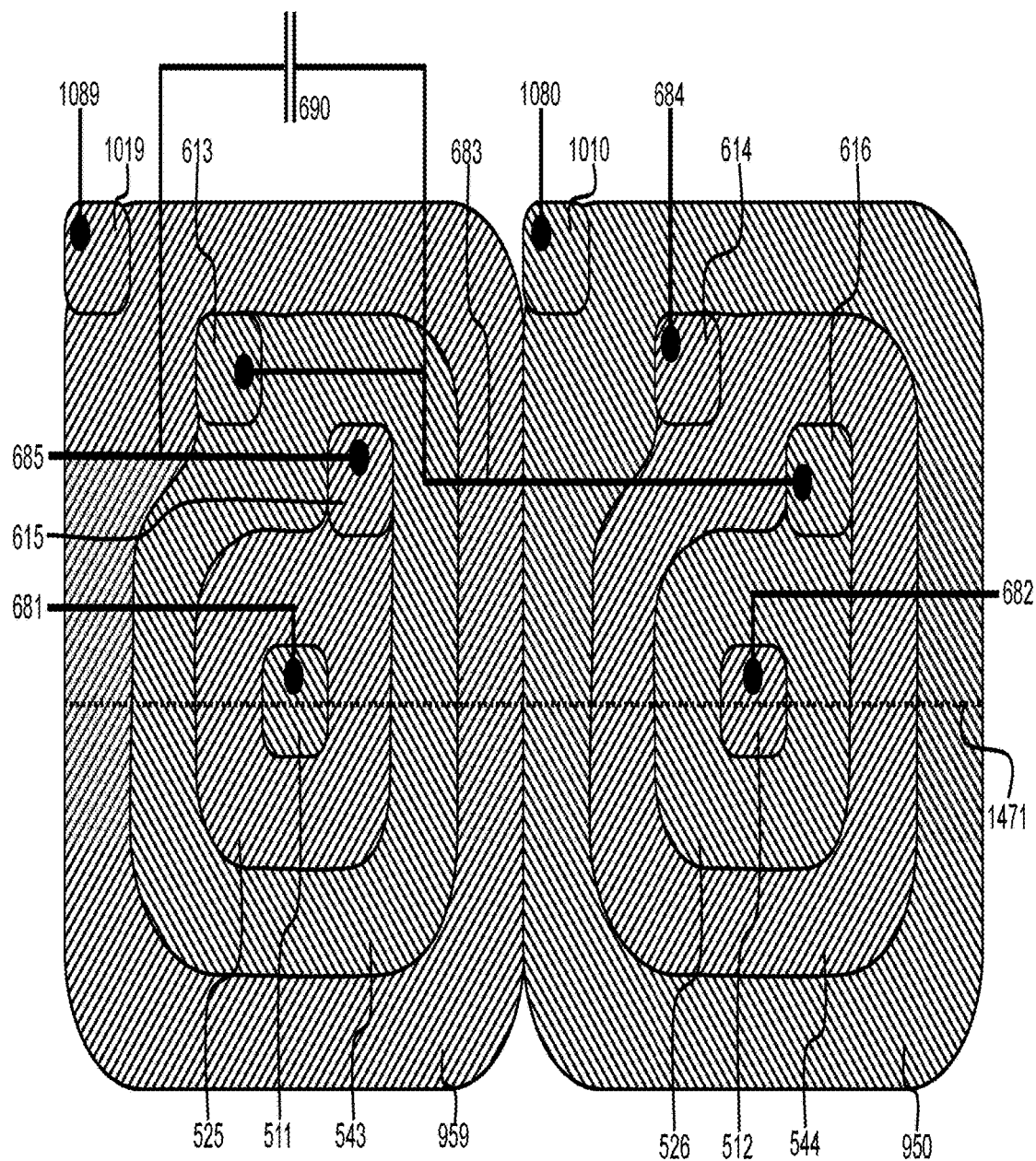
FIG. 14 illustrates an embodiment of the invention corresponding to the schematic layout of the semiconductor logic element according to FIG. 13.

FIG. 14 illustrates an embodiment of the invention corresponding to a schematic layout of a semiconductor logic element and FIG. 13 illustrates a schematic cross-section of the semiconductor logic element along the dashed line 1471 of FIG. 14. The semiconductor logic element of FIGS. 13 and 14 is based on the perpendicular wrap-around gate JFET arrangement of FIGS. 5 and 6 as well as on the insulating well dopings 950 and 959 as explained according to FIGS. 17 and 18 the only exception being in this case that the well dopings 950 and 959 enclose the first and second drain and not the back-gate dopings being part of first and second gate. The operation principle of the semiconductor logic element of FIGS. 13 and 14 is the same as the operation principle of the semiconductor logic element of FIGS. 5 and 6. The semiconductor logic element according to FIGS. 13 and 14 is compatible to MSCL and CS logic.

Figure 15:
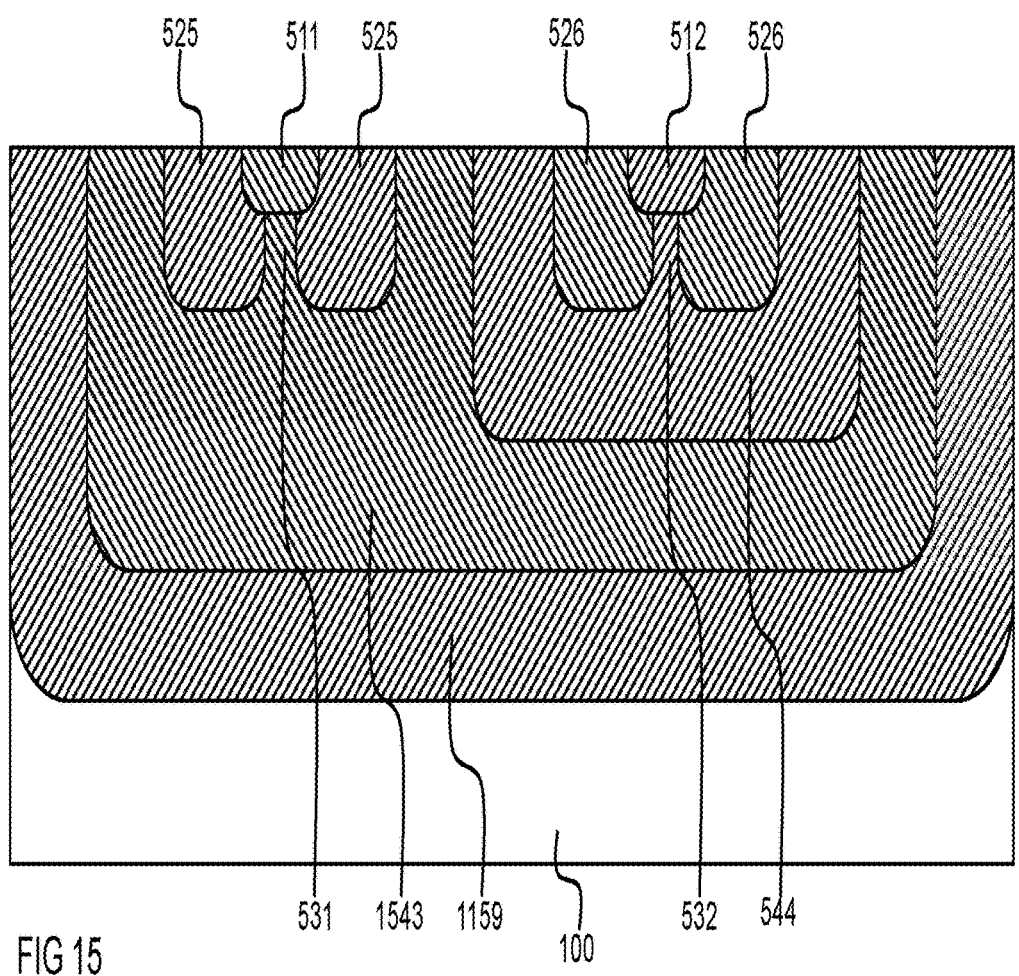
FIG. 15 illustrates an embodiment of the invention corresponding to a schematic cross-section of a semiconductor logic element.
Figure 16:
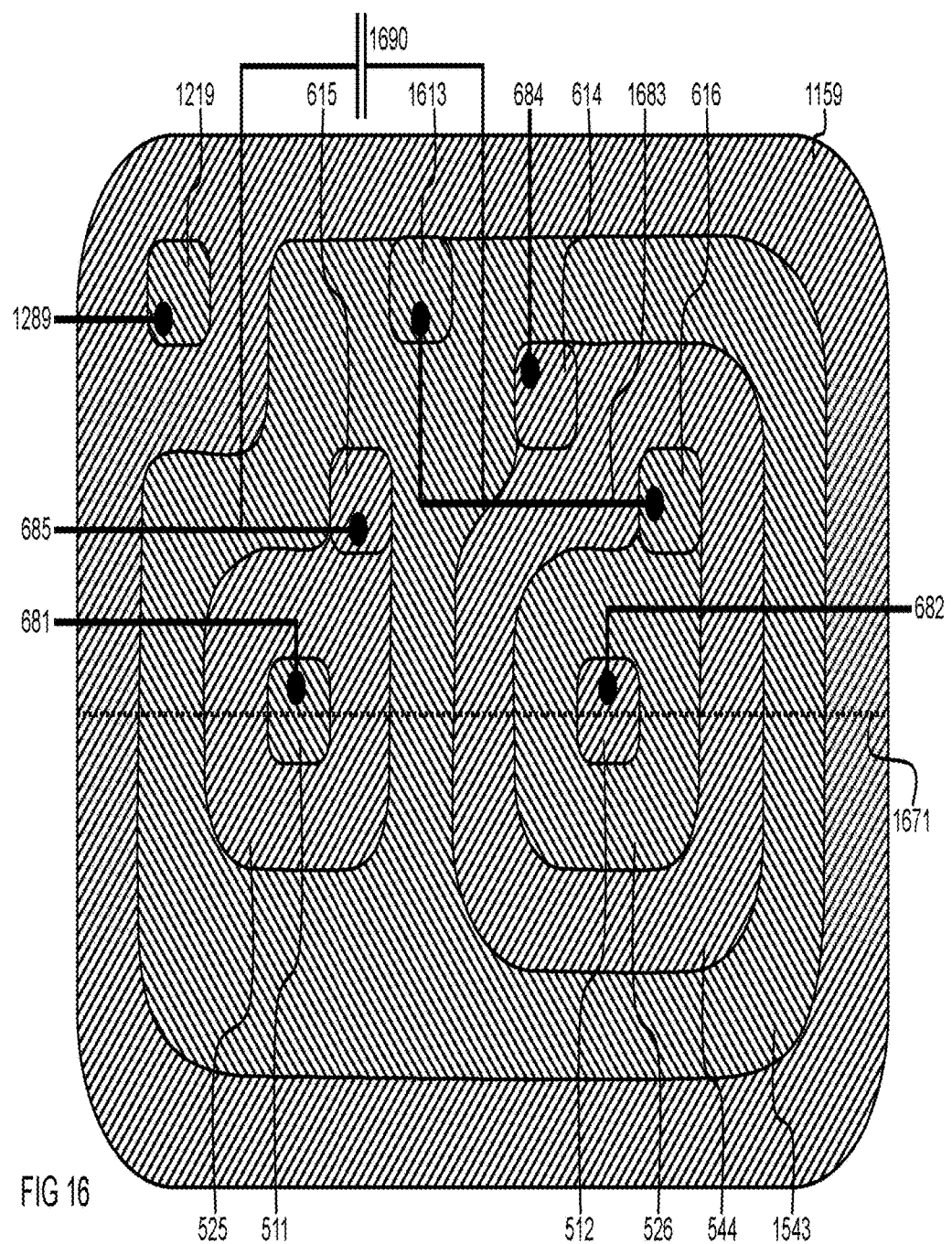
FIG. 16 illustrates an embodiment of the invention corresponding to the schematic layout of the semiconductor logic element according to FIG. 15.

FIG. 16 illustrates an embodiment of the invention corresponding to a schematic layout of a semiconductor logic element and FIG. 15 illustrates a schematic cross-section of the semiconductor logic element along the dashed line 1671 of FIG. 16. The first drain comprises the first conductivity type drain doping 1543 and the first conductivity type contact doping 1613. The second drain comprises the second conductivity type drain doping 544 and the second conductivity type contact doping 1614. The semiconductor logic element of FIGS. 15 and 16 is based on the perpendicular wrap-around gate JFET arrangement of FIGS. 5 and 6 as well as on the encapsulation of the second drain inside the first conductivity type drain doping 1543 and on the application of the first conductivity type insulating well doping 1159 along the lines explained according to FIGS. 19 and 20. The internal node comprises the first drain, the second gate, and associated wiring 1683. Between the internal node and the input there is an optional 'drag-along' plate capacitor 1690. The operation principle of the semiconductor logic element of FIGS. 15 and 16 is very similar to the operation principle of the semiconductor logic element of FIGS. 5 and 6. The semiconductor logic elements of FIGS. 15 and 16 are compatible to MSCL and CS logic.

Figure 41:
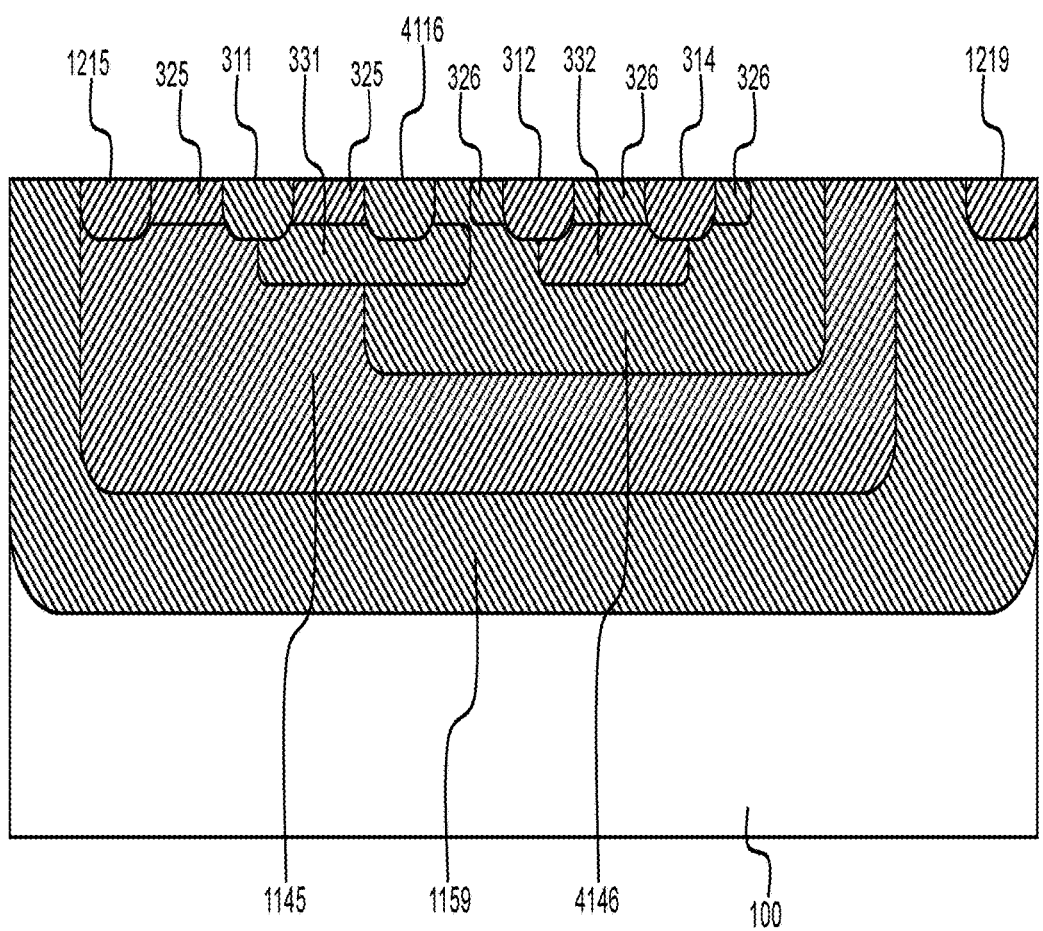
FIG. 41 illustrates an embodiment of the invention corresponding to a schematic cross-section of a semiconductor logic element.
Figure 42:
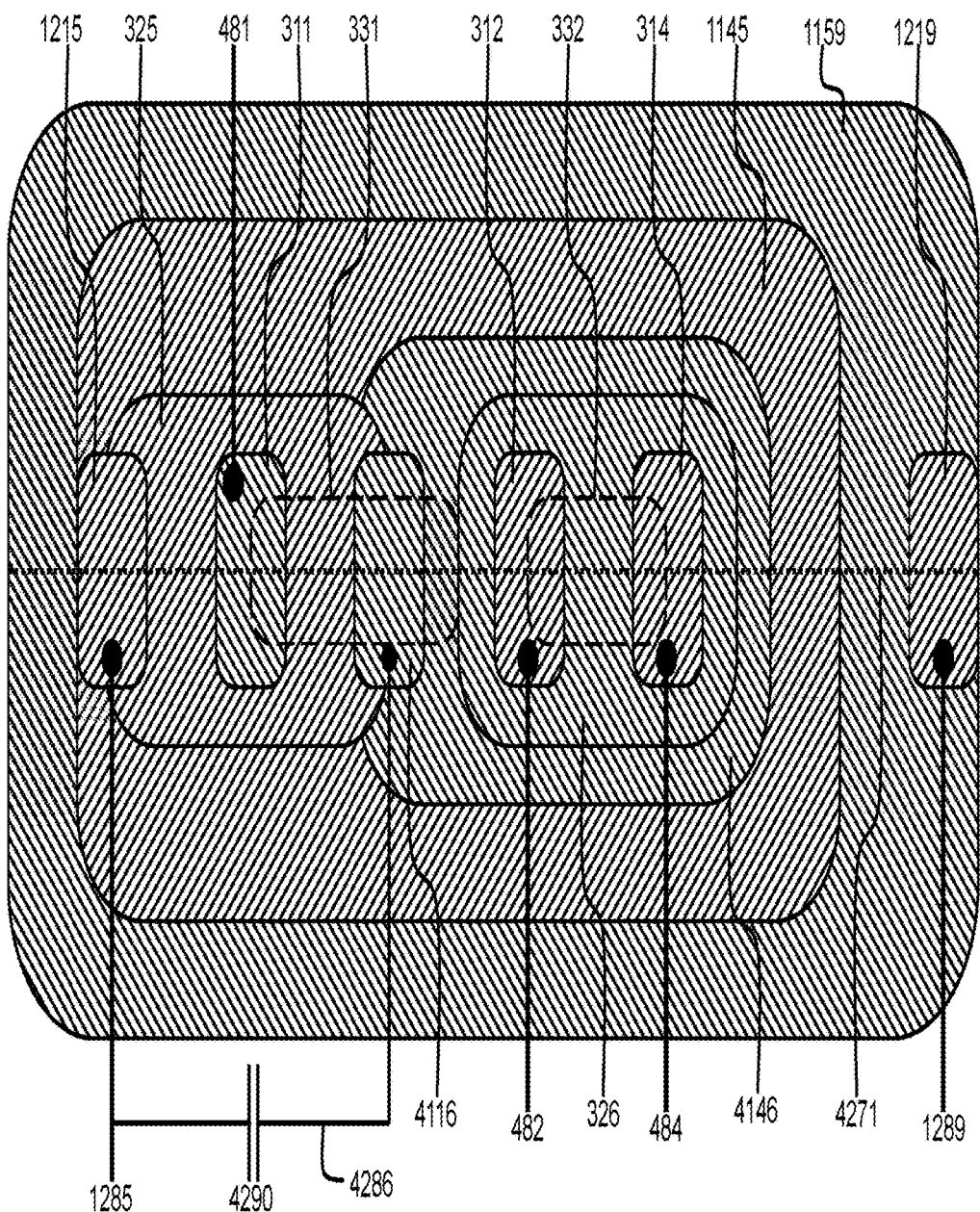
FIG. 42 illustrates an embodiment of the invention corresponding to the schematic layout of the semiconductor logic element according to FIG. 41.

FIG. 42 illustrates an embodiment of the invention corresponding to a schematic layout of a semiconductor logic element and FIG. 41 illustrates a schematic cross-section of the semiconductor logic element along the dashed line 4271 of FIG. 42. FIGS. 41 and 42 correspond to a slightly altered version of the semiconductor logic element of FIGS. 11 and 12 wherein the first conductivity type first drain and first conductivity type second gate have been fused together into one single entity forming the internal node and comprising a first conductivity type doped region. The said first conductivity type doped region comprises a first conductivity type doping 326 controlling/confining the second channel from above as well as a first conductivity type doping 4146 controlling/confining the second channel from below. This internal node arrangement means that a wiring is not required to contact the first drain and the second gate together since the first drain and the second gate are not formed of separate doped regions. Despite the different internal node arrangement the semiconductor logic element of FIGS. 41 and 42 operates similarly than the semiconductor logic element of FIGS. 11 and 12 and it is compatible to MSCL and CS logic.

In FIGS. 41 and 42 the internal node may comprise an optional first conductivity type contact doping 4116 and optional wiring 4286. The optional wiring is needed in case an optional 'drag-along' plate capacitor 4290 is utilized between the internal node and the input.

Figure 43:
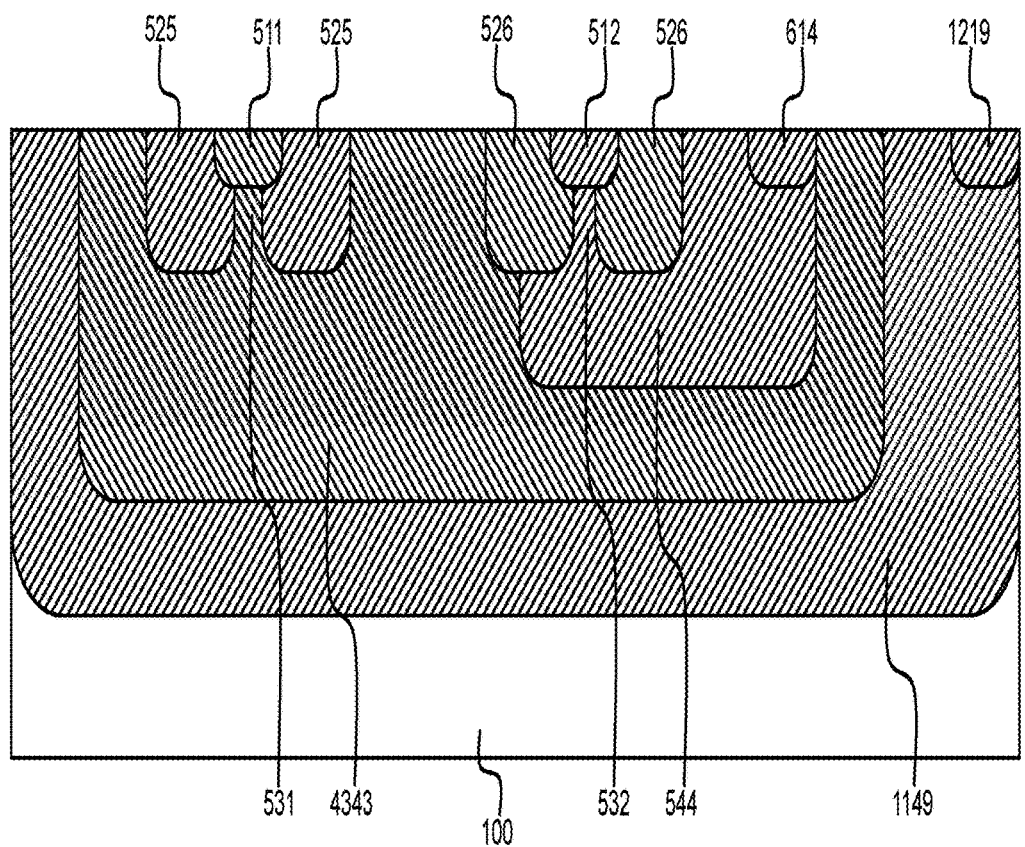
FIG. 43 illustrates an embodiment of the invention corresponding to a schematic cross-section of a semiconductor logic element.
Figure 44:
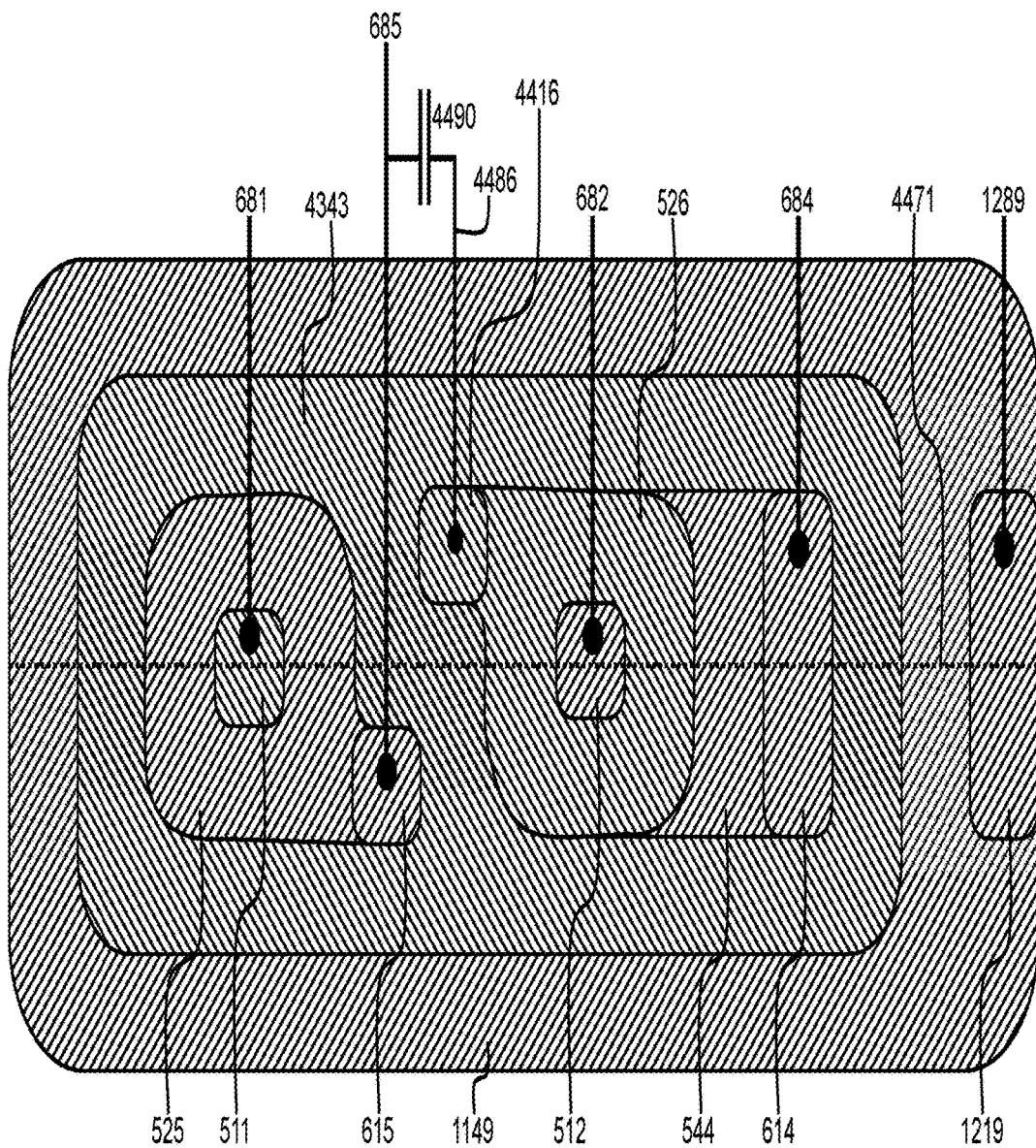
FIG. 44 illustrates an embodiment of the invention corresponding to the schematic layout of the semiconductor logic element according to FIG. 43.

FIG. 44 illustrates an embodiment of the invention corresponding to a schematic layout of a semiconductor logic element and FIG. 43 illustrates a schematic cross-section of the semiconductor logic element along the dashed line 4471 of FIG. 44. FIGS. 43 and 44 correspond to a slightly altered version of the semiconductor logic element of FIGS. 15 and 16 wherein the first conductivity type first drain and first conductivity type second gate have been fused together into one single entity forming the internal node and comprising a first conductivity type doped region. The said first conductivity type doped region comprises a first conductivity type drain doping 4343 as well as a first conductivity type gate doping 526 (in FIG. 43 the drain doping 4343 could be considered as the first drain and the gate doping 526 could be considered as the second gate). This internal node arrangement means that a wiring is not required to contact the first drain and the second gate together since the first drain and the second gate are not formed of separate doped regions. Despite the different internal node arrangement the semiconductor logic element of FIGS. 43 and 44 operates similarly than the semiconductor logic element of FIGS. 15 and 16.

In FIGS. 43 and 44 the internal node may comprise an optional first conductivity type contact doping 4416 and optional wiring 4486. The optional wiring is needed in case an optional 'drag-along' plate capacitor 4490 is utilized between the internal node and the input. The semiconductor logic elements of FIGS. 43 and 44 is compatible to MSCL and CS logic.

Figure 45:
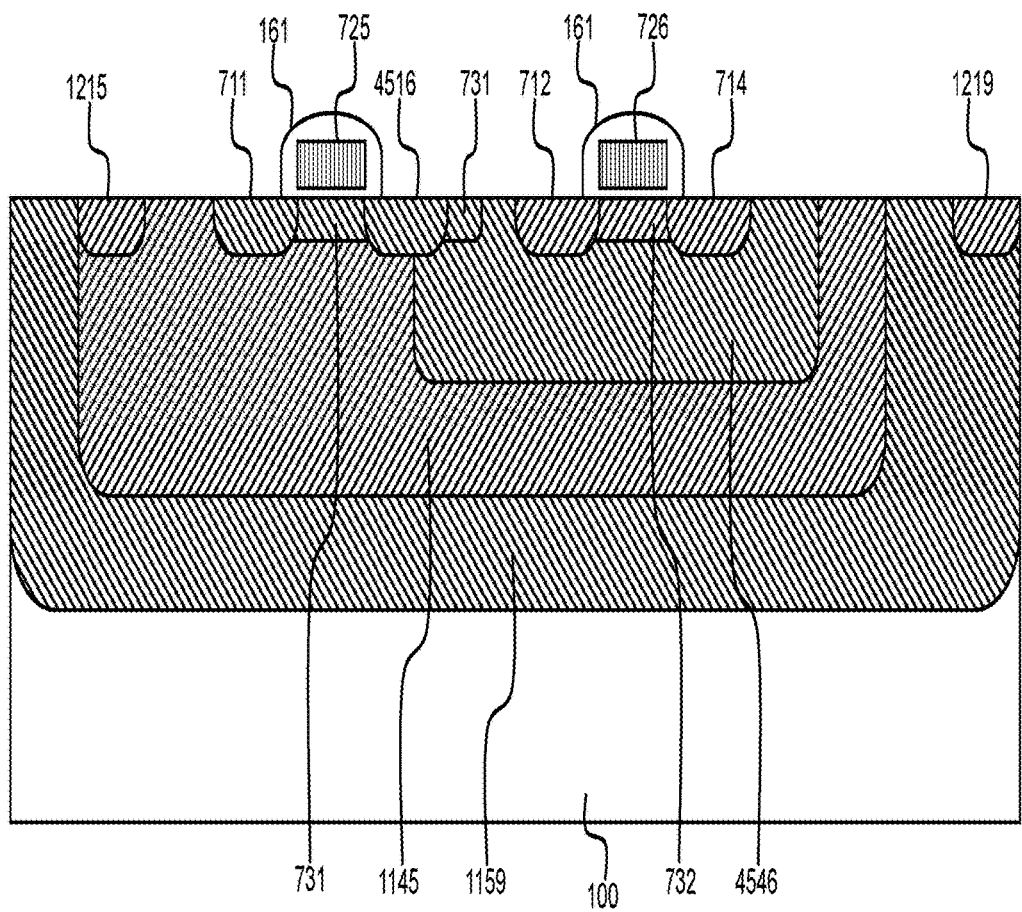
FIG. 45 illustrates an embodiment of the invention corresponding to a schematic cross-section of a semiconductor logic element.
Figure 46:
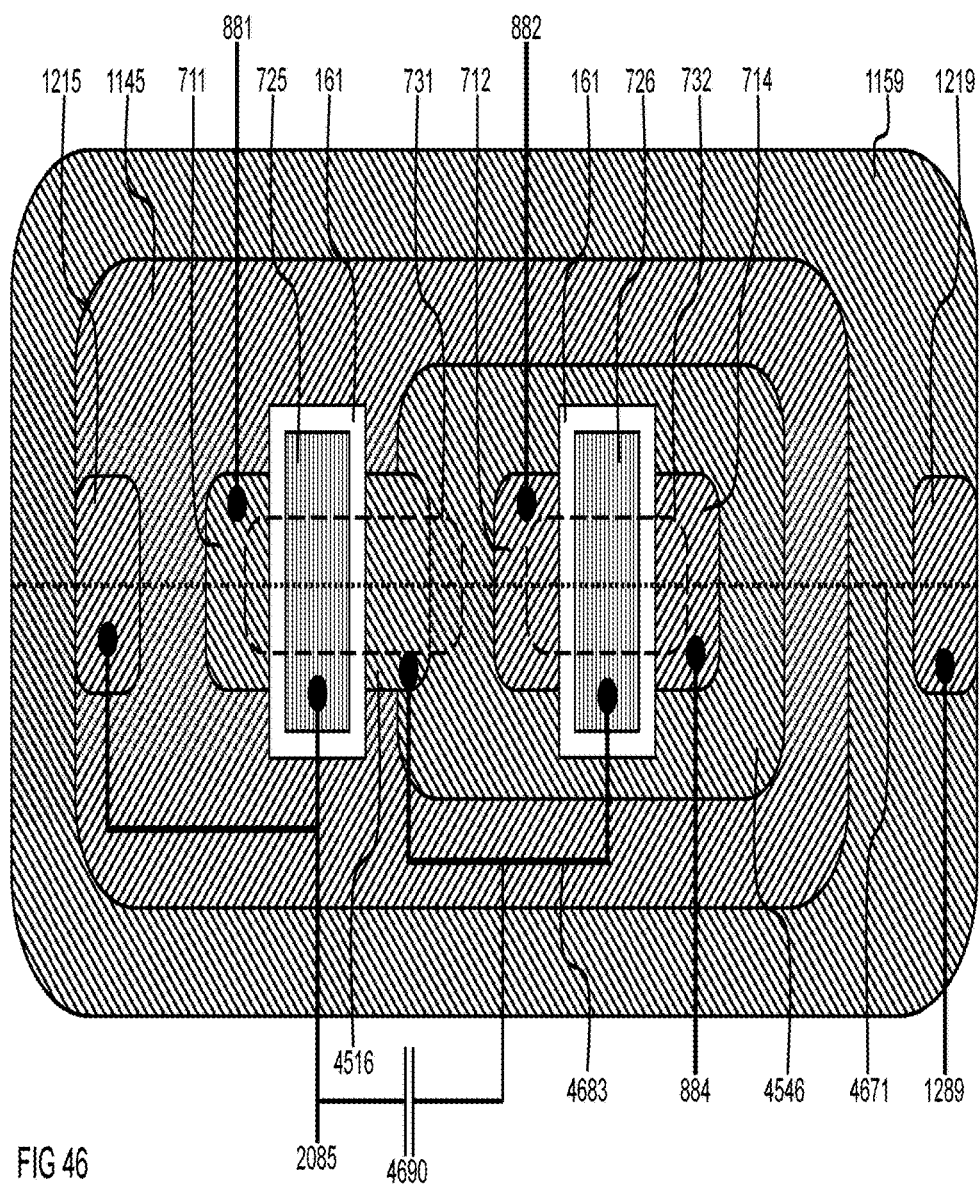
FIG. 46 illustrates an embodiment of the invention corresponding to the schematic layout of the semiconductor logic element according to FIG. 45.

FIG. 46 illustrates an embodiment of the invention corresponding to a schematic layout of a semiconductor logic element and FIG. 45 illustrates a schematic cross-section of the semiconductor logic element along the dashed line 4671 of FIG. 46. FIGS. 45 and 46 correspond to a slightly altered version of the semiconductor logic element of FIGS. 19 and 20 wherein the first conductivity type first drain and the first conductivity back-gate doping of second gate have been fused together into one single entity comprising a first conductivity type doped region. The said first conductivity type doped region comprises a first conductivity type well doping 4546 and a first conductivity type contact doping 4516, which act both as the first drain and as part of the second gate. The internal node comprises the well doping 4546, the contact doping 4516, the external gate 726, and associated wiring 4683. Despite the different internal node arrangement the semiconductor logic element of FIGS. 43 and 44 operates similarly than the semiconductor logic element of FIGS. 19 and 20. Between the internal node and the input there is an optional 'drag-along' plate capacitor 4290. The semiconductor logic element according to FIGS. 45 and 46 is applicable to MSCL and modified CCIS logic of the first kind.

Figure 47:
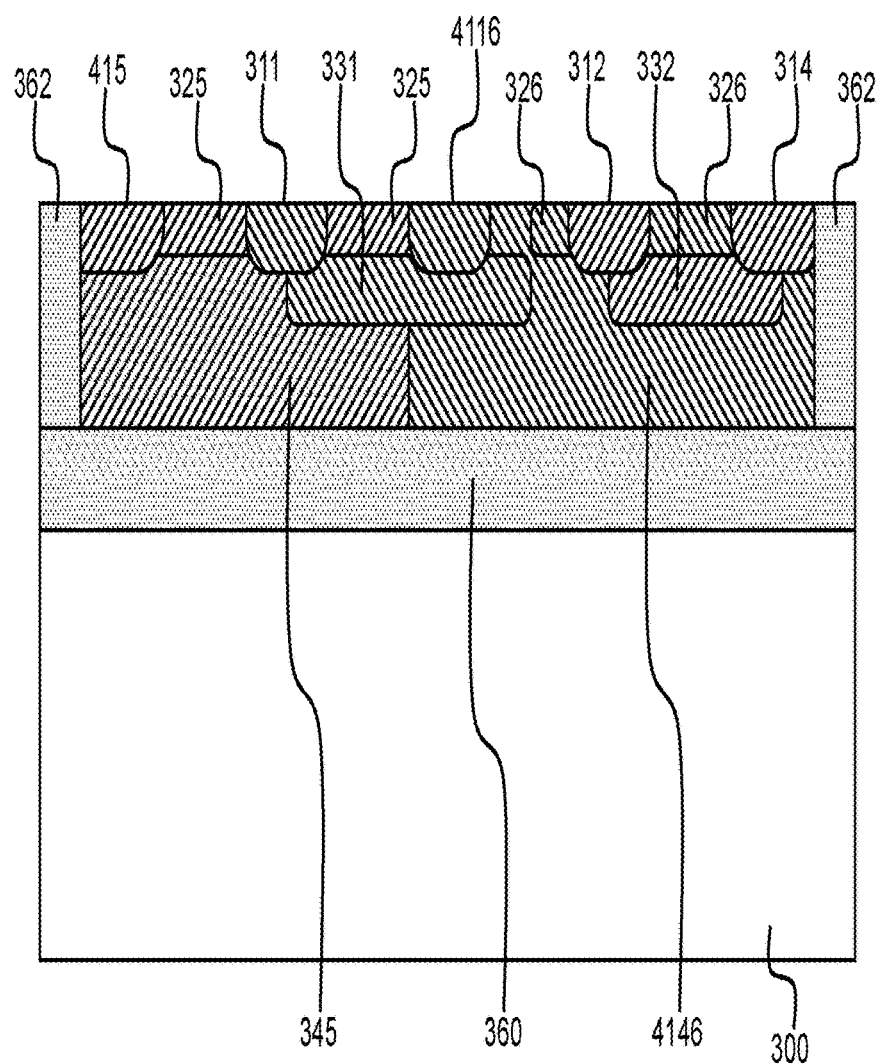
FIG. 47 illustrates an embodiment of the invention corresponding to a schematic cross-section of a semiconductor logic element.

FIG. 47 illustrates an embodiment of the invention corresponding to a schematic cross-section of the semiconductor logic element wherein the isolation well doping of FIGS. 41 and 42 has been replaced by a SOI structure and trenches. Otherwise the operation of the semiconductor logic element of FIG. 47 is similar than the operation of the semiconductor logic element of FIGS. 41 and 42. In particular, the first lower gate doping 345 and the first upper gate doping 325 form a single second conductivity type doped region surrounding the first channel doping 331 (which is located between the first source and first drain) at least from three different sides. Similarly, the second lower gate doping 346 and the second upper gate doping 326 form a single first conductivity type doped region surrounding the second channel doping 332 (which is located between the second source and the second drain) at least from three different sides. The semiconductor logic element according to FIG. 47 is compatible to MSCL and to CS logic.

Figure 48:
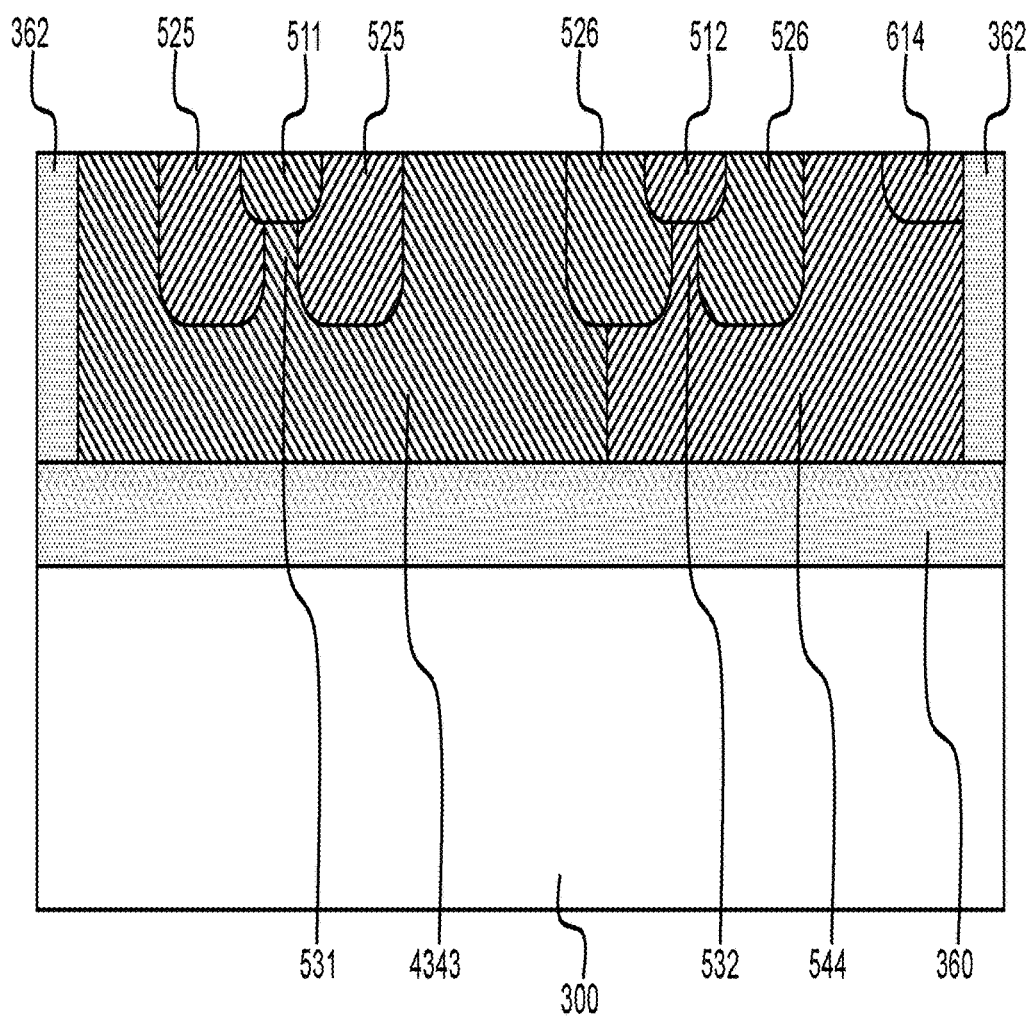
FIG. 48 illustrates an embodiment of the invention corresponding to a schematic cross-section of a semiconductor logic element.

FIG. 48 illustrates an embodiment of the invention corresponding to a schematic cross-section of the semiconductor logic element wherein the isolation well doping of FIGS. 43 and 44 has been replaced by a SOI structure and trenches. Otherwise the operation of the semiconductor logic element of FIG. 48 is similar than the operation of the semiconductor logic element of FIGS. 43 and 44. The semiconductor logic element according to FIG. 48 is compatible to MSCL and to CS logic.

Figure 49:
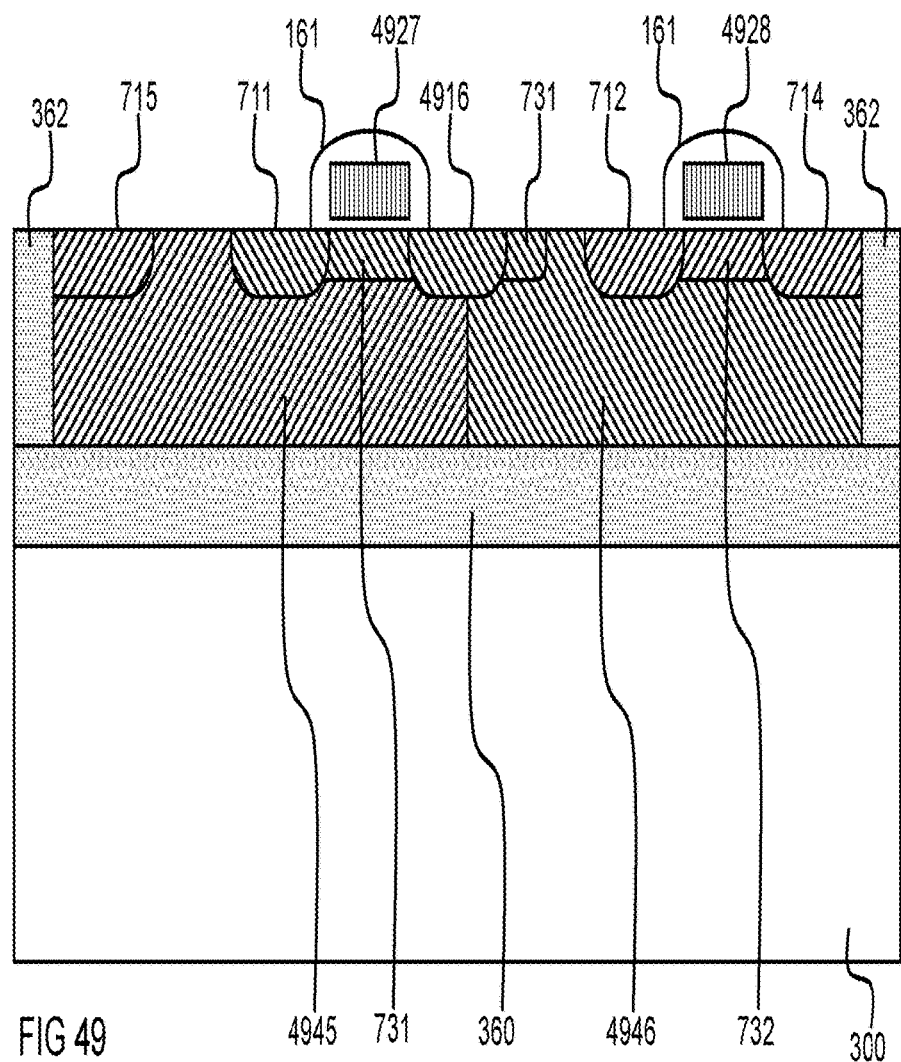
FIG. 49 illustrates an embodiment of the invention corresponding to a schematic cross-section of a semiconductor logic element.

FIG. 49 illustrates an embodiment of the invention corresponding to a schematic cross-section of the semiconductor logic element wherein the isolation well of FIGS. 45 and 46 has been replaced by a SOI structure and trenches. Furthermore, the semiconductor logic element of FIG. 49 comprises a first auxiliary gate and a second auxiliary gate. In the semiconductor logic element of FIG. 49 the first drain and the second gate have been fused together into one single entity forming the internal node and comprising a first conductivity type doped region. The said first conductivity type doped region comprises a first conductivity type doping 4946 acting both as the first drain and the second gate and an optional first conductivity type contact doping 4916. The first auxiliary gate comprises the first external gate 4927 and the second auxiliary gate comprises the second external gate 4928.

The first auxiliary gate node comprising the first auxiliary gate and associated wiring is preferably biased such that a second type inversion layer is formed at the semiconductor insulator interface beneath the first external gate 4927 irrespective of the fact whether the input (i.e. first gate) is at first or second input logic potential. In case the formation of a second type inversion layer is prevented by the formation of a second type layer of mobile second conductivity type charge carriers (hereinafter referred to as second type pinning layer) corresponding to interface states located in the forbidden gap then the first auxiliary gate node is preferably biased such that the second type pinning layer is established beneath the first external gate 4927 irrespective of the fact whether the input is at first or second input logic potential. The quasi Fermi level of the second type pinning layer will be at the same potential than the quasi Fermi level of the second type back-gate doping and thus in afore said biasing configuration the gate and the pinning layer will be at the same potential irrespective of the fact whether the input is at first or second input logic potential. In both cases the first auxiliary gate node should be biased with respect to the first source at a sufficiently larger reverse bias than the second input logic potential. When this condition is met then the first gate comprises the second conductivity type back-gate doping 4945, a corresponding second conductivity type contact doping 715, and afore said second type inversion layer or a second type pinning layer located beneath the first external gate 4927. This second type inversion layer or second type pinning layer controls/confines the first channel (formed of the first conductivity type channel doping 731) from above and the back-gate doping 4945 controls/confines the first channel from below. It has to be realized, however, that the second conductivity type first back-gate doping 4945 and the second type inversion layer or the second type pinning layer must be at electric contact together, which is enabled if the first back-gate doping surrounds the first conductivity type channel doping also from at least one horizontal direction, which is the case in the first FETs on the left side of FIGS. 51, 55, and 99. It should be noted also that the term 'mobile' in conjunction with charge carriers present in a pinning layer is relative to the time scale, to the depth of the energy states of the charge carriers in the pinning layer, and to the temperature.

The second auxiliary gate node comprising the second auxiliary gate and associated wiring is preferably biased such that a first type inversion layer or a first type pinning layer is formed at the semiconductor insulator interface beneath the second external gate 4928 irrespective of the fact whether the input is at first or second input logic potential. When this condition is met then the second gate comprises the first conductivity type doping 4946 and afore said first type inversion layer or first type pinning layer located beneath the second external gate 4928. This first type inversion layer or the first type pinning layer controls/confines the second channel (formed of the second conductivity type channel doping 732) from above and the first conductivity type doping 4946 controls/confines the second channel from below. It has to be realized, however, that the first conductivity type second back-gate doping 4946 and the first type inversion layer or the first type pinning layer must be at electric contact together, which is enabled if the second back-gate doping surrounds the first conductivity type channel doping also from at least one side (like is the case in the second FET on the right side of FIG. 99).

In case the interface is always locked at a certain bias with respect to the corresponding (later on referred to as the locking layer) gate (comprising the back-gate doping) one does actually not need the external gates corresponding to the auxiliary gates. Even in this case the both channels would be confined from above by the locking layer and from below by the back-gate doping 4945 or 4946.

In FIG. 49 the internal node may comprise an optional first conductivity type contact doping 4916 and optional wiring in case it is desired to utilize an optional 'drag-along' plate capacitor between the internal node and the input. It is, however, important to note that even though the semiconductor logic element of FIG. 49 comprises CIS structures (corresponding to external gates acting as auxiliary gates) no wiring is mandatory in the internal node and that the second channel is still controlled/confined at least from two sides. The semiconductor logic element according to FIG. 49 is compatible to MSCL and CCIS logic of the first kind. The benefit of the embodiment of the invention illustrated in FIG. 49 is that one can achieve very accurate control over both channels since the influence of variations in the gate insulator layer concerning insulator charge, k value, and thickness can be removed due to the fact that both in the first and second FET the interface is fixed at a certain bias with respect to the corresponding gate (due to the formation of the inversion, pinning, or a locking layer) irrespective of the potential on the gate. In the description of the semiconductor logic element of FIG. 31 the external gate arrangement of FIG. 49 is explained more rigorously, advantages are further highlighted, and alternative operation conditions are introduced.

Figure 31:
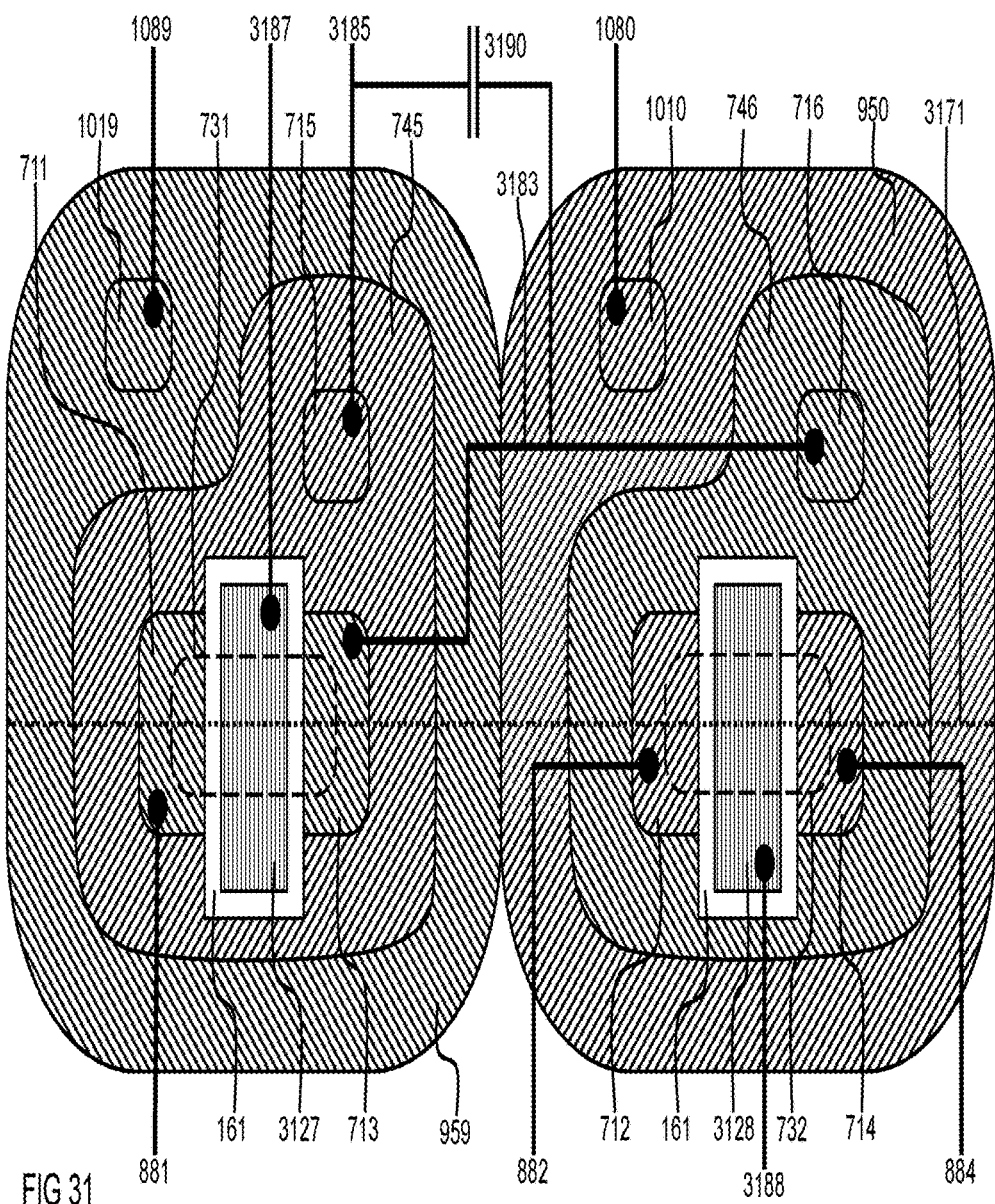
FIG. 31 illustrates an embodiment of the invention corresponding to a schematic layout of a semiconductor logic element.

FIG. 31 illustrates an embodiment of the invention corresponding to a schematic layout of a semiconductor logic element wherein a schematic cross-section of the semiconductor logic element along the dashed line 3171 corresponds to FIG. 17 with the exception that the external gates 725 and 726 have been replaced by the external gates 3127 and 3128. In FIG. 31 the first auxiliary gate node comprises the first external gate 3127 acting as the first auxiliary gate and the wiring 3187. Similarly the second auxiliary gate node comprises the second external gate 3128 acting as the second auxiliary gate and the wiring 3188. The first gate comprises the second conductivity type back-gate doping 745 and the second conductivity type contact doping 715. The first gate node (i.e. the input) comprises the first gate and associated wiring 3185. The second gate comprises the first conductivity type back-gate doping 746 and first conductivity type contact doping 716. The internal node comprises the first conductivity type first drain 713, the second gate, and associated wiring 3183. The first conductivity type first channel doping 731 is located between the first conductivity type first source doping 711 and the first conductivity type first drain doping 713. The second conductivity type second channel doping 732 is located between the second conductivity type second source doping 712 and the second conductivity type second drain doping 714. Between the first gate node and the internal node there is an optional 'drag-along' plate capacitor 3190.

In the semiconductor logic element of FIG. 31 it is possible to bias the first auxiliary gate node to sufficiently larger reverse bias than the second input logic potential with respect to the first source node (which is biased at first source potential) in order to create a second type inversion layer or a second type pinning layer at the semiconductor insulator interface beneath the external gate 3127 irrespective of the fact whether first input logic potential or second input logic potential is applied to the input. In a similar manner it is possible to bias the second auxiliary gate node to a sufficiently larger reverse bias than the first source potential with respect to the second source node (which is biased at first output logic potential) in order to create a first type inversion layer or first type pinning layer at the semiconductor insulator interface beneath the second external gate 3128 irrespective of the fact whether first input logic potential or second input logic potential is applied to the input.

It should be noted that in afore described biasing scheme the potential of the second type inversion layer or of the second type pinning layer in the first FET corresponds to the first gate potential (which is coupled via wiring to first or second input logic potential) and the potential of the first type inversion layer or of the first type pinning layer in the second FET corresponds to the potential of the second gate (being part of the internal node which is biased in the embodiment of FIG. 31 at first source potential or at first output logic potential due to clamping). Consequently, in afore said biasing scheme the first gate comprises also the second type inversion layer or the second type pinning layer beneath the first auxiliary gate meaning that the first channel is controlled/confined by the first gate at least from two sides (from above by the second type inversion or pinning layer and from below by the second conductivity type back-gate doping 745). Similarly, in afore said biasing scheme the second gate comprises also the first type inversion layer or the first type pinning layer beneath the second auxiliary gate meaning that the second channel is controlled/confined by the second gate at least from two sides (from above by the first type inversion or pinning layer and from below by the first conductivity type back-gate doping 746).

In afore described biasing scheme the potentials on the auxiliary gates have no influence on the channels as long as the channel is screened by the inversion layer or by the pinning layer and thus the term channel depth is utilized in this context (in case there were a locking layer at the interface the auxiliary gates would not be required, the locking layer would act as a part of the gate, and the term channel depth could be utilized). A beneficial property of afore described biasing scheme is that the channel depths depend only on the doping configuration of the channel doping layers (731; 732) and that the channel depths are always independent of variations on the insulator k value, on the amount of insulator charge, and on the insulator thickness (as long as the inversion layers and/or pinning layers are present) which is not the case in CISFET based traditional CCIS semiconductor logic elements. This fact enables more precise control of the channel depth in the modified CISFET based semiconductor logic element of FIG. 31 than what is the level of control over the threshold voltage in the traditional CISFET based semiconductor logic elements of FIGS. 1 and 2. A further benefit of the biasing scheme is that low k insulator is preferred underneath the auxiliary gates in order to reduce the capacitance whereas in the traditional CISFET based semiconductor logic elements exotic high k insulator material is preferred underneath the external gates in order to maximize the capacitance, but the high k insulator material complicates manufacturing. Another benefit of the biasing scheme is that one can utilize a lower quality gate insulator layer, which facilitates manufacturing (lower temperature can be utilized reducing the thermal budget). Yet another benefit of the biasing scheme is that radiation induced damage in the gate insulator layer (e.g. build up of insulator charge) does not affect device operation.

The semiconductor logic element of FIG. 31 is applicable to MSCL and modified CCIS logic of the first kind (the latter is due to clamping of the internal node). Based on afore said the modified CCIS logic of first kind according to FIG. 31 can withstand very high amount of radiation damage without affecting device operation (e.g. the channel depth is not altered and thus there will be no threshold voltage shift either in the first FET or in the second FET). However, the radiation hardness of the modified CCIS logic of the first kind according to FIG. 31 is not as good as in the previously introduced CS logic.

In case the first auxiliary gate node is biased such that there is no second type inversion layer or second type pinning layer present throughout the full operation range of the first gate node (i.e. the input) from first input logic potential to second input logic potential then the first gate node has poorer control over the first channel at potentials when the second type inversion layer or second type pinning layer is not present beneath the first external gate 3127. In this case the term threshold voltage is used with reference to the first channel instead of the term channel depth throughout the operation range when the second type inversion layer or second type pinning layer is not present beneath the first auxiliary gate. The reason for the poorer control is that when the second type inversion layer or second type pinning layer is not anymore present the first gate does not anymore control/confine the first channel from above. Furthermore, in case the second auxiliary gate node is biased such that there is no first type inversion layer or first type pinning layer present throughout the full operation range of the internal node from first source potential to first output logic potential then the internal node has poorer control over the second channel at potentials when the first type inversion layer or first type pinning layer is not present. In this case the term threshold voltage is used with reference to the second channel instead of the term channel depth throughout the operation range when the first type inversion layer or first type pinning layer is not present beneath the second auxiliary gate. The bigger the fraction of the operation range not incorporating an inversion layer or pinning layer in first FET and/or second FET the bigger the potential differences between the first and second input logic potential, between the first and second output logic potential, as well as between the first output logic potential and the first source potential need to be in order to achieve a properly operating semiconductor logic element.

In case a suitable forward bias is applied to the first auxiliary gate node with respect to the first source node and first input logic potential is applied to the input then one would have mobile first conductivity type charge carriers both in the first conductivity type channel doping 731 and in a first type accumulation layer at the interface beneath the first auxiliary gate (assuming that no pinning or locking takes place). The problem would be in this case, however, that the potential difference between the first input logic potential and the second input logic potential would need to be substantial in order to provide the conductive and non-conductive operation stages for the first channel (i.e. the first type accumulation layer would have to be removed when input is at the second input logic potential).

In case a suitable forward bias is applied to the second auxiliary gate node with respect to the second source node (when biased at first output logic potential) and second input potential is applied to the input (i.e. the internal node comprising the second gate would be at first output logic potential) then one would have mobile second conductivity type charge carriers both in the second conductivity type channel doping 732 and in a second type accumulation layer beneath the second auxiliary gate. The potential difference between the first output logic potential and the first source potential would, however, need to be substantial in order to provide the conductive and nonconductive operation stages for the second channel (i.e. the second type accumulation layer would have to be removed when the input is at first input logic potential).

Furthermore, in case a sufficiently large forward bias is applied to the first auxiliary gate node with respect to the first source node it is actually possible to utilize a first channel corresponding to a surface channel and thus the first conductivity type channel doping 731 could be removed. In more general terms, one could actually transform a surface channel transistor to a depletion mode transistor by utilizing a forward bias value on the auxiliary gate (corresponding to the external gate) exceeding the threshold value. In the conductive stage the first channel corresponding to the surface channel would comprise a first type inversion layer incorporating mobile first conductivity type charge carriers. Although the high amount of mobile first conductivity type charge carriers in the inversion layer (corresponding to the surface channel at conductive stage) would provide higher conductivity and thus faster operation the surface channel would, however, be a less beneficial option since potential on the back-gate doping 745 would have a lesser effect on the conductance of the first channel, i.e., a considerably large potential difference between the second input logic potential and the first input logic potential would be required in order to provide the conductive and nonconductive operation stages for the first channel. The influence of the back-gate doping's potential on the surface channel can be improved by utilizing a thick gate insulator layer, but this would complicate manufacturing as well as reduce the amount of mobile charge carries in the inversion layer which could only be compensated by larger forward bias on the auxiliary gate (corresponding to the external gate).

Similarly, in case a sufficiently large forward bias is applied to the second auxiliary gate with respect to the second source it would be possible to remove the second conductivity type channel doping 732 and replace it with a second channel corresponding to a surface channel. In the conductive stage the second channel corresponding to the surface channel would comprise a second type inversion layer incorporating mobile second conductivity type charge carriers. However, a considerably large potential difference between the first output logic potential and the first source potential would be required in order to provide the conductive and nonconductive operation stages for the second channel.

Based on afore said according to the semiconductor logic element of FIG. 31 it is beneficial in MSCL to utilize as the first FET a first type depletion mode buried channel CISFET having throughout the operation range a second type inversion layer or a second type pinning layer at the semiconductor insulator interface beneath the first external gate 3127 corresponding to the first auxiliary gate. Similarly, it is beneficial in MSCL to utilize as the second FET a second type depletion mode buried channel CISFET having throughout the operation range a first type inversion layer or a first type pinning layer at the semiconductor insulator interface beneath the second external gate 3128 forming the second auxiliary gate. In order to fulfill these requirements the first conductivity type channel doping 731 and the second conductivity type channel doping 732 need to have a proper doping configuration and the first auxiliary gate node and the second auxiliary gate node must be properly biased. For example the first auxiliary gate node comprising the wiring 3187 could be connected to the complementary first source potential. It should be noted than one could also use an enhancement mode buried channel CISFET for the first and/or second FET if the band-gap width, channel depth, and temperature are appropriate. As already previously explained in case there is a locking layer present above a channel the corresponding auxiliary gate is naturally not required.

Figure 32:
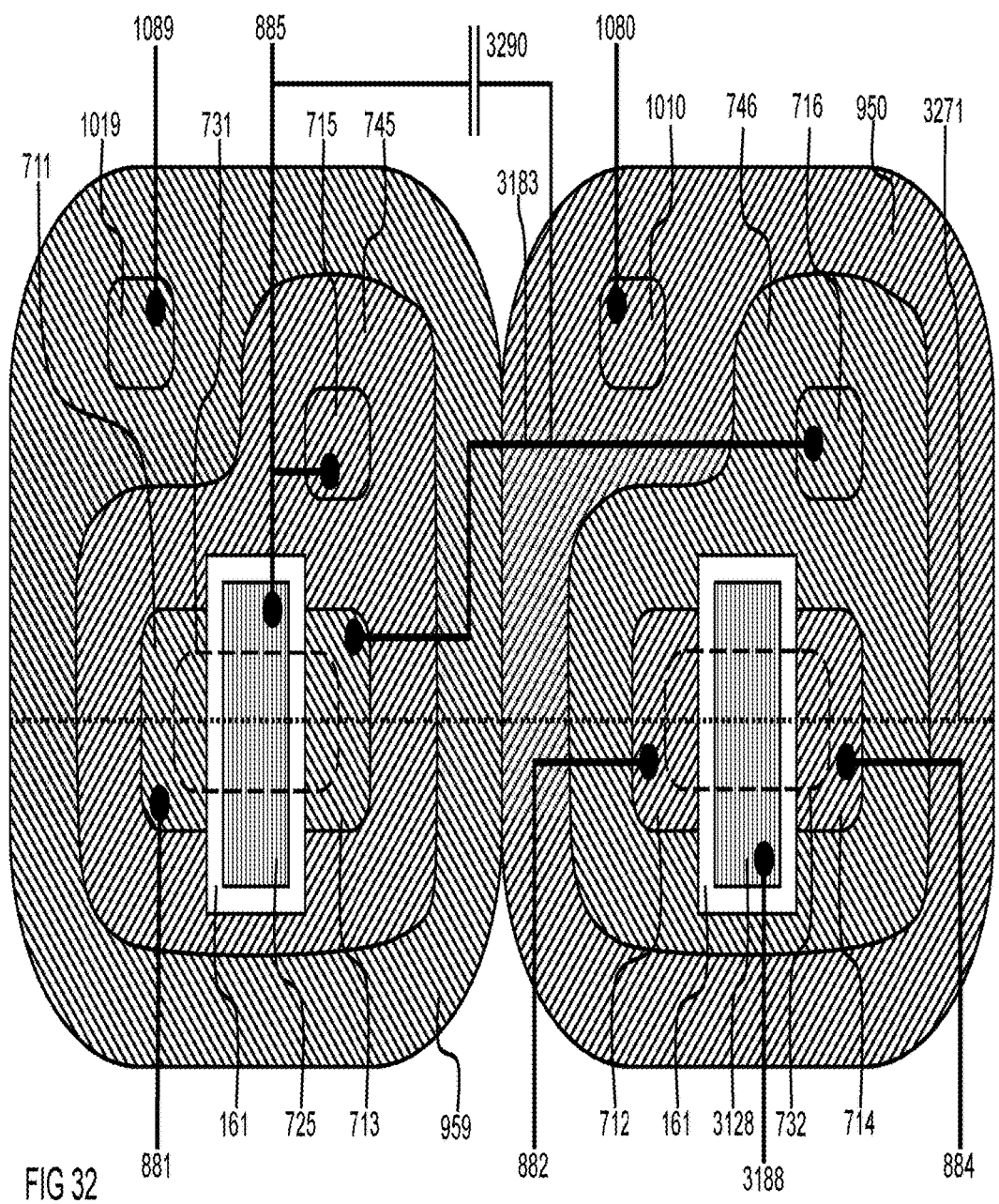
FIG. 32 illustrates an embodiment of the invention corresponding to a schematic layout of a semiconductor logic element.

FIG. 32 illustrates an embodiment of the invention corresponding to a schematic layout of a semiconductor logic element wherein a schematic cross-section of the semiconductor logic element along the dashed line 3271 corresponds to FIG. 17 with the exception that the second external gate 726 has been replaced by the second external gate 3128. In FIG. 32 there is only one auxiliary gate node comprising the wiring 3188 and the second external gate 3128 corresponding to the auxiliary gate. Between the input and the internal node there is an optional 'drag-along' plate capacitor 3290. In FIG. 32 the first FET on the left hand side and the operation of it corresponds to the first FET on the left hand side of FIGS. 17 and 18. Furthermore in FIG. 32 the second FET on the right hand side and the operation of it corresponds to the second FET on the right hand side of FIG. 31. The semiconductor logic element of FIG. 32 is applicable to MSCL and modified CCIS logic of the first kind. Based on the description according to FIGS. 17, 18, and 31 it is beneficial to use in the MSCL version of the semiconductor logic element of FIG. 32 depletion mode buried channel CISFETs as the first and second FET.

Figure 33:
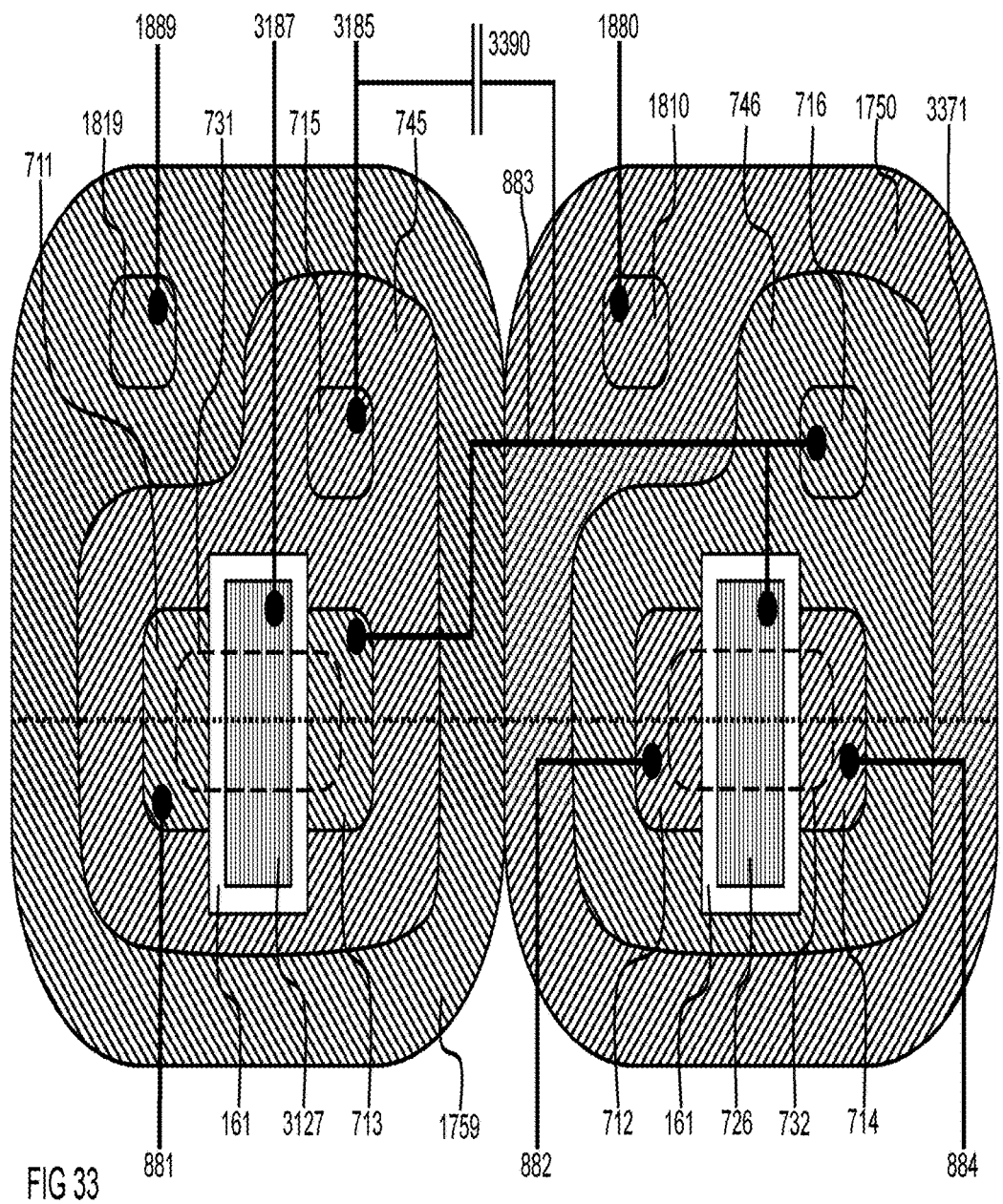
FIG. 33 illustrates an embodiment of the invention corresponding to a schematic layout of a semiconductor logic element.

FIG. 33 illustrates an embodiment of the invention corresponding to a schematic layout of a semiconductor logic element wherein a schematic cross-section of the semiconductor logic element along the dashed line 3371 corresponds to FIG. 17 with the exception that the first external gate 725 has been replaced by the first external gate 3127. In FIG. 33 there is only one auxiliary gate node comprising the wiring 3187 and the first external gate 3127 corresponding to the auxiliary gate. In between the input and the internal node there is an optional 'drag-along' plate capacitor 3390. In FIG. 33 the second FET on the right hand side and the operation of it corresponds to the second FET on the right hand side of FIGS. 17 and 18. Furthermore in FIG. 33 the first FET on the left hand side and the operation of it corresponds to the first FET on the left hand side of FIG. 31. The semiconductor logic element of FIG. 33 is applicable to MSCL and modified CCIS logic of the first kind. Based on the description according to FIGS. 17, 18, and 31 it is beneficial to use in the MSCL version of the semiconductor logic element of FIG. 33 depletion mode buried channel CISFETs as the first and second FET.

Figure 50:
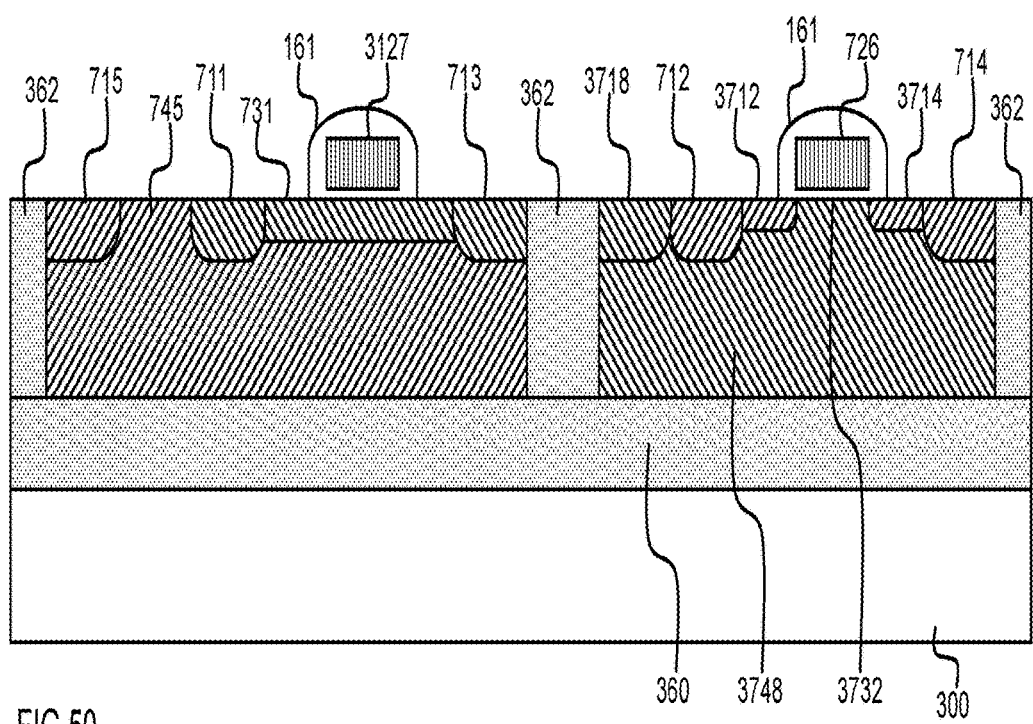
FIG. 50 illustrates an embodiment of the invention corresponding to a schematic cross-section of a semiconductor logic element.
Figure 51:
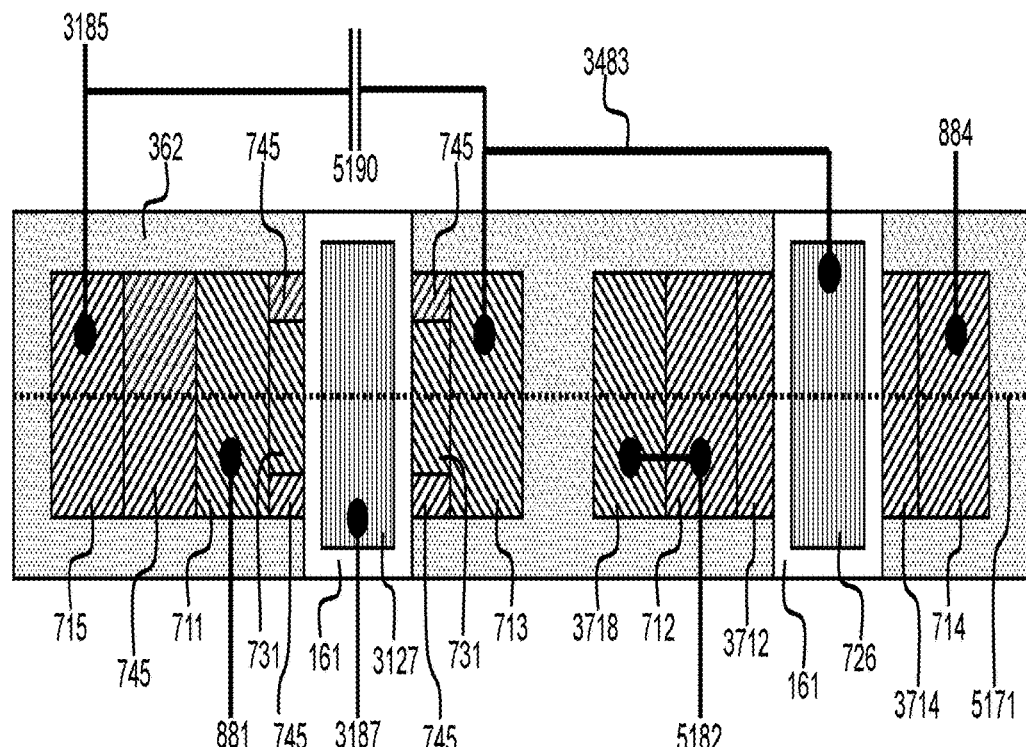
FIG. 51 illustrates an embodiment of the invention corresponding to the schematic layout of the semiconductor logic element according to FIG. 50.

FIG. 51 illustrates an embodiment of the invention corresponding to a schematic layout of a semiconductor logic element and FIG. 50 illustrates a schematic cross-section of the semiconductor logic element along the dashed line 5171 of FIG. 51. The first source node comprises the first conductivity source doping 711 and the wiring 881. The first gate comprises the second conductivity type back-gate doping 745 and the second conductivity type contact doping 715. The first gate node (i.e. the input) comprises the first gate and associated wiring 3185. The first auxiliary gate node comprises the wiring 3187 and the external gate 3127 corresponding to the first auxiliary gate. The internal node comprises the first conductivity type first drain doping 713, the external gate 726 corresponding to the second gate, and the wiring 3483. Between the input and the internal node there is an optional 'drag-along' plate capacitor 5190. The second source comprises the second conductivity type source doping 712. The second auxiliary gate comprises the first conductivity type back-gate doping 3748 and the first conductivity type contact doping 3718. The second source node comprises the second source, the second auxiliary gate, and associated wiring 5182, i.e. both the second source and the second auxiliary gate can be connected via the same wiring 5182 to first output logic potential. The second drain node (i.e. the output) comprises the second conductivity type drain doping 714 and the wiring 884. Since there is no gap between the heavily doped second conductivity type source doping 712 and the heavily doped first conductivity type contact doping 3718 the second source and the second auxiliary gate would be biased at the same potential irrespective of the fact whether the wiring 5182 is contacted to both of them or to either one of them. The first conductivity type first channel doping 731 is located between the first conductivity type first source doping 711 and the first conductivity type first drain doping 713. The surface channel 3732 is located between the second conductivity type second source extension doping 3712 and the second conductivity type second drain extension doping 3714.

In FIGS. 50 and 51 the second FET on the right hand side and the operation of it corresponds to the second FET on the right hand side of FIGS. 37 and 38. Furthermore in FIGS. 50 and 51 the first FET on the left hand side and the operation of it corresponds to the first FET on the left hand side of FIG. 31. The semiconductor logic element of FIGS. 50 and 51 is applicable to MSCL and to modified CCIS logic of the second kind. Based on the description according to FIG. 31 it is beneficial to use in the MSCL version of the semiconductor logic element of FIGS. 50 and 51 a depletion mode buried channel first type CISFET as the first FET as well as to have the first auxiliary gate node biased such that there exists throughout first gate node's operation range a second type inversion layer (or a second type pinning layer) at the semiconductor gate insulator interface beneath the first external gate 3127. Based on the description according to FIGS. 37 and 38 the second FET in FIGS. 50 and 51 is beneficially an enhancement mode surface channel second type CISFET.

In the semiconductor logic element of FIGS. 50 and 51 the first and second FET could be manufactured from different semiconductor materials. One could utilize a larger band gap semiconductor material for the first FET like for example Silicon, Silicon Carbide, or Gallium Arsenide. On the other hand, a smaller band gap semiconductor material could be utilized for the second FET like for example Germanium or Indium Gallium Arsenide. The benefit of this arrangement would be that one could combine fast operation and low power consumption. Besides the complementary first FET and the complementary second FET in the corresponding complementary semiconductor logic element could be made of yet another different set of semiconductor materials. It should be also noted that in the semiconductor logic elements of FIGS. 3-8, 23, 24, 37-40, 79, 80, and 88-97 it is also naturally possible to use different semiconductor materials for the first and second FET as well as for the complementary first and second FET in a corresponding complementary semiconductor logic element.

Figure 34:
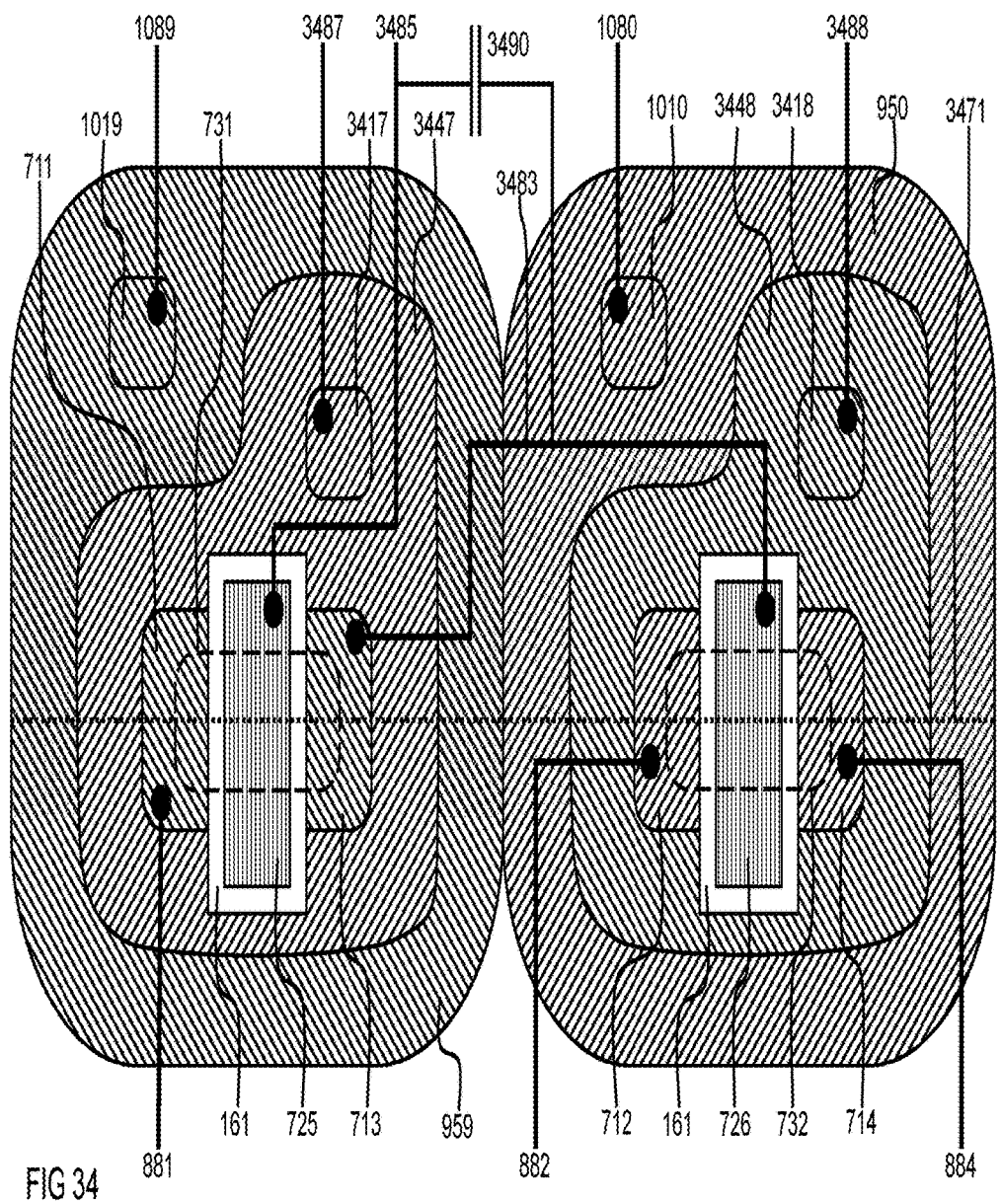
FIG. 34 illustrates an embodiment of the invention corresponding to a schematic layout of a semiconductor logic element.

FIG. 34 illustrates an embodiment of the invention corresponding to a schematic layout of a semiconductor logic element wherein a schematic cross-section of the semiconductor logic element along the dashed line 3471 corresponds to FIG. 17 with the exception that the back-gate dopings 745 and 746 have been replaced by the back-gate dopings 3447 and 3448. The first auxiliary gate comprises the second conductivity type contact doping 3417, and the second conductivity type back-gate doping 3447. The first auxiliary gate node comprises the wiring 3487 and the first auxiliary gate. The second auxiliary gate comprises the first conductivity type contact doping 3418 and the back-gate doping 3448. The second auxiliary gate node comprises the wiring 3488 and the second auxiliary gate. The first gate node (i.e. the input) comprises the external gate 725 acting as the first gate and the wiring 3485. The internal node comprises the first conductivity type first drain 713, the external gate 726 forming the second gate, and the wiring 3483. The second drain node (i.e. the output) comprises the second conductivity type drain doping 714 and the wiring 884. The first conductivity type first channel doping 731 is located between the first conductivity type first source doping 711 and the first conductivity type first drain doping 713. The second conductivity type second channel doping 732 is located between the second conductivity type second source doping 712 and the second conductivity type second drain doping 714. In between the first gate node and the internal node there is an optional 'drag-along' plate capacitor 3490. The semiconductor logic element of FIG. 34 are compatible to MSCL and CCIS logic of the second kind.

Figure 35:
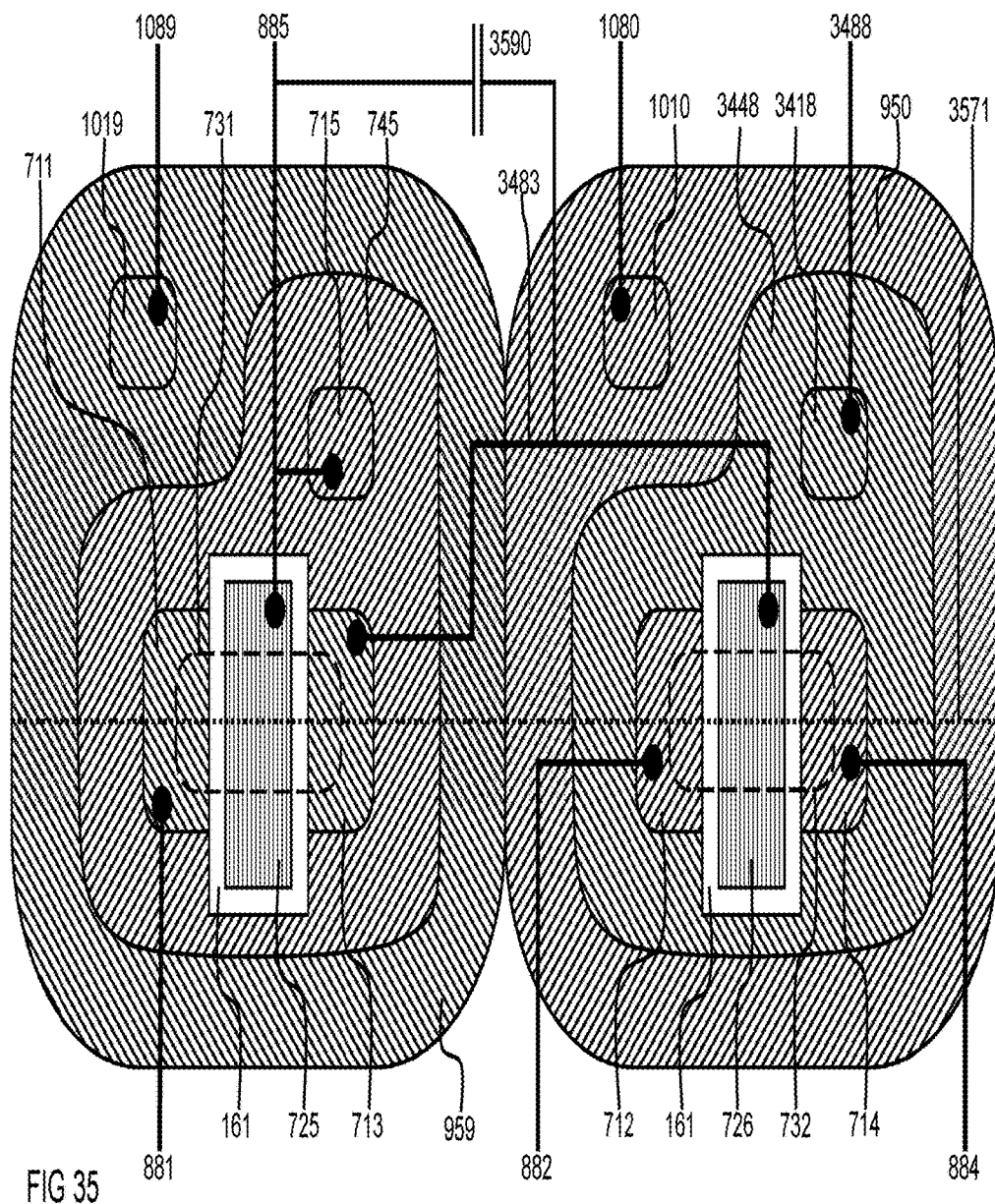
FIG. 35 illustrates an embodiment of the invention corresponding to a schematic layout of a semiconductor logic element.

FIG. 35 illustrates an embodiment of the invention corresponding to a schematic layout of a semiconductor logic element wherein a schematic cross-section of the semiconductor logic element along the dashed line 3571 corresponds to FIG. 17 with the exception that the back-gate doping 746 has been replaced by the back-gate doping 3448. The auxiliary gate comprises the first conductivity type contact doping 3418 and the back-gate doping 3448. The auxiliary gate node comprises the wiring 3488 and the auxiliary gate. In between the input and the internal node there is an optional 'drag-along' plate capacitor 3590. In FIG. 35 the first FET on the left hand side is the same as in FIGS. 17 and 18 the first FET on the left hand side. Furthermore in FIG. 35 the second FET on the right hand side is the same as in FIG. 34 the second FET on the right hand side. The semiconductor logic element of FIG. 35 is applicable to MSCL and modified CCIS logic of the second kind.

Figure 36:
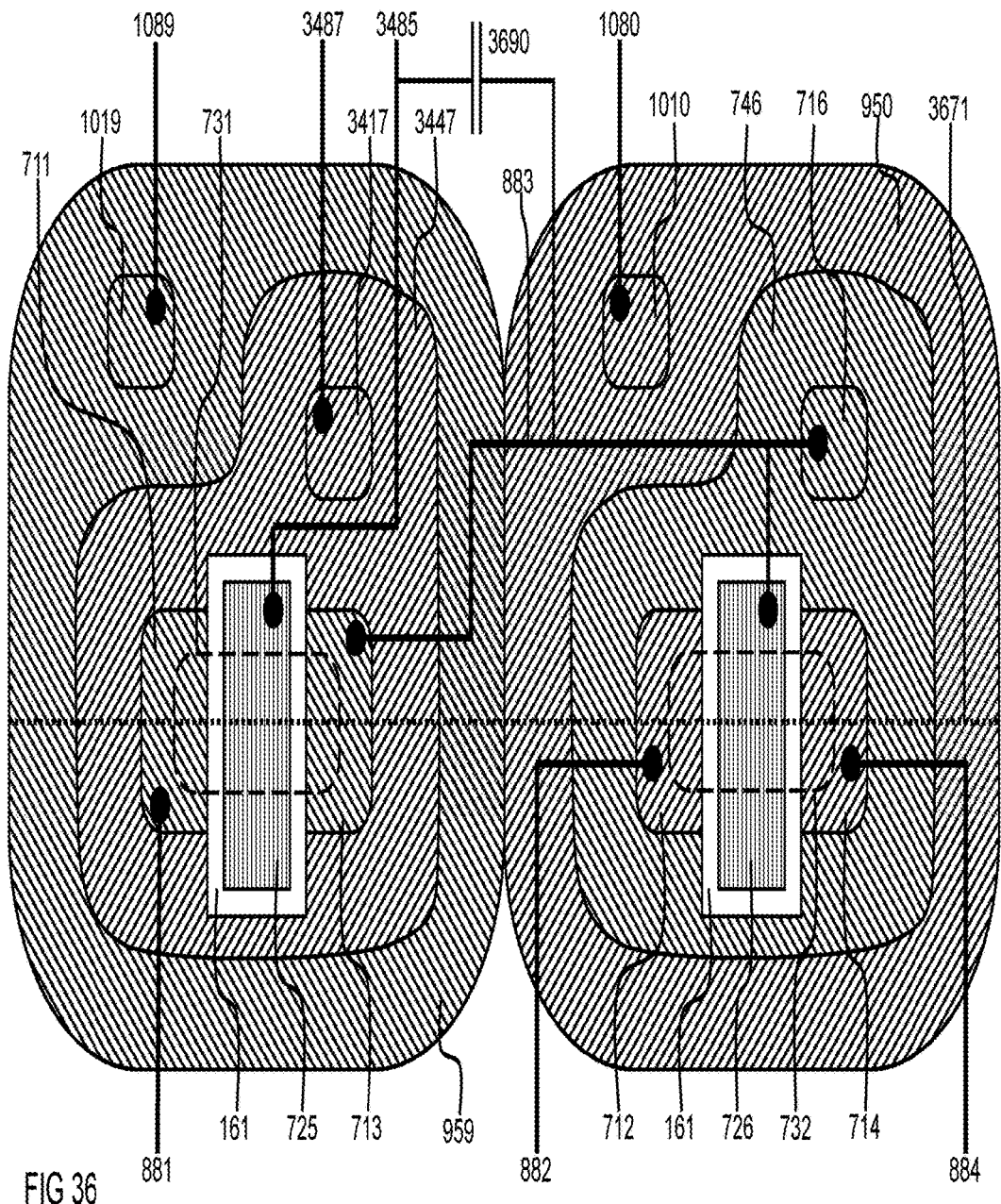
FIG. 36 illustrates an embodiment of the invention corresponding to a schematic layout of a semiconductor logic element.

FIG. 36 illustrates an embodiment of the invention corresponding to a schematic layout of a semiconductor logic element wherein a schematic cross-section of the semiconductor logic element along the dashed line 3671 corresponds to FIG. 17 with the exception that the back-gate doping 745 has been replaced by the back-gate doping 3447. The auxiliary gate comprises a first conductivity type contact doping 3417 and the back-gate doping 3447. The auxiliary gate node comprises the wiring 3487 and the second auxiliary gate. In between the input and the internal node there is an optional 'drag-along' plate capacitor 3690. In FIG. 36 the second FET on the right hand side is the same as in FIGS. 17 and 18 the second FET on the right hand side. Furthermore in FIG. 36 the first FET on the left hand side is the same as in FIG. 34 the first FET on the left hand side. The semiconductor logic element of FIG. 36 is applicable to MSCL and to modified CCIS logic of the first kind.

In FIG. 35 the first FET is preferably a depletion mode buried channel first type CISFET. In FIG. 36 the second FET is preferably a depletion mode buried channel second type CISFET. In FIGS. 34 and 35 one could actually remove the buried channel doping 732 in the second FET and use instead an enhancement mode surface channel second FET. In FIGS. 34 and 36 one could actually remove the buried channel doping 731 and use instead an enhancement mode surface channel first FET—this case is discussed more thoroughly in the description of FIGS. 79 and 80. One should also note that the embodiments of FIGS. 31-36 are based on the cross-section of the embodiment of FIG. 17 but they could be equally well be based on the cross-sections of other embodiments of the invention like e.g. the ones presented in FIGS. 7 and 19.

In the semiconductor logic elements of FIGS. 31-36 one could utilize the potential on the auxiliary gate nodes to adjust the threshold voltages (in the embodiments of FIGS. 31-33 this depends on the bias configuration of the auxiliary gates) of the first and/or second FET in the semiconductor logic element as well as the threshold voltages of the first and/or second FET in the corresponding complementary semiconductor logic element. In this manner it would be possible to use only one conductivity type channel doping for the same conductivity type FETs in the semiconductor logic element and in the corresponding complementary semiconductor logic element, i.e., it would be possible to utilize only two different transistors instead of four in order to create modified CCIS logic. Since the auxiliary gate corresponds in the embodiments of FIGS. 34-36 to the back-gate doping it is possible to influence the channel with the potential on the auxiliary gate irrespective of the fact whether the input is at first or second input logic potential and thus the term threshold voltage is utilized solely with respect to the embodiments of FIGS. 34-36, i.e. the term channel depth is not utilized in conjunction with the embodiments of FIGS. 34-36. A disadvantage related to the adjustment of the threshold voltage in the embodiments of FIGS. 34-36 is, however, that a gate based solely on an external gate controls/confines the channel only from one side having thus lesser influence on the channel. Yet another disadvantage related to the adjustment of the threshold voltage in the embodiments of FIGS. 34-36 is that after an inversion layer is formed at the interface beneath the external gate forming the first or second gate then the first or second gate has no more an influence on the threshold voltage.

Another way to achieve the same benefit of minimizing the amount of process steps in an embodiment featuring four different transistors would be to remove in the embodiments of FIGS. 34 and 35 the second channel doping 732 from the second FET and to utilize the second FET equipped with the channel doping only as the complementary first FET of the complementary semiconductor logic element. In a similar manner the channel doping could be removed from the complementary second FET in the complementary semiconductor logic element. In this manner four different FETs (two opposite type surface channel CISFETs and two buried channel CISFETs) would be generated with the amount of process steps corresponding to two different FETs.

Figure 23:
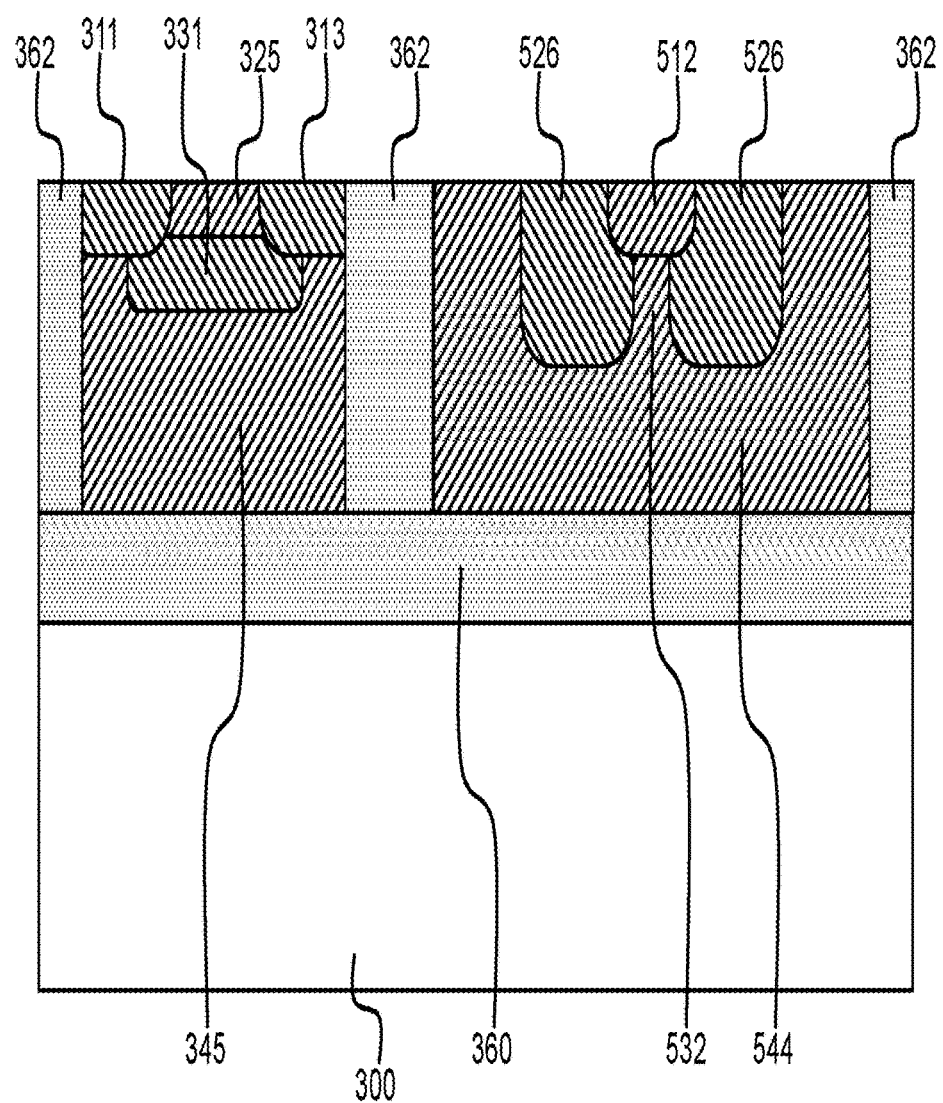
FIG. 23 illustrates an embodiment of the invention corresponding to a schematic cross-section of a semiconductor logic element.
Figure 24:
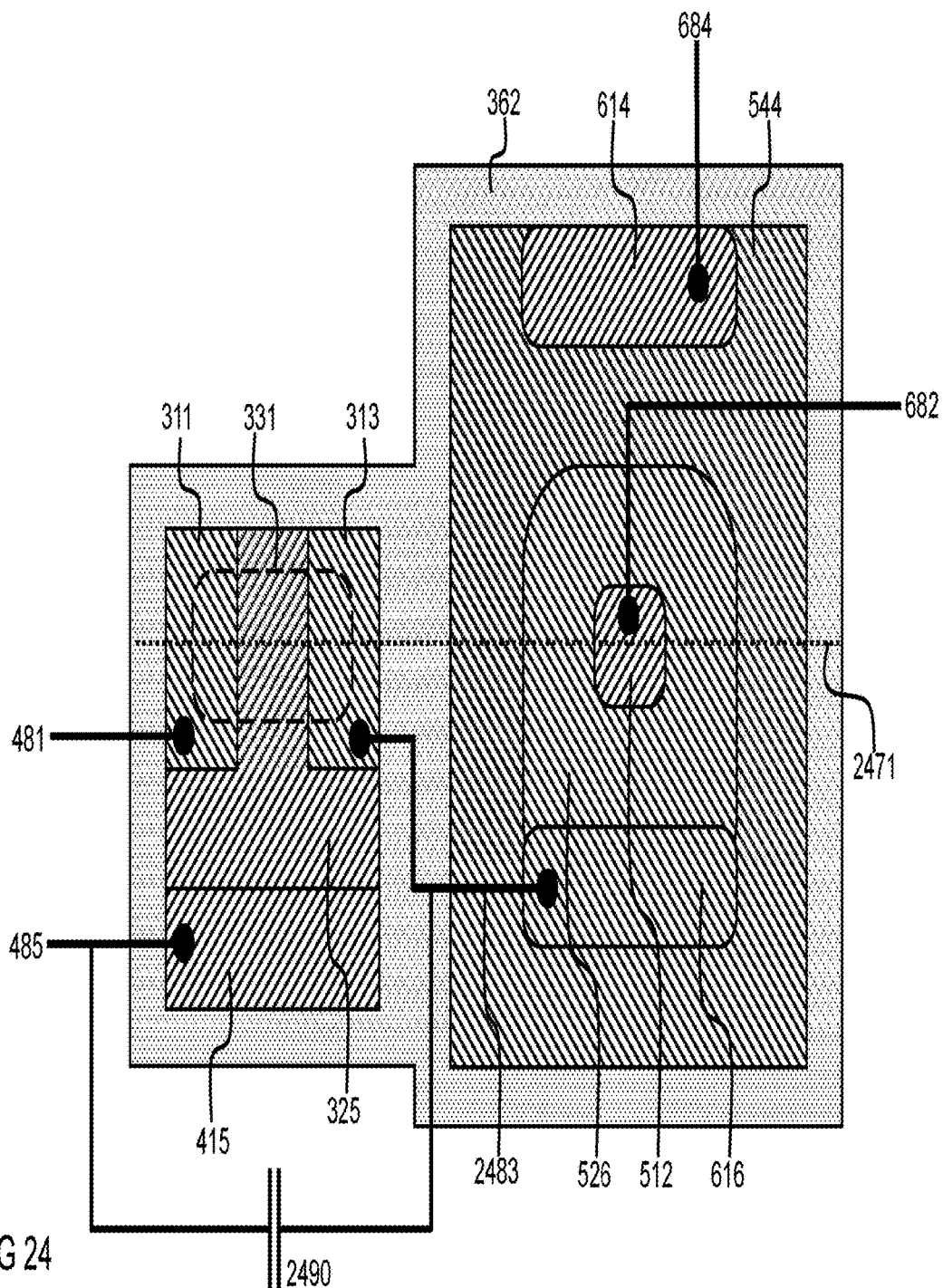
FIG. 24 illustrates an embodiment of the invention corresponding to the schematic layout of the semiconductor logic element according to FIG. 23.

FIG. 24 illustrates an embodiment of the invention corresponding to a schematic layout of a semiconductor logic element wherein a schematic cross-section of the semiconductor logic element along the dashed line 2471 corresponds to FIG. 23. The first FET on the left hand side of FIGS. 23 and 24 corresponds to the first FET on the left hand side of FIGS. 3 and 4. Similarly, the second FET on the right hand side of FIGS. 23 and 24 corresponds to the second FET on the right hand side of FIGS. 5 and 6. The second gate comprises the first conductivity type contact doping 616 and the first conductivity type gate doping 526. The internal node comprises the wiring 2483, the first conductivity type first drain 313, and second gate. In between the first gate node and the internal node there is an optional 'drag-along' plate capacitor 2490. The embodiment of FIG. 24 is applicable to MSCL and CS logic.

Figure 52A:
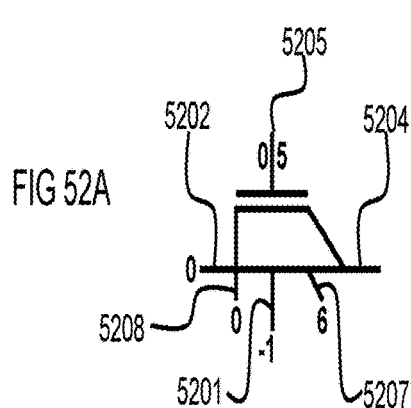
FIG. 52A illustrates the schematic symbol of an embodiment of the invented semiconductor logic element wherein the first conductivity type is p type.
Figure 52B:
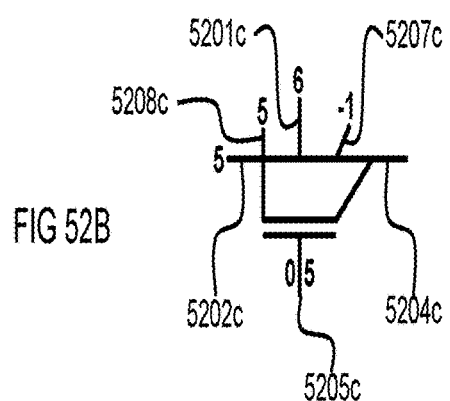
FIG. 52B illustrates the schematic symbol of an embodiment of the invented semiconductor logic element wherein the first conductivity type is n type and which is complementary to the one presented in FIG. 52A.

FIGS. 52A and 52B illustrate higher-level markings for the embodiment of FIGS. 50 and 51 corresponding to opposite doping types and complementary biasing schemes according to MSCL. In the embodiment of FIG. 52A the second conductivity type is n type and in the embodiment of FIG. 52B the second conductivity type is p type. Besides the embodiments of FIGS. 52A and 52B are complementary to each others. In FIG. 52A the second source 5202 is connected to 0 V, the second auxiliary gate 5208 is connected to 0 V, the first source 5201 is connected to −1 V, the first auxiliary gate 5207 is connected to 6 V, and the input 5205 may be connected to 0 V corresponding to the first input logic potential or it may be connected to 5 V corresponding to the second input logic potential (in FIG. 52A as well as in the following figures the voltage values are marked in bold font and the symbol V for Volt is left out in order to save space). In FIG. 52B the complementary second source 5202c is connected to 5 V, the complementary second auxiliary gate 5208c is connected to 5 V, the complementary first source 5201c is connected to 6 V, the complementary first auxiliary gate 5207c is connected to 6 V, and the complementary input 5205c may be connected to 5 V corresponding to the complementary first input logic potential or it may be connected to 0 V corresponding to the complementary second input logic potential.

Figure 52C:
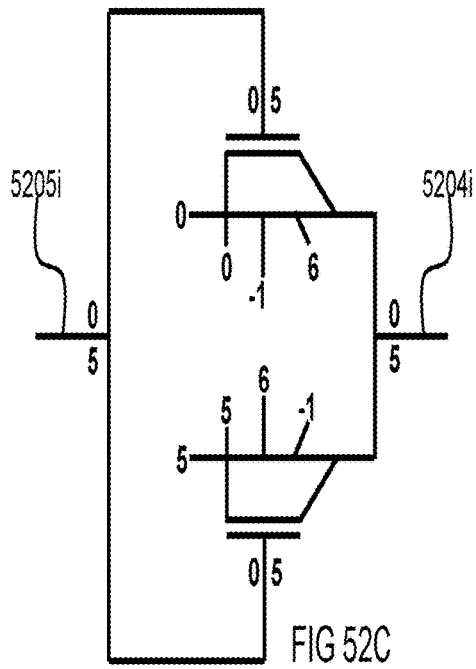
FIG. 52C illustrates an invented inverter configuration corresponding to the semiconductor logic elements of FIGS. 52A and 52B.
Figure 52D:
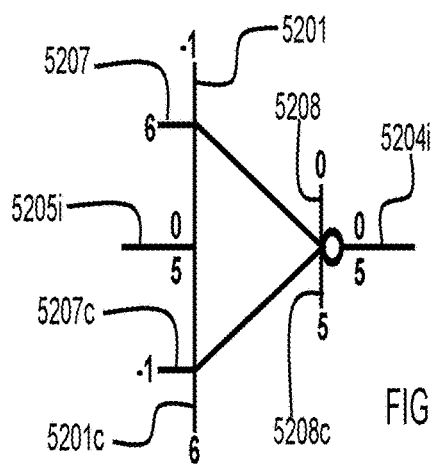
FIG. 52D illustrates the schematic symbol of the invented inverter configuration of FIG. 52C.

FIG. 52C illustrates an embodiment of an inverter arrangement according to MSCL and corresponding to the semiconductor logic element of FIG. 52A and to the complementary logic element of FIG. 52B. When the input of the inverter 5205i (comprising both nodes 5205 and 5205c) is at 0 V the output of the inverter 5204i (comprising both nodes 5204 and 5204c) is at 5 V and vice versa—when the input of the inverter is at 5 V the output of the inverter is at 0 V. FIG. 52D illustrates a more convenient symbol for the inverter of FIG. 52C. In the invented inverter arrangement reference is made to first input logic potential (0 V in FIG. 52D), to second input logic potential (5 V in FIG. 52D), to first output logic potential (0 V in FIG. 52D), and to second output logic potential (5 V in FIG. 52D) or in the inverter arrangement of FIG. 52D according to MSCL one may also simply refer to first logic potential (0 V in FIG. 52D) and to second logic potential (5 V in FIG. 52D).

Figure 52F:
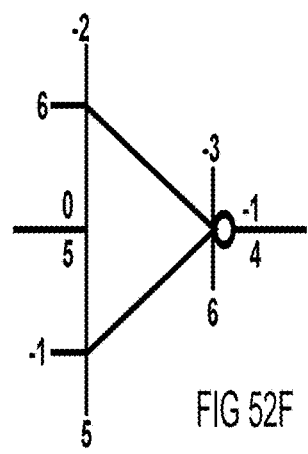
FIG. 52F illustrates the schematic symbol for the invented inverter configuration of FIG. 52E.
Figure 52E:
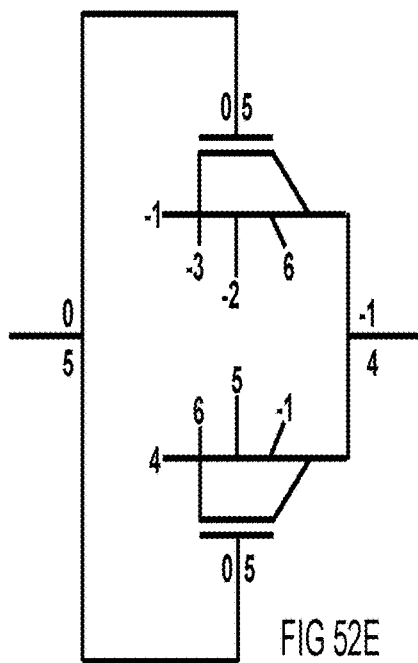
FIG. 52E illustrates another possible invented inverter configuration depicted according to schematic symbols of an invented semiconductor logic element and of an invented complementary semiconductor logic element.

FIG. 52E illustrates another inverter arrangement wherein the input is connected either to the first input logic potential (0 V) or to the second input logic potential (5 V), the second source is connected to a first output logic potential (−1 V), and the complementary second source is connected to a second output logic potential (4 V). FIG. 52F illustrates a more convenient symbol for the invented inverter of FIG. 52E. This arrangement is achieved by having in the inverter of FIGS. 52F and 52E a larger channel depth in the first channel than what is the channel depth of the first channel in the inverter of FIGS. 52C and 52D. Thus the first source in the inverter of FIGS. 52F and 52E can be connected to a smaller potential than the first source in the inverter of FIGS. 52C and 52D. Similarly in the inverter of FIGS. 52F and 52E the channel depth in the complementary first channel can be smaller than what is the channel depth of the complementary first channel in the inverter of FIGS. 52C and 52D and the complementary first source in the inverter of FIGS. 52F and 52E can be connected to a smaller potential than the complementary first source in the inverter of 52C and 52D.

Figure 53:
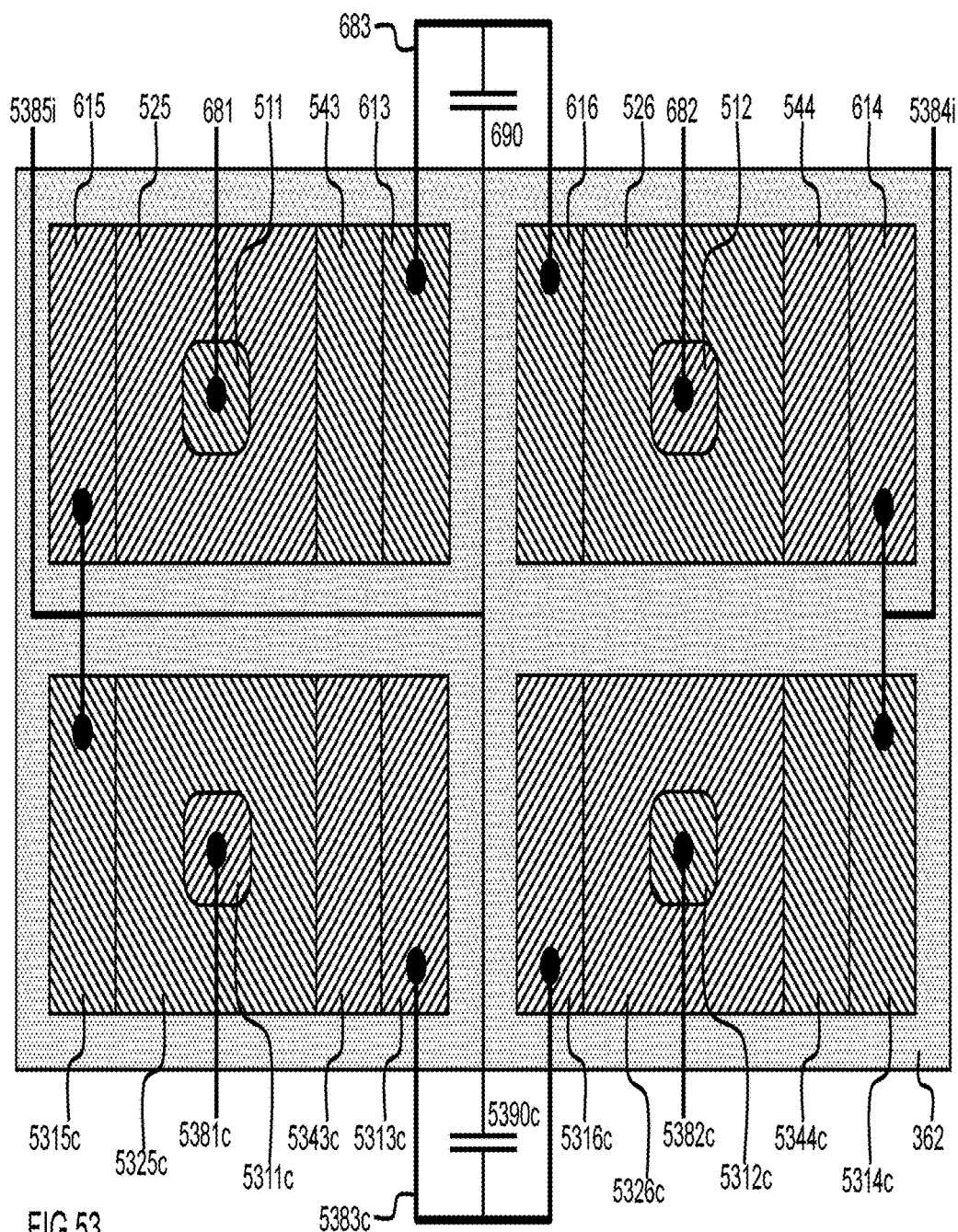
FIG. 53 illustrates a schematic layout of an invented inverter arrangement.

FIG. 53 illustrates a schematic layout of an inverter arrangement wherein the upper half corresponds to the semiconductor logic element according to FIGS. 5 and 6 and wherein the lower half corresponds to the complementary semiconductor logic element of the semiconductor logic element presented in the upper half of FIG. 53. The complementary first source node comprises the complementary second conductivity type first source 5311c and associated wiring 5381c and it is connected to the complementary first source potential. The complementary first drain comprises the complementary second conductivity type drain doping 5343c and the complementary second conductivity type contact doping 5313c. The complementary second gate comprises the complementary first conductivity type gate doping 5326c and the complementary first conductivity type contact doping 5316c. The complementary internal node comprises the complementary first drain, the complementary second gate, and wiring 5383c connecting these two together. The complementary second source node comprises the complementary first conductivity type second source doping 5312c and associated wiring 5382c. The complementary second source is connected to complementary first output logic potential (i.e. to the second output logic potential of the inverter).

The complementary first gate comprises the complementary first conductivity type first gate doping 5325c and a first conductivity type contact doping 5315c. The complementary second drain comprises the complementary first conductivity type drain doping 5344c and the complementary first conductivity type contact doping 5314c. The input of the inverter 5385i comprises the first gate of the semiconductor logic element as well as the complementary first gate of the complementary semiconductor logic element. The output of the inverter 5384i comprises the second drain of the semiconductor logic element as well as the complementary second drain of the complementary semiconductor logic element. Between the input of the inverter and the complementary internal node there is an optional 'drag-along' plate capacitor 5390c.

Figure 54:
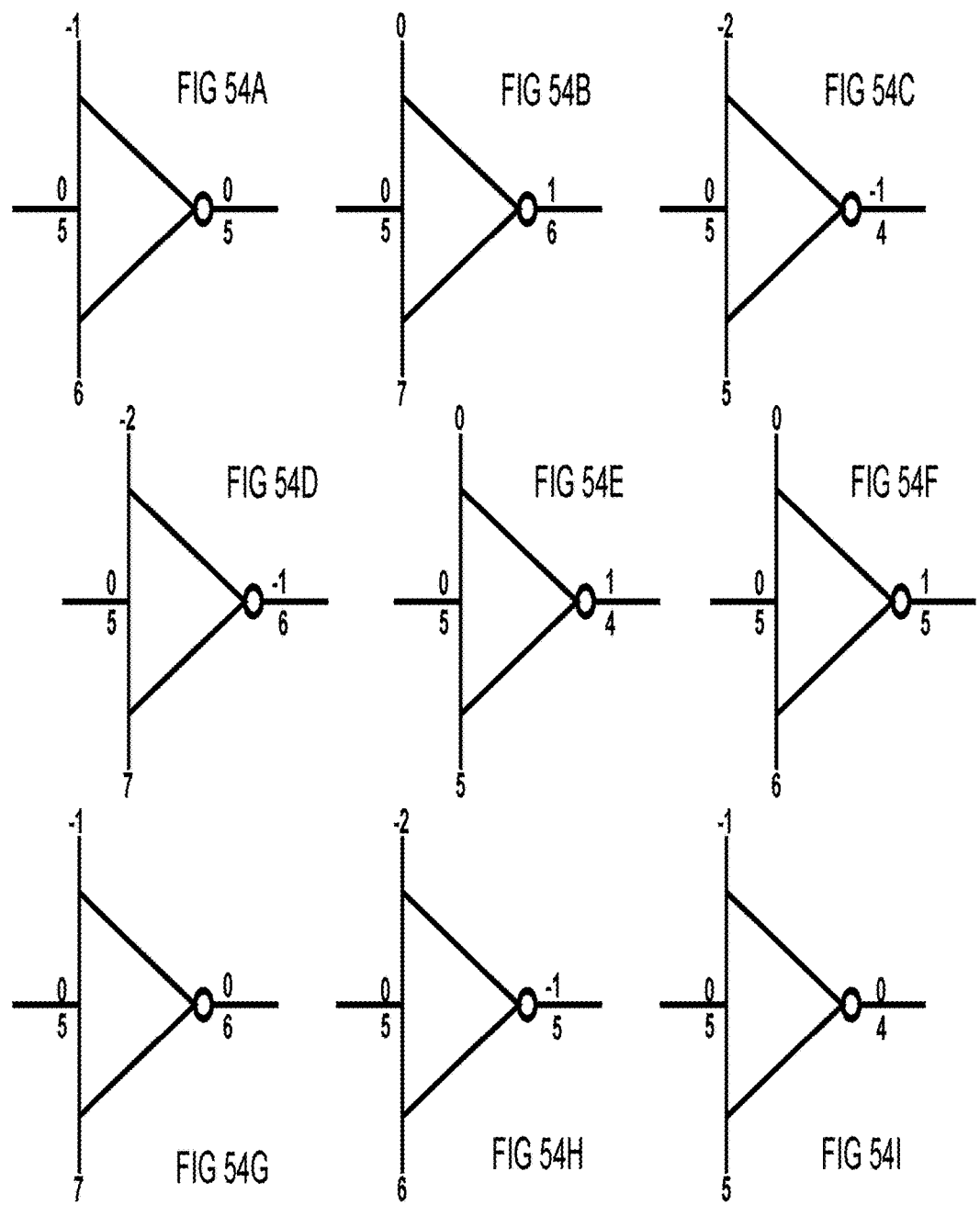
FIG. 54A illustrates a schematic symbol for a possible invented inverter configuration.
FIG. 54B illustrates a schematic symbol for a possible invented inverter configuration.
FIG. 54C illustrates a schematic symbol for a possible invented inverter configuration.
FIG. 54D illustrates a schematic symbol for a possible invented inverter configuration.
FIG. 54E illustrates a schematic symbol for a possible invented inverter configuration.
FIG. 54F illustrates a schematic symbol for a possible invented inverter configuration.
FIG. 54G illustrates a schematic symbol for a possible invented inverter configuration.
FIG. 54H illustrates a schematic symbol for a possible invented inverter configuration.
FIG. 54I illustrates a schematic symbol for a possible invented inverter configuration.

The benefit of the arrangement according to FIGS. 4, 5, and 53 is that different channel depths can be easily achieved as was already previously explained with simple layout alterations. This means also that with simple layout alterations it is easy to realize an inverter arrangement comprising level shifts, wherein the term level shift refers to first output logic potential being different than the first input logic potential and/or to second output logic potential being different than the second input logic potential. Another useful property of the embodiments of FIGS. 4, 5, and 53 is the SOI and trench isolation—the fact that no isolation wells are required means that consecutive level shifts can be easily realized (e.g. via series connected level shifted inverters). FIG. 54A illustrates a non-level shifted invented inverter configuration according to MSCL and corresponding to FIG. 53 and the FIGS. 54B-54I illustrate level shifted invented inverter configurations (non-MSCL) according to FIG. 53. Since the embodiments of FIGS. 4, 5, and 53 do not incorporate any auxiliary gates there are no markings in the inverter symbols of 54A-54I corresponding to auxiliary gates.

In the embodiment of FIG. 54B the first and second output logic potentials are both shifted by 1 V with respect to the first and second input logic potentials by providing a smaller channel depth for the first channel and by providing a larger channel depth for the complementary first channel when compared to FIG. 54A. In the embodiment of FIG. 54C the first and second output logic potentials are both shifted by −1 V with respect to the first and second input logic potentials by providing larger channel depth for the first channel and by providing a smaller channel depth for the complementary first channel when compared to FIG. 54A. In the embodiment of FIG. 54D the first output logic potential is shifted by −1 V with respect to the first input logic potential and the second output logic potential is shifted by 1 V with respect to the second output logic potential by providing a larger channel depth both for the first channel as well as for the complementary first channel when compared to FIG. 54A. In the embodiment of FIG. 54E the first output logic potential is shifted by 1 V with respect to the first input logic potential and the second output logic potential is shifted by −1 V with respect to the second input logic potential by providing a smaller channel depth both for the first channel as well as for the complementary first channel when compared to FIG. 54A. In the embodiment of FIG. 54F the first output logic potential is shifted by 1 V with respect to the first input logic potential by providing a smaller channel depth for the first channel when compared to FIG. 54A. In the embodiment of FIG. 54G the second output logic potential is shifted by 1 V with respect to the second input logic potential by providing a larger channel depth for the complementary first channel when compared to FIG. 54A. In the embodiment of FIG. 54H the first output logic potential is shifted by −1 V with respect to the first input logic potential by providing a larger channel depth for the first channel when compared to FIG. 54A. In the embodiment of FIG. 54I the second output logic potential is shifted by −1 V with respect to the second input logic potential by providing a smaller channel depth for the complementary first channel when compared to FIG. 54A.

Figure 55:
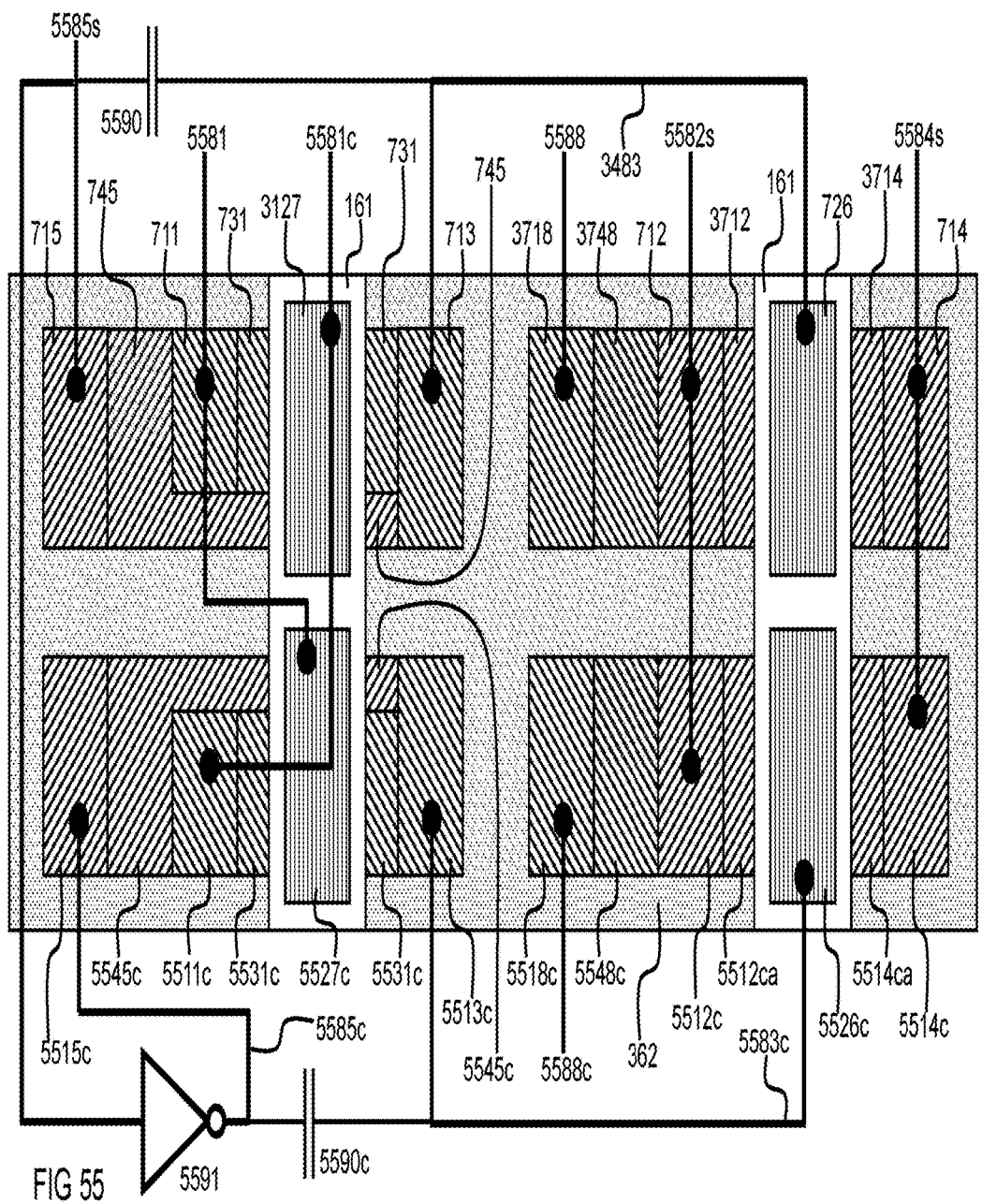
FIG. 55 illustrates a schematic layout of an invented switch arrangement.

FIG. 55 illustrates a switch which in off state does not let through between the nodes 5582s and 5584s either the first output logic potential or the second output logic potential or any potential in between meaning that both the first channel and the complementary first channel are conductive and that both the second channel and the complementary second channel are nonconductive. In the on state the switch lets through both the first output logic potential and the second output logic potential meaning that both the first channel and the complementary first channel are nonconductive and that at least either one the second channel or the complementary second channel is conductive. If in the on state either the second channel or the complementary second channel is conductive throughout the range between the first output logic potential and the second output logic potential then the switch lets through any potential in between the first and second output potentials.

In FIG. 55 the two FETs in the upper part of the figure correspond to the semiconductor logic element and the two FETs in the lower part of the figure correspond to the complementary semiconductor logic element. In between the complementary second conductivity type first source doping 5511c and the complementary second conductivity type first drain doping 5513c there is complementary second conductivity type first channel doping 5531c. On top of the complementary first channel doping there is an external gate 5527c corresponding to the complementary first auxiliary gate. The complementary first conductivity type back-gate doping 5545c and the complementary first conductivity type contact doping 5515c correspond to the complementary first gate. The complementary first gate node comprises the complementary first gate and wiring 5585c. The external gate 5526c corresponds to the complementary second gate. The complementary internal node comprises the complementary first drain doping, the complementary second gate, and associated wiring 5583c. Between the complementary internal node and the complementary first gate node there is an optional complementary 'drag-along' plate capacitor 5590c. The complementary second auxiliary gate corresponds to the complementary second conductivity type back-gate doping 5548c and to the complementary second conductivity type contact doping 5518c. The complementary second auxiliary gate node comprises the complementary second auxiliary gate and wiring 5588c. The complementary second source comprises the complementary first conductivity type second source doping 5512c and the complementary first conductivity type second source extension doping 5512ca. The complementary second drain comprises the complementary first conductivity type second drain doping 5514c and the complementary first conductivity type second drain extension doping 5514ca.

The wiring 5588 is part of the second auxiliary gate node. The source node of the switch comprises the second conductivity type second source, the complementary first conductivity type second source, and wiring 5582s. The drain node of the switch comprises the second conductivity type second drain, the complementary first conductivity type second drain, and wiring 5584s. The first source node comprises the first conductivity type first source 711, the complementary first auxiliary gate 5527c, and wiring 5581. The complementary first source node comprises the complementary second conductivity type first source 5511c, the first auxiliary gate 3127, and the wiring 5581c. The input of the switch comprises the first gate and wiring 5585s. Between the input of the switch and the internal node there is an optional 'drag-along' plate capacitor 5590. In between the input of the switch and complementary first gate node there is an inverter 5591.

Figure 56:
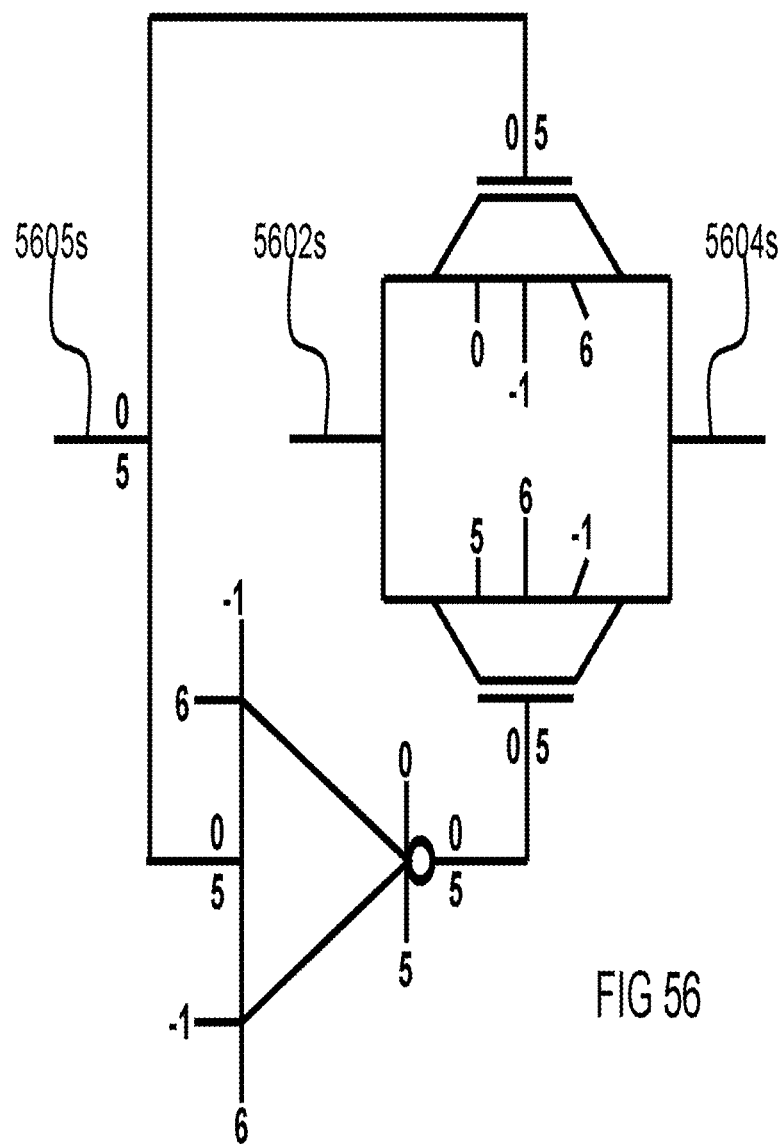
FIG. 56 illustrates a schematic symbol for a possible switch arrangement corresponding to FIG. 55.

FIG. 56 illustrates the schematic symbol for a possible switch corresponding to the switch of FIG. 55. The input of the switch 5605s, the source of the switch 5602s, and the drain of the switch 5604s are depicted in FIG. 56. The form of the symbols corresponding to the semiconductor logic element and to the complementary semiconductor logic element have been slightly altered (two sharp peaks instead of one) in order to highlight the facts that neither the potential of the switch's source nor the potential of the switch's drain is fixed and that the functions of the switch's source and the switch's drain could be interchanged.

Figure 57A:
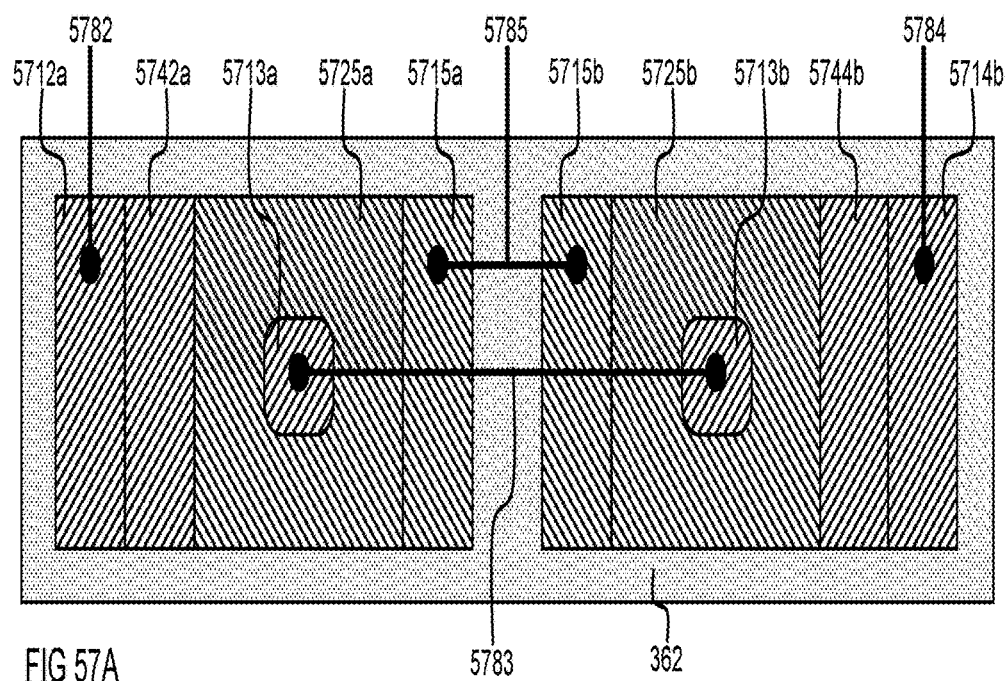
FIG. 57A illustrates a schematic layout of a high voltage transistor arrangement.

FIG. 57A illustrates a high voltage transistor that is based on the perpendicular JFET technology presented in FIGS. 5, 6, and 53. The source node of the high voltage transistor comprises the wiring 5782, the second conductivity type contact doping 5712a, and the second conductivity type source doping 5742a. The drain node of the high voltage transistor comprises the wiring 5784, the second conductivity type contact doping 5714b, and the second conductivity type drain doping 5744b. The gate node of the high voltage transistor comprises the wiring 5785, the first conductivity type contact dopings 5715a and 5715b, as well as the first conductivity type gate dopings 5725a and 5725b. The channel of the high voltage transistor comprises the second conductivity type regions 5713a and 5713b surrounded by the first conductivity type gate dopings 5725a and 5725b, and the wiring 5783.

Figures 57B, 57C, 57D, 57E:
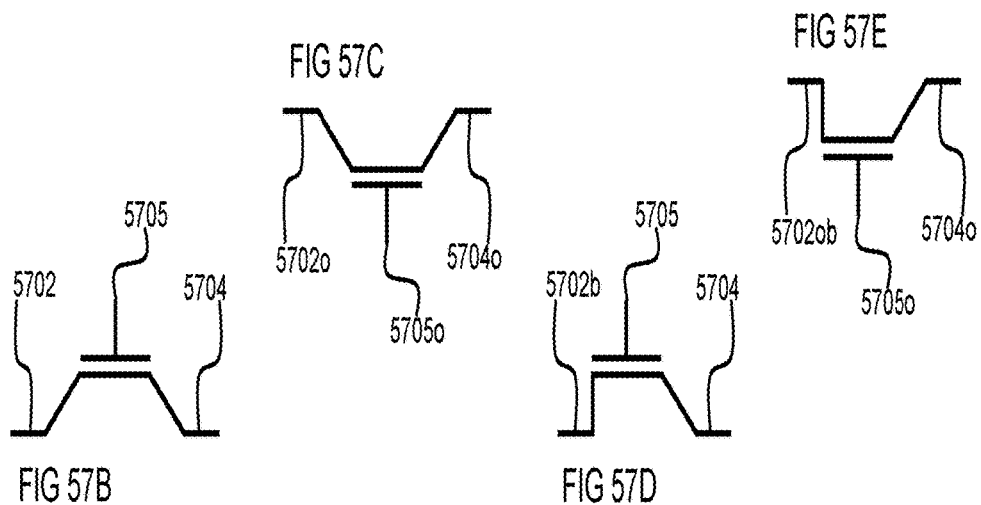
FIG. 57B illustrates a schematic symbol of a possible arrangement corresponding to FIG. 57A.
FIG. 57C illustrates a schematic symbol of another possible arrangement corresponding to FIG. 57A.
FIG. 57D illustrates a schematic symbol of yet another possible arrangement corresponding to FIG. 57A.
FIG. 57E illustrates a schematic symbol of still yet another possible arrangement corresponding to FIG. 57A.

FIG. 57B illustrates a schematic symbol corresponding to the high voltage transistor of FIG. 57A wherein the second conductivity type is of n type. The form of the symbol highlights the fact that in the high voltage transistor neither the potential on the source 5702 nor the potential on the drain 5704 is fixed. The gate 5705 of the high voltage transistor is preferably not forward biased either with respect to the source or drain. When the gate and the source of the high voltage transistor are at the same potential the channel of the high voltage transistor is conductive. FIG. 57C illustrates a schematic symbol corresponding to the high voltage transistor of FIG. 57A wherein the second conductivity type is of p type. The source 5702o, the drain 5704o, and the gate 5705o of the high voltage transistor of FIG. 57C are of opposite doping type than in the high voltage transistor of FIG. 57B. The schematic symbol of the high voltage transistor of FIG. 57D corresponds to the high voltage transistor of FIG. 57B wherein the potential of the source 5702b is fixed which is highlighted by the form of the symbol. The schematic symbol of the high voltage transistor of FIG. 57E corresponds to the high voltage transistor of FIG. 57C wherein the potential of the source 5702ob is fixed which is highlighted by the form of the symbol.

Figure 58:
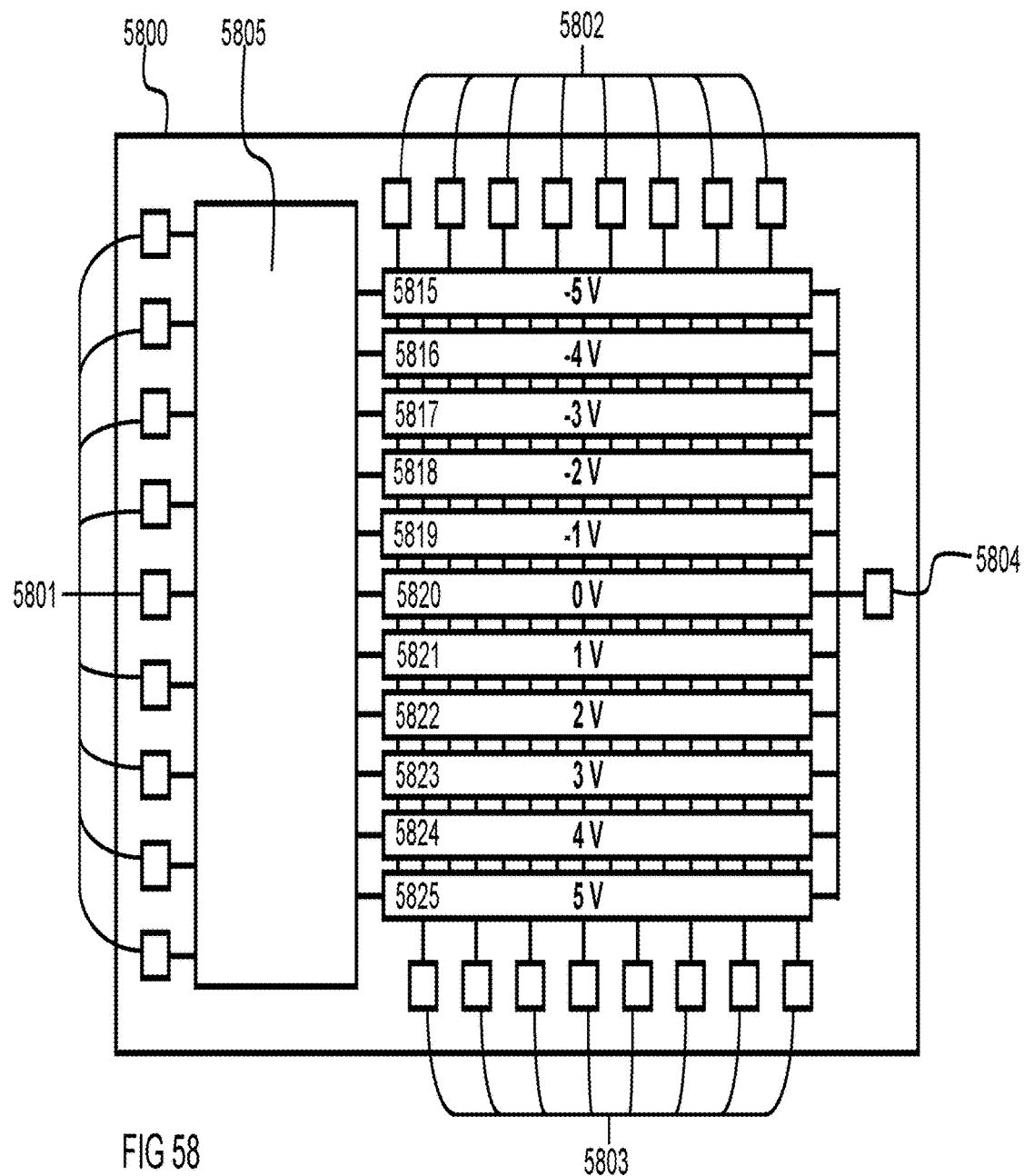
FIG. 58 illustrates an invented possible chip arrangement comprising multiple logic levels.
Figure 59:
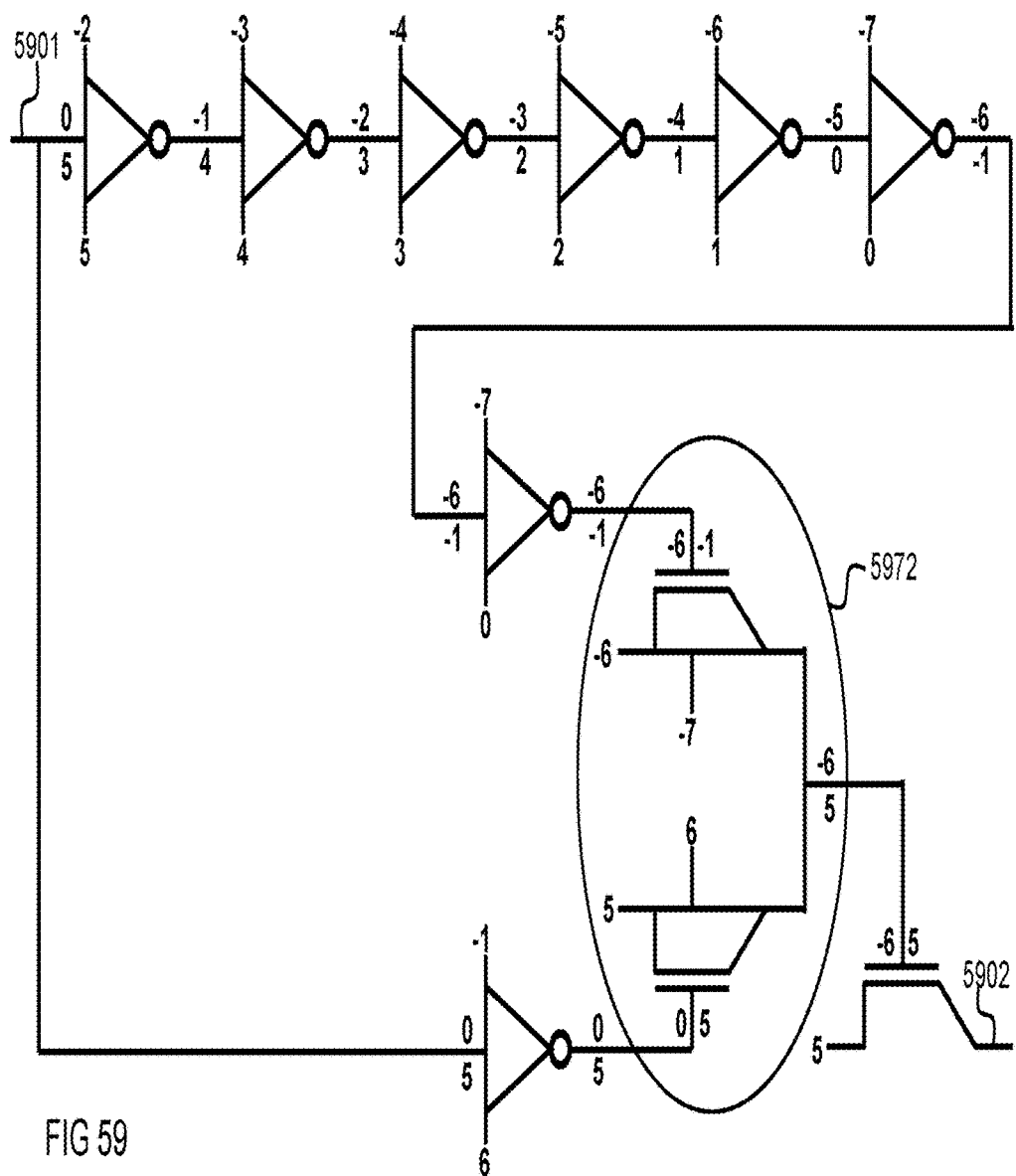
FIG. 59 illustrates an arrangement on the chip realizing 5 V on the output.
Figure 60:
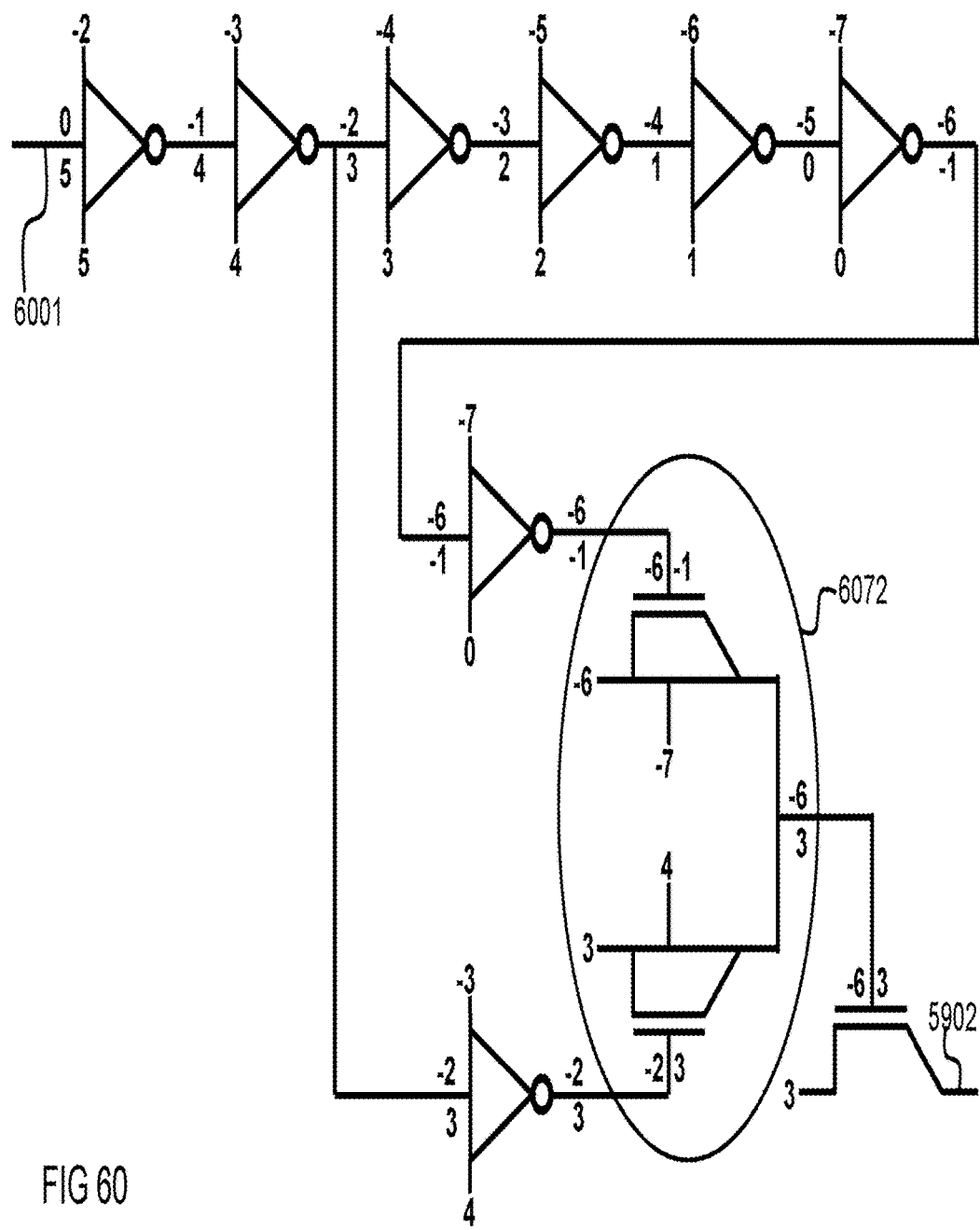
FIG. 60 illustrates an arrangement on the chip realizing 3 V on the output.
Figure 61:
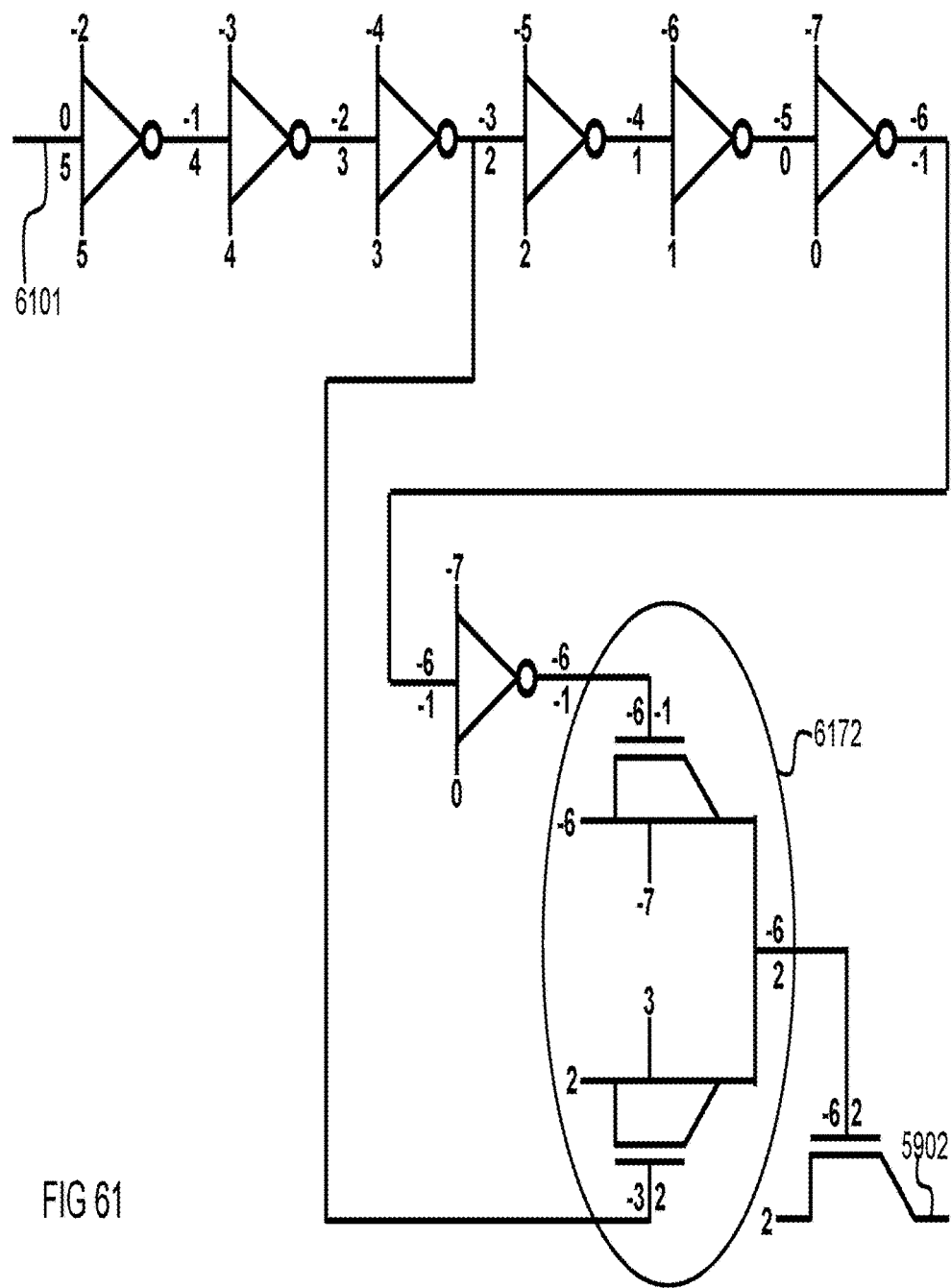
FIG. 61 illustrates an arrangement on the chip realizing 2 V on the output.
Figure 72A:
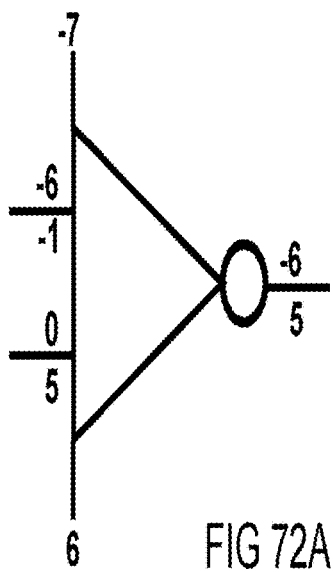
FIG. 72A illustrates a higher level marking for a high voltage device.
Figure 72B:
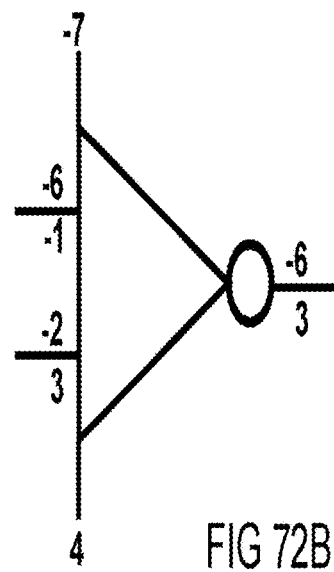
FIG. 72B illustrates a higher level marking for a high voltage device.
Figure 72C:
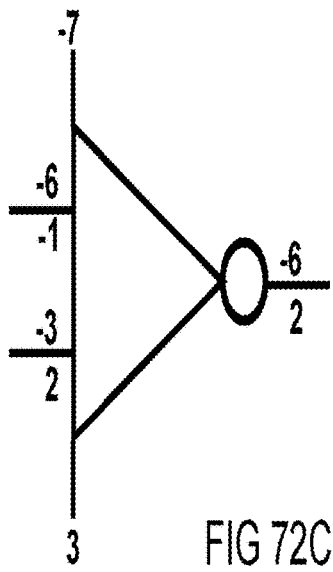
FIG. 72C illustrates a higher level marking for a high voltage device.

FIG. 58 illustrates a schematic layout of an exemplary chip 5800 comprising embodiments of the invention. The input/output pads 5801 are utilized for the exchange of information between an Integrated Circuit (IC) block 5805 and off-chip electronics. The input pads 5802 and 5803 are connected in this exemplary case to fixed integer valued potentials ranging from 5 to −9 V. The IC block 5805 selects which potential will be connected to the output pad 5804 by connecting second (output) logic potential to the input of the corresponding high voltage block (5815-5825). The inputs of the rest of the high voltage blocks are connected to first (output) logic potential. FIG. 59 illustrates the high voltage block 5825 wherein the input of the high voltage block 5901 is connected to the IC block 5805 and the output of the high voltage block 5902 is connected to the output pad 5804. FIG. 60 illustrates the high voltage block 5823 and its input 6001, FIG. 61 illustrates the high voltage block 5822 and its input 6101, FIG. 62 illustrates the high voltage block 5819 and its input 6201, FIG. 63 illustrates the high voltage block 5818 and its input 6301, FIG. 64 illustrates the high voltage block 5817 and its input 6401, FIG. 65 illustrates the high voltage block 5816 and its input 6501, and FIG. 66 illustrates the high voltage block 5815 and its input 6601. FIG. 72A illustrates an alternative compact marking of the entity 5972 in FIG. 59, FIG. 72B illustrates an alternative compact marking of the entity 6072 in FIG. 60, and FIG. 72C illustrates an alternative compact marking of the entity 6172 in FIG. 61.

Figure 67:
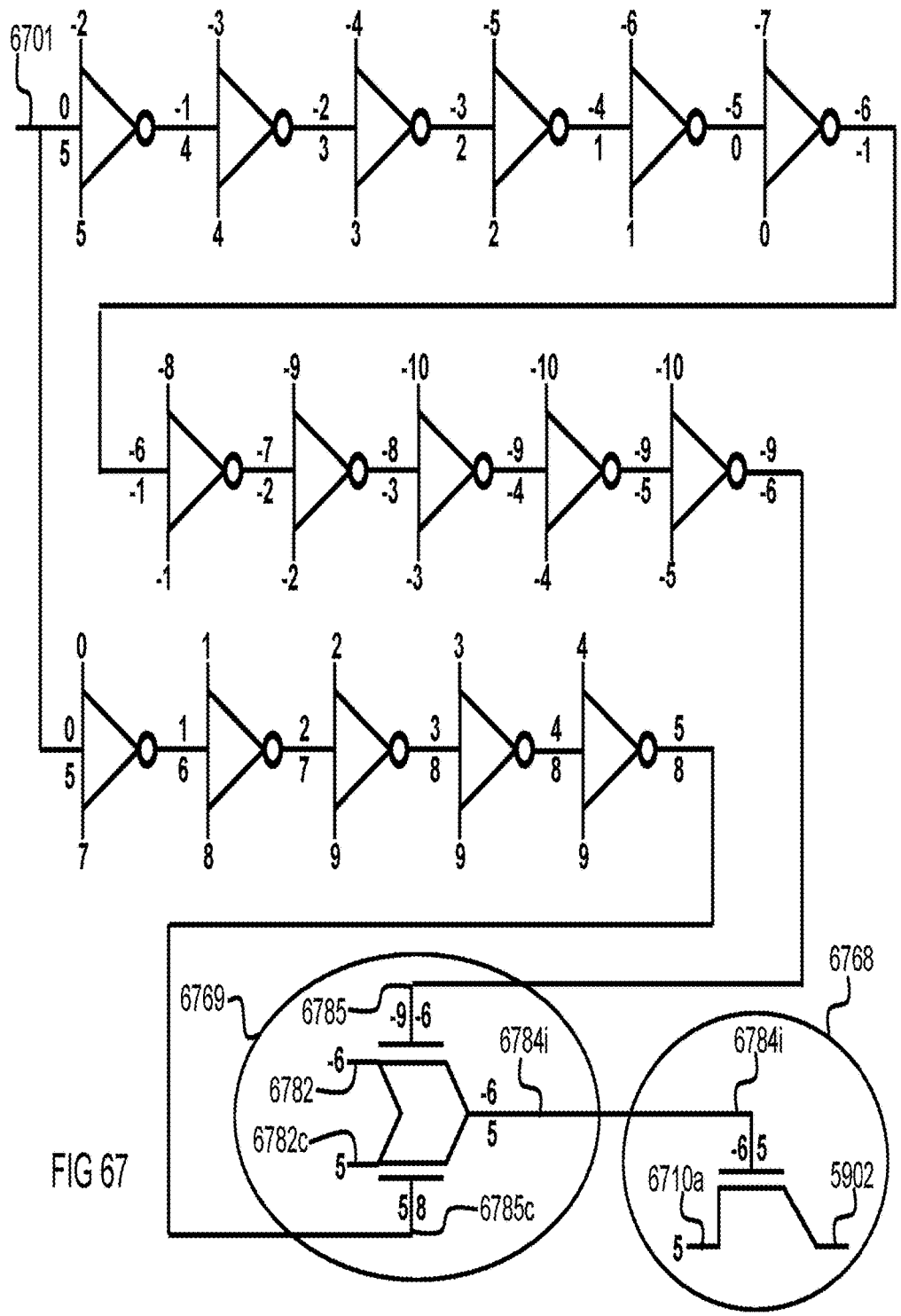
FIG. 67 illustrates an alternative arrangement on the chip realizing 5 V on the output.

FIG. 67 represents an alternative configuration of the high voltage block 5825 illustrated by FIG. 59. The arrangement of FIG. 67 requires a larger amount of integer voltages, namely, 20 altogether and thus one should add 4 more pads to the input pads 5802 and 5803 that are connected to fixed integer values. The benefit of the arrangement of FIG. 67 is, however, that no large reverse biases, i.e., no large voltage differences are created inside individual transistors due to the internal design of the high voltage devices 6768 and 6769.

Figure 68:
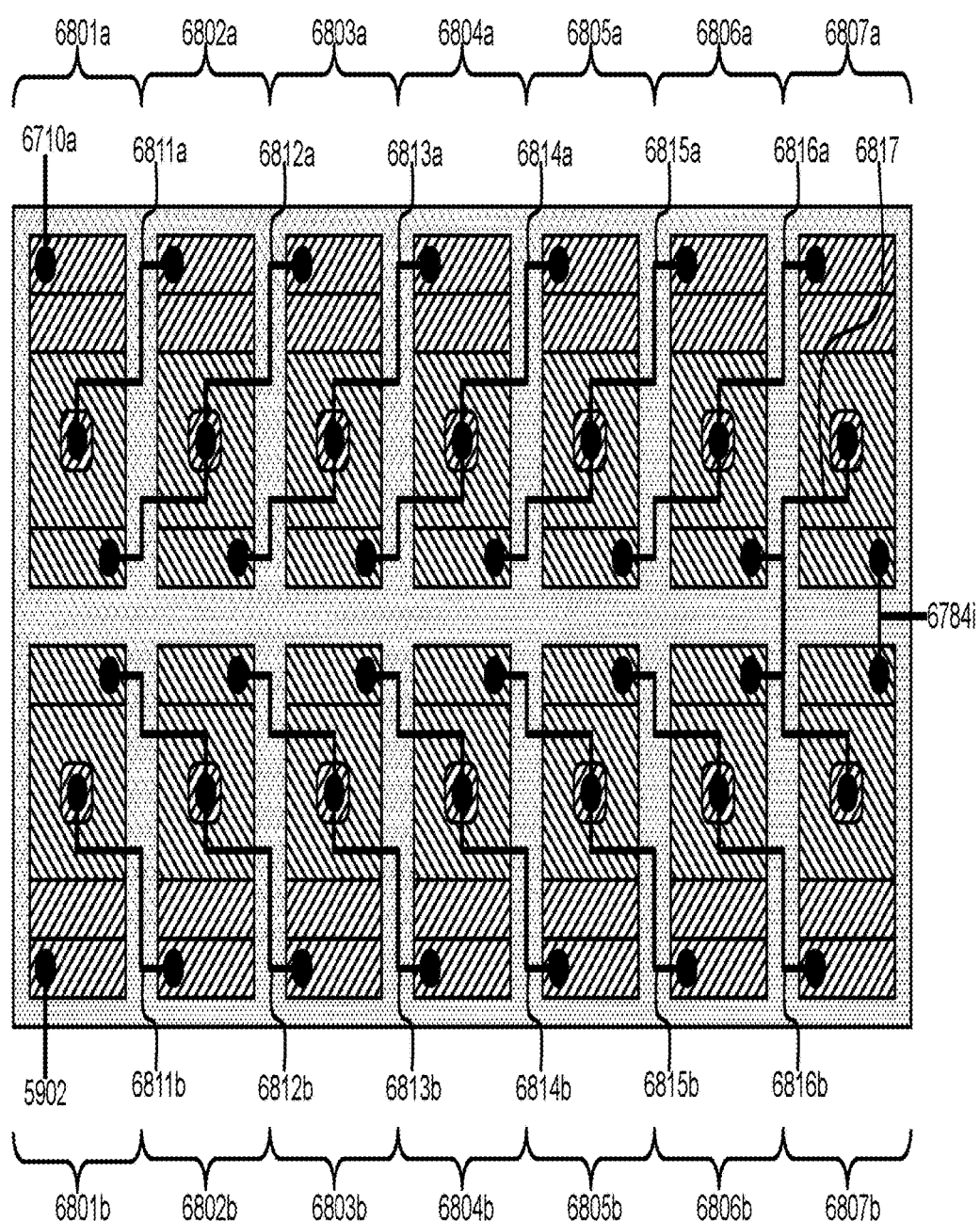
FIG. 68 illustrates a high voltage selection transistor.

The high voltage selection transistor 6768 is illustrated in FIG. 68 wherein it is shown that the transistor 6768 comprises 14 individual second type transistors 6801a-6807a and 6801b-6807b which are similar to the second type FETs of FIGS. 5 and 6 (in another arrangement the transistors 6801a-6807a and 6801b-6807b could be naturally also of first type and the amount of the transistors could differ) and/or to the second type FETs in the corresponding complementary arrangement. The internal wirings 6811a-6816a, 6811b-6816b, and 6817 form desired connections in between different nodes of the transistors 6801a-6807a and 6801b-6807b. The source node of the high voltage transistor 6768 corresponds to the external wiring 6710a which is connected to the drain of the transistor 6801a. The drain node of the high voltage transistor 6768 corresponds to the external wiring 5902 which is connected to the drain of the transistor 6801b. The gate node of the high voltage transistor 6768 corresponds to the external wiring 6748i which is connected to the gates of the transistors 6807a and 6807b. The high voltage transistor 6768 is actually an improved version of the high voltage transistor of FIG. 57A and thus the markings of FIGS. 57B-57E can be also utilized for the high voltage transistor 6768.

The high voltage selection transistor 6768 is composed of two transistor chains. The first transistor chain comprises second type transistors 6801a-6807a and the second transistor chain comprises second type transistors 6801b-6807b. These two transistor chains are connected in parallel and are joined together at the other end via the gate node (comprising the wiring 6784i) and the internal wiring 6817. The internal wirings of the two transistor chains in the high voltage device 6768 are connected in the following manner. In the transistors that are not situated at the ends of the transistor chains (i.e. 6801a, 6801b, 6807a, and 6807b) the source is always connected via internal wiring (6812a-6816a & 6812b-6816b) to the gate of the next transistor situated closer to the node 6701a or 5902 in the transistor chain as well as to the drain of the next transistor situated closer to the node 6784i in the transistor chain. The source of the transistor 6801a is connected via internal wiring 6811a only to the drain of the transistor 6802a and the source of the transistor 6801b is connected via internal wiring 6811b only to the drain of the transistor 6802b. The sources of the transistors 6807a and 6807b and the gates of the transistors 6806a and 6806b are connected together via an internal wiring 6817.

Figure 70A:
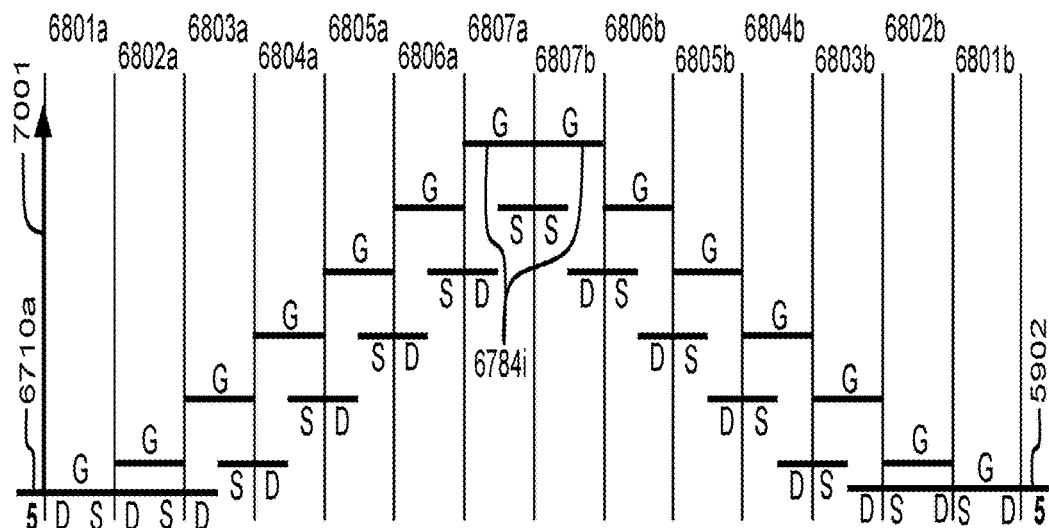
FIG. 70A illustrates the operation of the high voltage selection transistor corresponding to FIG. 68.
Figure 70B:
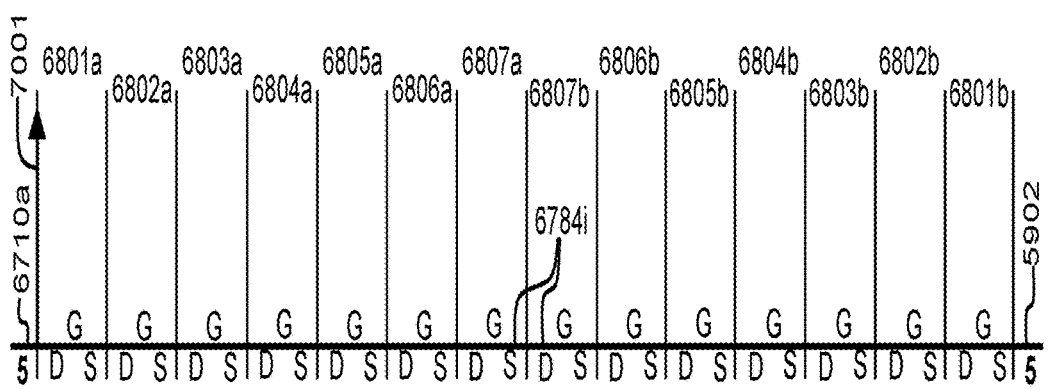
FIG. 70B illustrates the operation of the high voltage selection transistor corresponding to FIG. 68.
Figure 70C:
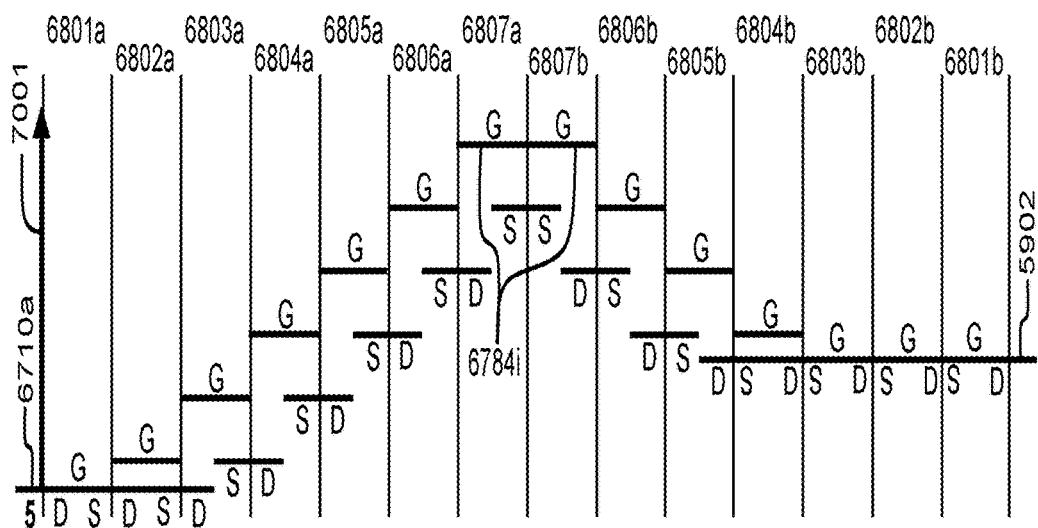
FIG. 70C illustrates the operation of the high voltage selection transistor corresponding to FIG. 68.

The operation of the high voltage transistor 6768 is illustrated in FIGS. 70A, 70B, and 70C wherein the axis 7001 corresponds to electron potential energy which is the negative of electric potential. In FIG. 70A both the source node 6710a and drain node 5902 of the high voltage transistor 6768 are connected to 5 V and the gate node 6748i of the high voltage transistor 6768 is connected e.g. to −6 V. In FIG. 70B both the source node 6710a and the gate node 6748i of the high voltage transistor 6768 are connected to 5 V rendering the potential on the drain node 5902 of the high voltage transistor 6768 to 5V corresponding to the situation when the input 5901 of the high voltage block 5825 is connected to the second (output) logic potential (i.e. to 5 V)

and the inputs of the rest of the high voltage blocks are connected to the first (output) logic potential (i.e. to 0 V). In FIG. 70C the source node 6710a of the high voltage transistor 6768 is connected to 5 V and the gate node 6748i of the high voltage transistor 6768 is connected e.g. to −6 V in which case the drain node 5902 of the high voltage transistor can be biased between −5-5 V (or even higher than 5 V) without introducing large current flow between the nodes of the high voltage transistor 6768.

Figure 69:
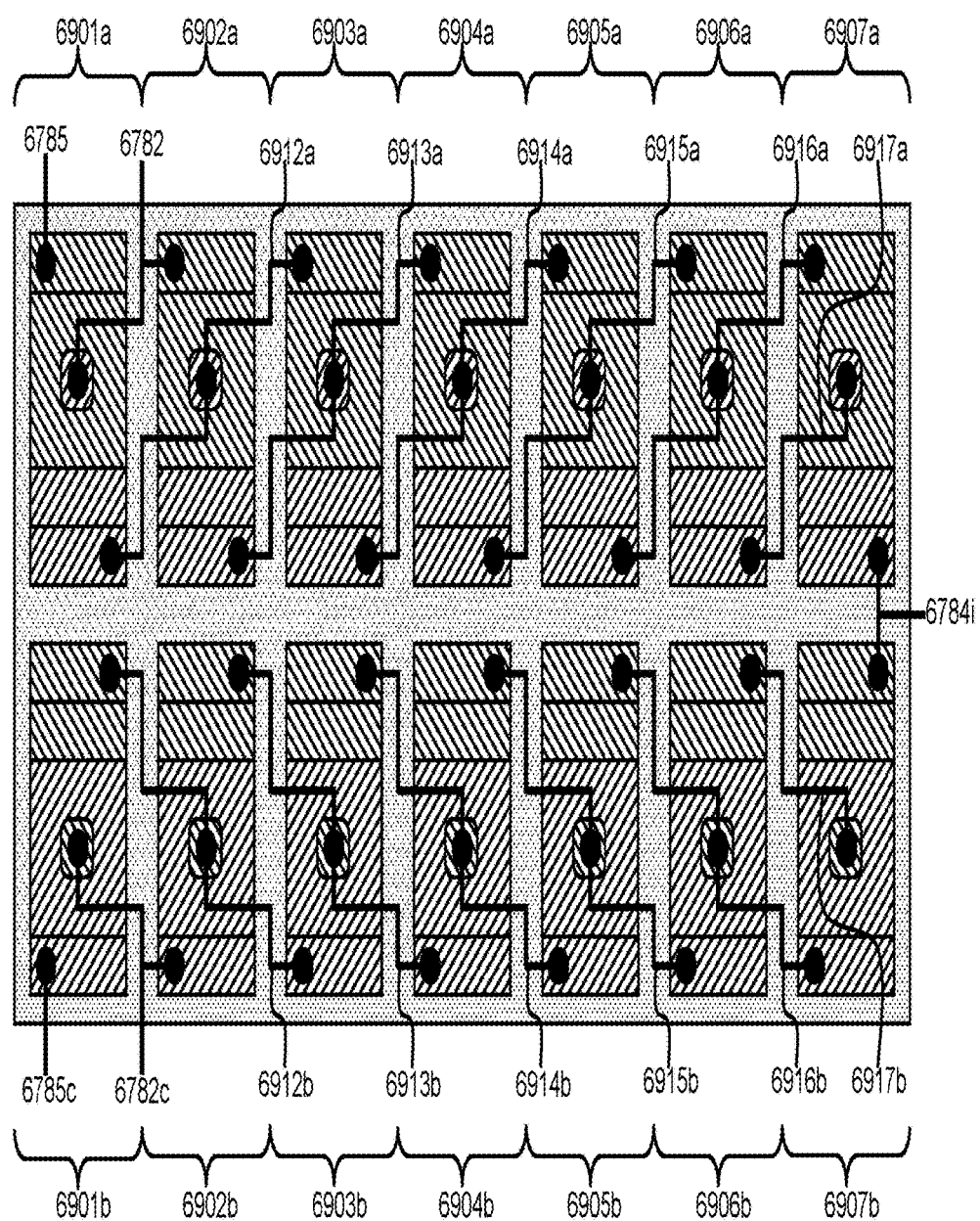
FIG. 69 illustrates a high voltage device.

The high voltage device 6769 is illustrated in FIG. 69 wherein it is shown that it comprises 7 second type transistors 6901a-6907a and 7 first type transistors 6901b-6907b which are similar to the second and first type FETs of FIGS. 5 and 6 and/or in the corresponding complementary arrangement (in another arrangement the amount of transistors could naturally differ from 14). The internal wirings 6912a-6917a form desired connections in between different nodes of the transistors 6901a-6907a and the internal wirings 6912b-6917b form desired connections in between different nodes of the transistors 6901b-6907b. The high voltage device 6769 comprises two source nodes, two gate nodes, and one drain node. The first one of the source nodes corresponds to the external wiring 6782 which is connected to the source of the transistor 6901a and to the gate of the transistor 6902a. The second one of the source nodes corresponds to the external wiring 6782c which is connected to the source of the transistor 6901b and to the gate of the transistor 6902b. The first one of the gate nodes corresponds to the external wiring 6785 which is connected to the gate of the transistor 6901a. The second one of the gate nodes corresponds to the external wiring 6785c which is connected to the gate of the transistor 6901b. The drain node corresponds to the external wiring 6784i which is connected to the drains of the transistors 6907a and 6907b.

The high voltage device 6769 is composed of two transistor chains. The first transistor chain comprises second type transistors 6901a-6907a and the second transistor chain comprises first type transistors 6901b-6907b. These two transistor chains are connected in series via the drain node 6784i. The internal wirings of the two transistor chains in the high voltage device 6769 are connected in the following manner. Beside the transistors at the ends of the transistor chains (i.e. 6901a, 6901b, 6907a, and 6907b) the source of a transistor is always connected via internal wiring (6912a-6916a & 6912b-6916b) to the gate of the next transistor situated closer to the node 6784i in the transistor chain as well as to the drain of the next transistor situated closer to the node 6785 or 6785c in the transistor chain. The source of the transistor 6707a is connected via internal wiring 6917a only to the drain of the transistor 6906a and the source of the transistor 6907b is connected via internal wiring 6917b only to the drain of the transistor 6907b.

Figure 71A:
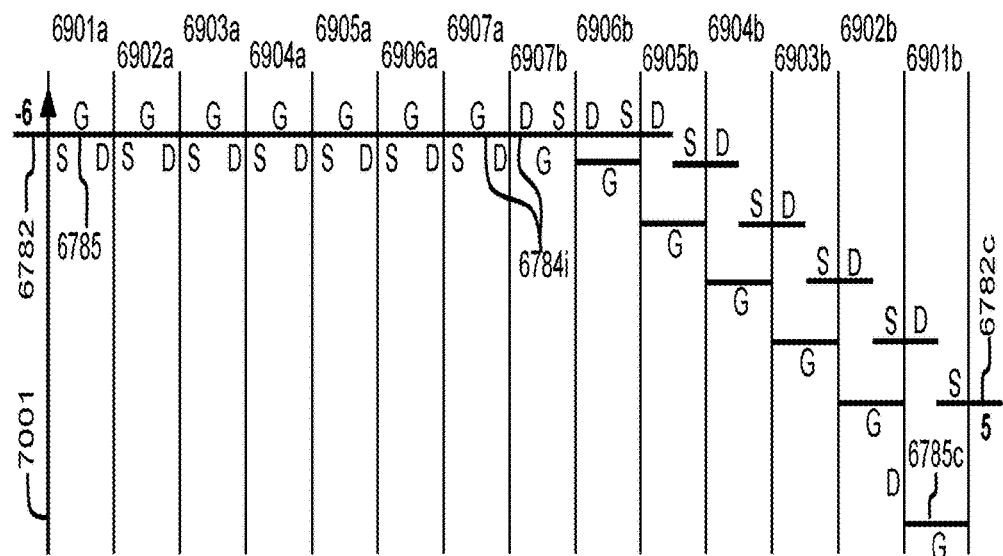
FIG. 71A illustrates the operation of the high voltage device corresponding to FIG. 69.
Figure 71B:
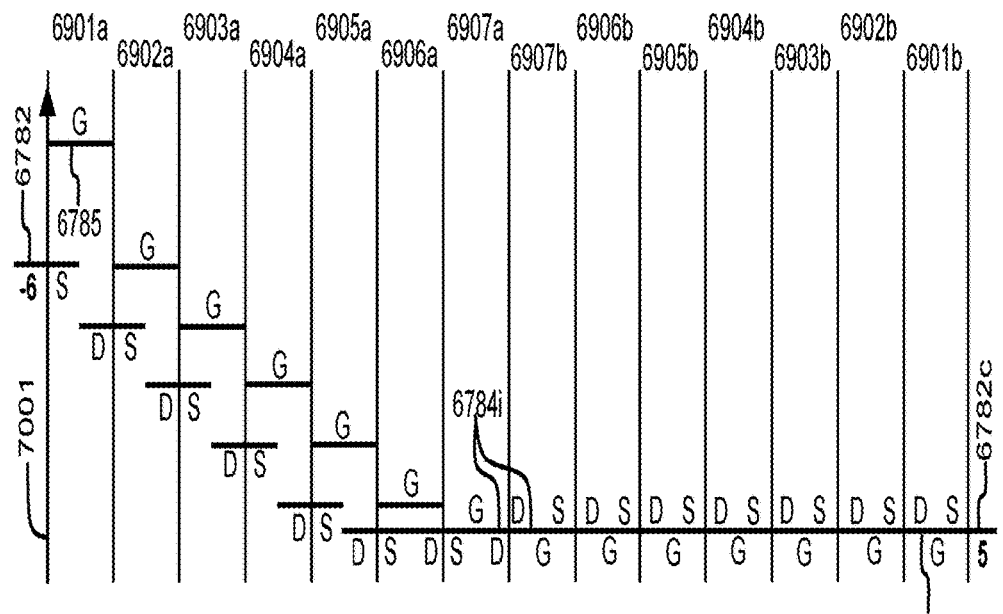
FIG. 71B illustrates the operation of the high voltage device corresponding to FIG. 69.

The operation of the high voltage device 6769 is illustrated in FIGS. 71A and 71B wherein the axis 7001 corresponds to electron potential energy which is the negative of electric potential. In FIG. 71A the first one 6785 of the two gate nodes is set to the same potential than the first source node 6782 rendering the channel of the transistor 6901a conductive. The second one 6785c of the two gate nodes is, on the other hand, set to a high enough reverse bias with respect to the second source node 6782c to render the channel of the transistor 6901b non-conductive. In this potential configuration the channels of the transistors 6901a-6907a in the first transistor chain are conductive and thus a conductive path is established in the first transistor chain from the transistor 6901a until the drain node 6784i. On the other hand, in the second transistor chain the channels of several transistors next to the node 6785c are non-conductive, i.e. at the end of the second transistor chain next to the node 6785c the potential changes from one transistor another until the potential on 6784i is reached (it is important to provide the transistor chains with enough transistors so that a high voltage drop is not resulted in the transistors 6907a or 6907b between their drain and source/gate). Consequently, in afore described potential configuration the node 6784i is biased at the same potential than the first one 6782 of the two source nodes as is depicted in FIG. 71A.

In FIG. 71B the second gate node 6785c is set to the same potential than the second source node 6782c rendering the channel of the transistor 6901b conductive. The first gate node 6785, on the other hand, is set to a high enough reverse bias with respect to the first source node 6782 to render the channel of the transistor 6901a non-conductive. Based on similar line of reasoning than in the case of FIG. 71A it is evident that in this potential configuration the drain node 6784i will be biased at the same potential than the second source node 6782c as is depicted in FIG. 71B.

The benefit of the high voltage device 6769 is that a large potential swing can be achieved at the drain node 6784i without generating large reverse biases, i.e., large voltage differences inside individual transistors due to the internal design of the high voltage device 6769. It should be also noted that by carefully adjusting the potential on the two gate nodes 6785 and 6785c (based on the information of the drain node potential) one can generate on the drain node 6784i any potential in between the potentials of the first and second source nodes. It is also self evident that e.g. for the high voltage blocks 5822 and 5823 a similar arrangement than presented in FIG. 67 could be also utilized.

Figure 72D:
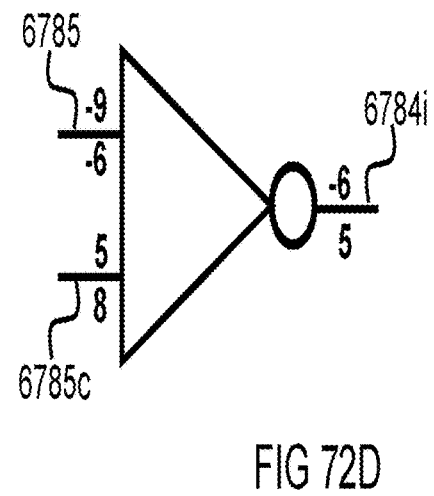
FIG. 72D illustrates a higher level marking for a high voltage device.
Figure 73A:
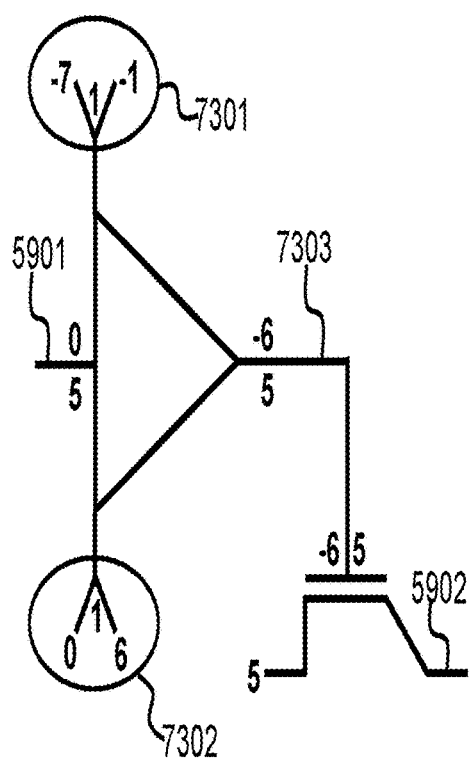
FIG. 73A illustrates a higher level marking for the arrangement corresponding to FIG. 59.
Figure 73B:
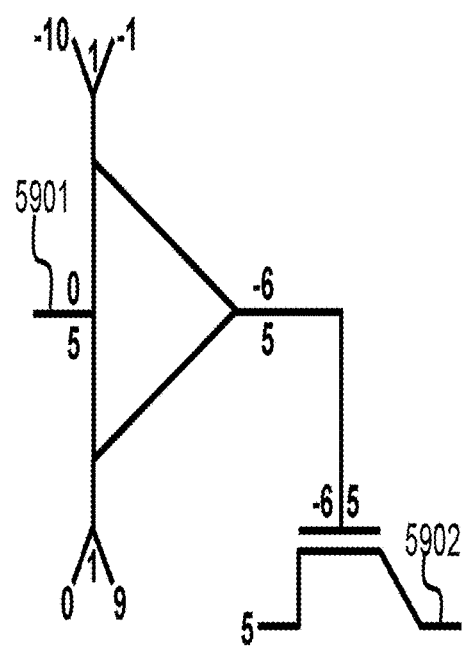
FIG. 73B illustrates a higher level marking for the arrangement corresponding to FIG. 67.

FIG. 72D illustrates an alternative compact marking for the high voltage device 6769 corresponding to a double input inverter wherein the potentials of the two inputs 6785 and 6785c should be simultaneously at high or low—when the inputs are high (−6 V & 8 V) the output 6784i is low (−6 V) and vice versa. The high voltage devices of FIGS. 72A, 72B, and 72C illustrate alternative compact markings for the double input inverters 5972 of FIG. 59, 6072 of FIG. 60, and 6172 of FIG. 61 wherein the two inputs need to be simultaneously either at high or low like in the double input inverter of FIG. 72D (the double input inverter of FIG. 72D differs from the internal structure from the three others). FIG. 73A illustrates an alternative compact marking for the high voltage block 5825 corresponding to FIG. 59 comprising a high voltage selection transistor on the right (comprising the drain node 5902) and a lever shifter on the left (comprising the input 5901; 0 V is shifted to −6 V). The marking 7301 tells that the level shifter requires biases from −7 V to −1 V at 1 V intervals and the marking 7302 tells that the level shifter requires also biases ranging from 0 V to 6 V at 1 V intervals. When the input 5901 of the level shifter is high (5 V) the output 7303 is also high (5 V) and when the input 5901 is low (0 V) the output 7303 is also low (−6 V). FIG. 73B illustrates an alternative compact marking for the high voltage block 5825 corresponding to FIG. 67.

The chip of FIG. 58 can be utilized for selecting a static high voltage output on the output pad 5804. Alternatively the chip of FIG. 58 can be utilized for creating an Alternating Current (AC) output with desired frequency and amplitude (the amplitude cannot though be larger than 5 V). Although the amplitude of 5 V is naturally not truly high voltage the output of the chip of FIG. 58 could be easily extended for much higher amplitudes than 5 V. In other words the chip of FIG. 58 can be utilized for frequency and amplitude modulation from Direct Current (DC) domain to AC domain. The benefit of this arrangement is that many electrical components are much simpler to realize in AC domain than in DC domain. In order gain full control of AC components one should be able to control both the frequency and the amplitude which is enabled with the single logic chip arrangement of FIG. 58. It is important to note that the desired AC configuration is achieved simply by consecutively selecting suitable high voltage blocks in a cyclic manner. In the chip arrangement of FIG. 74 one has only two high voltage inputs 7402 and 7403. In case AC is connected to the inputs 7402 and the input 7303 is at ground and in case the high voltage IC block 7406 comprises a multitude of capacitors connected via high voltage selection transistors to the input 7402 and to the output 5804 then the chip of FIG. 74 can be utilized as a frequency (and/or amplitude) modulator. This is achieved by consecutively connecting a suitable capacitor to the input 7402 at the correct phase so that one can store different constant potentials to different capacitors. By suitably connecting the outputs of the capacitors to the output 5804 of the chip one can adjust the frequency and the amplitude of the AC output. In this manner one has full control of the AC output with a single logic chip having only a single AC input 7402. In other words the invention enables digital control of high voltage AC outputs thus facilitating higher integration, smaller size, and cheaper implementation than what has been previously possible.

Figure 74:
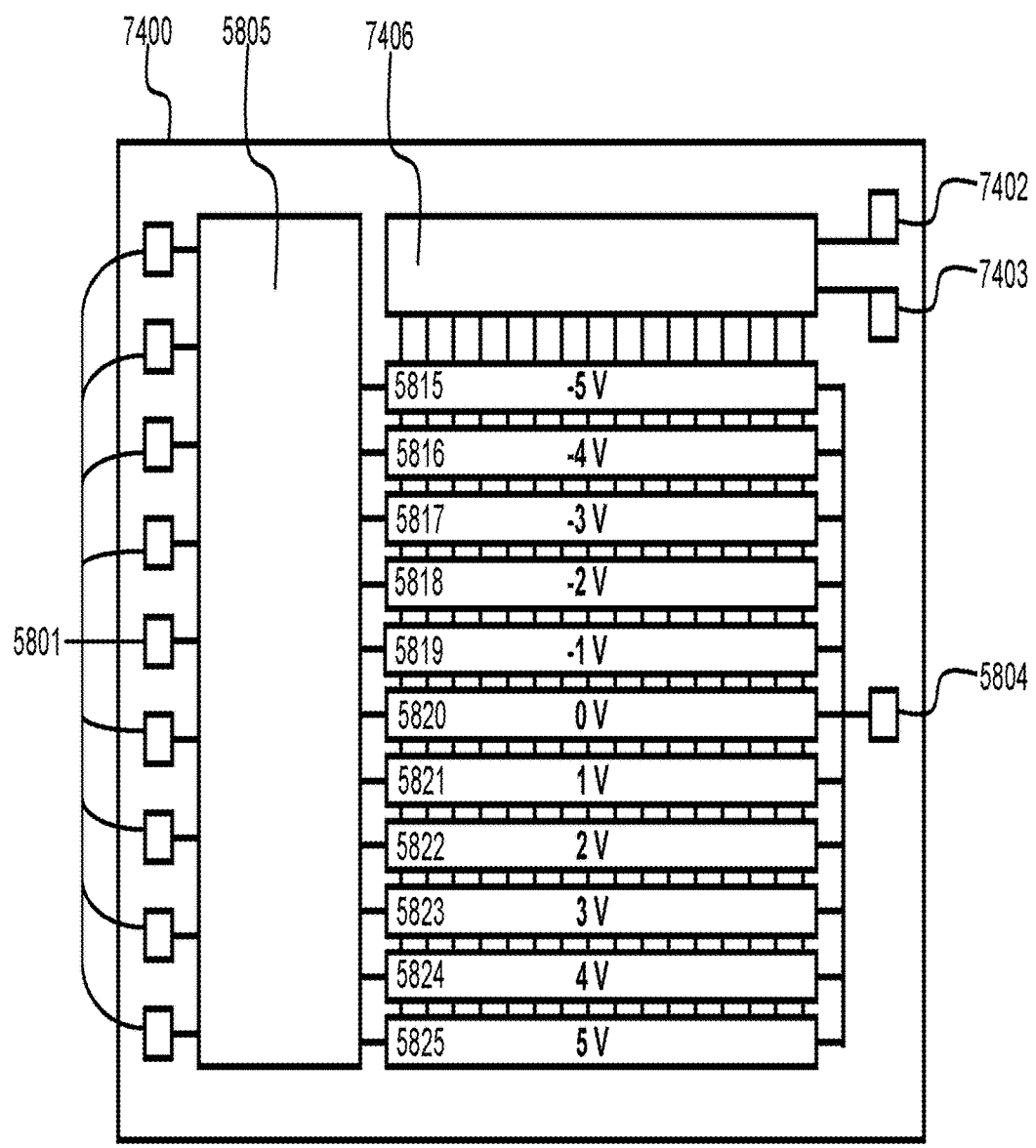
FIG. 74 illustrates another invented possible chip arrangement comprising multiple logic levels.
Figure 75:
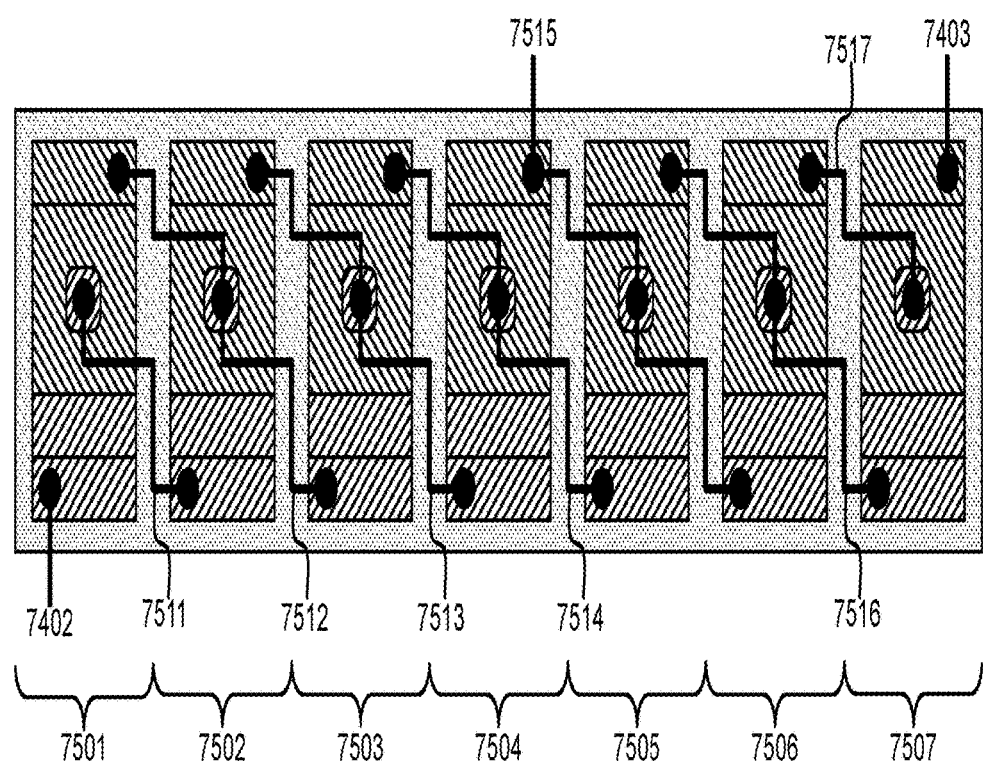
FIG. 75 illustrates a voltage divider arrangement.
Figure 76:
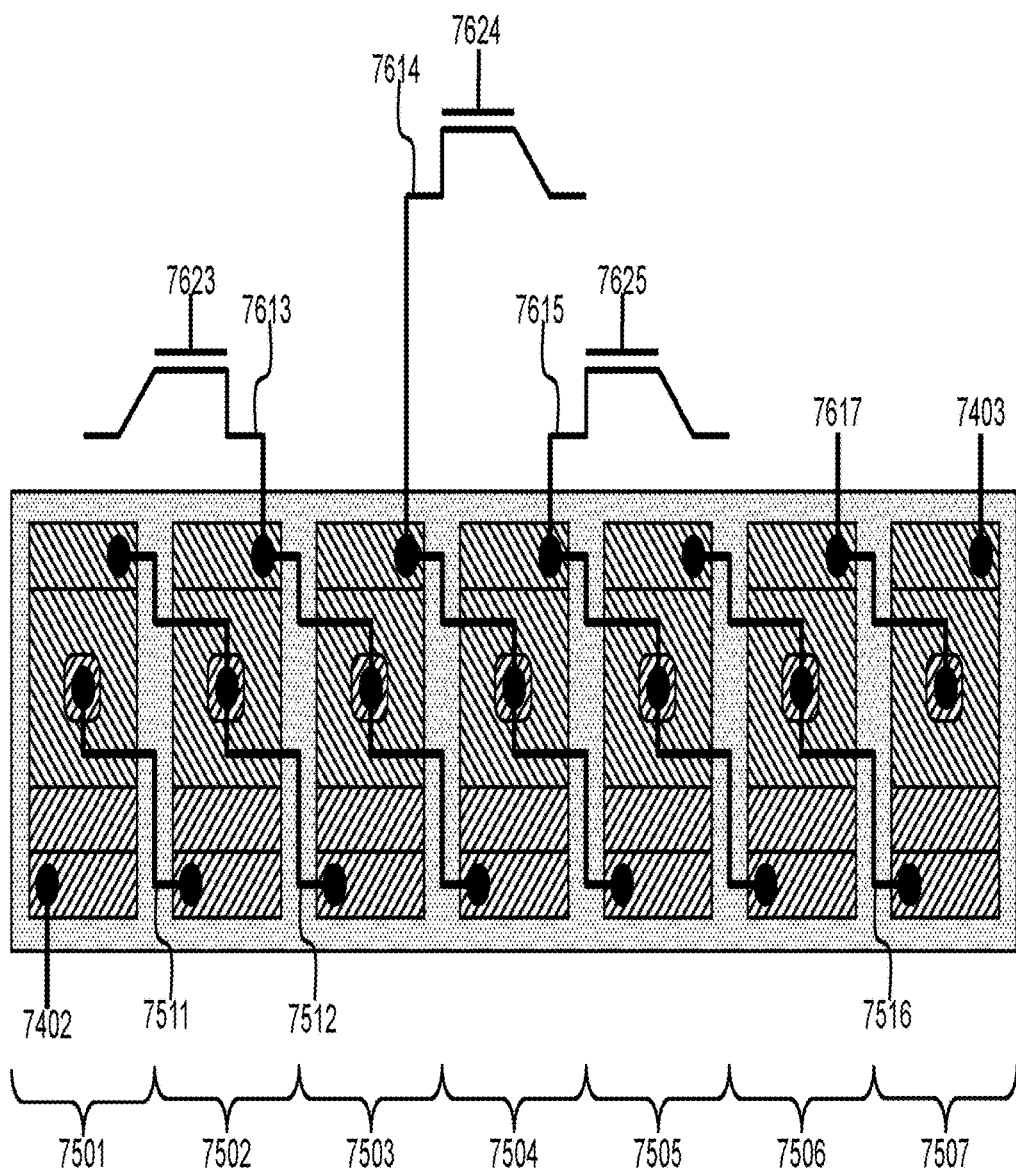
FIG. 76 illustrates another voltage divider arrangement.

In case a constant potential is applied between the high voltage inputs 7402 and 7403 and in case the high voltage IC block 7406 comprises voltage dividers like for example of the kind as presented in FIGS. 75, 76, and/or 78B it is possible to generate the required constant voltages for the high voltage blocks 5815-5825. In this manner the high voltage device of FIG. 74 could be used for example as a DC to AC converter by suitably selecting the high voltage blocks 5815-5825 in a cyclic manner with the IC block 5805. Furthermore it would be possible to generate an AC output with desired/changeable frequency and potential amplitude.

The voltage divider of FIG. 75 comprises seven second type FETs 7501-7507 of the kind being present in the semiconductor logic element of FIGS. 5 and 6 (and/or in the corresponding complementary semiconductor logic element). Different nodes of the transistors 7501-7507 are connected suitably together via the internal wirings 7511-7514 and 7516 as well as via the external wiring 7515 which is the output of the voltage divider. The generated potential on the external wiring 7515 is in between the potentials of the high voltage inputs 7402 and 7403. It is important to note that multiple voltage dividers as presented in FIG. 75 can be connected in parallel but even in this case the problem of the voltage divider of FIG. 75 is that one cannot provide a large current flow to the output of the voltage divider.

The voltage divider of FIG. 75 is composed of one transistor chain comprising second type transistors 7501-7507 similar to the ones presented in FIGS. 5 and 6 or to ones in a corresponding complementary arrangement. The wirings in the transistor chain are connected in the following manner. In the transistors that are not situated at the ends of the transistor chains (i.e. 7501 and 7507) the source is connected via a wiring (7512-7516) to the gate of the next transistor situated closer to the node 7402 in the transistor chain as well as to the drain of the next transistor situated closer to the node 7403 in the transistor chain. The source of the transistor 7501 is connected via wiring 7511 only to the drain of the transistor 7502. The source of the transistor 7507 is connected to the gate of the transistor 7506 via a wiring 7517. In a general case different potentials can be obtained by choosing from the wirings 7511-7517 a suitable one as an external wiring (in case of FIG. 75 the wiring 7515 is chosen as an external wiring).

FIG. 76 illustrates a more advanced voltage divider wherein a large current flow can be provided to the output by adjusting properly the bias of the node comprising the wiring 7617 (corresponding to the wiring 7517 and external wiring) with respect to the potential of the node 7403. The voltage divider of FIG. 76 comprises a transistor chain that is similar to the transistor chain of FIG. 75 in the sense that the transistors are of the same type, that there is similar amount of transistors, and that in between the sources, drains, and gates of the transistors in the transistor chain similar connections are made. The output of the voltage divider of FIG. 76 is programmable, i.e. the output voltage is programmable, since one can choose between three different outputs 7613 (corresponding to the wiring 7513 and external wiring), 7614 (corresponding to the wiring 7514 and external wiring), and 7615 (corresponding to the wiring 7515 and external wiring) by opening up the proper gate 7623, 7624, or 7625 of the corresponding high voltage selection transistor. It is self evident that also multiple voltage dividers corresponding to the one illustrated in FIG. 76 can be connected in parallel (and/or in series). It should be also noted that in FIGS. 68, 69, 75, and 76, different kind of preferably depletion mode FETs can be utilized instead of the transistors already presented in the images.

Figure 77:
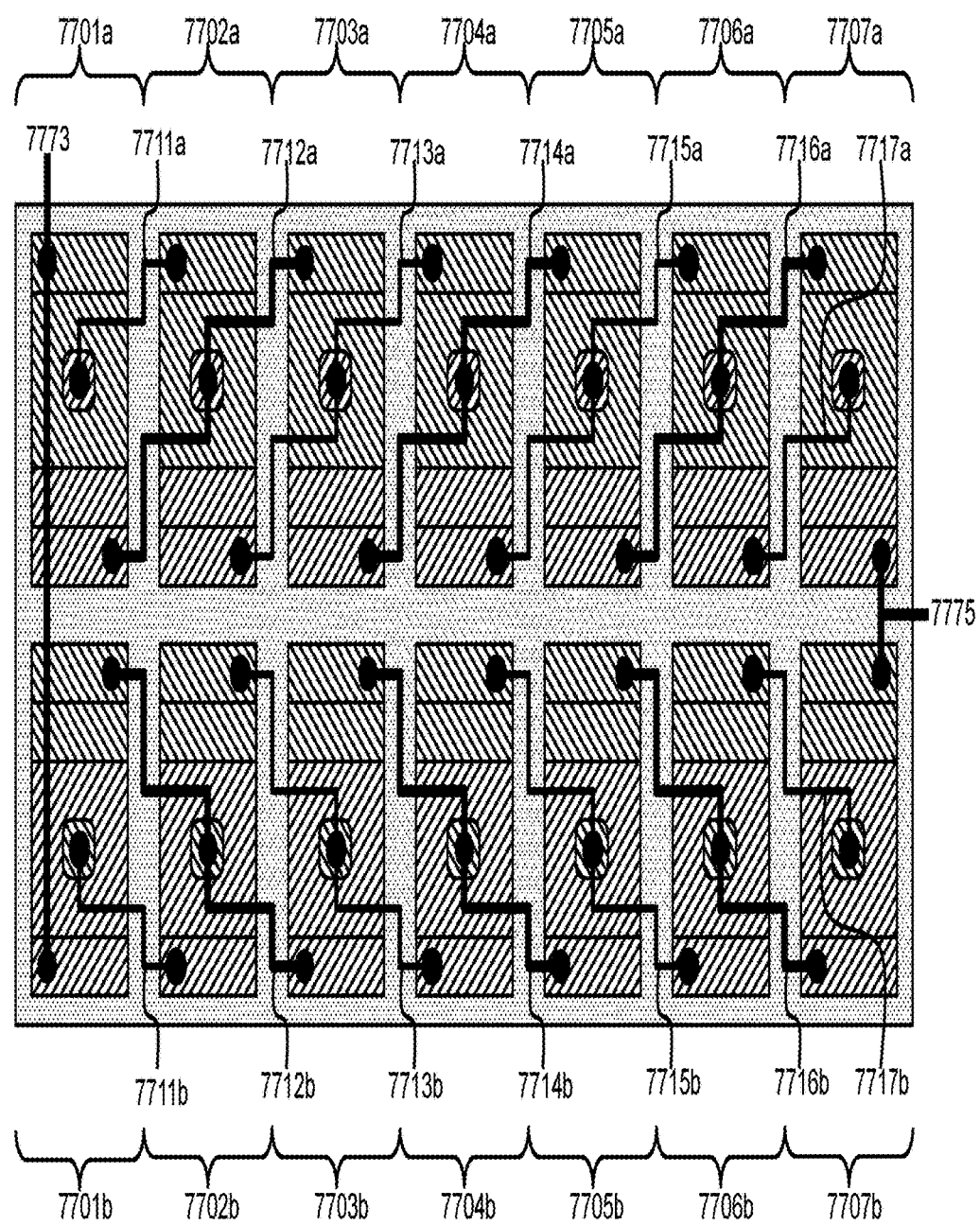
FIG. 77 illustrates a nonlinear resistor arrangement.

FIG. 77 illustrates a high voltage device corresponding to a nonlinear resistor arrangement. When this nonlinear resistor arrangement is utilized in a voltage divider arrangement then even larger current flows can be provided than with the voltage divider of FIG. 76. The nonlinear resistor arrangement of FIG. 77 comprises 7 second type transistors 7701a-7707a and 7 first type transistors 7701b-7707b which are similar to the second and first type FETs of FIGS. 5 and 6 and/or to the corresponding FETs in the complementary arrangement. Beside the vertical FET arrangement of FIGS. 5 and 6 one could naturally also use in the nonlinear resistor arrangement horizontal transistors corresponding to FIGS. 3 and 4 and/or to the corresponding complementary arrangement. Alternatively one could in the nonlinear resistor arrangement also use depletion mode FETs wherein the gate comprises a pn junction with source/drain like for example in FIGS. 7 and 8. The internal wirings 7711a-7717a form desired connections in between different nodes of the transistors 7701a-7707a and the internal wirings 7711b-7717b form desired connections in between different nodes of the transistors 7701b-7707b. The nonlinear resistor comprises two nodes corresponding to the external wirings 7773 and 7775; the former one is connected to the gates of the transistors 7701a and 7701b and the latter one is connected to the drains of the transistors 7707a and 7707b.

The nonlinear resistor arrangement of FIG. 77 is composed of two transistor chains. The first transistor chain comprises second type transistors 7701a-7707a and the second transistor chain comprises first type transistors 7701b-7707b. These two transistor chains are connected in parallel between the external input nodes 7773 and 7775; the gates of 7701a and 7701b are connected to the node 7773 and the drains of 7707a and 7707b are connected to the node 7775. The internal wirings in the nonlinear resistor arrangement of FIG. 77 are connected in the following manner. Beside the transistors at both ends of the transistor chains (i.e. 7701a, 7701b, 7707a, and 7707b) the source of a transistor is always connected via internal wiring (7712a-7716a & 7712b-7716b) to the gate of the next transistor situated closer to the node 7775 in the transistor chain as well as to the drain of the next transistor situated closer to the node 7773 in the transistor chain. The source of the transistor 7707a is connected via internal wiring 7717a only to the drain of the transistor 7706a and the source of the transistor 7707b is connected via internal wiring 7717b only to the drain of the transistor 7707b.

Figure 78A:
FIG. 78A illustrates a higher level marking for the nonlinear resistor arrangement corresponding to FIG. 77.
Figure 78B:
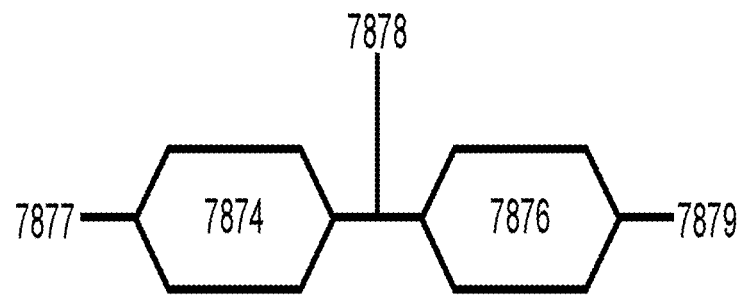
FIG. 78B illustrates a voltage divider arrangement utilizing the nonlinear resistor arrangement of FIGS. 77 and 78A.

FIG. 78A illustrates a more compact marking 7874 for the nonlinear resistor arrangement of FIG. 77 wherein also the external input nodes 7773 and 7775 are depicted. FIG. 78B illustrates how nonlinear resistors 7874 and 7476 can be utilized as a voltage divider comprising external input nodes 7877 and 7879 between which a voltage is applied and an external output node 7878 wherein a certain voltage is generated. It should be noted that one can utilize in the transistor chains of a nonlinear resistor corresponding to FIGS. 77 and 78A any amount of transistors and that the two transistor chains corresponding to one nonlinear resistor may have different amount of transistors. In case the two transistor chains contain a substantially disproportional amount of transistors avalanche multiplication would be generated in when the reverse bias in the non-conducting transistor chain exceeds certain value and this may affect the lifetime and the output stability of the nonlinear resistor, but in some circumstances this could be utilized for providing directional fuse operation.

One could naturally interchange the sources and drains of some or all of the transistors in the nonlinear resistor arrangement of FIG. 77. Besides it is possible to connect nonlinear resistors in parallel and/or in series in numerous ways and having multiple external input and/or output nodes like for example one can do with resistors, i.e., one can create a network of nonlinear resistors. The output node/nodes of a nonlinear resistor network can naturally also be connected to numerous circuit arrangements. It is also possible to interconnect nonlinear resistors, resistors, capacitances, inductors, transistors, memristors, memcapacitors, meminductors, memtransistors as well as any electric, electromechanical, and electro-optical components together as a network.

Depending on the polarity only the transistor chain is conductive wherein the drain to gate junction of the transistors is forward biased and the other one is nonconductive wherein the drain to gate junction of the transistors is reverse biased. In the conductive transistor chain the mobile charge carriers are first running through the channels of transistors 7702-7707 and finally through the drain gate pn junction in transistor 7701. When the forward bias in the conductive chain of transistors is increased sufficiently the major part of the mobile charge carriers start to run across pn junctions and metal wirings throughout the conductive transistor chain and only a minor part of the mobile charge carriers run through transistor channels in the conductive transistor chain. When the mobile charge carriers start to run across pn junctions throughout the conductive transistor chain the forward bias in the conductive transistor chain cannot be easily extended above a certain value (which is dependent on the polarity) since the pn junctions can carry a lot of current and since a tiny increase in forward potential across the pn junction results in a large change in current.

Based on afore said the benefit of the nonlinear resistor and of a voltage divider comprising nonlinear resistors are that potentials of both polarities can be connected between the external input nodes, that the output at different polarities can be made symmetric or as asymmetric as desired (however, avalanche multiplication may have to be avoided), and that the output current is nonlinear (i.e. the resistance is nonlinear). The resistance is first large at a small potential difference across the nonlinear resistor or across a voltage divider comprising nonlinear resistors, diminishes when the potential difference is increased, and is very small after the mobile charge carriers start to run across the pn junctions throughout the conductive transistor chain/chains. Consequently, it is actually possible to keep the output node (or output nodes) in a voltage divider at a fairly constant potential while the output node (or nodes) can provide large output currents which magnitude may also change rapidly. Thus a voltage divider comprising nonlinear resistors (like e.g. in the arrangement of FIG. 78B) is well suited for voltage generation and particularly so for generating the different voltages required in circuitries comprising the novel semiconductor logic elements that are described in this patent application—a good example is the high voltage block 7406 in the high voltage device of FIG. 74.

So far embodiments of the invention corresponding to semiconductor logic elements have been described wherein the first FET is preferably a depletion mode FET and wherein the first gate when biased at first input logic potential is preferably either reverse biased when compared to the first source biased at first source potential or at the same potential than the first source biased at first source potential. For the sake of readability it is hereby repeated that a gate that is reverse biased when compared to the source refers to a potential difference between the source and the gate that corresponds to a less conductive channel than when the source and gate are at the same potential. A gate that is forward biased when compared to the source refers to a potential difference between the source and the gate that corresponds to a more conductive channel than when the source and gate are at the same potential. The depletion mode FET means that the channel is conductive when the source and gate are at the same potential and that above a certain gate to source reverse bias the channel is nonconductive. In an enhancement mode FET the channel is nonconductive when the gate and the source are at the same potential and above a certain gate to source forward bias the channel is conductive. It should be also noted that in low power logic the preferred way to realize an enhancement mode FET is to utilize a CISFET configuration wherein the gate node corresponds to the external gate since in this manner the gate can be forward biased with respect to the source without generating a current flow between the gate and source nodes.

In the semiconductor logic element according to the invention one can also utilize the definition that the second input logic potential on the first gate is more reverse (or less forward) biased with respect to the first source than when the first gate is biased at first input logic potential. Similarly one can say that the first source potential on the second gate is more reverse (less forward) biased with respect to the second source biased at first output logic potential than when the second gate is biased at first output logic potential.

It is also possible to realize an embodiment of the invention corresponding to a semiconductor logic element wherein the first FET is an enhancement mode CISFET. In this arrangement the input corresponds to the first external gate. When the first gate is biased at first input logic potential it is forward biased when compared to the first source biased at first source potential and in addition the forward bias has to exceed a threshold value in order to turn the first channel conductive. When the first gate is biased at second input logic potential the first gate is either at the same potential or reverse biased or forward biased when compared to the first source node being at first source potential while the first channel is nonconductive. The latter most point means that the forward bias between the first gate and the first source must not exceed the threshold value that would turn the first channel conductive.

Below different scenarios for first FET, second FET, complementary first FET, and complementary second FET are summarized corresponding to the situation that neither pn junctions nor Schottky junctions are forward biased and wherein the first input logic potential corresponds to the complementary second logic potential and wherein the second input logic potential corresponds to the complementary first logic potential. Furthermore, the first source is biased at first source potential, the complementary first source is biased at complementary first source potential, the second source is biased at first output logic potential, the complementary second source node is biased at second output logic potential, the input refers also to complementary input, and the output refers also to complementary output.

If in the invented semiconductor logic element the first FET is a depletion mode field effect transistor the following facts apply:
  When the input is biased at first input logic potential the first gate and the first source are either at the same potential or reverse biased with respect to each others and first channel is conductive. If the first gate corresponds to an external CIS gate only the first gate can be also forward biased with respect to the first source.
  When the input is biased at second input logic potential the first gate and the first source are reverse biased with respect to each others and the first channel is nonconductive.

If in the invented complementary semiconductor logic element the complementary first FET is a depletion mode field effect transistor the following facts apply:
  When the input is biased at second input logic potential the complementary first gate and the complementary first source are either at the same potential or reverse biased with respect to each others and the complementary first channel is conductive. If the complementary first gate corresponds to an external CIS gate only the complementary first gate can be also forward biased with respect to the complementary first source.
  When the input is biased at first input logic potential the complementary first gate and the complementary first source are reverse biased with respect to each others and the complementary first channel is nonconductive.

If in the invented semiconductor logic element the second FET is a depletion mode field effect transistor the following facts apply:
  When the input is biased at first input logic potential the second gate is reverse biased with respect to the second source and the second channel is nonconductive.
  When the input is biased at second input logic potential the second gate is adjusted approximately at the same potential than the second source and the second channel is conductive. If the second gate corresponds solely to an external CIS gate the second gate can be also forward biased with respect to the second source.

If in the invented complementary semiconductor logic element the complementary second FET is a depletion mode field effect transistor the following facts apply:
  When the input is biased at second input logic potential the complementary second gate is reverse biased with respect to the complementary second source and the complementary second channel is nonconductive.
  When the input is biased at first input logic potential the complementary second gate is adjusted approximately at the same potential than the complementary second source and the complementary second channel is conductive. If the complementary second gate corresponds solely to an external CIS gate the complementary second gate can be also forward biased with respect to the second source.

If in the invented semiconductor logic element the second FET is an enhancement mode CISFET wherein the second gate corresponds solely to an external CIS gate the following facts apply:
  When the input is biased at first input logic potential the second gate is either at the same potential or reverse biased or forward biased with respect to the second source and the second channel is nonconductive. If the second gate is forward biased with respect to the second source the forward bias must not exceed the threshold value that would turn the second channel conductive.
  When the input is biased at second input logic potential the second gate is forward biased with respect to the second source and the forward bias exceeds the threshold value turning the second channel conductive.

If in the invented complementary semiconductor logic element the complementary second FET is an enhancement mode CISFET wherein the complementary second gate corresponds solely to an external CIS gate the following facts apply:
  When the input is biased at second input logic potential the complementary second gate is either at the same potential or reverse biased or forward biased with respect to the complementary second source and the second channel is nonconductive. If the complementary second gate is forward biased with respect to the complementary second source the forward bias must not exceed the threshold value that would turn the complementary second channel conductive.
  When the input is biased at first input logic potential the complementary second gate is forward biased with respect to the complementary second source and the forward bias exceeds the threshold value so that the complementary second channel is conductive.

If in the invented semiconductor logic element the first FET is an enhancement mode CISFET wherein the first gate corresponds solely to an external CIS gate the following facts apply:
  When the input is biased at first input logic potential the first gate is forward biased with respect to the first source and the forward bias exceeds the threshold value turning the first channel conductive.
  When the input is biased at second input logic potential the first gate is either at the same potential or reverse biased or forward biased with respect to the first source. If the first gate is forward biased with respect to the first source the forward bias must not exceed the threshold value that would turn the first channel conductive.

If in the invented complementary semiconductor logic element the complementary first FET is an enhancement mode CISFET wherein the complementary first gate corresponds solely to an external CIS gate the following facts apply:
  When the input is biased at second input logic potential the complementary first gate is forward biased with respect to the complementary first source and the forward bias exceeds the threshold value turning the complementary first channel conductive.
  When the input is biased at first input logic potential the complementary first gate is either at the same potential or reverse biased or forward biased with respect to the complementary first source. If the complementary first gate is forward biased with respect to the complementary first source the forward bias must not exceed the threshold value that would turn the complementary first channel conductive.

Figure 80:
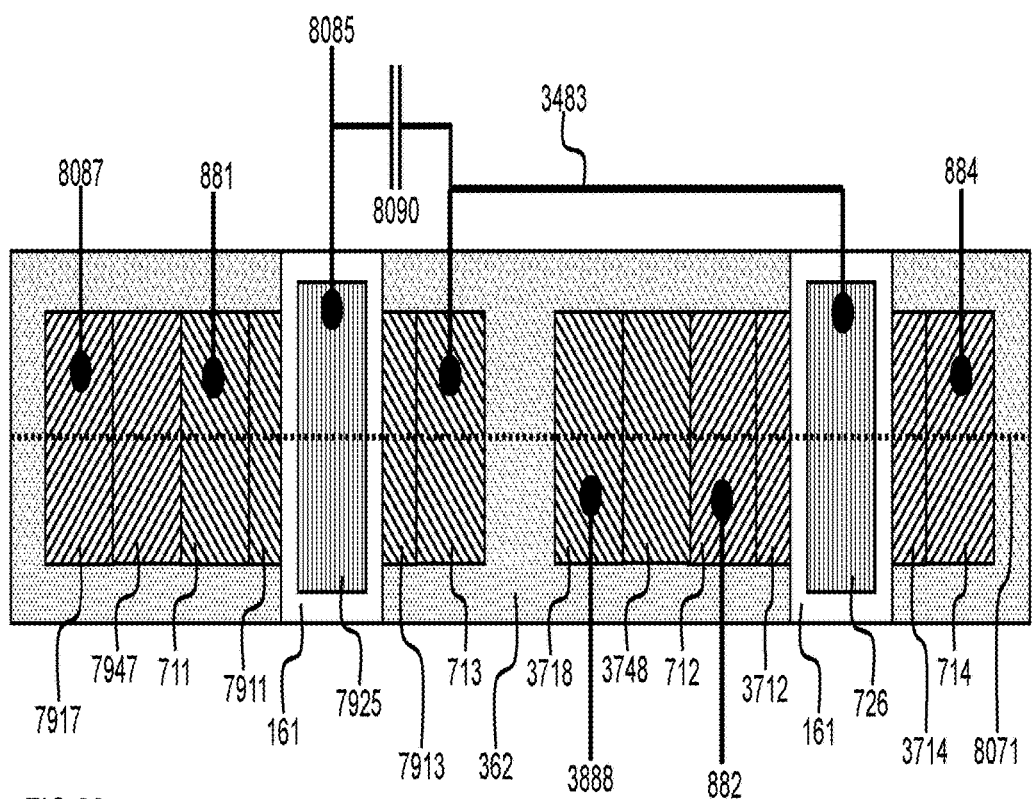
FIG. 80 illustrates an embodiment of the invention corresponding to the schematic layout of the semiconductor logic element according to FIG. 79.

An example of a semiconductor logic element comprising an enhancement mode first FET as well as an enhancement mode second FET is illustrated in FIGS. 79 and 80. The first FET corresponds to a surface channel CISFET wherein the input corresponds to the first external gate. FIG. 80 illustrates a schematic layout of the semiconductor logic element and FIG. 79 illustrates a schematic cross-section of the semiconductor logic element along the dashed line 8071 of FIG. 80. The first source node comprises the first conductivity type source doping 711, a lower doped first conductivity type source extension doping 7911, and a wiring 881. The first auxiliary gate node comprises a second conductivity type back-gate doping 7947, a second conductivity type back-gate contact doping 7917, and a wiring 8087. The first gate node (i.e. the input) comprises an external gate 7925 and a wiring 8085. The first channel is capable of transporting mobile first conductivity type charge carriers and it corresponds to a surface channel 7931.

The first drain comprises the first conductivity type drain doping 713 and a lower doped first conductivity type drain extension doping 7913. The second gate comprises the external gate 726. The internal node comprises the first drain doping 713, the drain extension doping 7913, the external gate 726, and a wiring 3483. The second channel is capable of transporting mobile second conductivity type charge carriers and it corresponds to a surface channel 3732. Between the input and the internal node there is an optional 'drag-along' plate capacitor 8090. The second source node comprises the second conductivity type source doping 712, the lower doped second conductivity type source extension doping 3712, and a wiring 882. The second auxiliary gate node comprises the first conductivity type back-gate doping 3748, the first conductivity type back-gate contact doping 3718, and a wiring 3888. The second drain node (i.e. the output) comprises the second conductivity type drain doping 714, the lower doped second conductivity type drain extension doping 3714, and the wiring 884. The second channel is capable of transporting mobile second conductivity type charge carriers and it corresponds to a surface channel 3732.

The fact that the first conductivity type first FET on the left hand side of FIGS. 79 and 80 is an enhancement mode transistor means that when the first gate is biased at first input logic potential and the first source is biased at the first source potential then the first gate must be forward biased above the threshold level with respect to the first source since otherwise the first channel 7931 would not be conductive. When the first gate is biased at second input logic potential and the first source is biased at first source potential then the first gate must be either at the same potential or reverse biased with respect to the first source in order to insure that the first channel 7931 is nonconductive. The first gate could be actually also forward biased with respect to the first source but only beneath the threshold value in order to insure that the first channel is not conductive.

In FIGS. 79 and 80 the second conductivity type second FET on the right hand side is in this example an enhancement mode transistor. When input is biased at the first input logic potential the first channel is conductive meaning that the second gate is biased at first source potential. When the second gate is biased at first source potential and the second source is biased at first output logic potential then the second channel 3732 must be nonconductive meaning that the second gate can be either at the same bias or reverse biased with respect to the second source. Besides the second gate may be also forward biased with respect to the second source but in this case the forward bias must not exceed the threshold value. When the input is biased at second input logic potential the first channel is nonconductive meaning that the potential at the second gate settles to a value that turns the second channel conductive meaning that the second gate is forward biased with respect to the second source.

It should be noted that the second FET and its operation corresponds to the second FET on the right hand side of FIGS. 37 and 38, i.e., the semiconductor logic elements of FIGS. 79 and 80 is applicable to CCIS logic of the second kind.

Figure 81A:
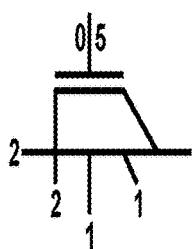
FIG. 81A illustrates a higher level marking for the semiconductor logic element of FIGS. 79 and 80 biased at a certain potential configuration.
Figure 81B:
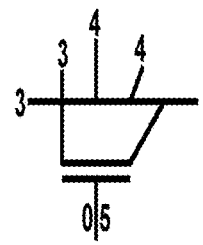
FIG. 81B illustrates a higher level marking for the complementary semiconductor logic element of FIG. 81A.
Figure 81C:
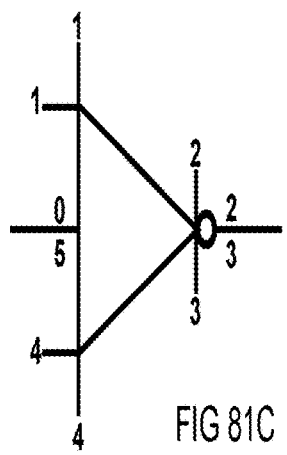
FIG. 81C illustrates a higher level marking for an inverter configuration comprising the semiconductor logic elements of FIGS. 81A and 81B.
Figure 81D:
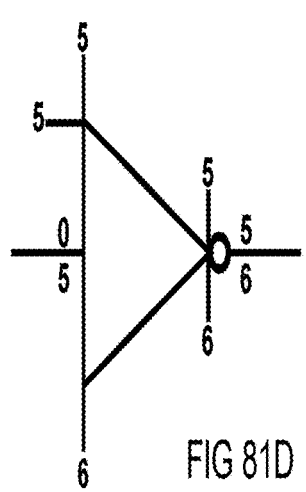
FIG. 81D illustrates possible bias configuration for an inverter configuration wherein the semiconductor logic element corresponds to FIGS. 79 and 80 and wherein the complementary semiconductor logic element comprises a depletion mode first FET and an enhancement mode second FET.

FIG. 81A illustrates a possible biasing scheme of an inverter arrangement based on the semiconductor logic element according to FIGS. 79 and 80. FIG. 81B illustrates a possible biasing scheme of a semiconductor logic element according to FIGS. 79 and 80 that is complementary to the semiconductor logic element of FIG. 81A. FIG. 81C illustrates a non-MSCL inverter arrangement corresponding to FIGS. 81A and 81B and to modified CCIS logic of the second kind. FIG. 81D illustrates a biasing scheme of another non-MSCL inverter arrangement wherein the semiconductor logic element corresponds to FIGS. 79 and 80 and wherein the complementary semiconductor logic element comprises a depletion mode first FET and an enhancement mode second FET. The higher level markings of FIG. 81A-81D are explained in the description according to FIGS. 52A-52E.

Figure 82A:
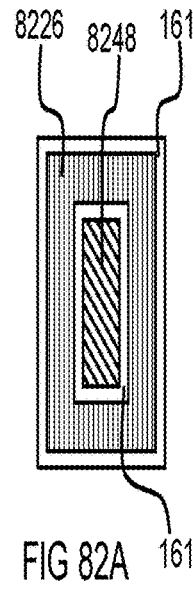
FIG. 82A illustrates a schematic cross-section of a surface channel wrap-around CIS gate.
Figure 82B:
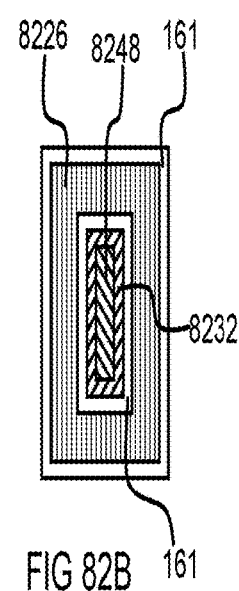
FIG. 82B illustrates a schematic cross-section of a buried channel wrap-around CIS gate.
Figure 83A:
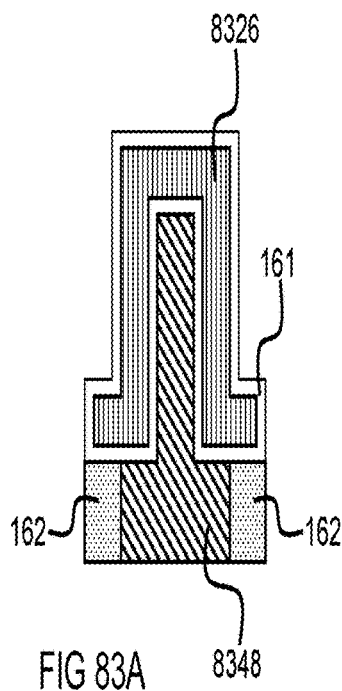
FIG. 83A illustrates a schematic cross-section of a surface channel FINFET CIS gate.
Figure 83B:
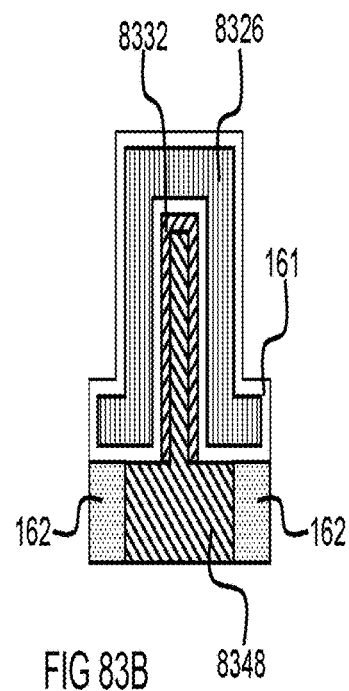
FIG. 83B illustrates a schematic cross-section of a buried channel FINFET CIS gate.
Figure 86A:
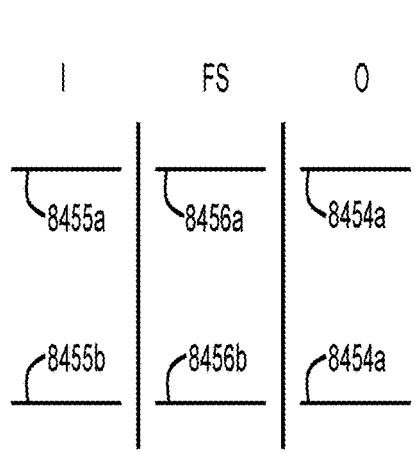
FIG. 86A illustrates possible bias levels in an inverter arrangement wherein the first FET is a depletion mode FET and the second FET is an enhancement mode FET having only a CIS gate.
Figure 86B:
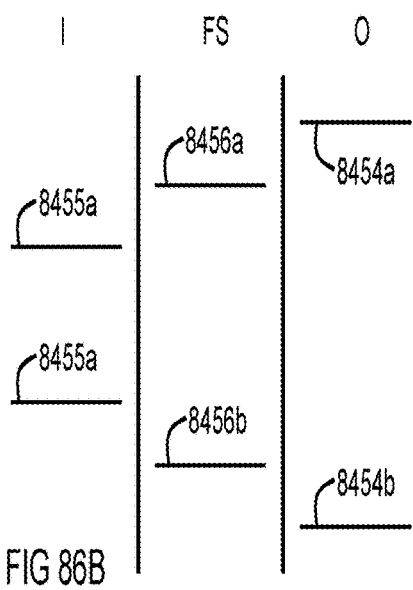

It is important to note that it is also possible to utilize in the first and second FET different kinds of gate arrangement that have so far not been presented. Examples of different possible CISFET gate arrangements are illustrated in FIGS. 82A, 82B, 83A, and 83B. FIG. 82A illustrates a schematic cross-section of a surface channel wrap-around CISFET gate comprising a wrap-around external gate 8226 and a back-gate doping 8248. FIG. 82B illustrates a schematic cross-section of a buried channel wrap-around CISFET gate comprising a buried channel doping 8232. FIG. 83A illustrates a schematic cross-section of a surface channel CISFET comprising a fin shaped external gate 8326 and back-gate doping 8348. FIG. 83B illustrates a schematic cross-section of a fin formed buried channel CISFET comprising a buried channel doping 8332. The CISFET arrangements corresponding to FIGS. 83A and 83B are also referred to as finFET arrangements.

FIGS. 84A, 84B, 84C, 86A, 86B, 87A, and 87B illustrate examples of possible bias levels in symmetrical inverter arrangements. The term symmetrical inverter means first of all that the first FET and the complementary first FET are similar but opposite type transistors as well as that the second FET and the complementary second FET are similar but opposite type transistors. Furthermore, the term symmetrical inverter means that when in the inverter arrangement the p and n type areas as well as the potentials between nodes and corresponding complementary nodes are interchanged then an identical inverter arrangement is resulted in. In the inverter arrangements of FIGS. 84A, 84B, 84C, 86A, 86B, 87A, and 87B the letter I refers to input, the letter O refers to output, and the letters FS refer to first source. The first input logic potential 8455a, the second input logic potential 8455b, the first output logic potential 8454a, the second output logic potential 8454b, the first source potential 8456a, and the complementary first source potential 8456b are also depicted in each of the figures.

In the symmetrical inverter arrangements corresponding to FIGS. 84A, 84B, 84C, 86A, and 86B the first FET and the complementary first FET are depletion mode field effect transistors. In the symmetrical inverter arrangements corresponding to FIGS. 84A, 84B, 84C, and 87A the second FET and the complementary second FET can be either depletion mode transistors or enhancement mode field effect transistors. In the symmetrical inverter arrangements corresponding to FIGS. 86A, 86B, and 87B the second FET and the complementary second FET are enhancement mode field effect transistors. In the symmetrical inverter arrangements corresponding to FIGS. 87A and 87B the first FET and the complementary first FET are enhancement mode field effect transistors. The embodiments in FIGS. 84A, 86A, and 87B correspond to MSCL; it should be noted, however, that a symmetric inverter arrangement is not a prerequisite for MSCL. Based on FIG. 87B one can deduce that the embodiment of FIGS. 79 and 80 is also applicable to MSCL.

FIGS. 85A and 85B illustrate examples of invented inverter arrangements wherein only two potential levels are required. In the inverter arrangement of FIG. 85A the first FET and the complementary first FET are depletion mode transistors wherein the first gate as well as the complementary first gate correspond to external gates. In the inverter arrangement of FIG. 85B the first FET and the complementary first FET are depletion mode transistors wherein the gate confines the channel at least from two sides. In both inverter arrangements corresponding to FIGS. 85A and 85B the second FET and the complementary second FET correspond to enhancement mode transistors.

Figure 88:
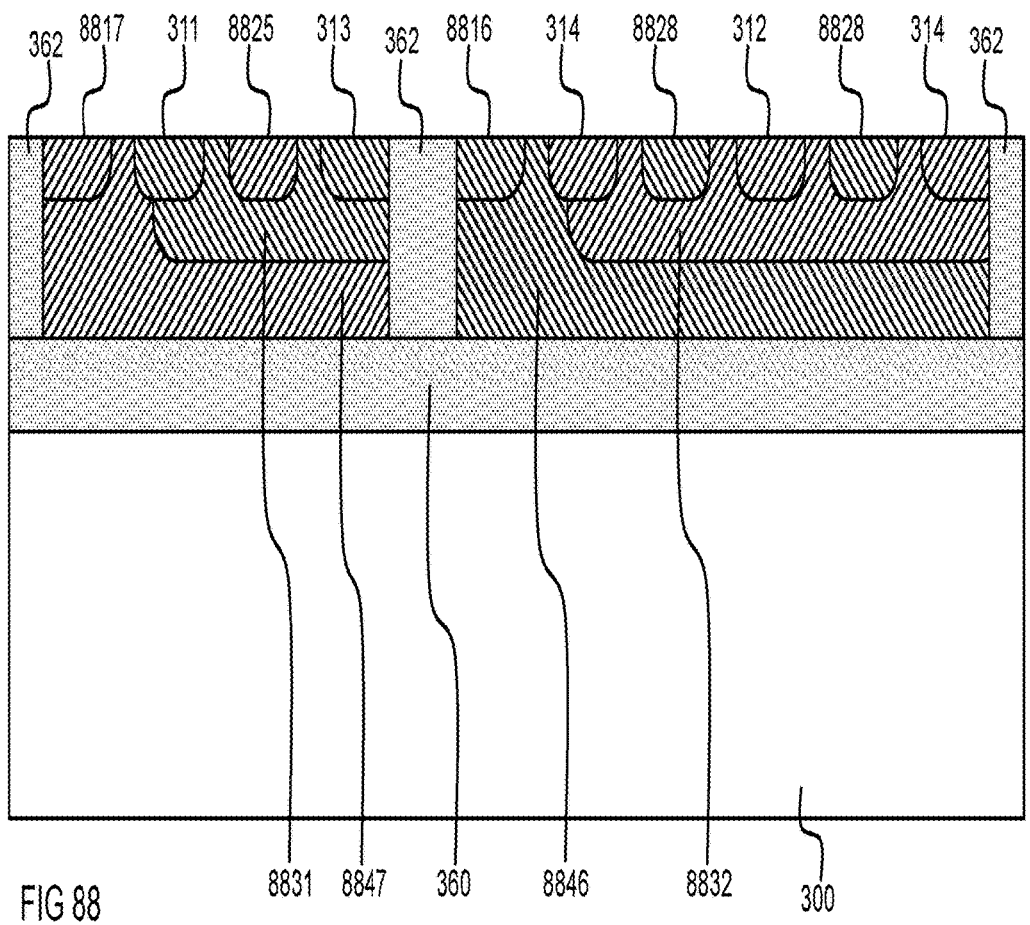

So far the embodiments wherein the first FET and/or the second FET correspond to a JFET the gate of the JFET has corresponded to a one single doped region surrounding the channel from at least from two sides; in previous embodiments comprising horizontal JFETs the gate comprises an upper gate doping and a lower gate doping that correspond to a single doped region of the same conductivity type. It is, however, also possible to utilize JFETs wherein a single doped region does not surround the channel from at least two sides. In the embodiment of FIGS. 88-90 the first FET and the second FET are lateral JFETs wherein two separate doped regions that are of the same conductivity type are located on the opposite sides of the channel; these separate doped regions are referred to as the front-gate doping and the back-gate doping. FIG. 89 illustrates a schematic layout of the semiconductor logic element, FIG. 88 illustrates a schematic cross-section of the semiconductor logic element along the dashed line 8971 of FIG. 89, and FIG. 90 illustrates a schematic cross-section of the semiconductor logic element along the dashed line 8972 of FIG. 89.

The first source node comprises the first conductivity type source doping 311 and a wiring 481. The first auxiliary gate node comprises a second conductivity type back-gate doping 8847, a second conductivity type back-gate contact doping 8817, and a wiring 8987. The first gate node (i.e. the input) comprises a front-gate doping 8825 and a wiring 8985. The first drain comprises the first conductivity type drain doping 313. The first channel corresponds to a first conductivity type channel doping 8831 that is located between the first source and the first drain and that is capable of transporting mobile first conductivity type charge carriers. The second gate comprises the first conductivity type back-gate doping 8846 and a first conductivity type back-gate contact doping 8816. The internal node comprises the first drain, the second gate, and a wiring 8983 connecting the two. The second source node comprises the second conductivity type source doping 312 and a wiring 482. The second channel corresponds to a second conductivity type channel doping 8832 that is located between the second source and the second drain and that is capable of transporting mobile second conductivity type charge carriers. Between the input and the internal node there is an optional 'drag-along' plate capacitor 8990. The second auxiliary gate node comprises the first conductivity type front-gate doping 8828 and a wiring 8988. The second drain node (i.e. the output) comprises the second conductivity type drain doping 314 and a wiring 484.

In the semiconductor logic element of FIGS. 88, 89, and 90 the first auxiliary gate node can be connected for example to the second input logic potential and the second auxiliary gate node can be connected for example to the first source potential. This is possible since the front-gate doping and back-gate doping correspond both in the first FET as well as in the second FET to separate doped regions. Otherwise the operation of the semiconductor logic element of FIGS. 88, 89, and 90 corresponds to the operation of the semiconductor logic element of FIGS. 3 and 4 including that the first channel is conductive and the second channel is nonconductive when the input is at first input logic potential, when the second source is at first output logic potential, and when the first source is at first source potential as well as that the first channel is nonconductive, the second channel is conductive, and the internal node is clamped at first output logic potential when the input is at second input logic potential, when the second source is at the first output logic potential, and when the first source is at first source potential, i.e., the embodiment of FIGS. 88, 89, and 90 is applicable to MSCL and CS logic.

Figure 91:
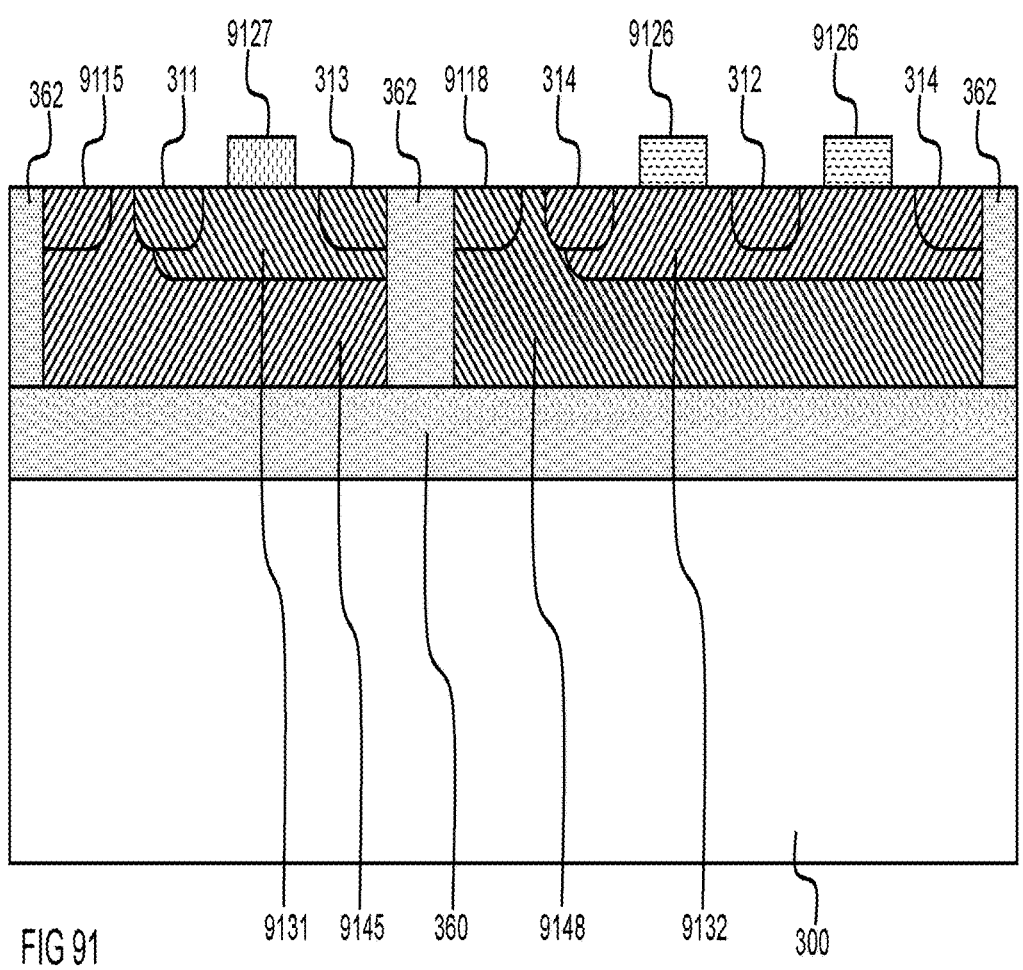

In the embodiments corresponding to FIGS. 91, 92, and 93 an embodiment of the semiconductor logic element comprising external Schottky gates is illustrated. FIG. 92 illustrates a schematic layout of the semiconductor logic element, FIG. 91 illustrates a schematic cross-section of the semiconductor logic element along the dashed line 9271 of FIG. 92, and FIG. 92 illustrates a schematic cross-section of the semiconductor logic element along the dashed line 9272 of FIG. 92. In the previous embodiments there has been always an Ohmic contact between the contact dopings and the wirings, but in FIGS. 91, 92, and 93 the conductor material of an external Schottky gate 9127 forms a Schottky diode in the first FET with respect to the first conductivity type semiconductor material corresponding to a first channel doping 9131 (located between the first conductivity type source doping 311 and the first conductivity type drain doping 313). Similarly the conductor material of an external Schottky gate 9126 in the second FET forms a Schottky diode with respect to the second conductivity type semiconductor material corresponding to a second channel doping 9132 (located between the second conductivity type source doping 312 and second conductivity type drain doping 314).

In FIGS. 91, 92, and 93 the first source node corresponds to the source doping 311 and to a wiring 481. The first gate node (i.e. the input) corresponds to a second conductivity type back-gate doping 9145, to a second conductivity type contact doping 9115, and to a wiring 9285. The first auxiliary gate node corresponds to the external Schottky gate 9127 and to a wiring 9287. The internal node corresponds to the first drain doping 313, to the external Schottky gate 9126, and to a wiring 9283 connecting the two. Between the input and the internal node there is an optional plate capacitor 9290. The second auxiliary gate node corresponds to a first conductivity type back-gate doping 9148, to a first conductivity type contact doping 9118, and to a wiring 9288. The second source node corresponds to the source doping 312 and to a wiring 482. The second drain node (i.e. the output) corresponds to the drain doping 314 and to a wiring 484.

In the semiconductor logic element of FIGS. 91, 92, and 93 the first auxiliary gate node can be connected for example to the second input logic potential and the second auxiliary gate node can be connected for example to the first source potential. The operation of the semiconductor logic element of FIGS. 91, 92, and 93 corresponds to the operation of FIGS. 88, 89, and 90, i.e. excluding the auxiliary gates the operation of the semiconductor logic element of FIGS. 91, 92, and 93 corresponds to the operation of the semiconductor logic element of FIGS. 3 and 4 including that the first channel is conductive and the second channel is nonconductive when the input is at first input logic potential, when the second source is at first output logic potential, and when the first source is at first source potential as well as that the first channel is nonconductive, the second channel is conductive, and the internal node is clamped at first output logic potential when the input is at second input logic potential, when the second source is at the first output logic potential, and when the first source is at first source potential, i.e., the embodiment of FIGS. 91, 92, and 93 is applicable to MSCL. In addition, the first FET and the second FET correspond both preferably to depletion mode Conductor Semiconductor Field Effect Transistors (CSFETs).

Figure 94:
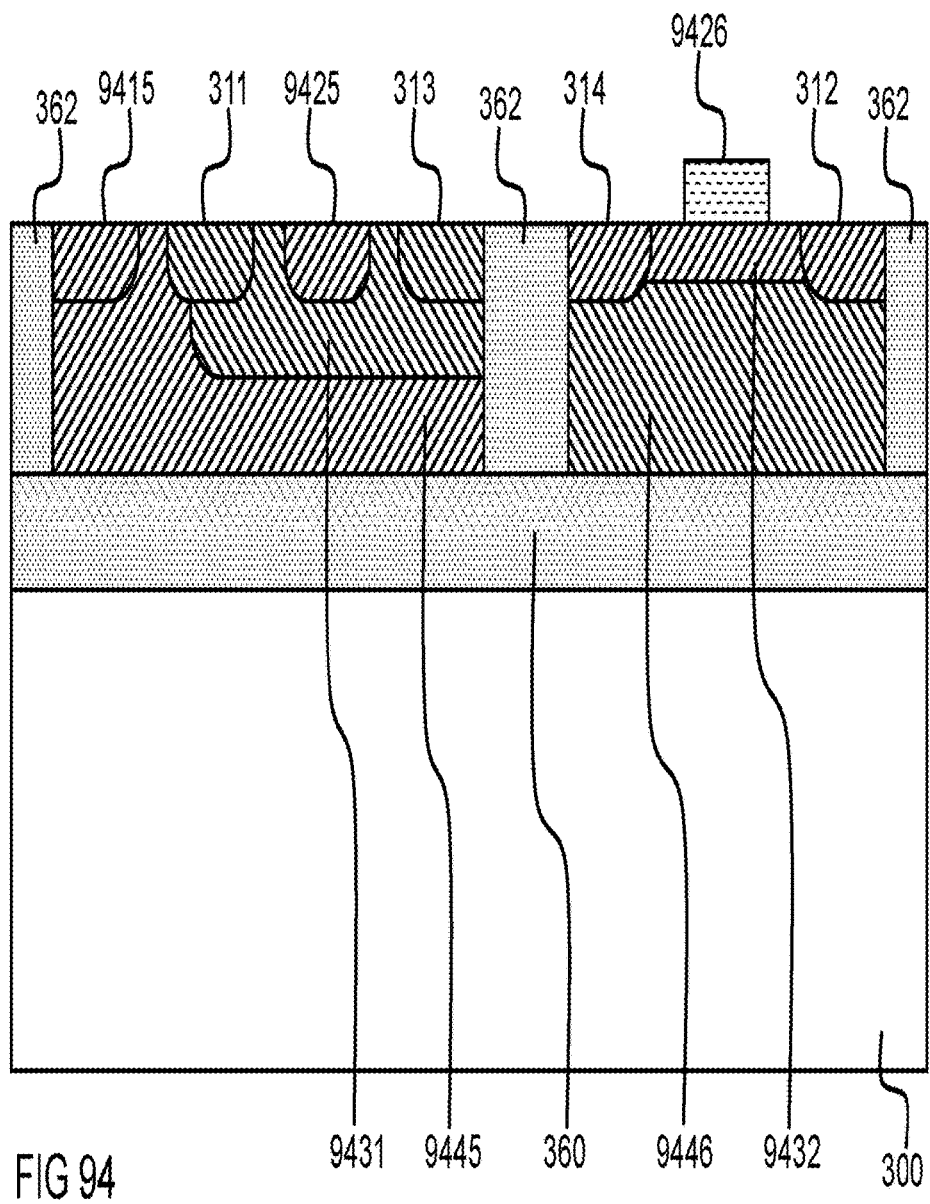

FIG. 95 illustrates a schematic layout of a semiconductor logic element corresponding to an embodiment of the invention, FIG. 94 illustrates a schematic cross-section of the semiconductor logic element along the dashed line 9571 of FIG. 95, FIG. 96 illustrates a schematic cross-section of the first FET along the dashed line 9572 of FIG. 95, and FIG. 97 illustrates a schematic cross-section of the second FET along the dashed line 9573 of FIG. 95. In the embodiment of FIGS. 94-97 the first FET is a junction field effect transistor having separate front-gate doping 9425 and back-gate doping 9445 that are connected together as the first gate. In addition the embodiment comprises a second FET being a CSFET wherein a first conductivity type back-gate doping 9446 and an external Schottky gate 9426 are connected together as the second gate. The reason why in the second FET no wiring is required for connecting the external Schottky gate and the first conductivity type back-gate doping is due to the fact that in this case the conductor material of the external Schottky gate forms an Ohmic contact with the second FET's first conductivity type semiconductor material and a Schottky junction with the second FET's second conductivity type semiconductor material.

In FIGS. 94-97 the first source node corresponds to the first conductivity type first source doping 311 and to the wiring 481. The first gate node, i.e. the input, corresponds to a second conductivity type front-gate doping 9425, to a second conductivity type back-gate doping 9445, to a second conductivity type contact doping 9415, and to a wiring 9585. Between the first source doping 311 and the first drain doping 313 there is a first conductivity type first channel doping 9431 that is capable of transporting mobile first conductivity type charge carriers. The second gate corresponds to the external Schottky gate 9426 and to the first conductivity type back-gate doping 9446. The internal node corresponds to the first conductivity type drain doping 411, to the second gate, and to a wiring 9583 connecting the two. Between the input and the internal node there can be an optional plate capacitor 9590. The second source node comprises the second conductivity type second source doping 312 and the wiring 482. The second drain node, i.e. the output, comprises the second conductivity type second drain doping 314 and the wiring 484. Between the second source doping 312 and the second drain doping 314 there is a second conductivity type second channel doping 9432 capable of transporting mobile second conductivity type charge carriers.

The operation of the semiconductor logic element of FIGS. 94-97 corresponds to the operation of the semiconductor logic element of FIGS. 3 and 4 including that the first channel is conductive and the second channel is nonconductive when the input is at first input logic potential, when the second source is at first output logic potential, and when the first source is at first source potential as well as that the first channel is nonconductive, the second channel is conductive, and the internal node is clamped at first output logic potential when the input is at second input logic potential, when the second source is at the first output logic potential, and when the first source is at first source potential, i.e., the embodiment of FIGS. 91, 92, and 93 corresponds MSCL. In the embodiments corresponding to FIGS. 88-97 one could naturally also replace the horizontal insulation layer 360 with proper isolation wells as already previously explained.

The embodiment of FIGS. 98 and 99 illustrates a modification of the embodiment presented in FIG. 49. FIG. 99 illustrates a schematic layout of a semiconductor logic element corresponding to an embodiment of the invention and FIG. 98 illustrates a schematic cross-section of the semiconductor logic element along the dashed line 9971 of FIG. 99. The advantage of the semiconductor logic element in FIGS. 98 and 99 is that capacitive coupling of the internal node to the outside of the semiconductor logic element is minimized because the internal node is completely surrounded by biased nodes belonging to the same semiconductor element. In this manner, when the input is at second input logic potential, the coupling of the internal node for example to a radio frequency resonance is mitigated, i.e. the tendency of the internal node to act as a receiving antenna is mitigated.

In FIGS. 98 and 99 a horizontal conductor layer 9878 is sandwiched between the horizontal insulator layer 360 and an additional horizontal insulator layer 9860. The vertical conductor layer 9868 is sandwiched between the vertical insulator layer 362 and an additional vertical insulator layer 9862. The vertical conductor layer 9868 and the horizontal conductor layer 9878 are in electric contact together and surround the pixel from below and from the horizontal directions. The layers 9860, 9862, 9868, and 9878 are optional can be utilized in conjunction with the horizontal insulator layer 360 and/or in conjunction with an insulating substrate (corresponding in the embodiment of FIG. 98 to the layer 300) in any other previous embodiment comprising the horizontal insulator layer and/or an insulating substrate. It is also important to note that instead of using all the four 9860, 9862, 9868, and 9878 optional layers one could naturally use only the optional vertical layers 9862 and 9868. Besides the embodiment of FIG. 98 comprises also a Shallow Trench Isolation (STI) 162, which is optional and could be also used in the previous embodiments.

In the embodiment of FIGS. 98 and 99 the first gate node (i.e. the input) corresponds to the second conductivity type back-gate doping 4945, to the second conductivity type contact doping 715, and to a wiring 9985. The first source node corresponds to the first conductivity type first source doping 711 and to the wiring 881. The first conductivity type doping 4946 corresponds both to the first drain and to the second gate and it corresponds to the internal node of the semiconductor logic element. The first conductivity type first channel doping 731 is located in between the first source doping 711 and the first conductivity type doping 4946 (corresponding also to the first drain) and it is capable of transporting mobile first conductivity type charge carriers. The first auxiliary gate node corresponds to the external gate 4927 and to a wiring 9987. The second source node corresponds to the second conductivity type second source doping 712 and to the wiring 882. The second drain node, i.e. the output, corresponds to the second conductivity type second drain doping 714 and to the wiring 884. The second conductivity type second channel doping 732 is located in between the second source doping and the second drain doping and it is capable of transporting mobile second conductivity type charge carriers. The second auxiliary gate node corresponds to the second external gate 4928, to an additional second auxiliary gate 9828, as well as to the vertical and horizontal conductor layers 9868 and 9878. It should be noted that afore said vertical and horizontal conductor layers could be alternatively connected e.g. to the input and that the additional second auxiliary gate could be alternatively connected e.g. to the first source node.

The semiconductor logic element of FIGS. 98 and 99 is preferably biased such that in the first FET there is at the semiconductor interface beneath the first auxiliary gate 4927 a layer of mobile second conductivity type charge carriers and that in the second FET there is at the semiconductor interface beneath the second auxiliary gate 4928 a layer of mobile first conductivity type charge carriers irrespective of the fact whether the input is at first or second input logic potential. In this case the operation of the semiconductor logic element of FIGS. 98 and 99 is similar than the operation of the semiconductor logic element of FIGS. 3 and 4 including that the first channel is conductive and the second channel is nonconductive when the input is at first input logic potential, when the second source is at first output logic potential, and when the first source is at first source potential as well as that the first channel is nonconductive, the second channel is conductive, and the internal node is clamped at first output logic potential when the input is at second input logic potential, when the second source is at the first output logic potential, and when the first source is at first source potential. The embodiment of FIGS. 98 and 99 is applicable to MSCL and to modified CCIS logic of the first kind. It should be noted that the capacitance related to the external gate 9828 could be reduced in the embodiment of FIGS. 98 and 99 by placing underneath the external gate 9828 an STI.

FIG. 100A illustrates a possible biasing scheme of the embodiment corresponding to FIGS. 98 and 99 when the first conductivity type is p type and the second conductivity type is n type. Similarly, FIG. 100B illustrates a possible biasing scheme of the embodiment corresponding to FIGS. 98 and 99 when the first conductivity type is n type and the second conductivity type is p type.

FIGS. 101A-101L illustrate symbols for typical transistor types that can be utilized in conjunction with the invention. In these figures the symbol S refers to the source, the symbol D to the drain, the symbol FG to the front gate, and the symbol BG to the back-gate. In CISFET the term front gate refers to an external CIS gate, in CSFET the term front gate refers to an external Schottky gate, and in JFET the term front gate refers to the front-gate doping. In CISFET, CSFET, and JFET the term back gate refers to the back-gate doping. In case the FG and BG nodes are shorted together in a JFET one can also utilize instead of FG and BG the terms upper and lower gate doping as in case of FIGS. 3 and 4 or just the term gate doping as in case of FIGS. 5 and 6; sometimes such transistor arrangements have been also referred to in the literature as a Static Induction Transistor (SIT).

FIG. 101A illustrates an Enhancement Mode (EM) n type CISFET (nCISFET), FIG. 101B illustrates a Depletion Mode (DM) nCISFET, FIG. 101C illustrates an EM p type CISFET (pCISFET), FIG. 101D illustrates a DM pCISFET, FIG. 101E illustrates an EM nCSFET, FIG. 101F illustrates a DM nCSFET, FIG. 101G illustrates an EM pCSFET, FIG. 101H illustrates a DM pCSFET, FIG. 10H illustrates an EM nJFET, FIG. 101J illustrates a DM nJFET, FIG. 101K illustrates an EM pJFET, and FIG. 101L illustrates a DM pJFET. It should be noted that concerning the FIGS. 101A-101L a different designation convention is utilized than elsewhere in this text since the difference between a DM and an EM transistor is made according to the fact whether the channel is conductive (DM) or non-conductive (EM) when all the nodes are at the same potential (i.e. according to this designation one cannot change the transistor type by applying a suitable bias to an optional auxiliary gate node corresponding to either BG or FG node). It should be, however, noted that there is no difference between the designation convention of FIGS. 101A-101L and the rest of the text when the FG and BG are shorted together as a gate node.

It has been already explained in the description of previously illustrated embodiments that it is possible to utilize DM and EM CISFETs as the first FET, DM and EM CISFETs as the second FET, DM and EM JFETs as the first FET, DM and EM JFETs as the second FET, DM CSFETs as the first FET, and DM CSFETs as the second FET. However, it should be noted that it is possible to utilize EM CSFETs (just like EM JFETs) also as the first FET in which case the first gate node (i.e. the input) when biased at first input logic potential must be forward biased with respect to the first source biased at first source potential in order to turn the first channel conductive. The power consumption of the forward biased arrangement depends on the bang gap width, on the Schottky barrier height, on the temperature, and on the amount of forward bias, i.e. in favorable circumstances (like e.g. in case of wide band gap semiconductor materials) the forward bias on the first gate may not lead to prohibitively high power consumption. Another important observation is that one can also utilize EM CSFETs (just like EM JFETs) as the second FET in which case the second gate must be forward biased with respect to the second source when the input is at second input logic potential. However, in order to maintain the forward bias it may be necessary to implant underneath the first drain doping impurity atoms introducing localized mid-band-gap energy states. In this manner the internal node would collect enough of mobile first conductivity charge carriers generated by the mid-band-gap states in order to counter the current generated in the forward biased pn junction or in the forward biased Schottky junction between the second channel doping and the second gate. The downside of this is naturally increased power consumption. Another possibility to maintain afore said forward bias would be to use a narrower band-gap semiconductor material in the first FET than in the second FET since the narrower band-gap would generate more dark current.

FIG. 102 illustrates a silicon based inverter configuration comprising a traditional complementary semiconductor logic element corresponding to an EM pCISFET 10294 as well as a semiconductor logic element 10293 according to the invention having a DM pCISFET as the first FET and a DM nCISFET as the second FET. In this inverter arrangement corresponding to MSCL the semiconductor logic element 10293 has replaced the traditional semiconductor logic element corresponding to an EM nCISFET that would be otherwise present in a traditional inverter arrangement corresponding TSCL having 0 V and 5 V as logic potentials. In the traditional inverter arrangement corresponding to TSCL the channel of the EM nCISFET is nonconductive and the channel of the EM pCISFET is conductive when the input of the inverter is at the first logic potential (in this case 0 V) and in addition the channel of the EM nCISFET is conductive and the channel of the EM pCISFET is nonconductive when the input of the inverter is at the second logic potential (in this case 5 V).

In the semiconductor logic element 10293 according to the invention the first gate of the first FET (i.e. the input) comprises both the first external gate and the first back-gate doping. In addition to the first drain doping the internal node comprises both the second external gate and the second back-gate doping of the second FET. Between the input and the internal node there is an optional plate capacitor 10290. In the inverter arrangement of FIG. 102 the external gate of the EM pCISFET 10294 is connected together with the input of the semiconductor logic element 10293 as the input of the inverter arrangement and the drain of the EM pCISFET 10294 is connected together with the second drain (i.e. the output) of the semiconductor logic element as the output of the inverter arrangement.

In FIG. 102 the first FET's channel depth 10291 has been indicated to be 3 V at channel pinch-off and the second FET's channel depth 10292 has been indicated to be 1.5 V at channel pinch-off. The first source is biased at first source potential being −1.5 V and the second source is biased at 0 V. In the EM pCISFET 10294 the back-gate doping is connected to the source node, which is biased at 5 V. In the inverter arrangement of FIG. 102 the first input logic potential and the first output logic potential correspond to 0 V and the second input logic potential and the second output logic potential correspond to 5 V. Taking into account that the n type second source in the second FET is biased at 0 V and that the channel depth of the second FET is 1.5 V means that there will be a roughly 1 V barrier height from the second source to the second drain when the gate of the second FET comprising the p type back-gate doping is biased at −1.5 V. The reason for this is that this is that afore said barrier height plus pseudo channel depth 1.5 V equals 1.5 V reverse bias plus built-in potential (roughly 1 volt) resulting in 1 V for afore said barrier height.

The MSCL biasing scheme of FIG. 102 has been illustrated in FIG. 103A with a higher level inverter symbol wherein the existence of a single semiconductor logic element according to the invention is indicated by the lack of a complementary first source potential (see the lowest corner of the triangular inverter symbol). The higher level inverter symbol of 103B illustrates another possible non-MSCL biasing scheme of the inverter configuration of FIG. 102 wherein the only alteration to FIG. 102 is that the node corresponding to the source and back-gate doping of the EM pCISFET 10294 is connected to 4 V. In the inverter arrangement of FIG. 103B the first input and output logic potentials correspond to 0 V, the second input logic potential corresponds to 5 V, and the second output logic potential corresponds to 4 V, i.e. the second output logic potential is shifted by −1 V with respect to the second input logic potential.

FIG. 103C illustrates a non-MSCL modified inverter arrangement of FIG. 102 wherein the node of the EM pCISFET 10294 corresponding to the source and back-gate doping is biased at 6 V and wherein the absolute value of the threshold voltage of EM pCISFET 10294 is such that when the external gate of the EM pCISFET 10294 is biased at 5 V the channel of the EM pCISFET 10294 is nonconductive and that when the gate of the EM pCISFET 10294 is biased at 0 V the channel of the EM pCISFET 10294 is conductive. In the inverter arrangement of FIG. 103C the second output logic potential is shifted by 1 V with respect to the second input logic potential. FIG. 103D illustrates a non-MSCL modification of the inverter arrangement of FIG. 103C wherein the source of the EM pCISFET (corresponding to the traditional complementary semiconductor logic element) is biased at 6 V and wherein the larger absolute value of the threshold voltage in the EM pCISFET is achieved by biasing the back-gate doping at 7 V (which is indicated by the line 10308c) whereas in the inverter arrangement of FIG. 103C the larger absolute value of the threshold voltage is achieved by proper doping of the back-gate doping. In both inverter arrangements of FIGS. 103C and 103D the second output logic potential is shifted by 1 V with respect to the second input logic potential.

FIG. 103E illustrates a non-MSCL modified inverter arrangement of FIG. 102 wherein the channel depth of the first FET has been increased to 4 V (as indicated in the upmost corner of the triangle in the inverter symbol), the first source potential has been changed to −2.5 V, the first output logic potential at the second source has been changed to −1 V, and in the EM pCISFET 10294 the potential of the node corresponding to source and back-gate doping has been changed to 4 V. Consequently, both the first and second output logic potentials have been changed with −1 V with respect to the first and second input logic potentials.

FIG. 104 illustrates a silicon based inverter configuration comprising a traditional complementary semiconductor logic element corresponding to the EM nCISFET 10494 as well as a semiconductor logic element 10493 according to the invention having a DM nCISFET as the first FET and a DM pCISFET as the second FET. In this inverter arrangement corresponding to MSCL the semiconductor logic element 10493 has replaced the traditional semiconductor logic element corresponding to EM nCISFET that would be otherwise present in a traditional inverter arrangement corresponding to TSCL having 0 V and 5 V as logic potentials. In the inverter arrangement 5 V corresponds to the first input and output logic potentials and 0 V corresponds to the second input and output logic potentials. In the first FET the first source is biased at first source potential (6.5 V) and the first external gate corresponding to first auxiliary gate is biased at second logic potential (0 V). The first gate, i.e. the input, corresponds to the first back-gate doping and it is biased at first logic potential (5 V) or at the second logic potential. The internal node corresponds to the first drain and second back-gate doping. Between the input and the internal node there is an optional plate capacitor 10490. The second external gate corresponding to the second auxiliary gate is biased at first source potential (6.5 V). The second source is biased at first logic potential (5 V). The second drain corresponds to the output of the semiconductor logic element 10493.

In FIG. 104 the biasing of the first auxiliary gate results in the formation of a hole inversion layer beneath the first auxiliary gate when the input is at first logic potential (i.e. when the first channel is conductive) and when the first channel is at pinch-off. Similarly the biasing of the second auxiliary gate results in the formation of an electron inversion layer beneath the second auxiliary gate when the input is at second logic potential (i.e. when the second channel is conductive) and when the second channel is at pinch-off. The first FET's channel depth 10491 has been indicated to be 3 V at channel pinch-off and the second FET's channel depth 10492 has been indicated to be 1.5 V at channel pinch-off.

In the EM nCISFET 10494 the node corresponding to the source and back-gate doping is biased at the second logic potential (0 V). In the inverter arrangement of FIG. 104 the external gate of the EM nCISFET 10494 and the input of the semiconductor logic element 10493 have been connected together as the input of the inverter arrangement and the drain of the EM nCISFET 10494 and the output of the semiconductor logic element 10493 have been connected together as the output of the inverter arrangement.

The MSCL biasing scheme of FIG. 104 has been illustrated in FIG. 105A with a higher level inverter symbol wherein the existence of a single semiconductor logic element according to the invention is indicated by the lack of a complementary first source potential (see the topmost corner of the triangular inverter symbol). The higher level inverter symbol of 105B illustrates another possible non-MSCL biasing scheme of the inverter configuration of FIG. 104 wherein the only alteration to FIG. 104 is that the node corresponding to the source and back-gate doping of the EM nCISFET 10494 is connected to 1 V. In the non-MSCL inverter arrangement of FIG. 105B the first input and output logic potentials correspond to 5 V, the second input logic potential corresponds to 0 V, and the second output logic potential corresponds to 1 V, i.e. the second output logic potential is shifted by 1 V with respect to the second input logic potential.

FIG. 105C illustrates a non-MSCL modified inverter arrangement of FIG. 104 wherein the node of the EM nCISFET 10494 corresponding to the source and back-gate doping is biased at −1 V and wherein the absolute value of the threshold voltage of EM nCISFET 10494 is such that when the external gate of the EM nCISFET 10494 is biased at 0 V the channel of the EM nCISFET 10494 is nonconductive and when the gate of the EM nCISFET 10494 is biased at 5 V the channel of the EM nCISFET 10494 is conductive. In the inverter arrangement of FIG. 105C the second output logic potential is shifted by −1 V with respect to the second input logic potential. FIG. 105D illustrates a non-MSCL modification of the inverter arrangement of FIG. 105C wherein the source of the EM nCISFET (corresponding to the traditional complementary semiconductor logic element) is biased at −1 V and wherein the larger absolute value of the threshold voltage in the EM nCISFET is achieved by biasing the back-gate doping at −2 V (which is indicated by the line 10508c) whereas in the inverter arrangement of FIG. 105C the larger absolute value of the threshold voltage is achieved by proper doping of the back-gate doping. In both inverter arrangements of FIGS. 105C and 105D the second output potential is shifted by −1 V with respect to the second input potential.

FIG. 105E illustrates a non-MSCL modified inverter arrangement of FIG. 104 wherein the channel depth of the first FET has been increased to 4 V (as indicated in the lowest corner of the triangle in the inverter symbol), the first source potential has been changed to 7.5 V, the first output logic potential at the second source has been changed to 6 V, and in the EM nCISFET 10494 the potential of the node corresponding to source and back-gate doping has been changed to 1 V. Consequently, both the first and second output logic potentials have been changed with 1 V with respect to the first and second input logic potentials.

It should be noted that in the inverter arrangements comprising EM pCISFET and/or EM nCISFET operating as a logic element (like e.g. in FIGS. 102-106I) the EM pCISFET could be replaced by an EM pCSFET or by an EM pJFET and the EM nCISFET could be replaced by an EM nCSFET or by an EM nJFET provided that when the input of the inverter is at the first or second input logic potential the forward bias in a Schottky junction or in a pn junction is not large enough to cause prohibitively high power consumption. This power consumption in a forward biased Schottky or pn junction depends on the Schottky barrier height in the CSFET, on the band-gap width, on the temperature, and on the size of the forward bias. Means to mitigate this power consumption is to utilize in the first case materials forming a large Schottky barrier and wide band gap semiconductor material, as well as relatively small potential difference between the first and second input logic potentials. An important observation is also that it is possible to utilize DM field effect transistors as traditional semiconductor logic element or as traditional complementary semiconductor logic elements in non-TSCL arrangements. It should be also noted that in an inverter arrangement comprising an EM FET as well as a semiconductor logic element according to the invention it is also possible to utilize any other semiconductor logic element described in this text in addition to the ones presented in FIGS. 102 and 104.

FIG. 106A illustrates a TSCL (non-level shifted) inverter arrangement wherein the source and back-gate dopings have been connected together both in the EM nCISFET and in the EM pCISFET. Furthermore, the external gates of both the EM nCISFET and the EM pCISFET have been connected together as the input of the inverter configuration, which is biased either at first input logic potential (0 V) or at second input logic potential (5 V). The node comprising the source of the EM nCISFET is biased at the first output logic potential (0 V) and the node comprising the source of the EM pCISFET is biased at second output logic potential (5 V). In addition the drains of both the EM nCISFET and the EM pCISFET have been connected together as the output of the inverter configuration. When the input of the inverter configuration is at the first input logic potential the channel of the EM pCISFET is conductive and the channel of the EM nCISFET is nonconductive thereby biasing the output of the inverter configuration at the second output logic potential. When the input of the inverter configuration is at second input logic potential the channel of the EM nCISFET is conductive and the channel of the EM pCISFET is nonconductive thereby biasing the output of the inverter configuration at the first output logic potential.

The FIGS. 106B-106I illustrate level shifted non-MSCL inverter configurations corresponding to the traditional inverter configuration of FIG. 106A, but wherein the first and/or second output logic potentials are shifted. FIG. 106B illustrates an inverter configuration wherein the first output logic potential is shifted by −1 V with respect to the first input logic potential and the second output logic potential is shifted by 1 V with respect to the second input logic potential. FIG. 106C illustrates an inverter configuration wherein the first output logic potential is shifted by 1 V with respect to the first input logic potential and the second output logic potential is shifted by −1 V with respect to the second input logic potential. FIG. 106D illustrates an inverter configuration wherein the first output logic potential is shifted by −1 V with respect to the first input logic potential. FIG. 106E illustrates an inverter configuration wherein the first output logic potential is shifted by 1 V with respect to the first input logic potential. FIG. 106F illustrates an inverter configuration wherein the second output logic potential is shifted by 1 V with respect to the second input logic potential. FIG. 106G illustrates an inverter configuration wherein the second output logic potential is shifted by −1 V with respect to the second input logic potential. FIG. 106H illustrates an inverter configuration wherein the first and second output logic potentials are shifted by −1 V with respect to the first and second input logic potentials. FIG. 106I illustrates an inverter configuration wherein the first and second output logic potentials are shifted by 1 V with respect to the first and second input logic potentials.

FIGS. 107A-107H illustrate binary logic level shifters according to the invention comprising 6 inverters with different input and/or output binary logic levels. The binary logic level shifters according to FIGS. 107A and 107B comprise semiconductor logic elements according to the invention and complementary semiconductor logic elements according to the invention. The binary logic level shifters according to FIGS. 107C-107F comprise semiconductor logic elements according to the invention and traditional complementary semiconductor logic elements. The invented binary logic level shifters according to FIGS. 107G and 107H comprise traditional semiconductor logic elements and traditional complementary semiconductor logic elements. The embodiments of FIGS. 107A, 107C, 107E, and 107G comprise inverters wherein both the first and second output logic potentials have been shifted towards a first direction with respect to the first and second input logic potentials. The embodiments of FIGS. 107B, 107D, 107F, and 107H comprise inverters wherein either the first or the second output logic potentials has been shifted towards a first direction with respect to the first and second input logic potentials. In the binary logic level shifters corresponding to FIGS. 107C-107H the EM FETs corresponding to traditional complementary semiconductor logic elements and possibly to traditional semiconductor logic elements are preferably made on a SOI layer located on top of a horizontal insulator layer; in addition the EMFETS are preferably surrounded by vertical insulating trenches that reach through the SOI layer until the horizontal insulator layer.

It should be noted that even though in the embodiments of FIGS. 107A-107H the logic levels have been shifted always towards a negative direction the levels could have been shifted also towards a positive direction. It is also possible that in a binary logic level shifter the logic levels have been shifted towards both directions. Besides it is possible to mix different types of inverters presented in FIGS. 107A-107H as one binary logic level shifter. In addition, it is also possible that a binary logic level shifter comprises other binary logic level circuitries in between the inverters. The term inverter should also be understood broadly as a binary logic level device wherein there is at least one input node and at least one output node that are connected to other binary logic level devices, wherein a first input logic potential at the input provides a second output logic potential at the output, and wherein a second input logic potential at the input provides a first output logic potential at the output, i.e. an inverter may comprise multiple logic elements providing also additional functionalities other than the inverter functionality. Particularly the inverter could correspond to a NAND or NOR element which have been down converted to inventers. In order to test whether a binary logic level device corresponds to an inverter one can remove all the other input/output nodes of the binary logic level device except two nodes, remove all the other logic elements in the binary logic level device except two logic elements, and check whether a first input logic potential at first node provides a second output logic potential at the second node, and whether a second input logic potential at the first node provides a first output logic potential at the second output.

In particular a multi-level logic circuitry (e.g. according to FIGS. 107A-107H) may comprise a first and a second logic circuitry (corresponding to inverters), wherein
in the first logic circuitry at least one of the following: the first output logic potential of the first logic circuitry, the second output logic potential of the first logic circuitry is shifted towards a first direction with respect to the first and second input logic potential of the first logic circuitry,
in the second logic circuitry the first and second input logic potentials are shifted towards the first direction with respect to the first and second input logic potentials of the first logic circuitry, and
at least one of the following: the first output logic potential of the second logic circuitry, the second output logic potential of the second logic circuitry is shifted with respect to the first and second output logic potentials of the second logic circuitry towards the first direction.

Furthermore, a multi-level logic circuitry (e.g. according to FIGS. 107A-107H) may comprise a first, a second and a third logic circuitry (corresponding to inverters), wherein
in the first logic circuitry at least one of the following: the first output logic potential of the first logic circuitry, the second output logic potential is shifted towards a first direction with respect to the first and second input logic potential of the first logic circuitry,
in the second logic circuitry the first and second input logic potentials are shifted towards the first direction with respect to the first and second input logic potentials of the first logic circuitry,
at least one of the following: the first output logic potential of the second logic circuitry, the second output logic potential of the second logic circuitry is shifted with respect to the first and second input logic potentials of the second logic circuitry towards the first direction,
in the third logic circuitry the first and second input logic potentials are shifted towards the first direction with respect to the first and second input logic potentials of the second logic circuitry, and
at least one of the following: the first output logic potential of the third logic circuitry, the second output logic potential of the third logic circuitry is shifted with respect to the first and second output logic potentials of the third logic circuitry towards the first direction.

It is important to note that a channel is always located in between a source and drain, that the gate insulator material between the semiconductor material and the gate could be replaced by vacuum or by a gas (particularly whenever it is beneficial to utilize low k insulators), that in all the invented semiconductor logic elements the first source is biased at first source potential and that the in all the invented complementary semiconductor logic elements the complementary first source is biased at complementary first source potential. It should be noted also that the biasing in the given examples are well suited for silicon but may not necessarily work for other semiconductor materials. In all of the embodiments of the invention it is possible to utilize band-gap engineering e.g. in order to create High Electron Mobility Transistors (HEMTs) that are based on CISFET, CSFET, or JFET. In addition it is possible to utilize the embodiments that are based on polycrystalline or amorphous semiconductor material for example as Thin Film Transistors (TFTs) to be utilized e.g. in displays. In addition the invented semiconductor logic elements and the invented complementary semiconductor logic elements could also be based e.g. on graphene, carbon nano tubes, and MoS2 (particularly when in two dimensional form like graphene). Yet another important observation is that with the help of the invented semiconductor logic element and/or the invented complementary semiconductor logic element it is possible to reduce power consumption when compared to traditional CCIS logic since it is possible to avoid leakage through the channel and through the gate insulator material.

It should be noted that a chip like e.g. the one presented in FIG. 74 can comprise e.g. inductors, capacitors, and resistors as well as any high voltage devices including traditional high voltage devices (like e.g. Insulated Gate Bipolar Transistors, IGBTs) and integrated circuitry corresponding to complementary logic like e.g. CCIS. The chip of FIG. 74 is preferably based on SOI layer that could be Silicon located on top of an insulator or Silicon carrier/support wafer (the insulator wafer should have approximately similar thermal expansion coefficient as Silicon). The traditional high voltage devices could be processed into a semiconductor based carrier/support wafer by removing the SOI layer at the corresponding locations.

It should be also noted that although only relatively small voltages are utilized in the chip arrangement of FIGS. 74 and 58 this document provides measures to realize programmable chips with programmable voltage outputs that can cover a range of several hundreds or even several thousands of Volts. This is enabled particularly with the help of the arrangements illustrated in FIGS. 67, 68, and 69 (and possibly with the arrangements of FIGS. 75, 76, and/or 78B) if they comprise a large enough amount of transistors in the transistor chains in order to withstand the large voltage differences. Besides having only a single phase AC chip like the ones presented in FIGS. 58 and 74 one could easily extend the operation of the chips to three phase operation for example by merely providing three sets of high voltage components (i.e. by tripling the amount of high voltage components and corresponding input and output pads) and by driving them at desired phase with respect to each others. Yet another self evident but important point is that all the numbers presented in bold font in FIGS. 52A-107H refer to Voltages—the marking V is left out since it would only consume space without providing significantly enhanced clarity.

The semiconductor logic element of FIG. 24 and its complementary semiconductor logic element enable the realization of CS logic. The semiconductor logic element of FIGS. 23 and 24 illustrate that it is possible to combine different types of FETs for the first and second FET. Besides it is naturally also possible to make the first and second FET in FIGS. 23 and 24 of different semiconductor materials. One could actually also utilize four different type transistors for the first FET, second FETs, complementary first FET, and complementary second FET; it is even possible to utilize a different semiconductor material for each of the four FETs. As already previously said in a semiconductor logic element embodiment according to the invention may comprise different types of transistors as the first FET and second FET. Similarly the first FET and the second FET in the complementary semiconductor logic element embodiment according to the invention may comprise two more different types of transistors. For example one could use a first type lateral JFET, a second type surface channel CISFET, second type perpendicular JFET, and first type buried channel CISFET. The four different transistors could be also formed of one, two, three, or four different types of semiconductor materials. One could even use different gate insulator layers corresponding to different thicknesses in each CISFET. One could even utilize more than four different transistors in order to form different types of semiconductor logic elements and/or of complementary semiconductor logic elements to be utilized at different parts of the chip in order to optimize the performance of the chip. In addition, as it was already previously explained one can also have multiple first FETs and/or multiple second FETs in a semiconductor logic element and all of these could be made of different kinds of FETs and/or of different kind of semiconductor material. Besides, instead of having only one gate and/or auxiliary gate one could also have multiple independent gates and/or multiple independent auxiliary gates belonging to the first FET and/or to the second FET in case the gates and/or auxiliary gates are of external gate type corresponding to a CIS stack or to a Schottky gate (corresponding to Conductor Semiconductor (CS) stack).

In the particular case wherein the second FET of the invented semiconductor logic element comprises multiple independent CIS gates that are connected to the first drains of independent first FETs the multiple independent inputs of the first FETs need to be at second input logic potentials in order to turn the second channel conductive, i.e. in order to have the output biased at the first output logic potential. This arrangement corresponds to modified CCIS logic of the second type since the multiple independent gates of the second FET are not clamped at first output logic potential and it has the benefits that it provides fast switching speed, that it requires less area, and that it can be exploited e.g. in the part of NAND (or NOR) configuration wherein semiconductor logic elements are connected in series. Furthermore, in case the invented complementary semiconductor logic element comprises multiple independent first FETs having first drains connected to the second gate of a single second FET this arrangement could be exploited in the part of the NAND (or NOR) configuration wherein complementary semiconductor logic elements are connected in parallel in order save area. If this arrangement is properly designed the reduction in switching speed should be marginal and especially so in case of two logic gate NAND (or NOR) cell. In afore described manner only 6 transistors are required to for a two logic gate NAND (or NOR) cell corresponding to the invented modified CCIS logic of the second kind. In a similar manner one can reduce the amount of transistors e.g. in a AND, OR, NOR, XOR, XNOR, and Static Random Access Memory (SRAM) cells.

In stead of the term perpendicular JFET that is utilized in this text one could have also used the term vertical JFET. Beside the lateral CISFET it is naturally also possible to utilize perpendicular(/vertical) CISFETs like the ones utilized in Insulated Gate Bipolar Transistors (IGBTs) wherein the channel current runs also in the perpendicular(/vertical) direction. Other possibility would be to utilize a CISFET wherein the gate is located inside a trench so that the channel current runs in the perpendicular(/vertical) direction. In such embodiments the drain could be located at the same surface or on the surface on the opposite side. In a similar manner the drain of a perpendicular(/vertical) JFET could be also located on a surface that is on the opposite side when compared to the surface comprising the source. There could be also wiring on both surfaces.

Another benefit of the invented semiconductor logic element is small power consumption at idle since channel leakage can be avoided and thus leakage current is only generated from reverse biased pn junctions. It should be also noted that highly doped semiconductor material in the CIS gate (like e.g. strongly doped poly-silicon) is also referred to as conductor.

The contact dopings according to different embodiments are actually not necessary in case no wiring is used or in case the Fermi levels of the wiring and of the semiconductor material of the corresponding conductivity type to which the contact is made are appropriate. It would be also possible to replace the CIS stacks corresponding to external gates with Schottky gates (i.e. the CIS stack would be replaced by a CS stack). The insulator trenches or even the SOI layer could incorporate metal in order to reduce capacitive coupling between different FETs (e.g. between different semiconductor logic elements and/or between the first FET and second FET of the same semiconductor logic element). One could also pack many first FETs or second FETs to the same well dopings (like to isolation wells) when possible in order to save area. Similarly one could fuse together different parts belonging to different semiconductor logic elements and/or complementary semiconductor logic elements when possible in order to save area. In case the first drain and the second gate are electrically fused together inside the semiconductor material they may not have to be part of a similarly doped region but they could be also electrically fused together through side by side positioned n+ p+ n+ or p+ n+ p+ junctions. One can also omit the wiring in a node in case other means of biasing is provided—e.g. one could bias a source, drain, or gate of the first FET or second FET through the semiconductor substrate. Thus in the figures illustrating and in the text describing an embodiment of the invention all the wirings could be omitted if afore said other biasing means are provided.

It is important to note also that in the invented semiconductor logic element the second source belonging to the second FET must not always be biased at first output logic potential. However, at a certain time point in a complementary logic circuitry comprising previously described invented semiconductor logic elements there must be at least one invented semiconductor logic element wherein the second source is biased at first output logic potential. Thus although in figures illustrating and/or text describing the case wherein the second source of the invented semiconductor logic element is connected to first output logic potential it could be very well that at another point of time or in another semiconductor logic element the second source is not connected to the first output logic potential. Besides the invented semiconductor logic element can be also designed to be bidirectional so that the function of the second source and the second drain can be interchanged during the operation of the invented complementary logic circuitry. Yet another point is that the first source of the first FET may not be always connected to the first source potential for example if there are multiple first FETs that are connected in series in the invented semiconductor logic element.

When a surface channel CISFET corresponding e.g. to the second FET in FIG. 40 is conductive there may be a second type accumulation layer present beneath the central part of the external gate but beneath the upper edge of the external gate there may be a second type inversion layer present. There could be also in between the buried channel and the insulator layer a very shallow layer of oppositely doped semiconductor material than the buried channel. In such a case there may actually be an inversion layer instead of an accumulation layer present at the interface but the type would be anyhow the same. Thus it is actually not important whether there is an accumulation layer or inversion layer or pinning layer present at the interface but instead it is important which conductivity type mobile charge carrier layer there is present at the interface. It is also possible to replace the buried channel in a depletion mode CISFET with a properly charged insulator layer resulting in a mobile charge carrier layer at the interface.

The term configured to be coupled means that at a certain moment the device may not be coupled to a power source but when it is the nodes are coupled at least during a certain time point to the specific potentials described by the term configured to be coupled. Besides in case the same numbering is utilized for a certain object illustrated in different figures corresponding to different embodiments of the invention the object and/or the function of this certain object may not be repeatedly explained but instead the explanation can be read from the embodiment wherein the function of the object is described for the first time in the text.

A major benefit of the semiconductor logic elements and complementary semiconductor logic elements corresponding to the invention is that a single defect cannot establish a permanent conductive path between the first gate node as well as the second source node and/or second drain node due to the fact that in between them there is the internal node. By providing better defect isolation so that a defect is less likely to result in a permanent conductive path between two logic lines means that the damage caused by a defect is easier to isolate, that countermeasures against defects are easier to design, and that complete device breakage is less likely resulted in.

The purpose of the invention is to replace at least part of the semiconductor logic elements of the traditional CCIS logic with the semiconductor logic elements according to the invention and/or to replace at least part of the complementary semiconductor logic elements in the traditional CCIS logic with the complementary semiconductor logic elements according to the invention in order to improve tolerance against defects. An alternative purpose of the invention is to replace at least part of the semiconductor logic elements of the traditional CCIS logic with the semiconductor logic elements according to the invention and to replace at least part of the complementary semiconductor logic elements in the traditional CCIS logic with the complementary semiconductor logic elements according to the invention in order to provide novel semiconductor logic having comparable power consumption and better defect isolation than traditional CCIS logic. Yet another purpose of the invention is to provide novel semiconductor logic enabling the application of multiple logic levels for example in mixed mode chips, power electronics, Micro Electro Mechanical Systems (MEMS), memory chips like SRAM and Dynamic RAM (DRAM) chips, and/or sensors and detectors. In radiation detectors one could for example provide interconnected logic that is situated in side several drift rings.

Finally the invented semiconductor logic element can be utilized for replacing traditional n type surface channel CISFET semiconductor logic elements with the invented semiconductor logic element since functioning n type surface channel CISFETs have been very difficult to realize due to surface pinning. The benefit of complementary logic based on germanium over silicon is that one could reach with germanium much higher operation speeds than with silicon.

The specific examples provided in the description given above should not be construed as limiting the applicability and/or the interpretation of the appended claims. Lists and groups of examples provided in the description given above are not exhaustive unless otherwise explicitly stated.

The invention claimed is:

1. A nonlinear resistor comprising a first node and a second node and two transistor chains, the first transistor chain comprises first conductivity type field effect transistors and the second transistor chain comprises second conductivity field effect transistors, wherein

- a gate of a first transistor in the first transistor chain and a gate of a first transistor in the second transistor chain being connected together as the first node,
- a drain of a last transistor in the first transistor chain and a drain of a last transistor in the second transistor chain being connected together as the second node,
- a source of the first transistor in the first transistor chain and a gate of the second transistor in the first transistor chain being connected together,
- a source of the first transistor in the second transistor chain and a gate of the second transistor in the second transistor chain being connected together,
- a source of the last transistor in the first transistor chain and a drain of a second last transistor in the first transistor chain being connected together,
- a source of the last transistor in the second transistor chain and a drain of a second last transistor in the second transistor chain being connected together,
- in a transistor located in the first transistor chain in between the first transistor and the last transistor a source being connected to a drain of a next transistor in the first transistor chain located closer to the first node as well as the source connected to a gate of a next transistor in the first transistor chain located closer to the second node, and
- in a transistor located in the second transistor chain in between the first transistor and the last transistor a source being connected to a drain of a next transistor in the second transistor chain located closer to the first node as well as the source connected to a gate of a next transistor in the transistor chain located closer to the second node.

2. The nonlinear resistor of claim 1, wherein at least some of the transistors correspond to junction field effect transistors.

3. The nonlinear resistor of claim 1, wherein at least some of the transistors correspond to conductor insulator semiconductor field effect transistors.

4. The nonlinear resistor of claim 1, wherein at least some of the transistors correspond to depletion mode field effect transistors.

* * * * *